US008502201B2

(12) United States Patent
Nagao et al.

(10) Patent No.: US 8,502,201 B2
(45) Date of Patent: Aug. 6, 2013

(54) LIGHT-EMITTING ELEMENT

(75) Inventors: Kazumasa Nagao, Otsu (JP); Takeshi Arai, Otsu (JP); Takeshi Ikeda, Otsu (JP); Tsuyoshi Tominaga, Otsu (JP); Daisaku Tanaka, Otsu (JP); Yasunori Ichihashi, Otsu (JP); Koji Ueoka, Otsu (JP)

(73) Assignee: TORAY Industries, Inc., Tokyo (JP)

( * ) Notice: Subject to any disclaimer, the term of this patent is extended or adjusted under 35 U.S.C. 154(b) by 397 days.

(21) Appl. No.: 12/737,339

(22) PCT Filed: Jun. 26, 2009

(86) PCT No.: PCT/JP2009/061674
§ 371 (c)(1),
(2), (4) Date: Dec. 30, 2010

(87) PCT Pub. No.: WO2010/001817
PCT Pub. Date: Jan. 7, 2010

(65) Prior Publication Data

US 2011/0121268 A1 May 26, 2011

(30) Foreign Application Priority Data

Jul. 1, 2008 (JP) ................................ 2008-172125
Feb. 19, 2009 (JP) ................................ 2009-036213

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS

| | | | | |
|---|---|---|---|---|
| 2007/0205412 | A1 * | 9/2007 | Bae et al. | 257/40 |
| 2007/0247063 | A1 * | 10/2007 | Murase et al. | 313/504 |
| 2009/0096356 | A1 * | 4/2009 | Murase et al. | 313/504 |
| 2009/0131673 | A1 * | 5/2009 | Tanabe et al. | 546/88 |

FOREIGN PATENT DOCUMENTS

| | | | |
|---|---|---|---|
| EP | 1 621 597 | A1 | 2/2006 |
| JP | 2000-348864 | | 12/2000 |
| JP | 2002-352961 | | 12/2002 |
| JP | 2003-128651 | | 5/2003 |
| JP | 2003-238534 | | 8/2003 |
| JP | 2003-347060 | | 12/2003 |
| JP | 2004-002297 | | 1/2004 |
| JP | 2004-277377 | | 10/2004 |
| JP | 2008-094776 | | 4/2008 |
| WO | 2005/113531 | A1 | 12/2005 |
| WO | 2005/115950 | A1 | 12/2005 |
| WO | 2006/128800 | A1 | 12/2006 |
| WO | 2007/029798 | A1 | 3/2007 |
| WO | 2007/102683 | A1 | 9/2007 |
| WO | 2008/108256 | A1 | 9/2008 |
| WO | 2008/143229 | A1 | 11/2008 |

OTHER PUBLICATIONS

C.W. Tang et al., "Organic electroluminescent diodes" Appl. Phys. Lett. 51 (12), pp. 913-915 Sep. 1987.

European Search Report dated Jun. 28, 2011, issued in European Application No. 09773395.0-2111/2296204.

* cited by examiner

*Primary Examiner* — Anthony Ho
(74) *Attorney, Agent, or Firm* — Kubovcik & Kubovcik

(57) ABSTRACT

The present invention relates to an organic thin-film light emitting device containing an organic compound represented by formula (1) and a donor compound. the light emitting device can achieve both of the low-voltage driving operation and high luminance efficiency.

$$Y{-}\!(A^1{-}Ar)_{n^1} \quad (1)$$

(Y represents either substituted or unsubstituted pyrene, or substituted or unsubstituted anthracene. $A^1$ is selected from the group consisting of a single bond, an arylene group, and a hetero arylene group. Ar is selected from the group consisting of a carbazolyl group, a dibenzofuranyl group, and a dibenzothiophenyl group. These groups may be substituted or unsubstituted, and $n^1$ is an integer of 1 to 3.).

13 Claims, No Drawings

LIGHT-EMITTING ELEMENT

This application is a 371 of international application PCT/JP2009/061674, filed Jun. 26, 2009, which claims priority based on Japanese patent application Nos. 2008-172125 and 2009-036213 filed Jul. 1, 2008, and Feb. 19, 2009, respectively, which are incorporated herein by reference.

TECHNICAL FIELD

The invention relates to a pyrene compound or an anthracene compound effectively used for a charge transporting material, and a light emitting device that uses these, and more particularly concerns a light emitting device that is applicable to various fields, such as display devices, flat panel displays, backlights, lighting fittings, interior goods, signs, signboards, electronic cameras, and light signal generators.

BACKGROUND ART

In recent years, studies have been vigorously made on an organic thin-film light emitting device that emits light when electrons injected from a cathode and holes injected from an anode are recombined inside an organic fluorescent body sandwiched between the two electrodes. This light emitting device is characterized by a thin structure, high luminance light emission under a low driving voltage, and light emissions with multiple colors achieved by selecting fluorescent materials, and has drawn public attentions.

These studies have been carried out by many research organizations since C. W. Tangs, et al of Kodak Company indicated that an organic thin-film device could emit light with high luminance. The typical structure of the organic thin-film light emitting device, proposed by the research group of Kodak Company, was prepared by successively stacking a hole transporting diamine compound, 8-hydroxyquinoline aluminum serving as an emissive layer, and Mg:Ag serving as a cathode on an ITO glass substrate, and green light emission of 1,000 cd/$m^2$ was available at a driving voltage of about 10 V (see Non-Patent Document 1).

Moreover, since the organic thin-film light emitting device allows many luminescent colors to be obtained by using various kinds of fluorescent materials for the emissive layer, studies for putting the device into practical use for displays and the like have been progressively carried out. Among the emissive materials for the three primary colors, studies for green color emissive materials have been developed most greatly, and at present, intensive studies have been carried out on red color emissive materials and blue color emissive materials so as to improve their characteristics.

The organic thin-film light emitting device needs to be improved in luminance efficiency, reduced in their driving voltage, and also improved in durability. Among these, in the case when the luminance efficiency is poor, an image output required for high luminance is not available to cause high power consumption in outputting an image with desired luminance. In order to improve the luminance efficiency, various emissive materials have been developed (for example, see Patent Documents 1 to 5). Moreover, a technique for doping a material to be used as an electron transporting layer with an alkali metal has been proposed (see Patent Documents 6 to 10).

PRIOR-ART DOCUMENTS

Patent Documents

Patent Document 1: International Publication No. WO2005/113531 Pamphlet

Patent Document 2: International Publication No. WO2005/115950 Pamphlet

Patent Document 3: International Publication No. WO2007/29798 Pamphlet

Patent Document 4: International Publication No. WO2008/108256 Pamphlet

Patent Document 5: International Publication No. WO2008/143229 Pamphlet

Patent Document 6; JP-A No. 2000-348864 (claim 6)

Patent Document 7: JP-A No. 2004-277377 (claim 7)

Patent Document 8: JP-A No. 2003-347060 (claim 1)

Patent Document 9; JP-A No. 2002-352961 (claim 1)

Patent Document 10; JP-A No. 2004-2297 (Claims, 1, 15, 16)

Non-Patent Documents

Non-Patent Document 1: "Applied Physics Letters", (U.S.), pp. 913 to 915, No. 12, Vol. 51, issued in 1987

DISCLOSURE OF THE INVENTION

Problems to be Solved by the Invention

In the methods as shown in Patent Documents 1 to 5, however, in order to improve the luminance efficiency of light emission of all the RGB, improvements are required for the respective emissive materials. As one example for easily improving luminance efficiency, a method is proposed in which an interference effect exerted between emitted light from the emissive layer and the reflected light from the cathode is utilized; however, the optimal conditions thereof tend to raise the driving voltage used for making the thin-film layer thicker.

Moreover, conventionally known combinations, as shown in Patent Documents 6 to 10, are insufficient to achieve both of a low-voltage driving operation and high luminance efficiency.

The present invention has been devised to solve the problems in the prior art, and its object is to provide an organic thin-film light emitting device that can achieve both of the low-voltage driving operation and high luminance efficiency.

Means to Solve the Problems

The present invention relates to a light emitting device serving as an organic electric field light emitting device, which is provided with a thin-film layer including at least an emissive layer and an electron transporting layer, and a second electrode formed on the thin-film layer, with the thin-film layer and the second electrode being formed on a first electrode formed on a substrate, and the electron transporting layer is characterized by containing an organic compound represented by the following formula (1) and a donor compound:

$$Y\text{-}(\text{-}A^1\text{-}Ar)_{n^1} \quad (1)$$

wherein Y represents either substituted or unsubstituted-pyrene, or substituted or unsubstituted anthracene; $A^1$ is selected from the group consisting of a single bond, an arylene group, and a hetero arylene group; Ar is selected from the group consisting of a carbazolyl group, a dibenzofuranyl group, and a dibenzothiophenyl group; where these groups may be substituted or unsubstituted, and $n^1$ is an integer of 1 to 3.

Effects of the Invention

The present invention makes it possible to provide an organic electric field light emitting device that achieves both of the low-voltage driving operation and high luminance efficiency.

BEST MODE FOR CARRYING OUT THE INVENTION

The following description will discuss embodiments of a light emitting device of the present invention in detail. The light emitting device of the present invention is provided with a first electrode and a second electrode, and an organic layer interposed between these, and the organic layer at least includes an emissive layer, and the emissive layer is allowed to emit light by electric energy.

In addition to the structure composed of only the emissive layer, the organic layer may have stacked structures of 1) hole transporting layer/emissive layer/electron transporting layer, 2) emissive layer/electron transporting layer, 3) hole transporting layer/emissive layer, and the like. Moreover, the respective layers may be prepared as either a single layer or a plurality of layers. In the case when each of the hole transporting layer and the electron transporting layer is composed of a plurality of layers, the layers located on the side contacting the electrode are sometimes referred to as a hole injection layer and an electron injection layer, respectively; however, in the following description, a hole injection material is included in a hole transporting material, and an electron injection material is included in an electron transporting material, respectively, unless otherwise specified.

The electron transporting layer in the light emitting device of the present invention contains a compound represented by the following formula (1) and a donor compound:

$$Y\text{-}(A^1\text{-}Ar)_{n^1} \quad (1)$$

Y represents either substituted or unsubstituted pyrene, or substituted or unsubstituted anthracene. $A^1$ is selected from the group consisting of a single bond, an arylene group, and a hetero arylene group. Ar is selected from the group consisting of a carbazolyl group, a dibenzofuranyl group, and a dibenzothiophenyl group. These groups may be substituted or unsubstituted. $n^1$ is an integer of 1 to 3. By the function of this mixture layer, the electron transporting process from the cathode to the emissive layer is accelerated so that both of high luminance efficiency and low driving voltage can be achieved. The following description will discuss the respective components in detail.

The compound represented by formula (1) is effectively utilized for an emissive material, in particular, for a blue host material, for example, as described in Patent Documents 1 to 5; however, in the present invention, it functions as an electron transporting material. Moreover, the present invention uses the compound represented by formula (1) in combination with a specific donor compound so that both of high luminance efficiency and low driving voltage can be achieved.

In general, the electron transporting material is required for efficiently transporting electrons from the cathode, and has preferably high electron injection efficiency so as to efficiently transport electrons that have been injected. For these reasons, the material needs to have high electron affinity and high electron mobility, and also needs to be superior in stability, and prepared as a material to hardly generate impurities that cause traps. In particular, in the case when stacked layers with a high thickness are prepared, since a compound having a low molecular weight tends to easily deteriorate in its film quality due to crystallization or the like, a compound having a molecular weight of 400 or more having a stable film quality is preferably used. The compound represented by formula (1) is a material that satisfies these conditions, and is superior in electron transporting characteristic and electrochemical stability because it includes a pyrene or anthracene skeleton. Moreover, since a substituent, selected from the group consisting of a carbazolyl group, a dibenzofuranyl group, and a dibenzothiophenyl group, which are bulky aromatic heterocyclic groups, is introduced therein through an aryl group or a hetero aryl group, it becomes possible to obtain stable film quality, while maintaining a high electron transporting capability possessed by the pyrene or anthracene skeleton. Moreover, by the introduction of the substituent, the compatibility with the donor compound in a thin-film state is improved, making it possible to exert a higher electron transporting capability.

In the case when the compound represented by formula (1) has a pyrene skeleton, the following compound is preferably used.

(2)

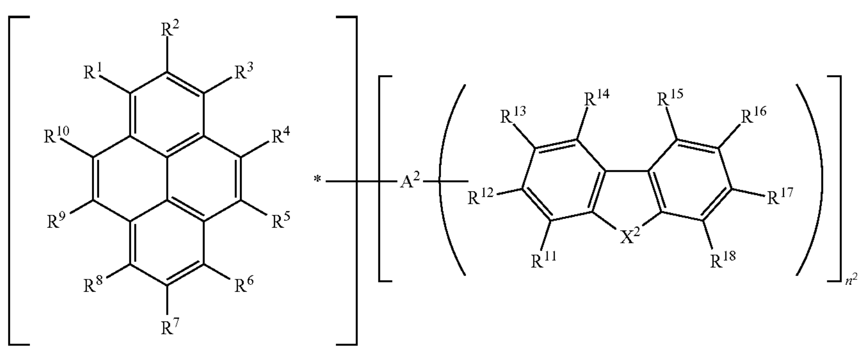

$R^1$ to $R^{18}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and $—P(=O)R^{19}R^{20}$. Each of $R^{19}$ and $R^{20}$ is an aryl group or a heteroaryl group. $R^1$ to $R^{20}$ may form a ring together with adjacent substituents. $n^2$ is an integer of 1 to 3. $X^2$ is selected from the group consisting of —O—, —S—, and —$NR^{21}$—. $R^{21}$ is selected from the group consisting of hydrogen, an alkyl group, a cycloalkyl group, a heterocyclic group, an alkenyl group, a cycloalkenyl group, an alkynyl group, an aryl group, a heteroaryl group, and an amino group. $R^{21}$ may be bonded to $R^{11}$ or $R^{16}$ to form a ring. $A^2$ is selected from the group consisting of a single bond, an arylene group; and a heteroarylene group. Any $n^2$ number of $R^1$ to $R^{10}$ and any one of $R^{11}$ to $R^{21}$ are used for a linkage to $A^2$. In this case, at least one group of $R^3$, $R^6$ and $R^8$ is a group different from $R^1$.

In the pyrene compound represented by formula (2), when at least one group of $R^3$, $R^6$ and $R^8$ is a group different from $R^1$, the symmetry of the molecule is lowered so that a good quality amorphous thin film is preferably formed.

Moreover, in the pyrene compound represented by formula (2), when $R^1$ is prepared as an aryl group or a heteroaryl group, with at least one of $A^2$ being linked at a position of $R^6$ or $R^8$, the interaction between pyrene compounds is suppressed so that it is possible to preferably obtain high luminance efficiency. It is more preferable when $R^1$ is prepared as an aryl group. Furthermore, in the case when $R^2$ is prepared as an alkyl group or a cycloalkyl group, with at least one of $A^2$ being linked at a position of $R^6$ or $R^8$, the amorphous property of the molecule is improved so that it is possible to preferably form a stable thin film.

Among the compounds represented by formula (2) of the present invention, from the viewpoints of convenience in obtaining materials or easiness in synthesis, pyrene compounds represented by the following formula (3) or (4) are preferably used.

(3)

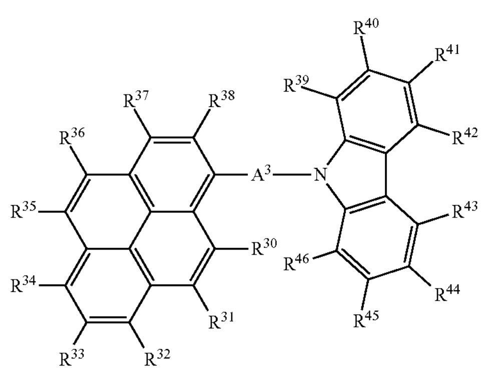

$R^{30}$ to $R^{46}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and —P(=O)$R^{47}R^{48}$. Each of $R^{47}$ and $R^{48}$ is an aryl group or a heteroaryl group. $R^{30}$ to $R^{48}$ may form a ring together with adjacent substituents. $A^3$ is an arylene group or a heteroarylene group. At least one of $R^{32}$ and $R^{34}$ is an aryl group or a heteroaryl group, or $R^{33}$ is an alkyl group or a cycloalkyl group.

(4)

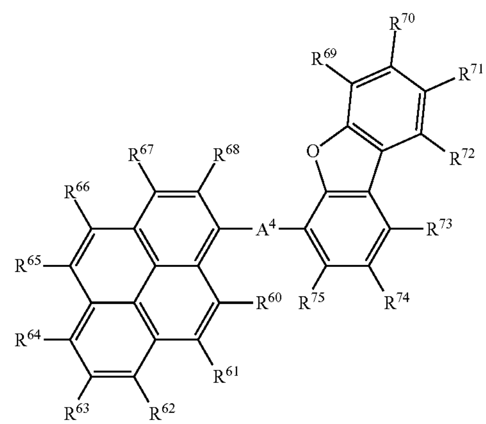

$R^{60}$ to $R^{75}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and —P(=O)$R^{76}R^{77}$. Each of $R^{76}$ and $R^{77}$ is an aryl group or a heteroaryl group. $R^{60}$ to $R^{77}$ may form a ring together with adjacent substituents. $A^4$ is an arylene group or a heteroarylene group. At least one of $R^{62}$ and $R^{64}$ is an aryl group or a heteroaryl group, or $R^{63}$ is an alkyl group or a cycloalkyl group.

Moreover, preferable modes are proposed in which at least one of $R^{11}$ to $R^{18}$ in general formula (2), or at least one of $R^{39}$ to $R^{46}$ in formula (3), is a group selected from the group consisting of an alkyl group, a cycloalkyl group, an aryl group, and a heteroaryl group, and in which, in formula (4), $R^{62}$ to $R^{64}$ are hydrogen atoms, $R^{63}$ is an alkyl group, and $R^{67}$ is an aryl group or a heteroaryl group. Alternatively, another preferable mode is proposed in which at least two of adjacent groups of $R^{11}$ to $R^{18}$, or at least two of adjacent groups of $R^{39}$ to $R^{46}$, are bonded to form a ring. With this structure, the interaction between pyrene compounds is suppressed so that it is possible to preferably obtain high luminance efficiency and also to preferably improve the thin-film stability.

In the case when the compound represented by formula (1) has an anthracene skeleton, the following compound is preferably used.

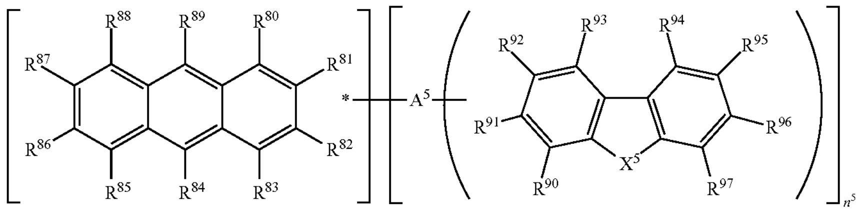

(5)

In this formula, $R^{80}$ to $R^{97}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a cyano group, a carbonyl group, an ester group, a carbamoyl group, an amino group, a silyl group, and —P(═O)$R^{98}R^{99}$. Each of $R^{98}$ and $R^{99}$ is an aryl group or a heteroaryl group. $R^{80}$ to $R^{99}$ may form a ring together with adjacent substituents. $n^5$ is an integer of 1 or 2. $X^5$ is selected from the group consisting of —O—, —S—, and —$NR^{100}$—. $R^{100}$ is selected from the group consisting of hydrogen, an alkyl group, a cycloalkyl group, a heterocyclic group, an alkenyl group, a cycloalkenyl group, an alkynyl group, an aryl group, a heteroaryl group, and an amino group. $R^{100}$ may be bonded to $R^{90}$ or $R^{97}$ to form a ring. $A^5$ is selected from the group consisting of a single bond, an arylene group, and a heteroarylene group. Any $n^5$ number of $R^{80}$ to $R^{89}$ and any one of $R^{90}$ to $R^{100}$ are used for a linkage to $A^5$.

Among these, in the case when each of $R^{90}$ to $R^{97}$ in formula (5) is prepared as at least one group selected from the group consisting of hydrogen, an alkyl group, a cycloalkyl group, an alkoxy group, a phenyl group, a naphthyl group, and a heteroaryl group, it becomes possible to improve the thin-film stability, and also to provide a light emitting device with high luminance efficiency.

Among the compounds represented by formula (5) of the present invention, from the viewpoints of convenience in obtaining materials or easiness in synthesis, anthracene compounds represented by the following formula (6) or (7) are preferably used.

(6)

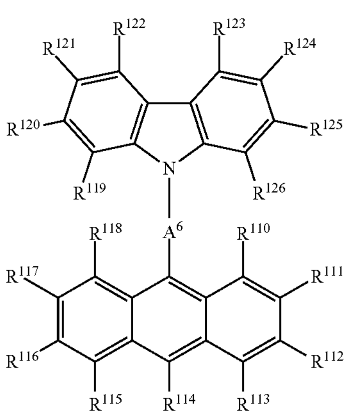

In this formula, $R^{110}$ to $R^{126}$, which may be the same as or different from one another, are selected from the group consisting of hydrogen, an alkyl group, a cycloalkyl group, a heterocyclic group, an alkoxy group, an alkylthio group, an aryl ether group, an arylthio ether group, a phenyl group, an alkyl-substituted phenyl group, an alkoxy-substituted phenyl group, an aryl-substituted phenyl group, a naphthyl group, an alkyl-substituted naphthyl group, an alkoxy-substituted naphthyl group, an aryl-substituted naphthyl group, a phenanthryl group, an alkyl-substituted phenanthryl group, an alkoxy-substituted phenanthryl group, an aryl-substituted phenanthryl group, a heteroaryl group, and a silyl group. $A^6$ is a heteroarylene group or an arylene group having carbon atoms of 6 or more to 12 or less.

(7)

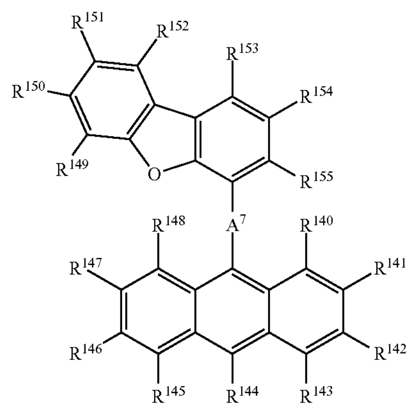

In this formula, $R^{140}$ to $R^{148}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a cyano group, a carbonyl group, an ester group, a carbamoyl group, an amino group, a silyl group, and —P(═O)$R^{156}R^{157}$. Each of $R^{156}$ and $R^{157}$, is an aryl group or a heteroaryl group. $R^{149}$ to $R^{155}$, which may be the same as or different from one another, are selected from the group consisting of hydrogen, an alkyl group, an cycloalkyl group, an alkoxy group, a phenyl group, a naphthyl group, and a heteroaryl group. $A^7$ is selected from the group consisting of a single bond, an arylene group, and a heteroarylene group.

Moreover, preferable modes are proposed in which $R^{114}$ in formula (6) or $R^{144}$ in formula (7) is a group selected from the group consisting of hydrogen, an alkyl group, a cycloalkyl group, a heterocyclic group, an alkoxy group, an alkylthio group, an aryl group, a heteroaryl group, an amino group, a silyl group and a ring structure formed between adjacent substitutes. With this structure, the interaction between anthracene compounds is suppressed so that it is possible to preferably obtain high luminance efficiency and also to preferably improve the thin-film stability.

Among the above-mentioned substituents, the alkyl group represents a saturated aliphatic hydrocarbon group, such as, for example, a methyl group, an ethyl group, an n-propyl group, an isopropyl group, an n-butyl group, a sec-butyl group, and a tert-butyl group, and each of these may or may not have a substituent. In the case when substituted, the added substituent is not particularly limited, and examples thereof include an alkyl group, an aryl group, and a heteroaryl group, and this point is in common with the following description. Moreover, although not particularly limited, the number of carbon atoms of the alkyl group is normally set in a range from 1 or more to 20 or less, preferably, from 1 or more to 8 or less, from the viewpoints of easiness in availability and costs.

The cycloalkyl group represents a saturated alicyclic hydrocarbon group, such as, for example, a cyclopropyl group, a cyclohexyl group, a norbornyl group, and an adamantyl group, and each of these may or may not have a substituent. Although not particularly limited, the number of carbon atoms of the alkyl group portion is normally in a range from 3 or more to 20 or less.

The heterocyclic group represents an aliphatic ring having an atom other than carbon atoms inside the ring, such as, for example, a pyran ring, a piperidine ring, and a ring-shaped amide, and each of these may or may not have a substituent. Although not particularly limited, the number of carbon atoms of the heterocyclic group is normally in a range from 2 or more to 20 or less.

The alkenyl group represents an unsaturated aliphatic hydrocarbon group including double bonds, such as, for example, a vinyl group, an allyl group, a butadienyl group, and each of these may or may not have a substituent. Although not particularly limited, the number of carbon atoms of the alkenyl group is normally in a range from 2 to 20.

The cycloalkenyl group represents an unsaturated alicyclic hydrocarbon group including double bonds, such as, for example, a cyclopentenyl group, a cyclopentadienyl group, a cyclohexenyl group, and each of these may or may not have a substituent.

The alkynyl group represents an unsaturated alicyclic hydrocarbon group including triple bonds, such as, for example, an ethynyl group, and each of these may or may not have a substituent. Although not particularly limited, the number of carbon atoms of the alkynyl group is normally in a range from 2 to 20.

The alkoxy group represents a functional group in which aliphatic hydrocarbon groups are bonded to each other by an ether bond, such as, for example, a methoxy group, an ethoxy group and a propoxy group, and each of these aliphatic hydrocarbon groups may or may not have a substituent. Although not particularly limited, the number of carbon atoms of the alkoxy group is normally in a range from 1 or more to 20 or less.

The alkylthio group represents a group in which an oxygen atom of an ether bond of an alkoxy group is substituted with a sulfur atom. The hydrocarbon group of the alkylthio group may or may not have a substituent. Although not particularly limited, the number of carbon atoms of the alkylthio group is normally in a range from 1 or more to 20 or less.

The aryl ether group represents a functional group in which aromatic hydrocarbon groups are bonded to each other by an ether bond, such as, for example, a phenoxy group, and each of these aromatic hydrocarbon groups may or may not have a substituent. Although not particularly limited, the number of carbon atoms of the aryl ether group is normally in a range from 6 or more to 40 or less.

The arylthio ether group represents a group in which an oxygen atom of an ether bond of an aryl ether group is substituted with a sulfur atom. The aromatic hydrocarbon group of the aryl ether group may or may not have a substituent. Although not particularly limited, the number of carbon atoms of the aryl ether group is normally in a range from 6 or more to 40 or less.

The aryl group represents an aromatic hydrocarbon group, such as, for example, a phenyl group, a naphthyl group, a biphenyl group, a phenanthryl group, and a terphenyl group. The aryl group may or may not have a substituent. Although not particularly limited, the number of carbon atoms of the aryl group is normally in a range from 6 or more to 40 or less.

The heteroaryl group represents a cyclic aromatic group in which one or a plurality of atoms other than carbon atoms are present in the ring, such as a pyridyl group, a quinolinyl group, a pyrazinyl group, a naphthylidyl group, a dibenzofuranyl group, a dibenzothiophenyl group, and a carbazolyl group, and each of these groups may be substituted, or is not necessarily substituted. Although not particularly limited, the number of carbon atoms of the heteroaryl group is normally in a range from 2 to 30. The bonding position of the heteroaryl group may be any portion, and, for example, in the case of the pyridyl group, it may be any of a 2-pyridyl group, a 3-pyridyl group, or a 4-pyridyl group.

The halogen atom represents a fluorine atom, a chlorine atom, a bromine atom, or an iodine atom. Each of the carbonyl group, carboxyl group, oxycarbonyl group, carbamoyl group, amino group, and phosphine oxide group may or may not have a substituent, and examples of the substituent include an alkyl group, a cycloalkyl group, an aryl group, and a heteroaryl group, and each of these substituents may be further substituted.

The silyl group represents a functional group having a bond to a silicon atom, such as, for example, a trimethylsilyl group, and the silyl group may or may not have a substituent. Although not particularly limited, the number of carbon atoms of the silyl group is normally in a range from 3 to 20. Moreover, the number of silicon atoms is normally in a range of 1 to 6.

The arylene group represents a divalent group introduced from an aromatic hydrocarbon group, such as a phenyl group, a naphthyl group, a biphenyl group, a phenanthryl group, and a terphenyl group, and the arylene group may or may not have a substituent. Although not particularly limited, the number of carbon atoms of the arylene group is normally in a range from 6 to 40. In the case when, in formula (1), A is prepared as an arylene group, the arylene group may or may not have a substituent, and the number of carbon atoms including the substituent is in a range from 6 to 30.

The heteroarylene group represents a divalent group introduced from a cyclic aromatic group in which one or a plurality of atoms other than carbon atoms are present in the ring, such as a pyridyl group, a quinolinyl group, a pyrazinyl group, a naphthylidyl group, a dibenzofuranyl group, a dibenzothiophenyl group, and a carbazolyl group, and each of these groups may or may not have a substituent. Although not particularly limited, the number of carbon atoms of the heteroarylene group including the substituent is normally in a range from 2 to 30.

In the case when adjacent substituents mutually form a ring, arbitrary two adjacent substituents (for example, $R^1$ and $R^2$ in formula (1)) may be mutually bonded to each other to form a conjugated condensed ring or a non-conjugated condensed ring. As the constitutive elements of the condensed ring, in addition to carbon atoms, nitrogen, oxygen, sulfur, phosphorous and silicon atoms may be included; moreover, the condensed ring may be further condensed with still another ring. Although the above-mentioned organic compounds are not particularly limited, specific examples include the following compounds:

[Formula 9]

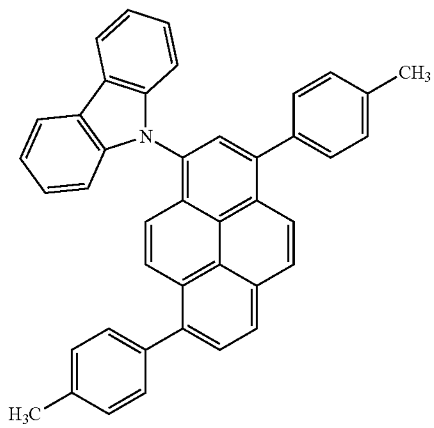

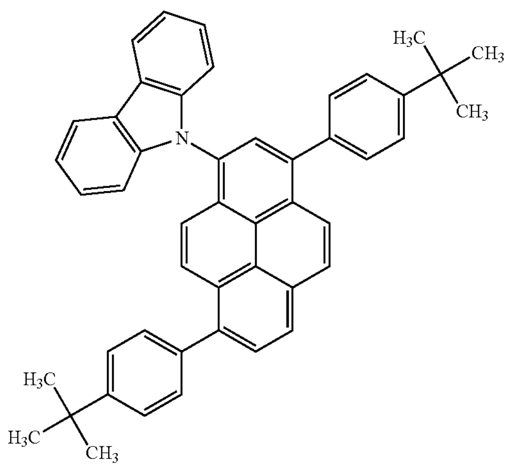

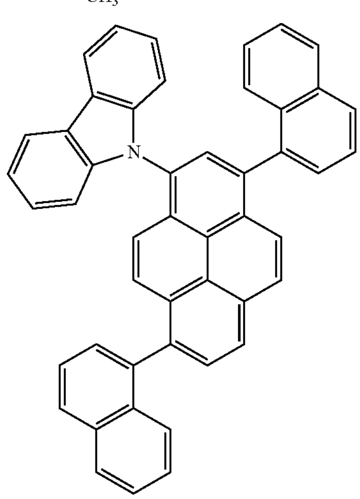

-continued

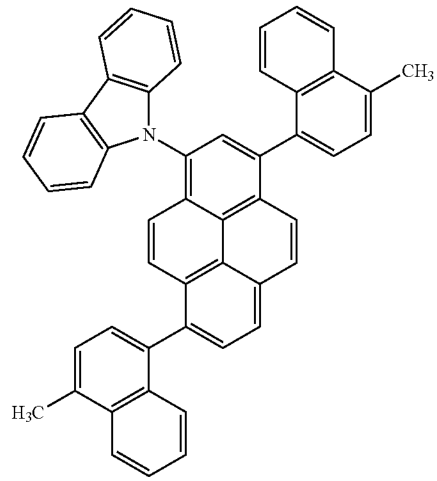

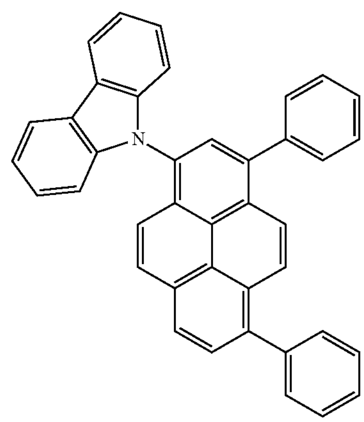

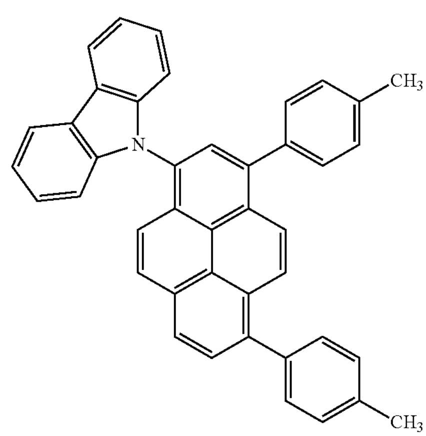

-continued
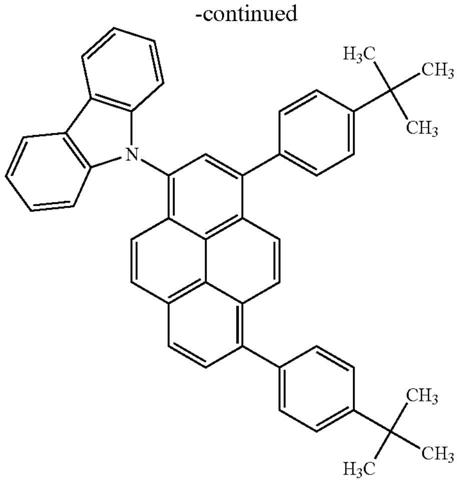
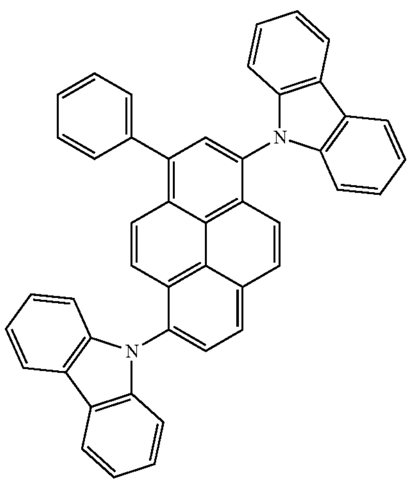
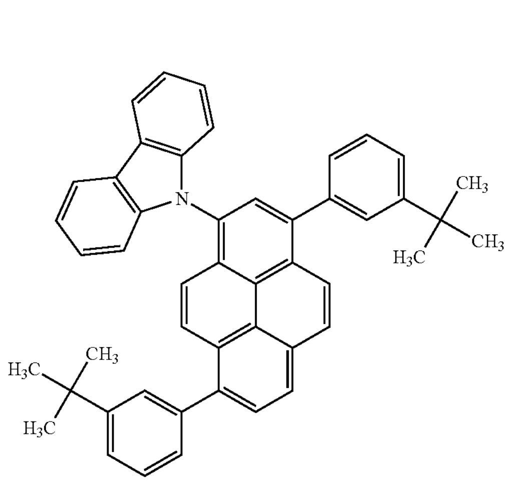
-continued
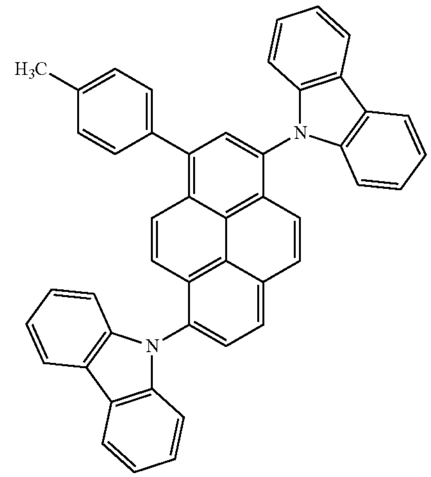
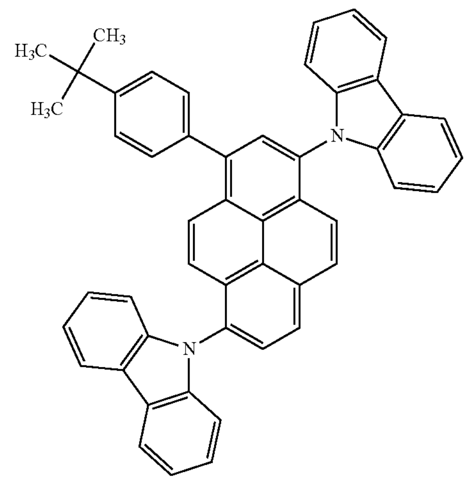
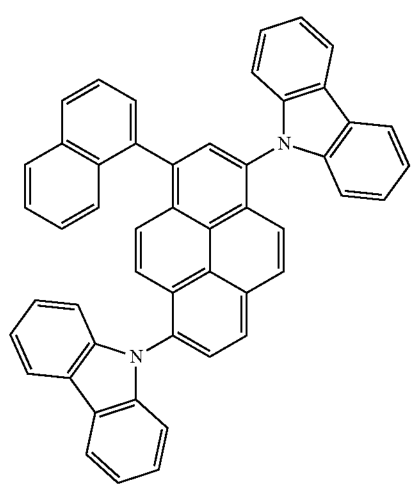

-continued
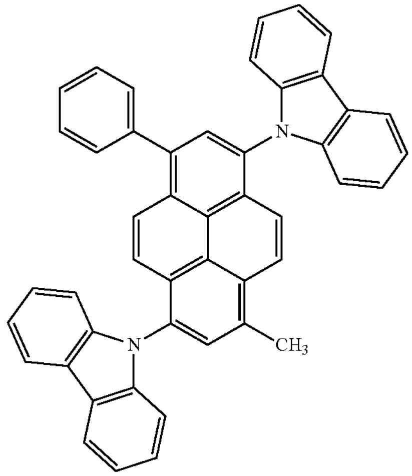
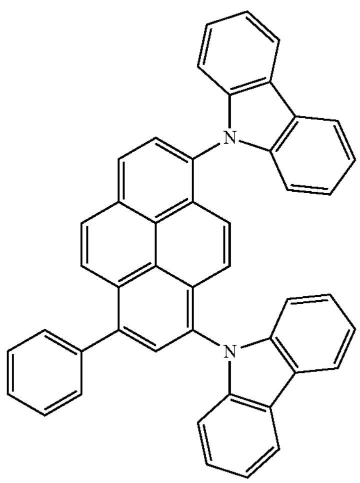
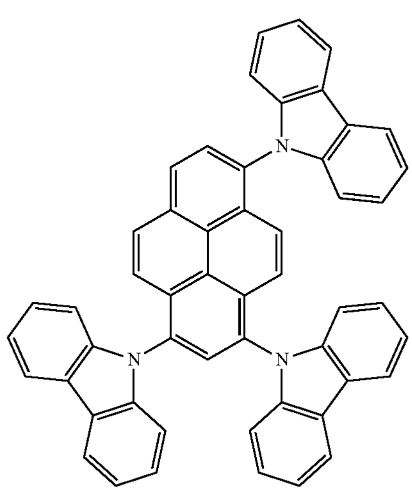
-continued
[Formula 10]
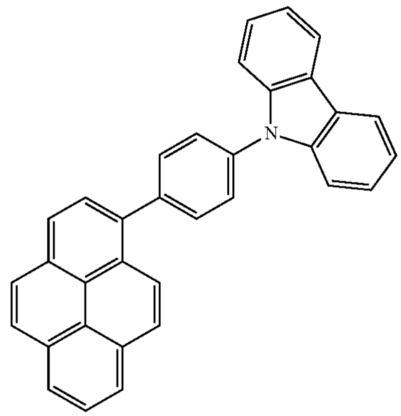
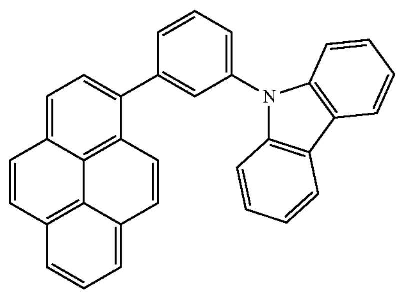
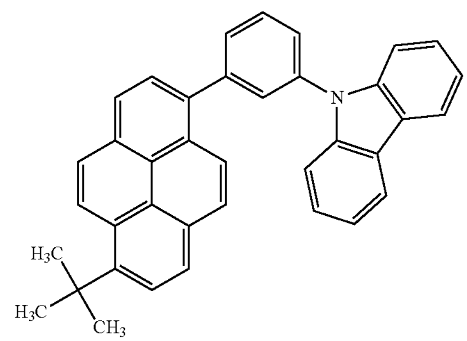
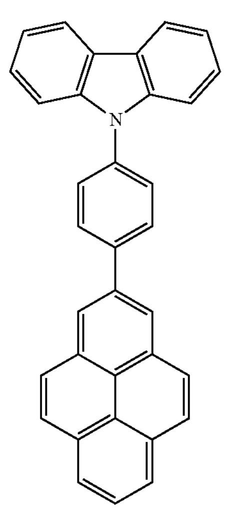
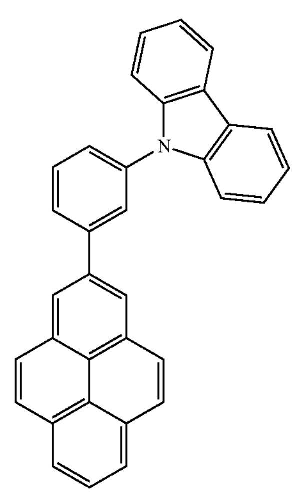

-continued
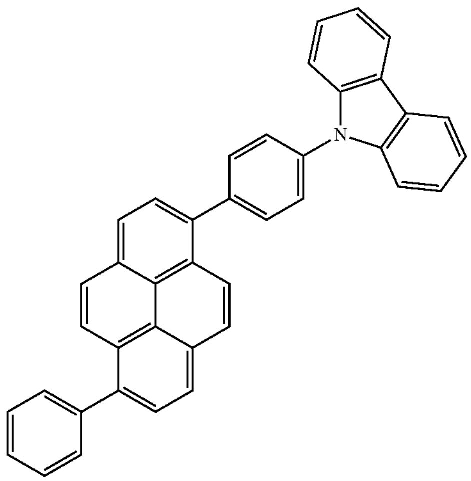
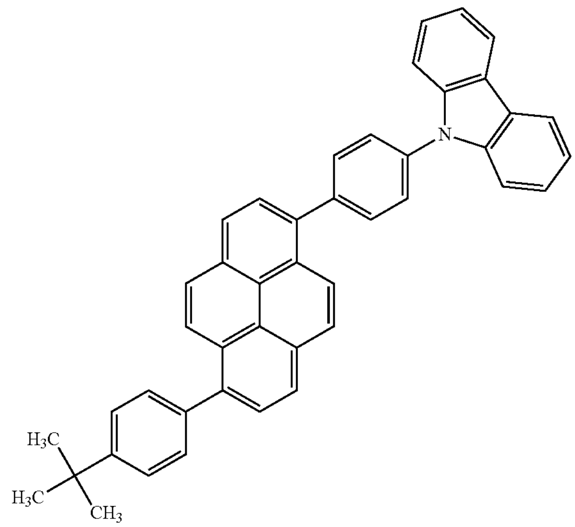
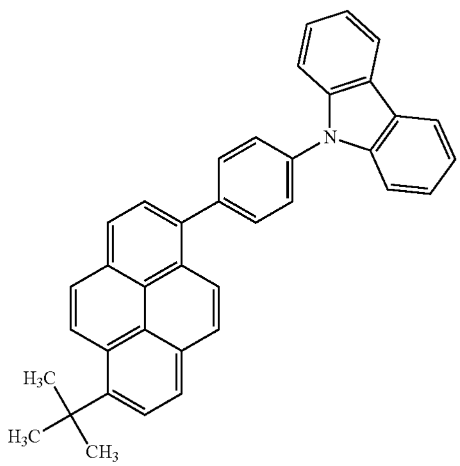
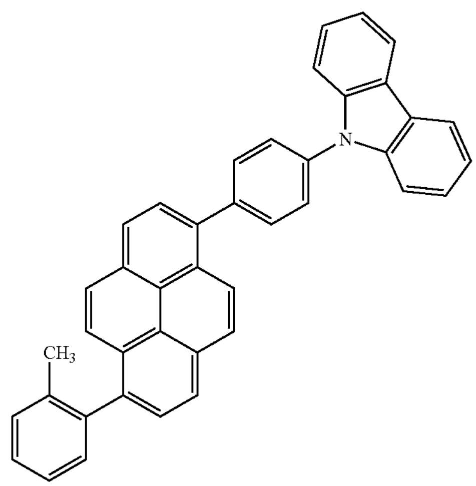
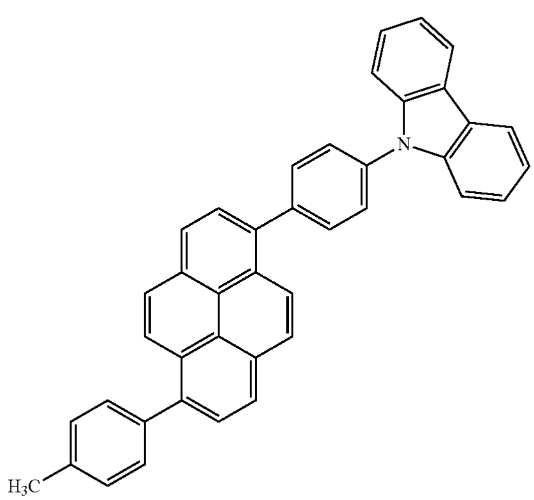
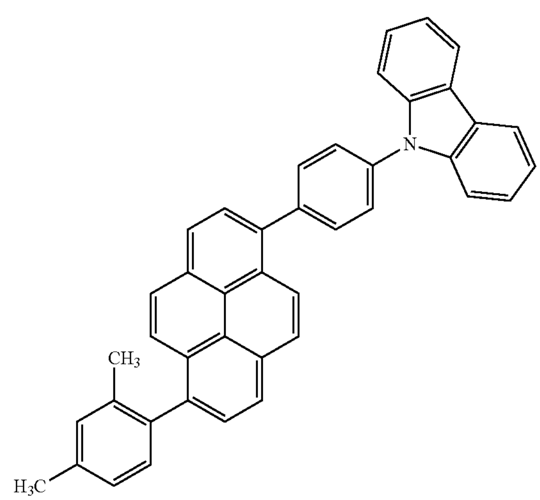
-continued -continued
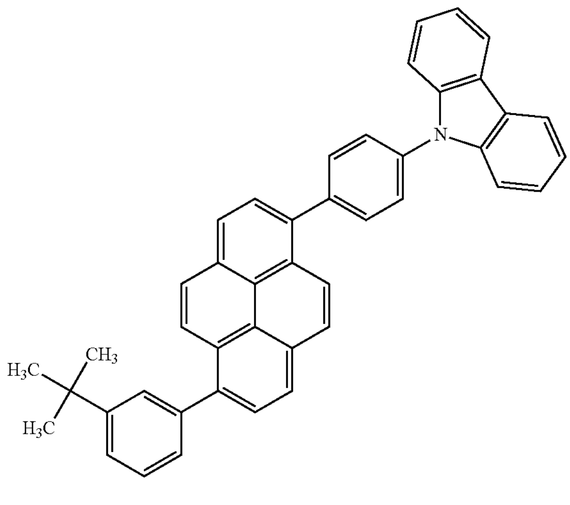
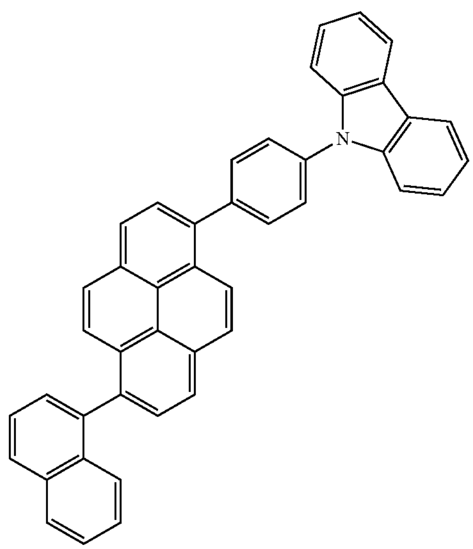
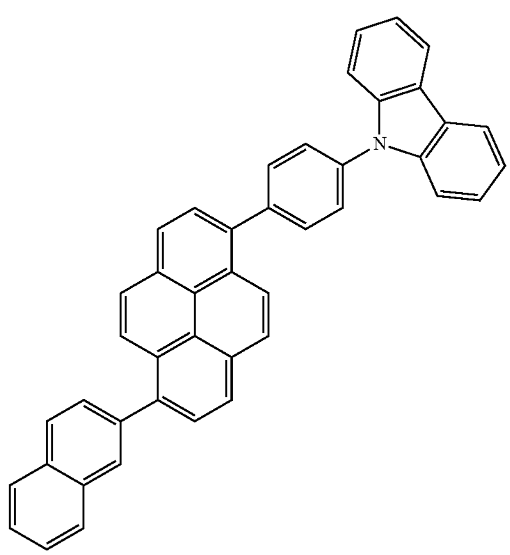
-continued
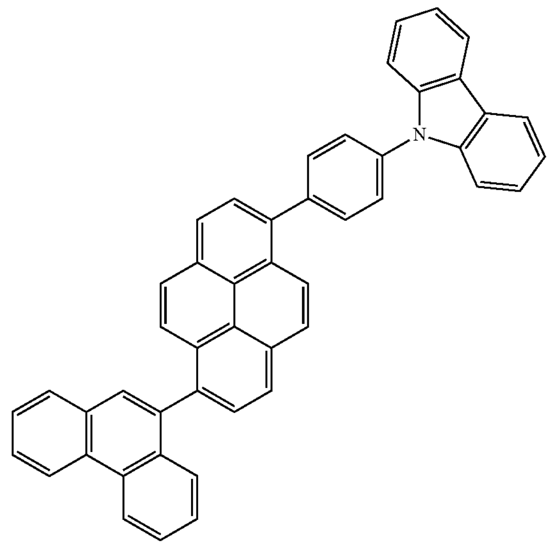
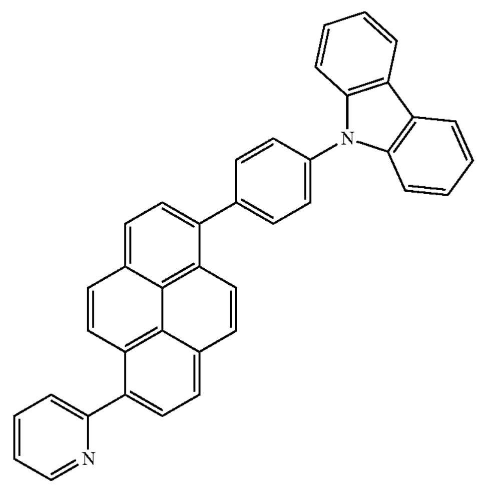
[Formula 11]
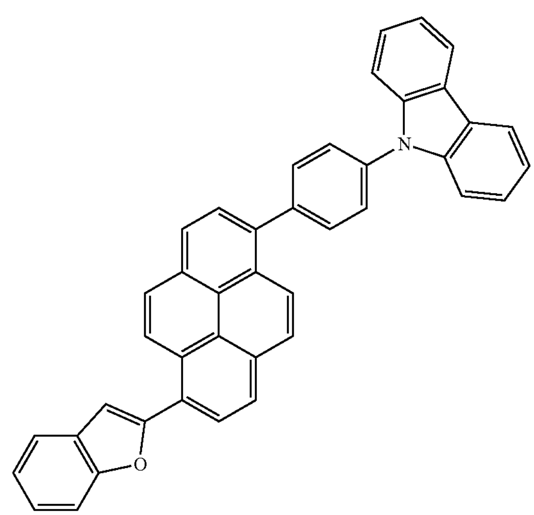

-continued
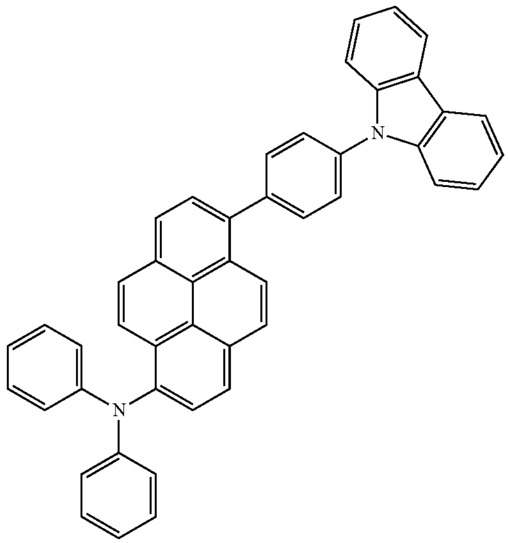
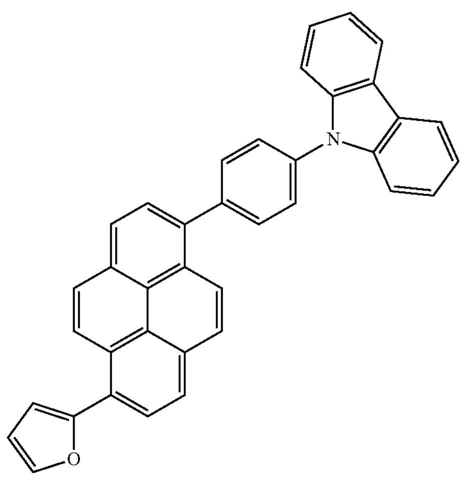
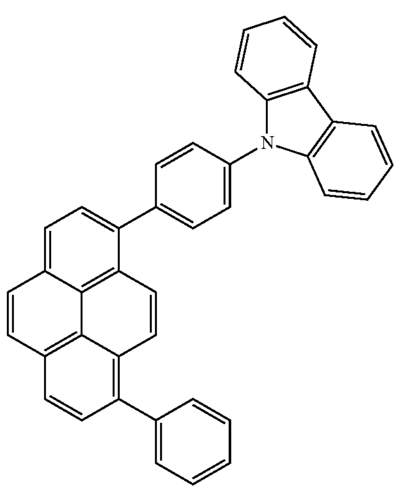
-continued
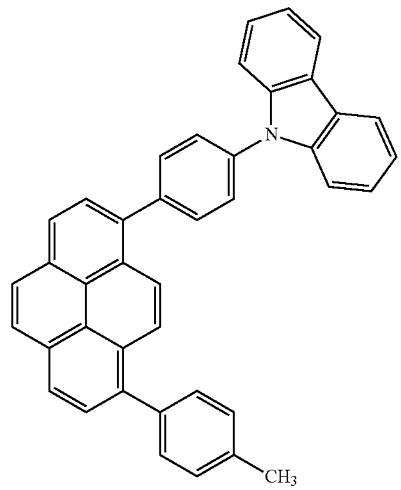
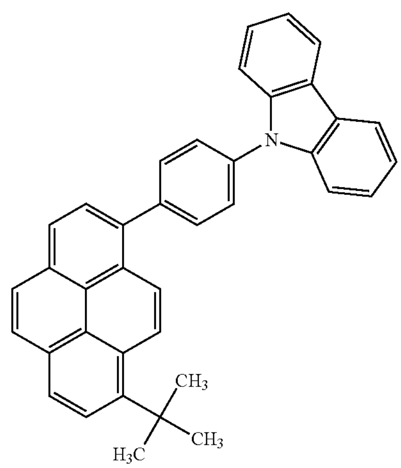
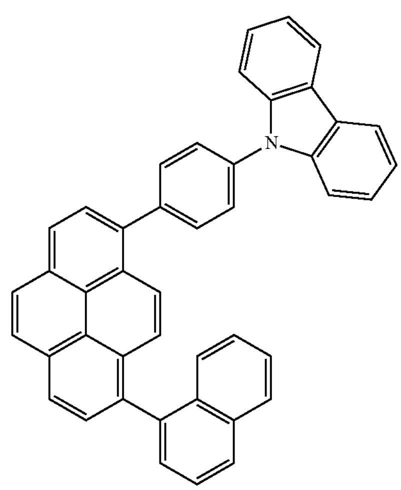

-continued
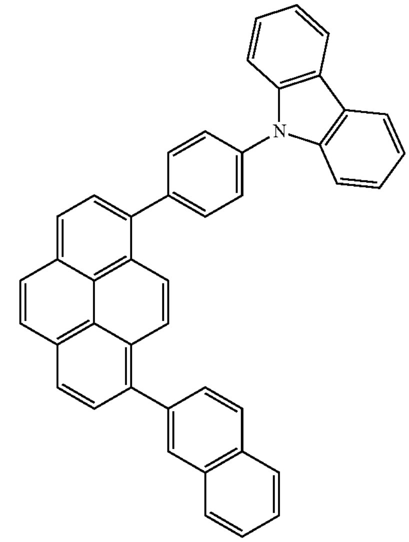
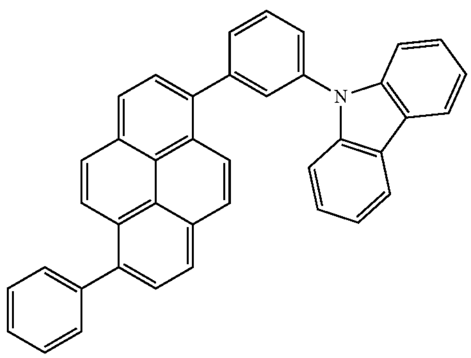
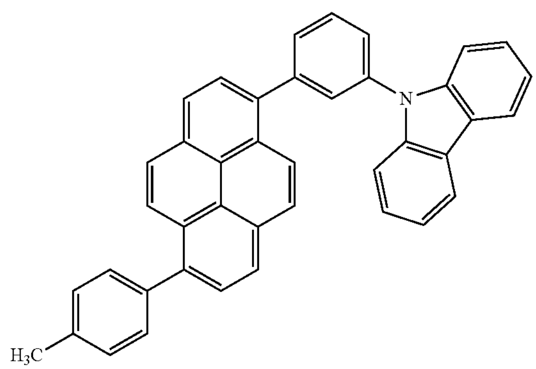
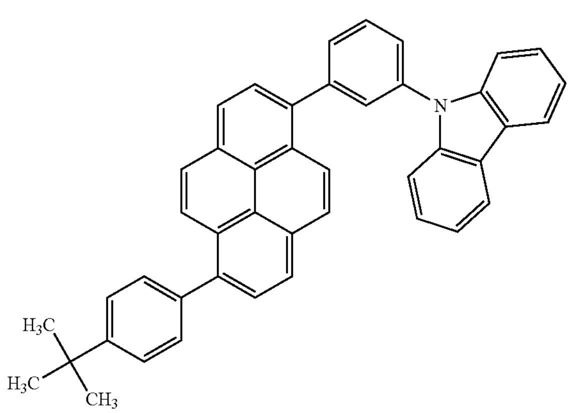
-continued
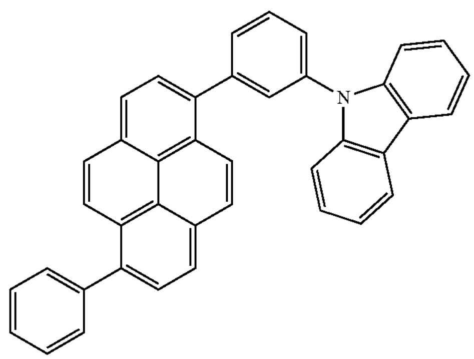
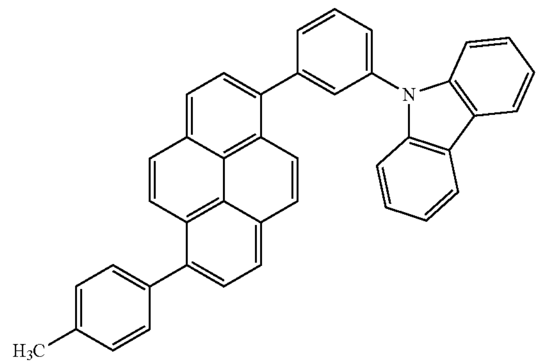
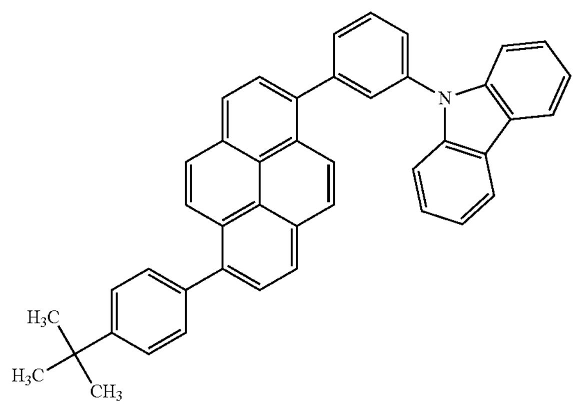
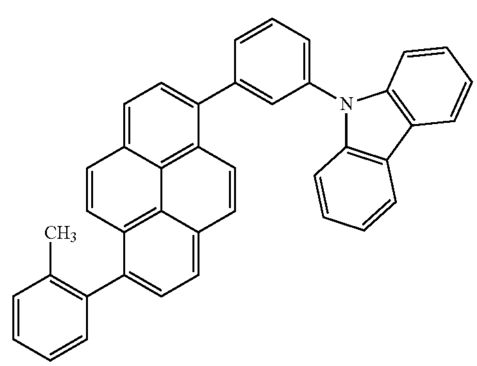

-continued
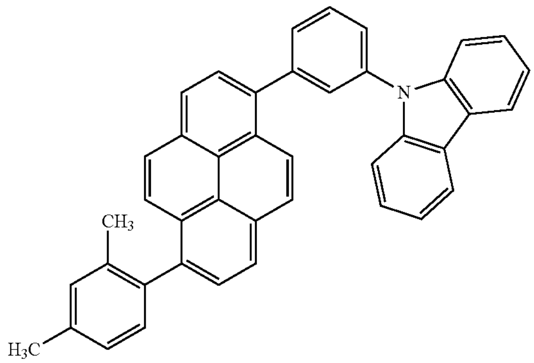
[Formula 12]
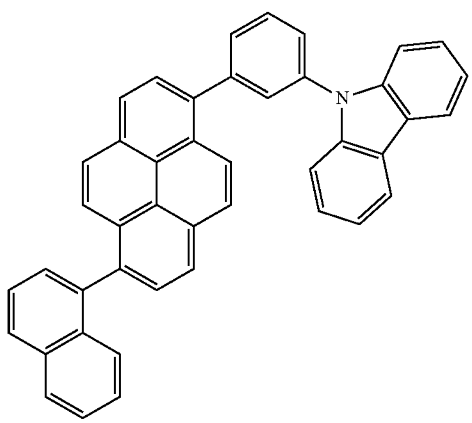
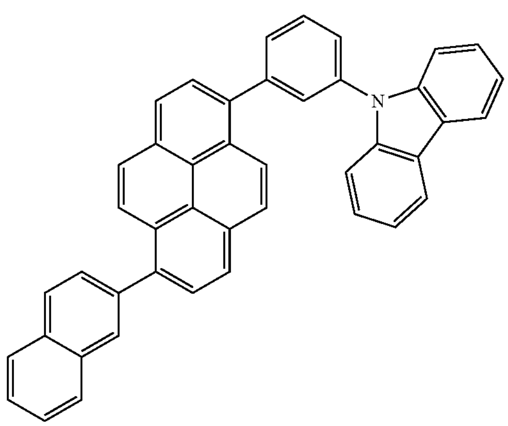
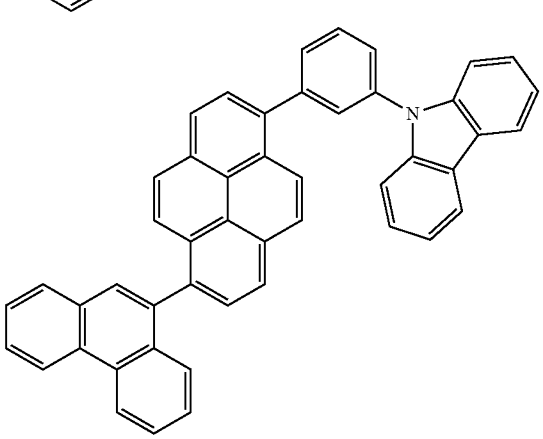
-continued
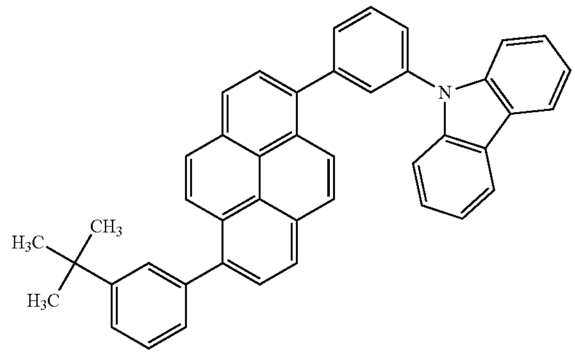
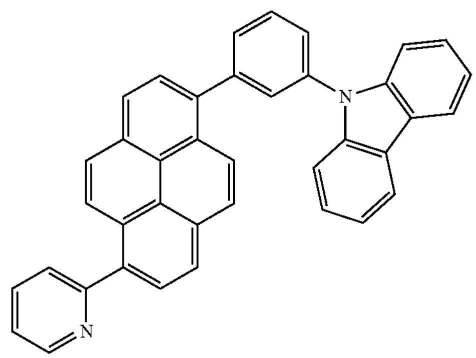
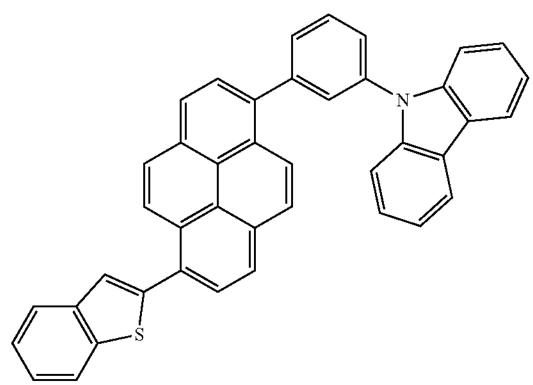
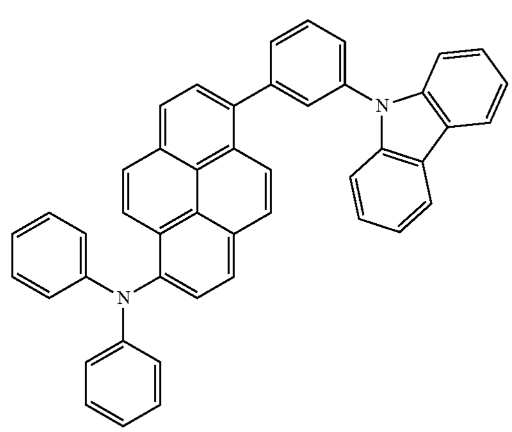

-continued
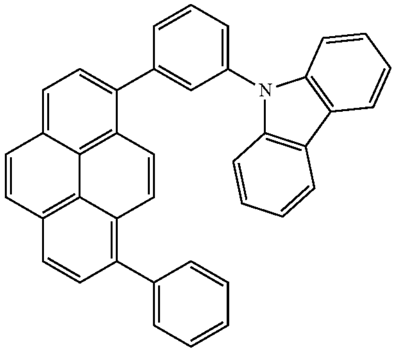
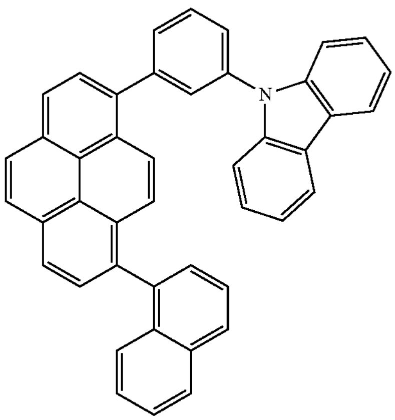
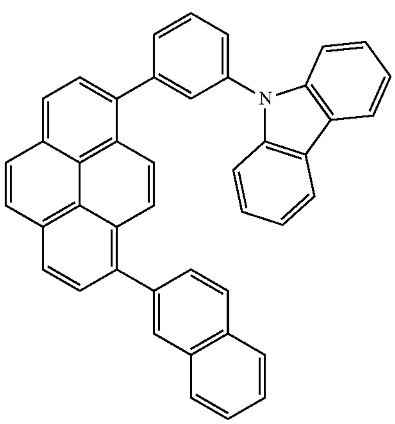
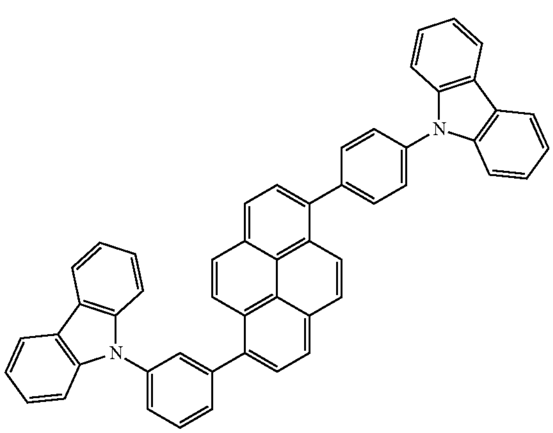
-continued
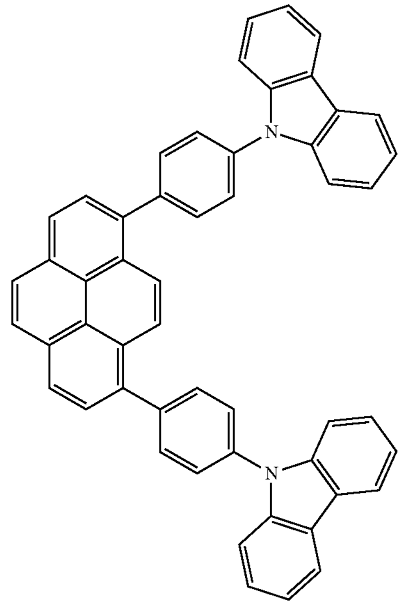
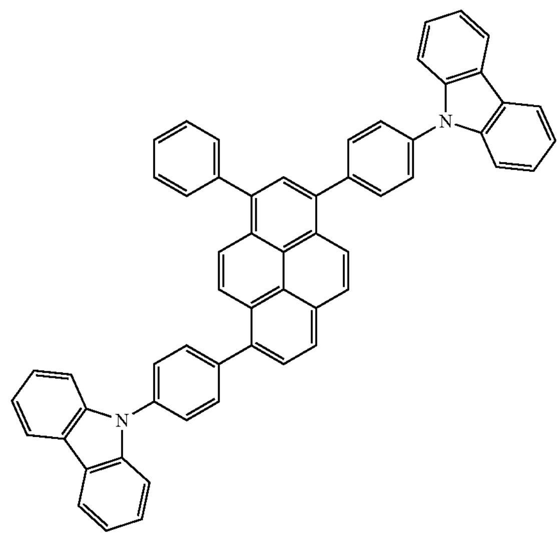
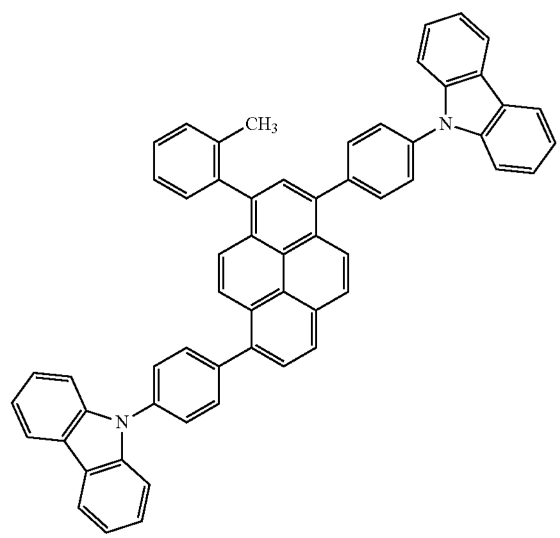

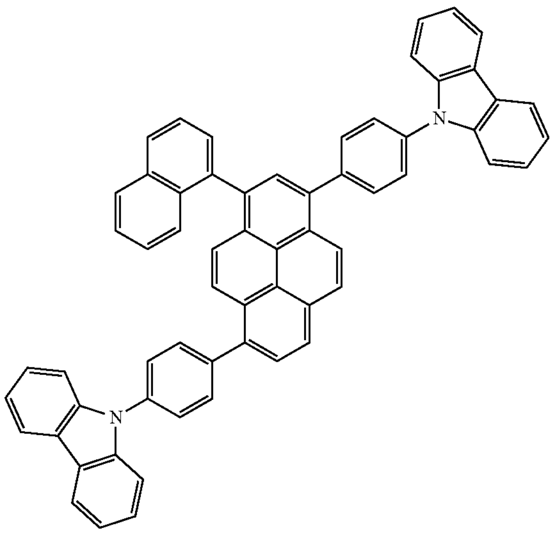
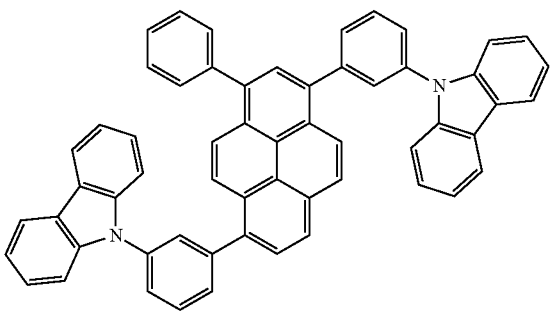
[Formula 13]
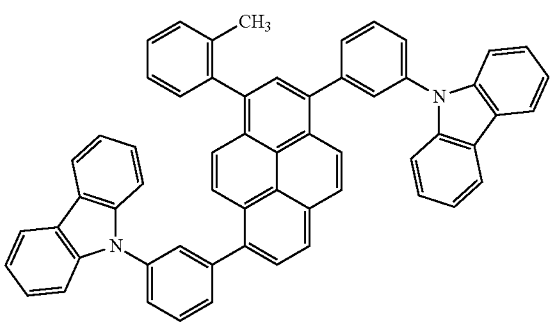
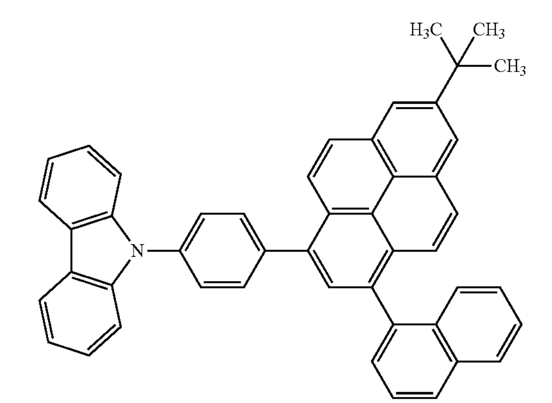
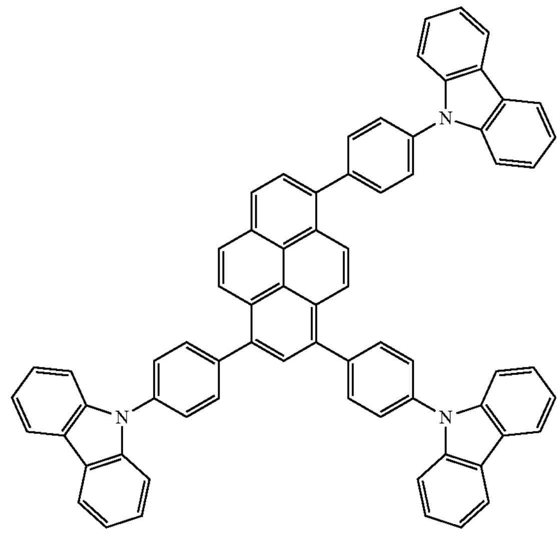
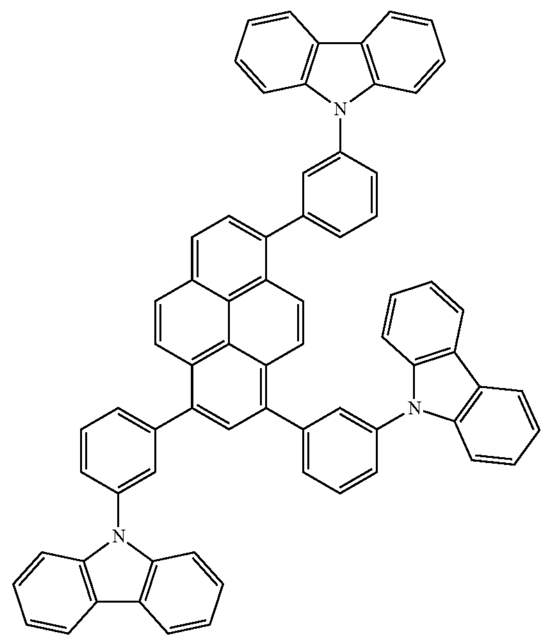
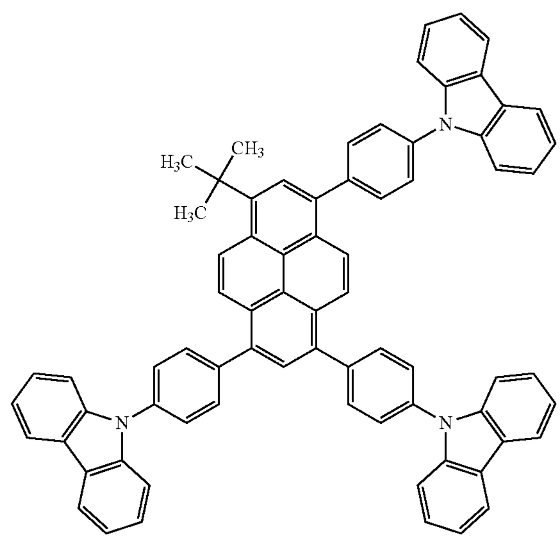

-continued
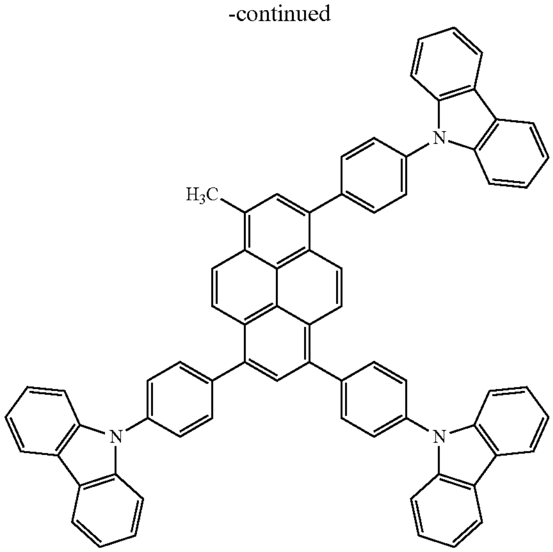
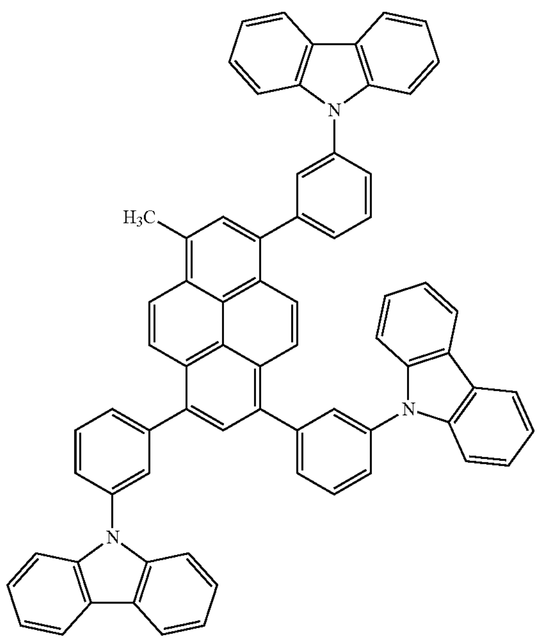
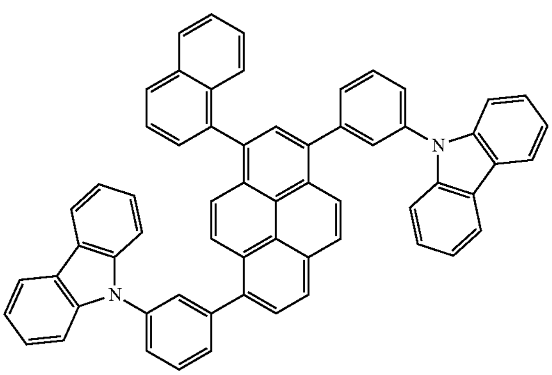
-continued
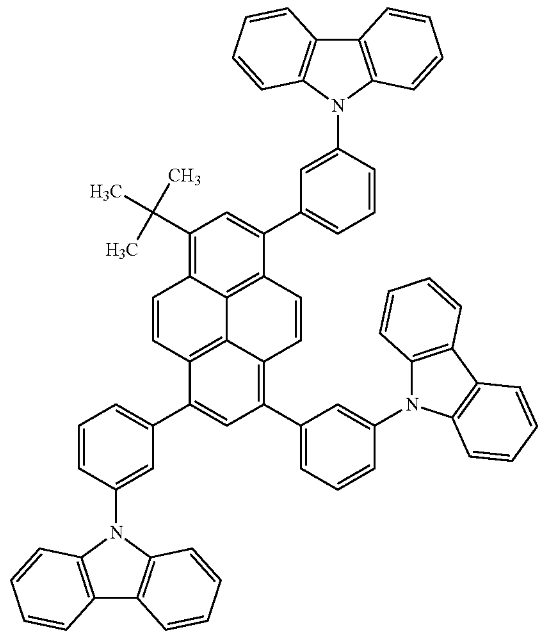
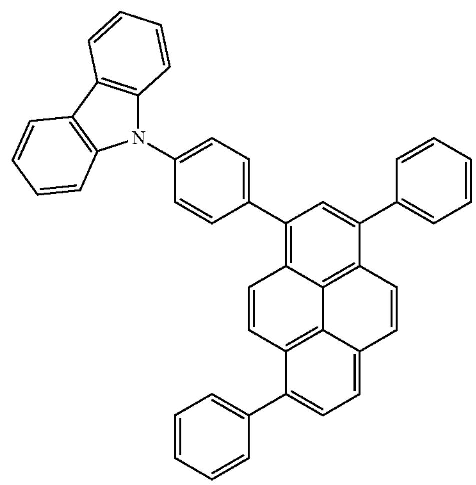
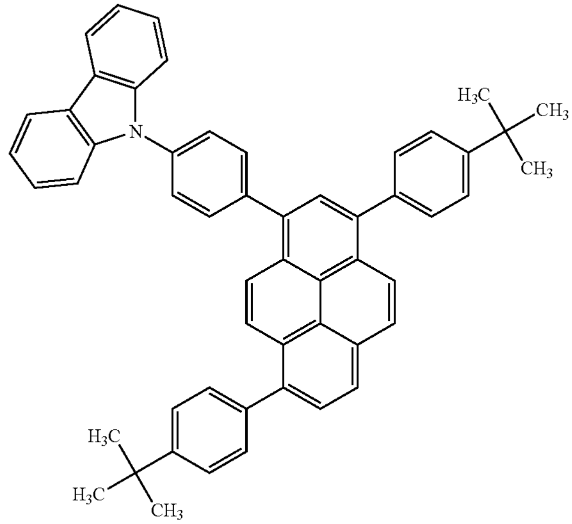

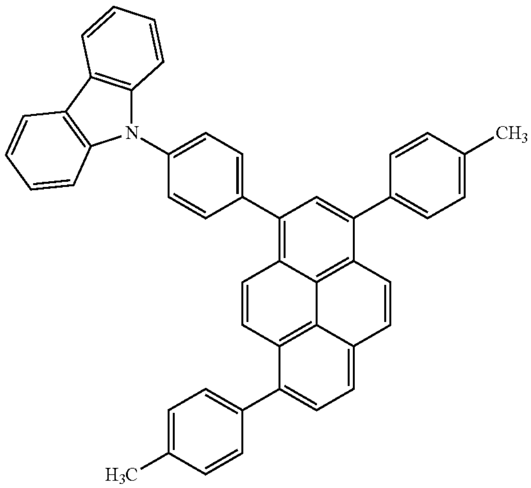
[Formula 14]
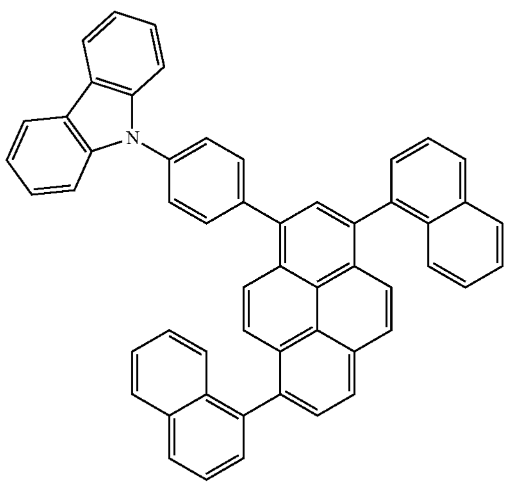
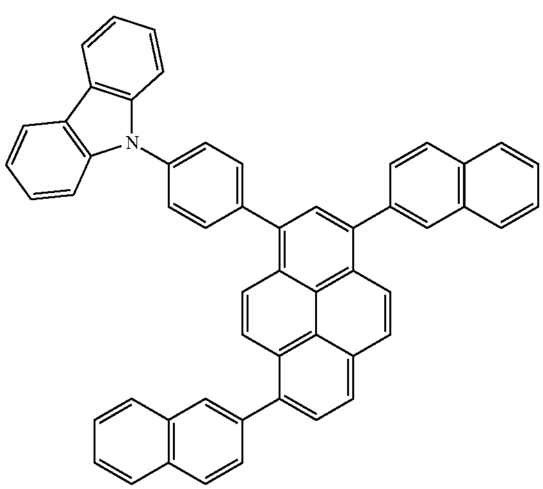
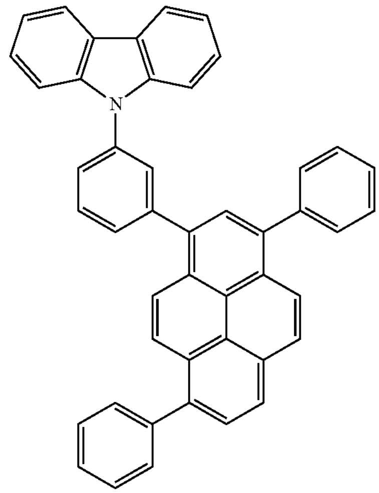
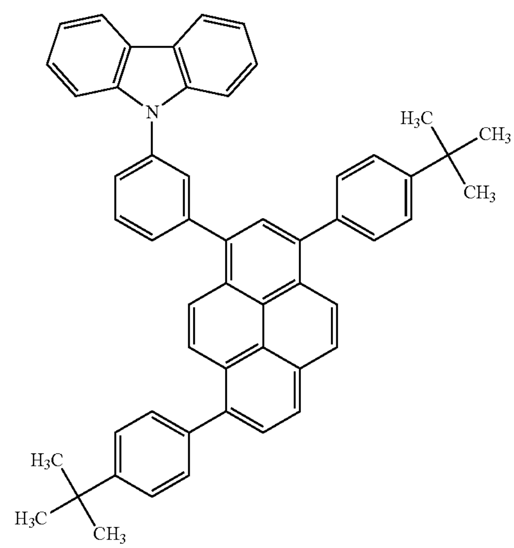
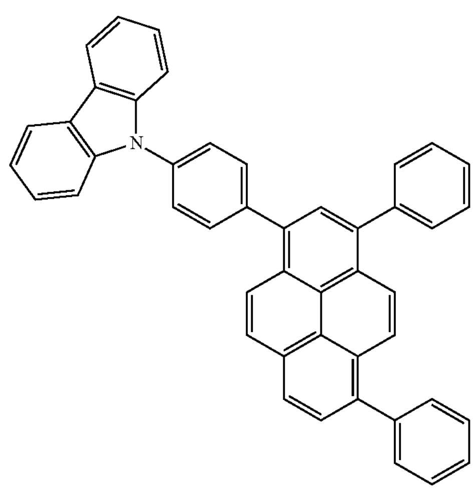

-continued
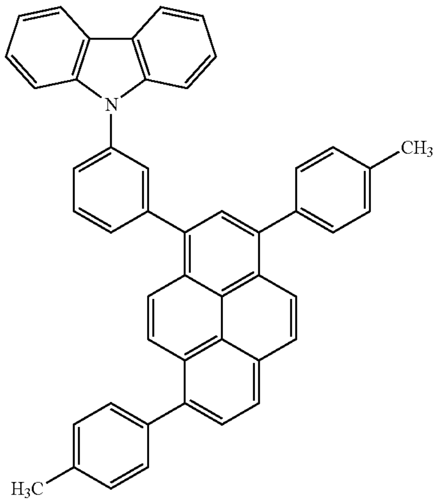
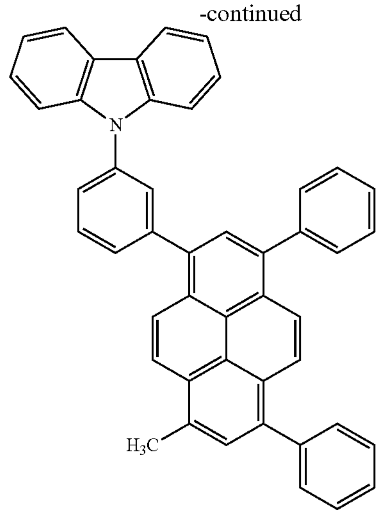
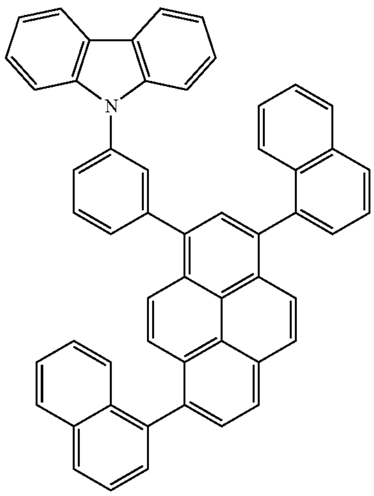
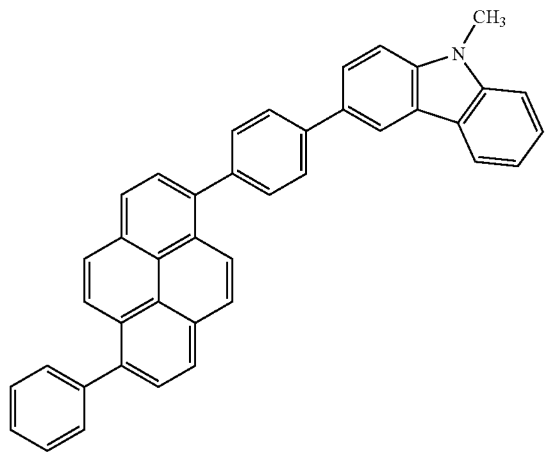
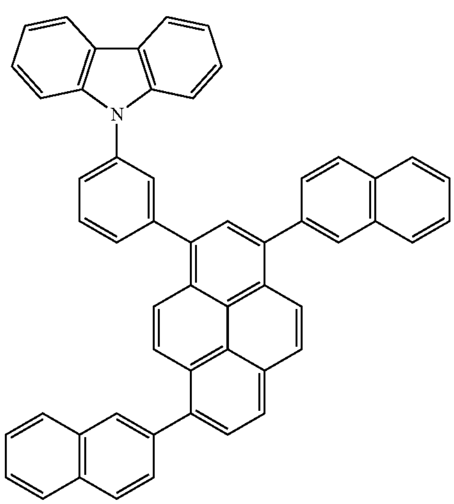
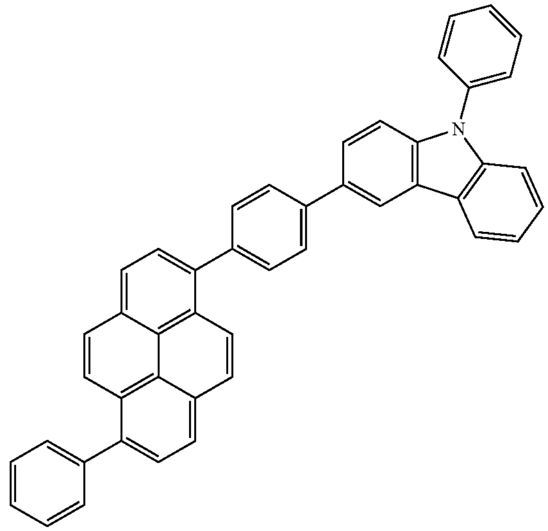

-continued
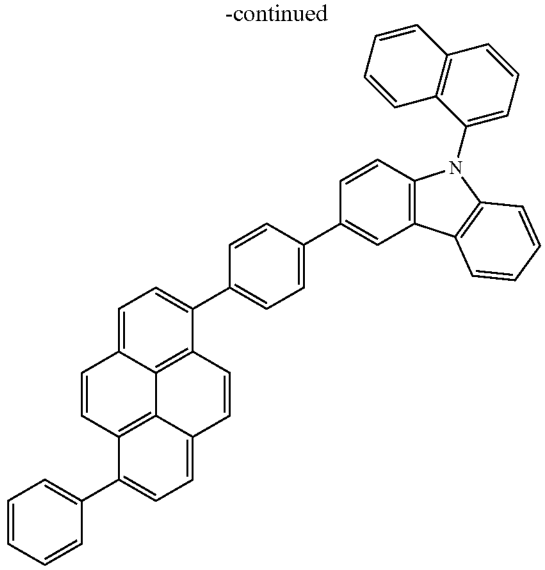
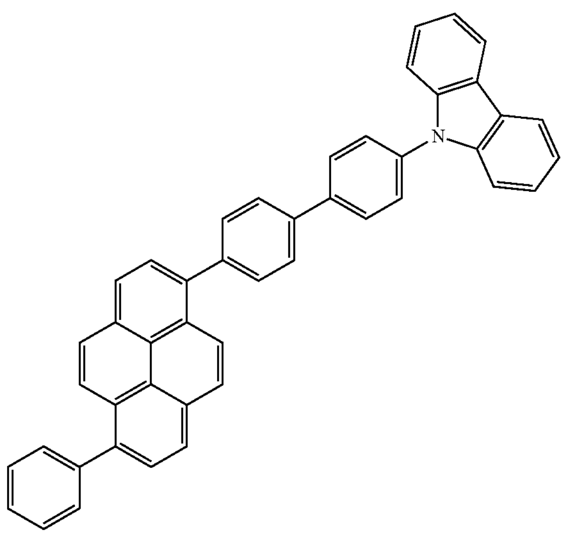
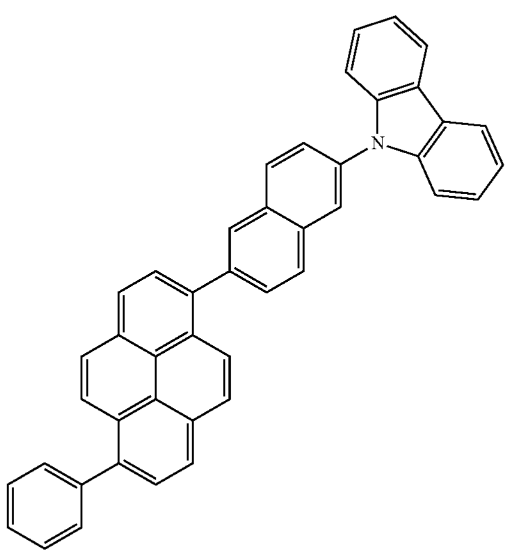
-continued
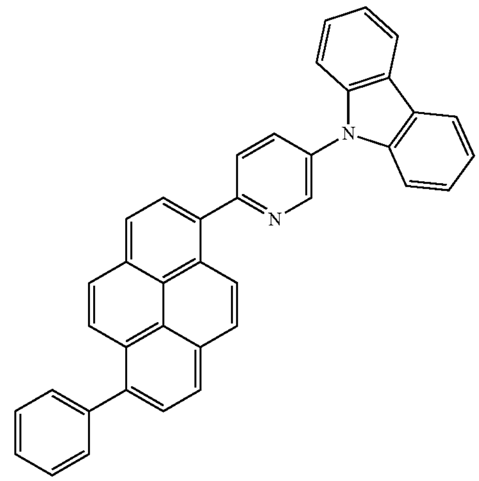
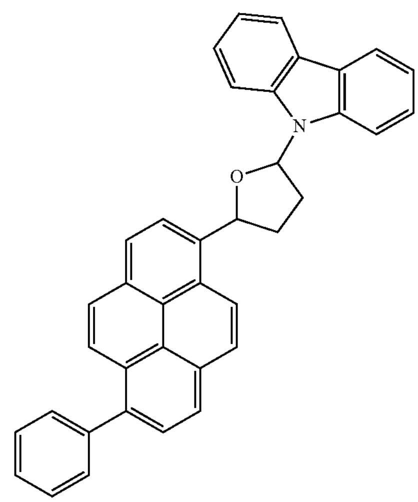
[Formula 15]
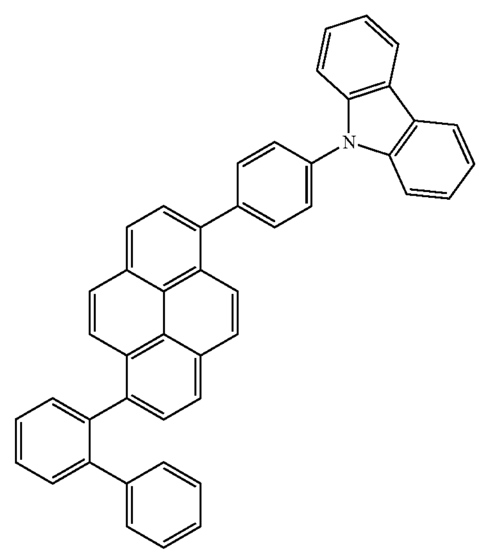

-continued
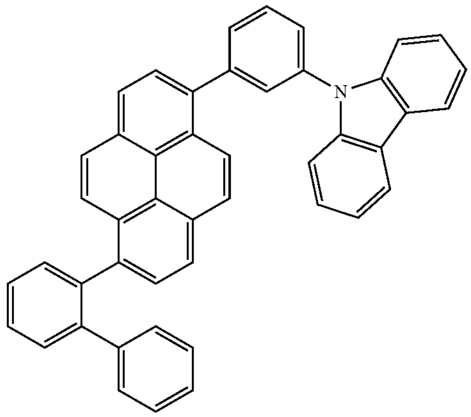
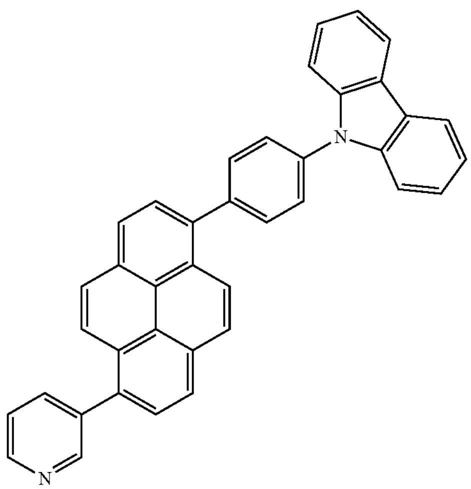
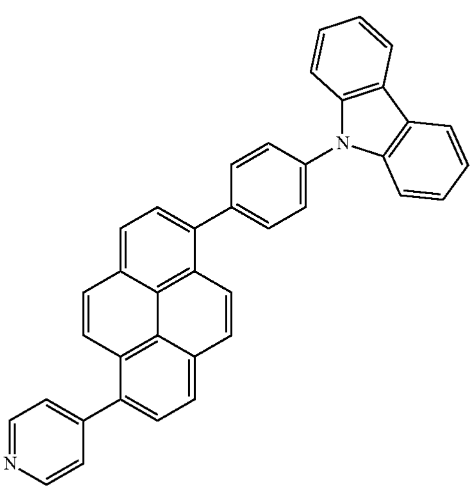
-continued
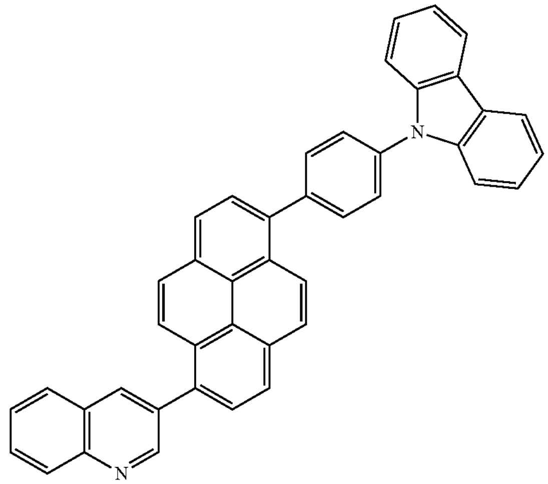
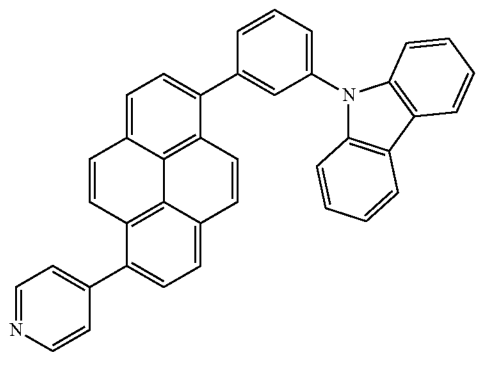
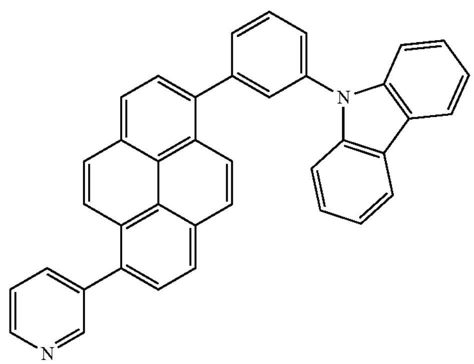
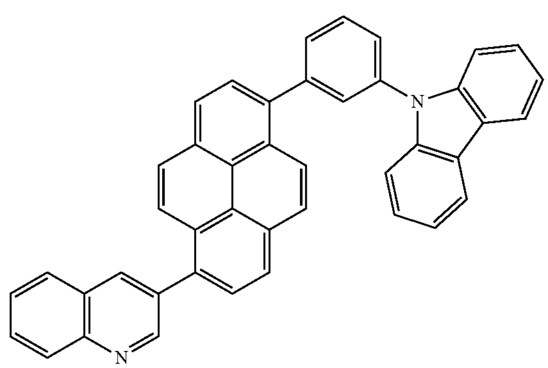

-continued
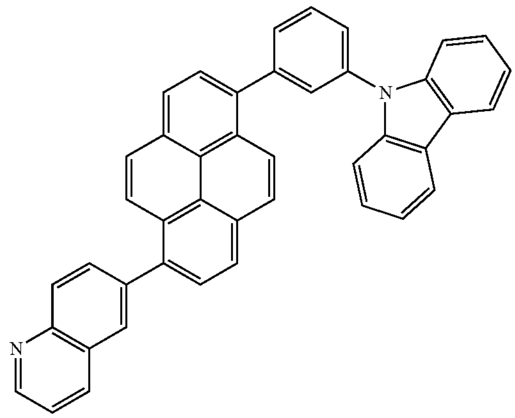
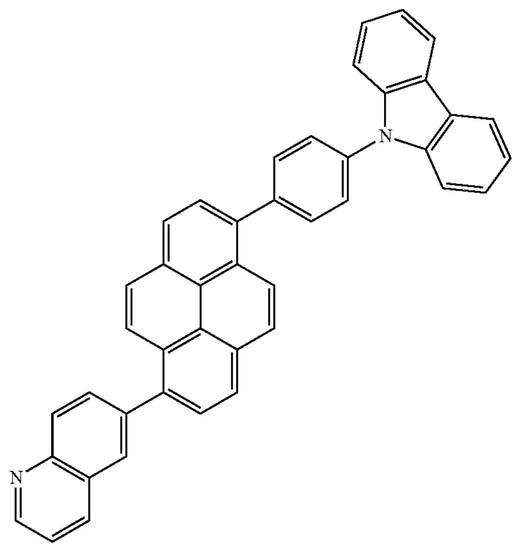
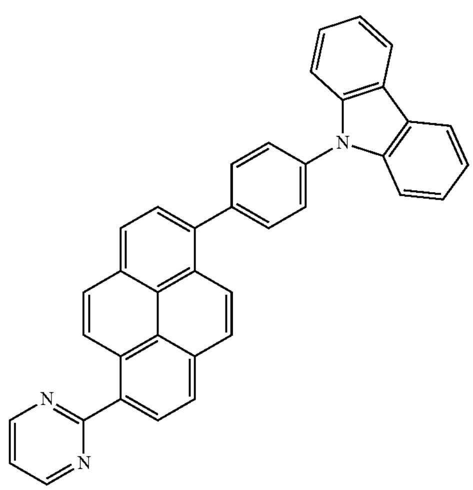
-continued
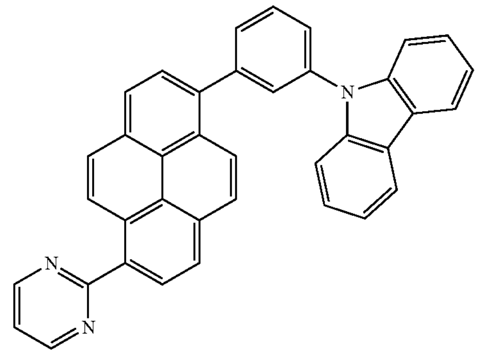
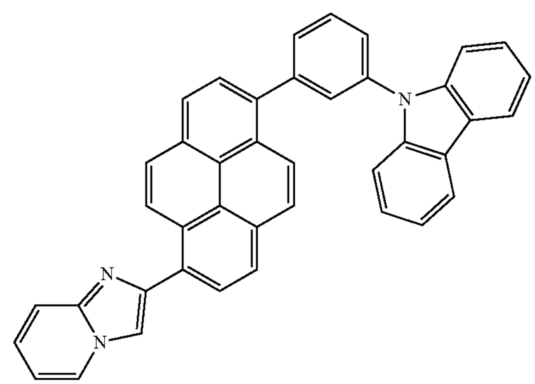
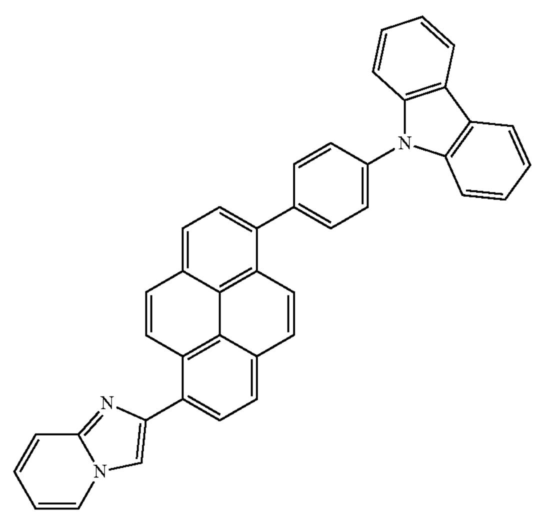

-continued
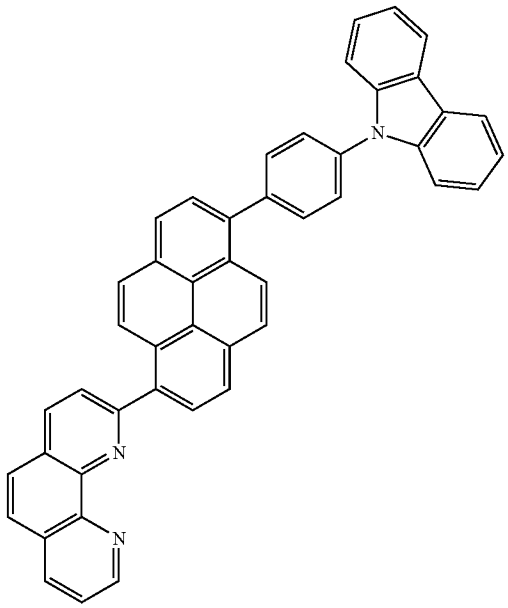
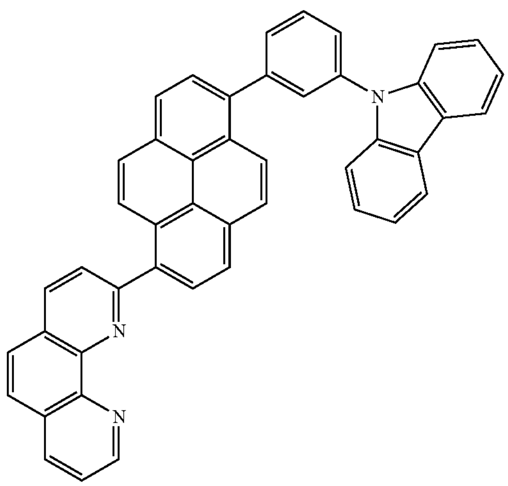
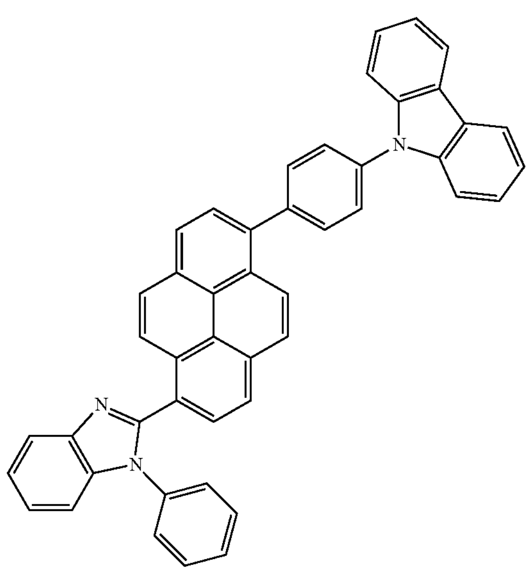
-continued
[Formula 16]
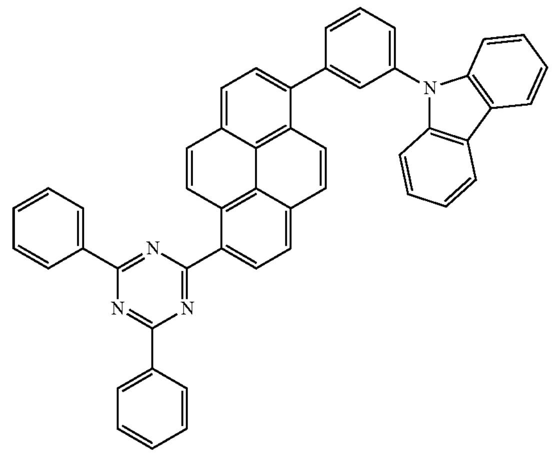
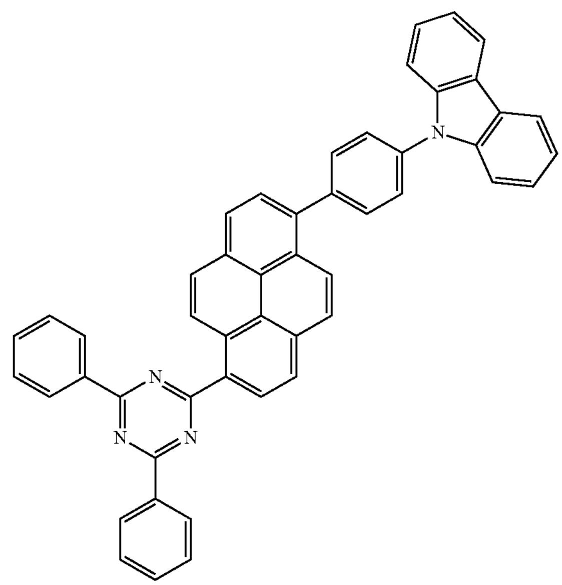
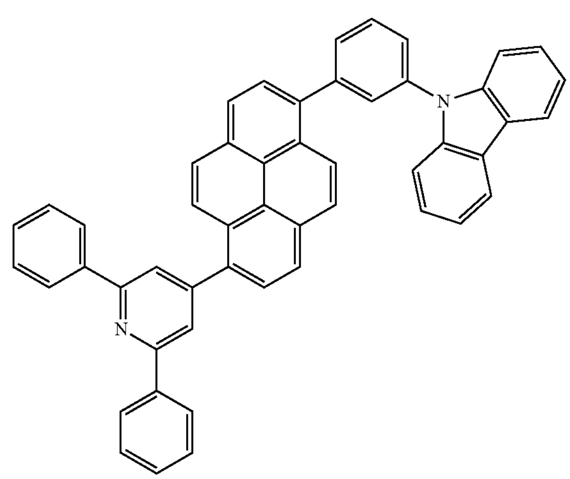

-continued
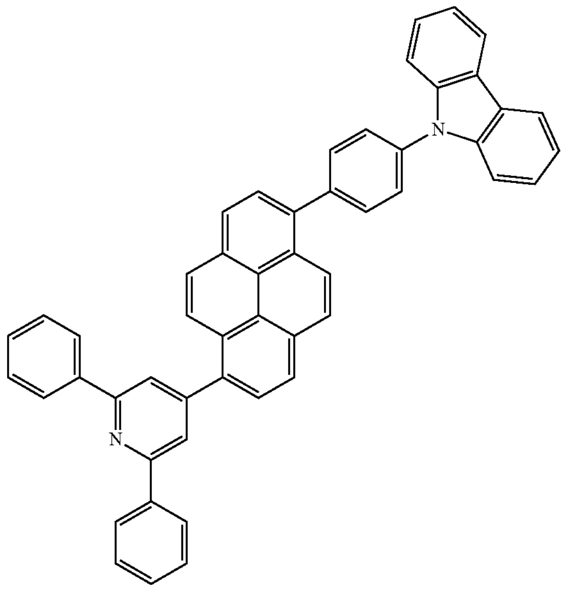
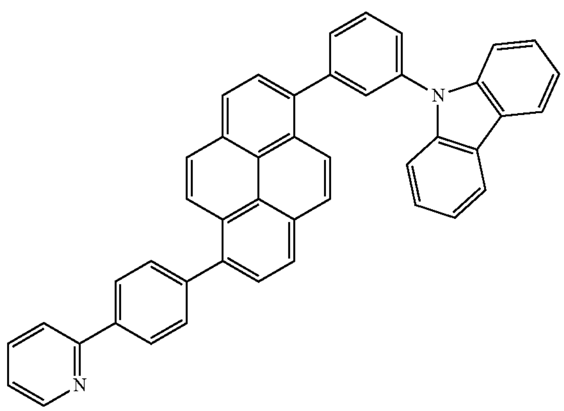
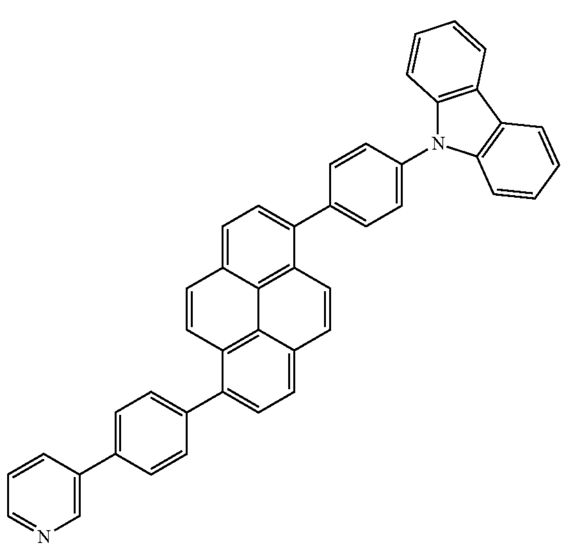
-continued
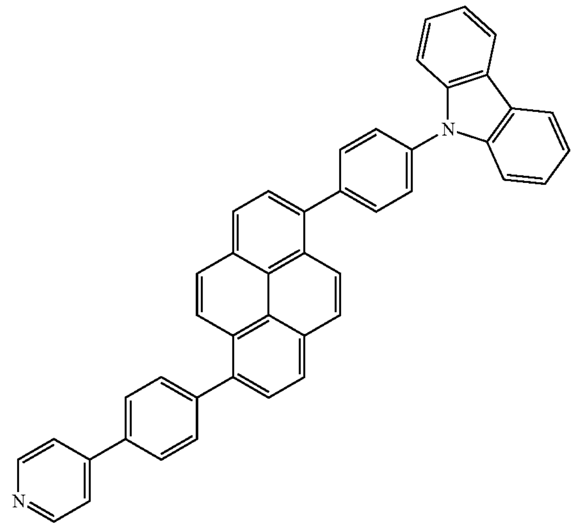
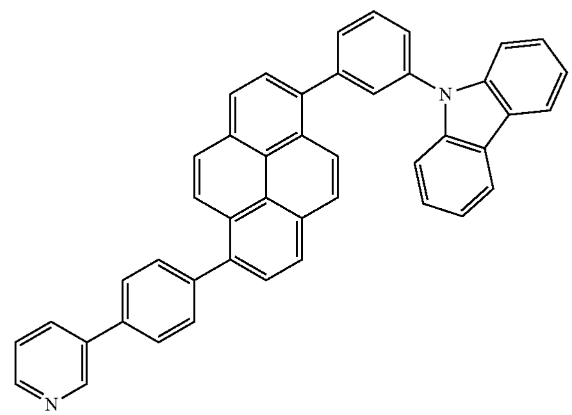
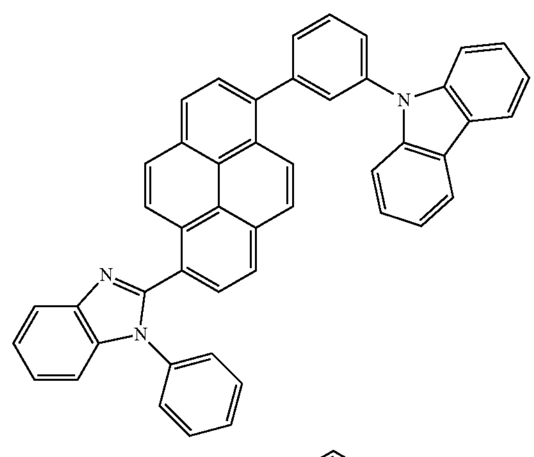
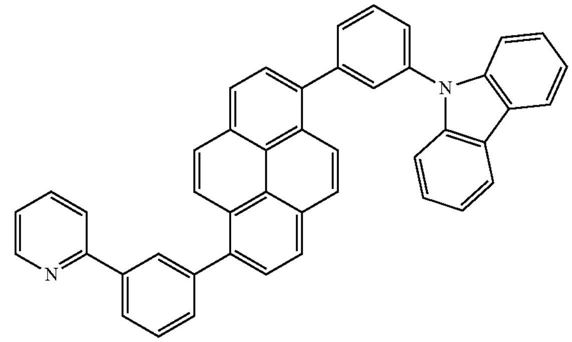

-continued
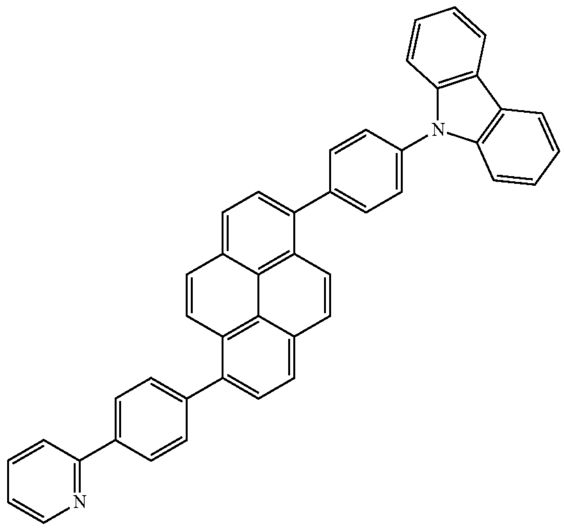
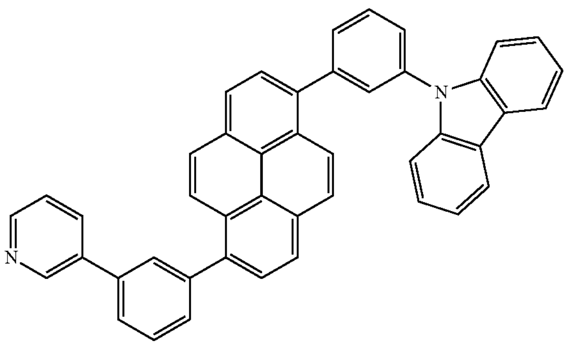
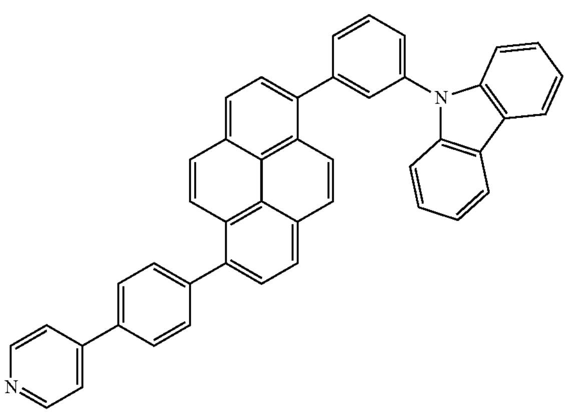
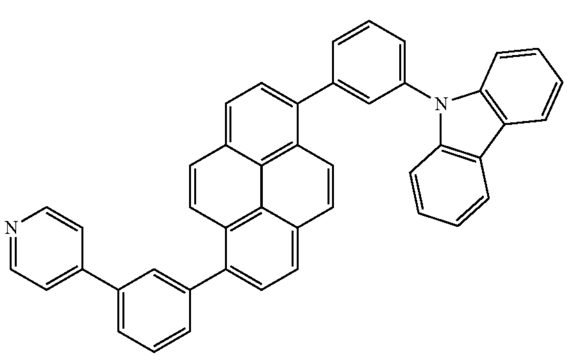
-continued
[Formula 17]
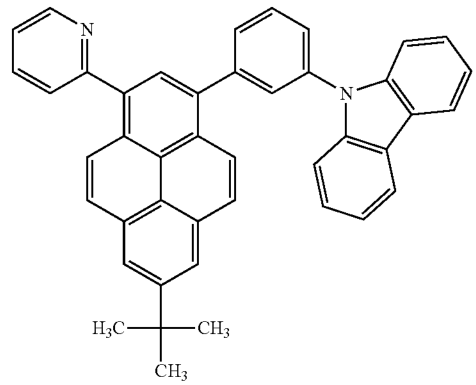
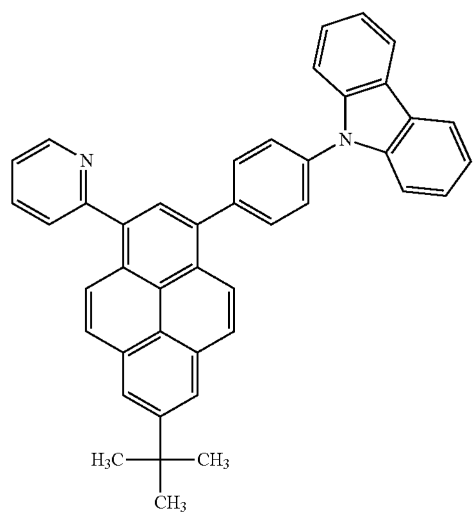
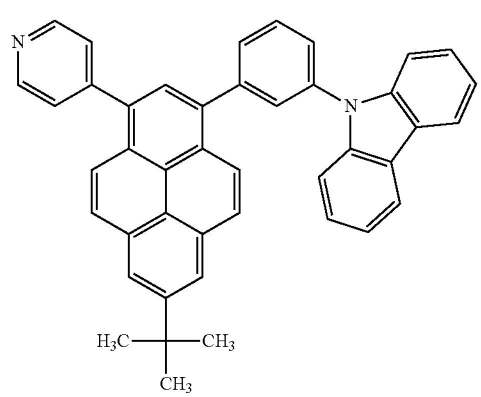

-continued
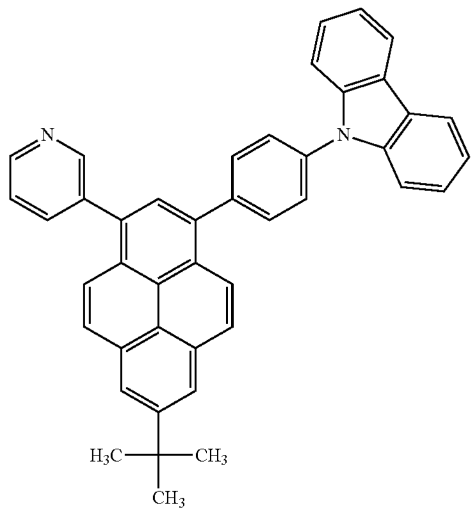
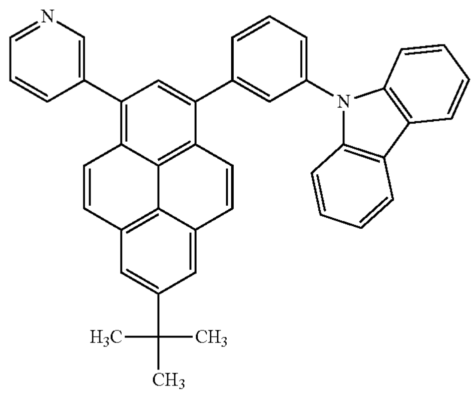
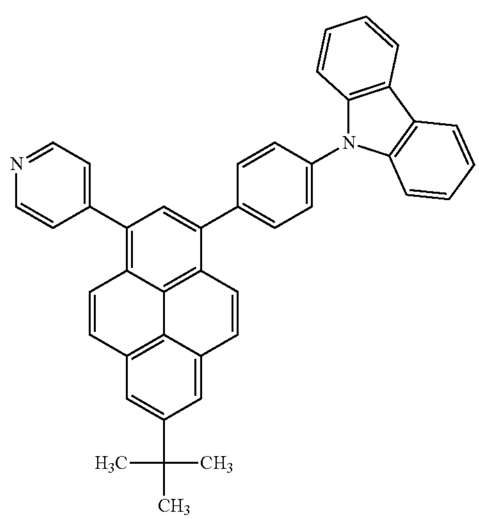
-continued
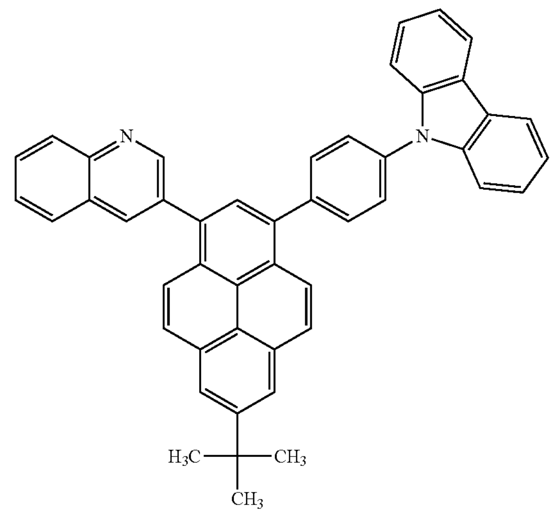
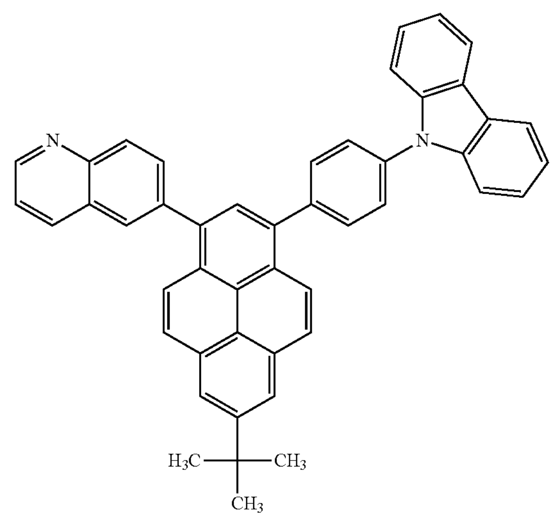
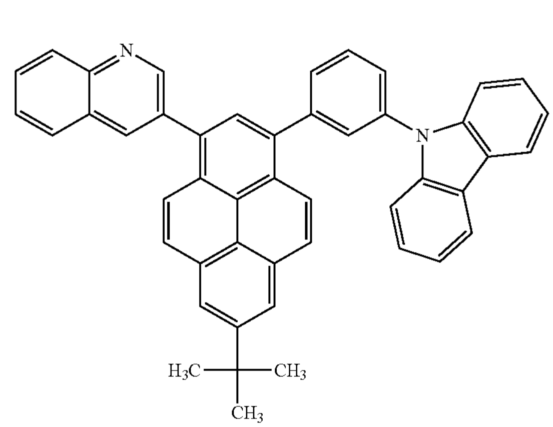

-continued
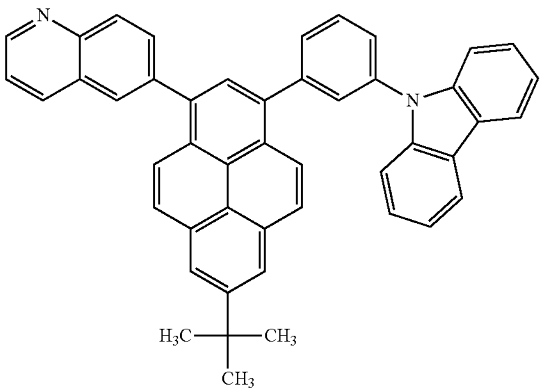
[Formula 18]
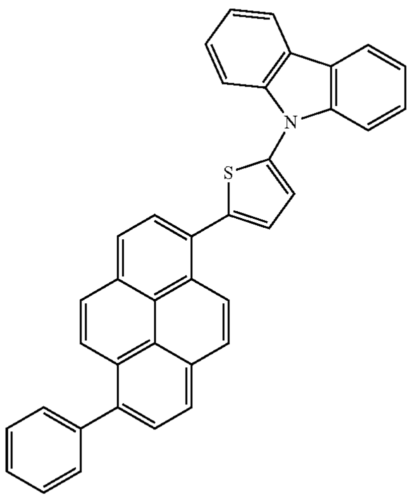
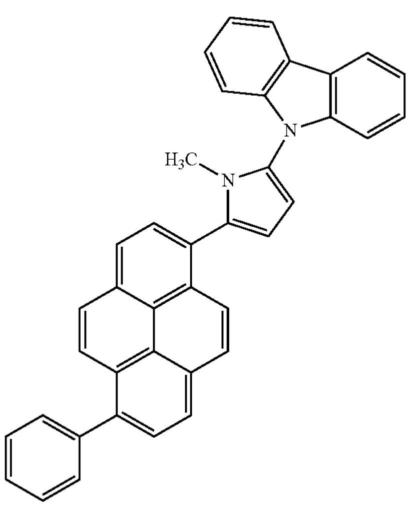
-continued
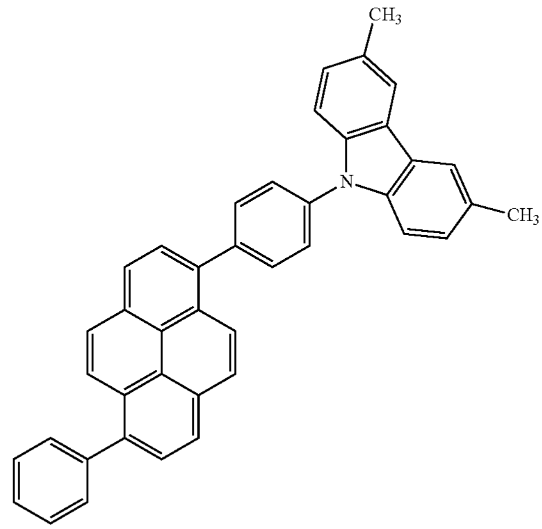
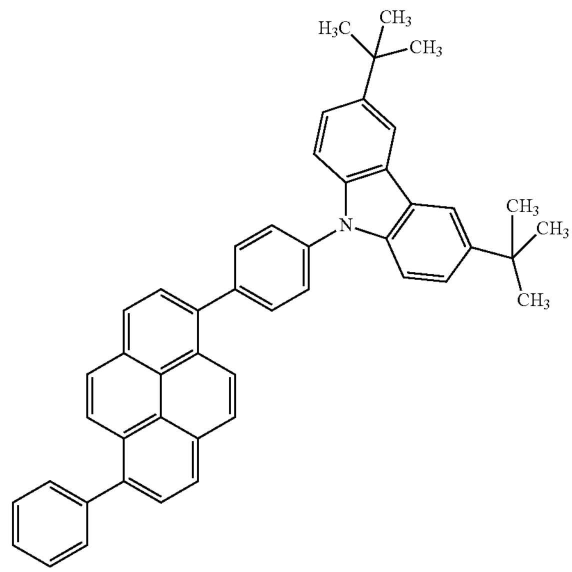
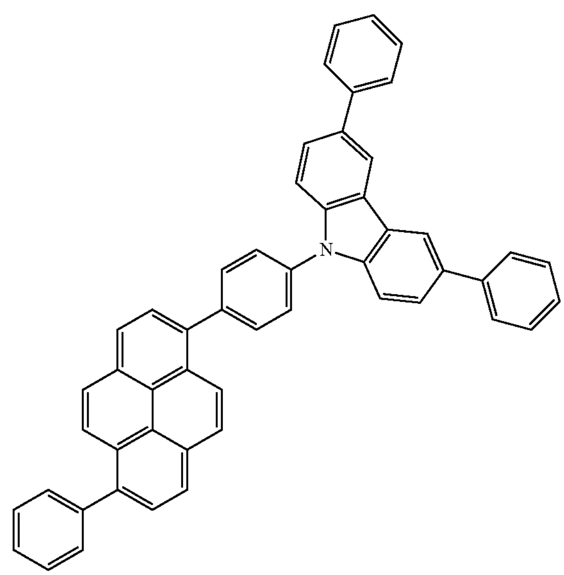

-continued
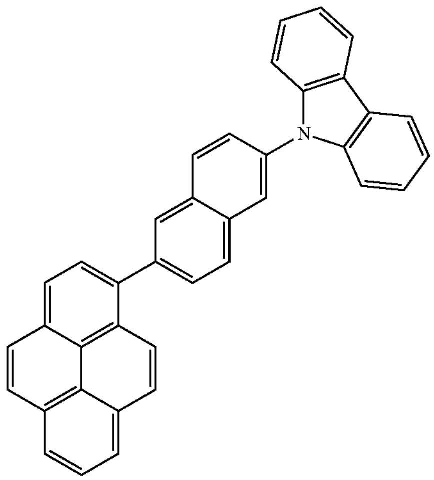
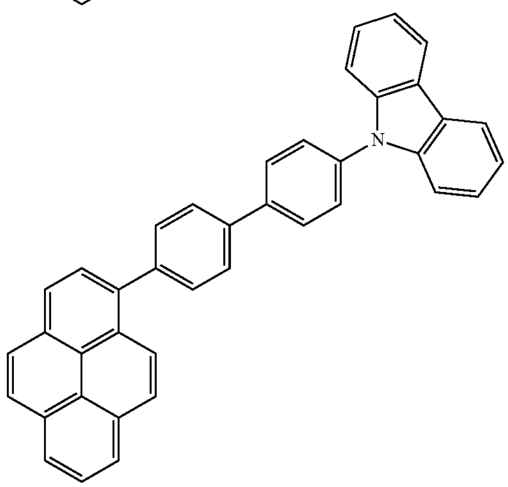
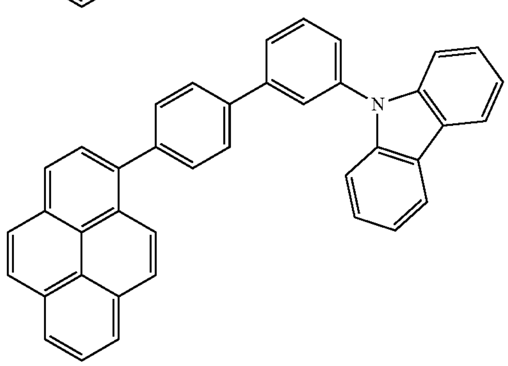
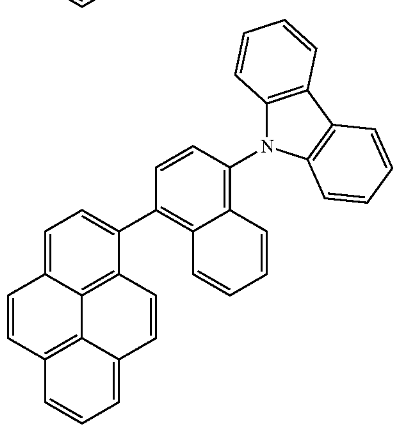
-continued
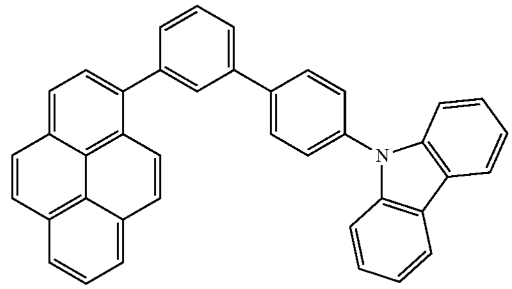
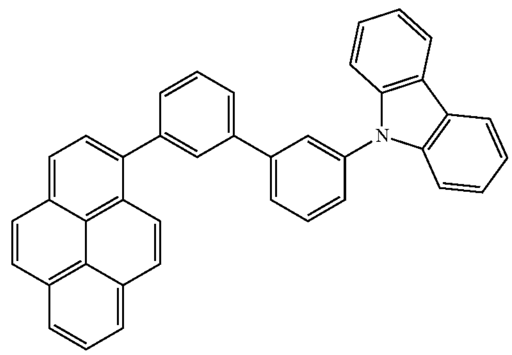
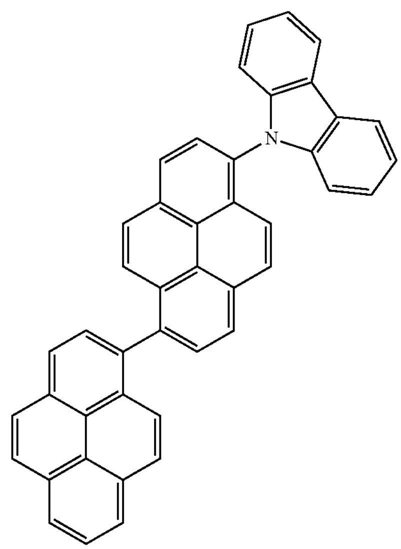
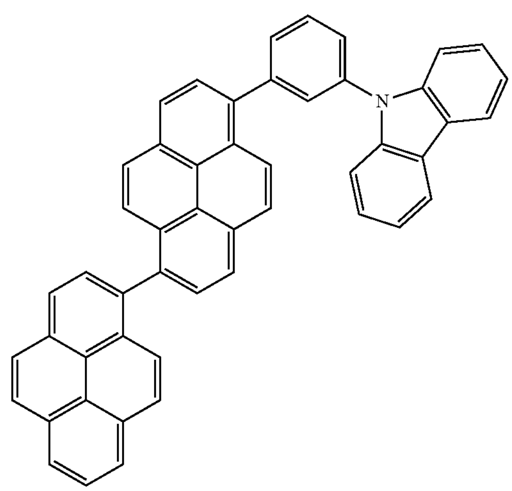

-continued
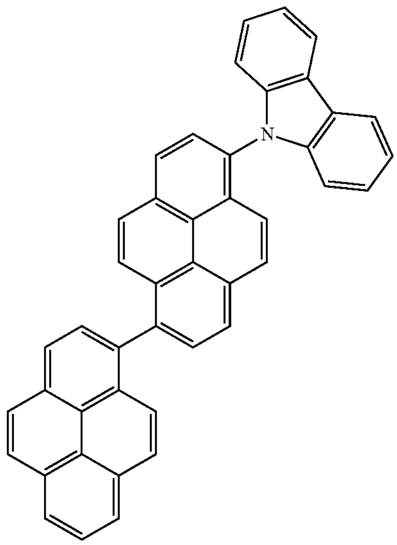
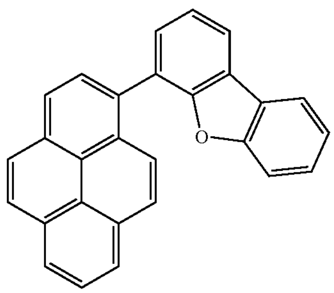
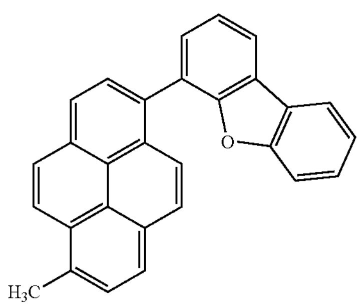
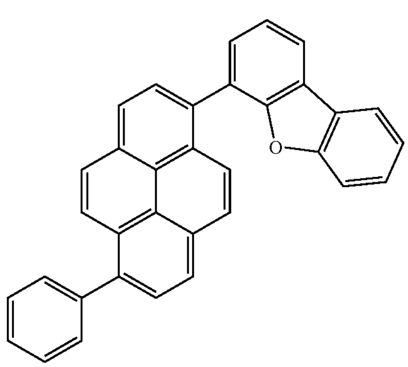
-continued
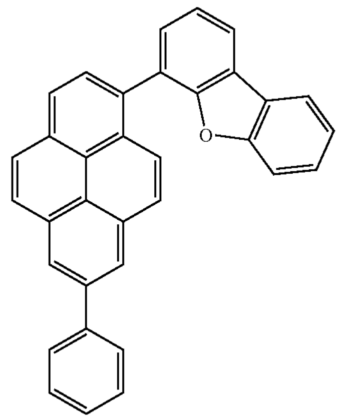
[Formula 19]
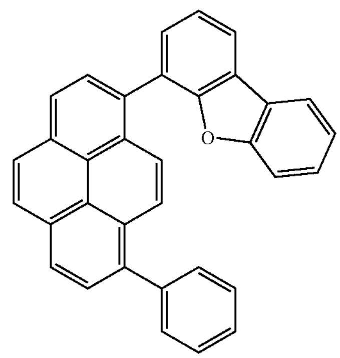
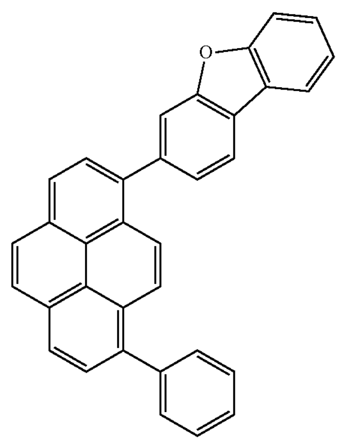
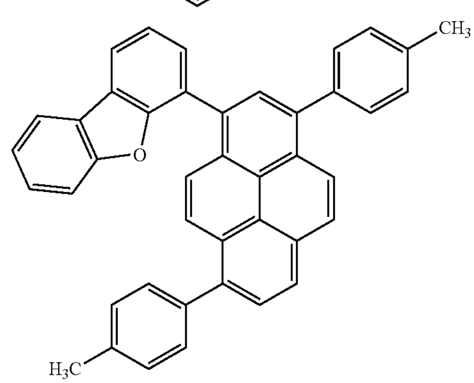

-continued
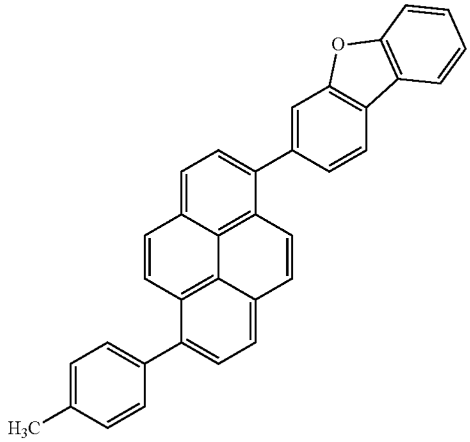
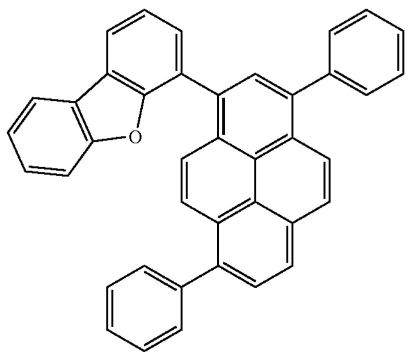
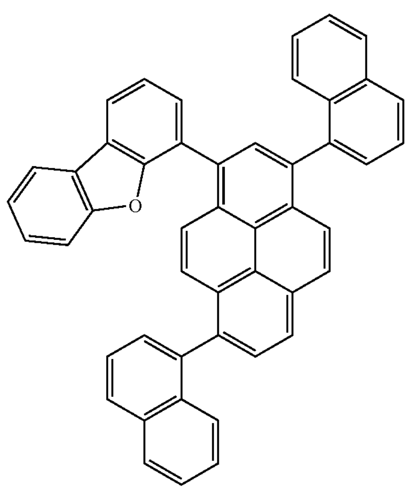
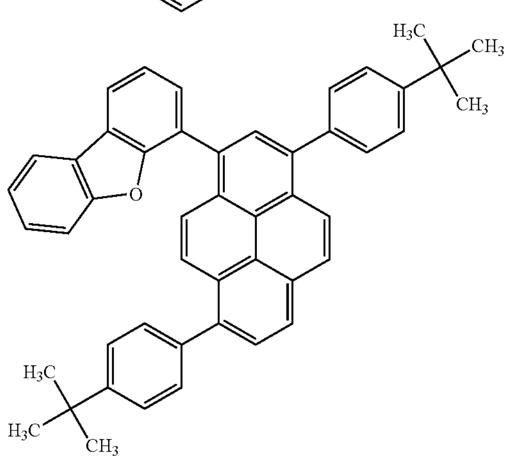
-continued
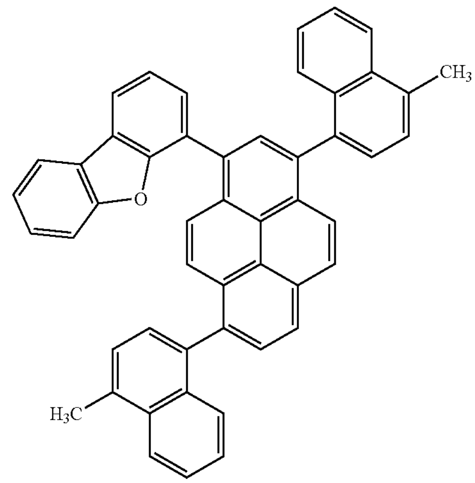
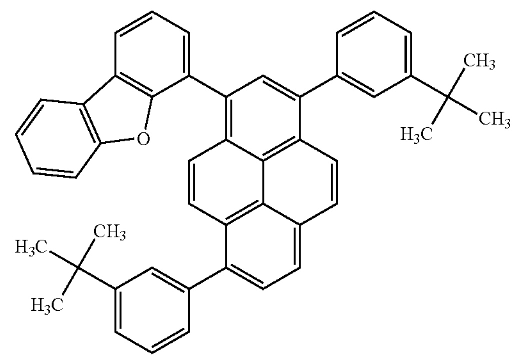
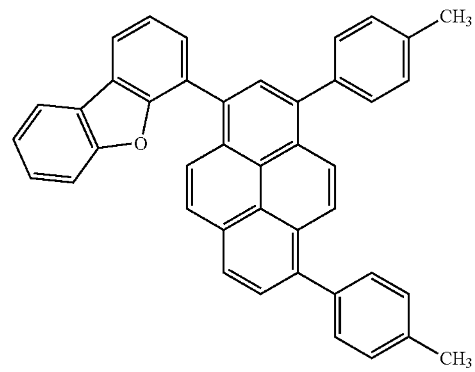
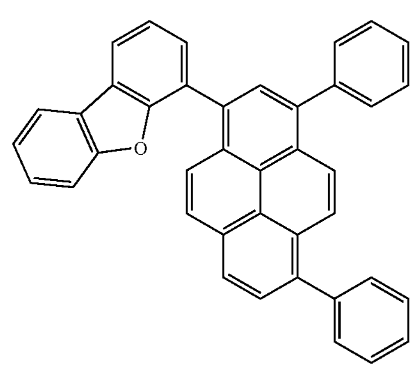

-continued
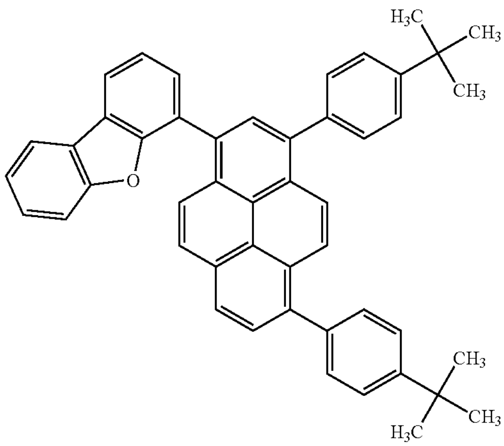
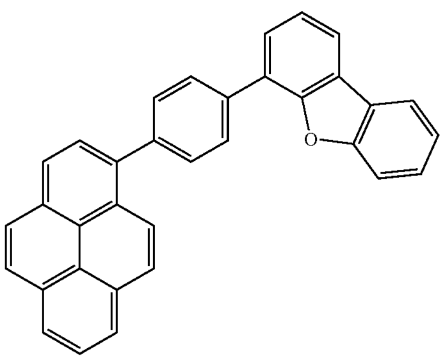
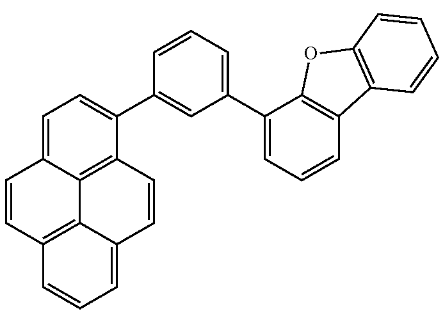
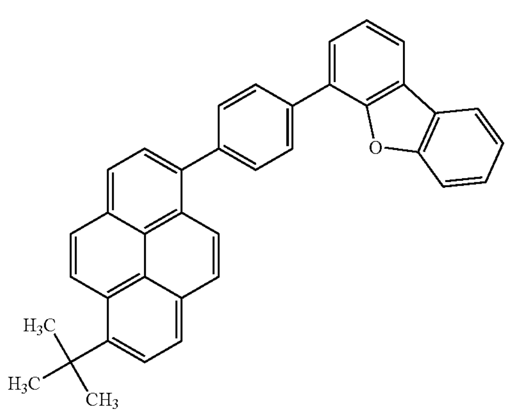
-continued
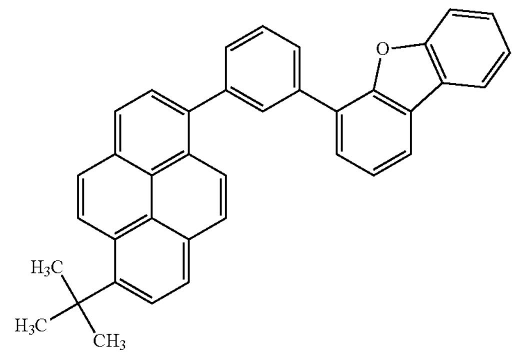
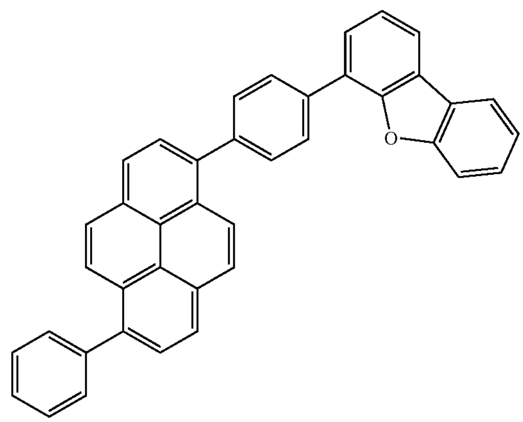
[Formula 20]
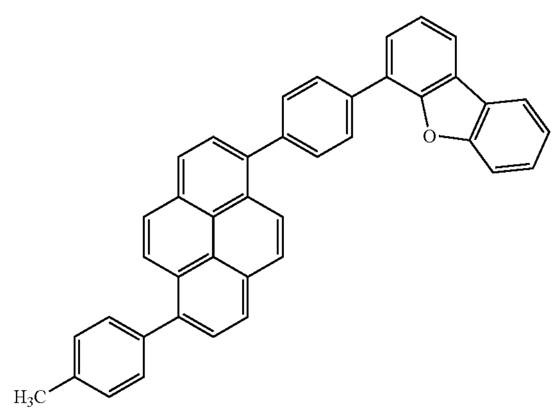
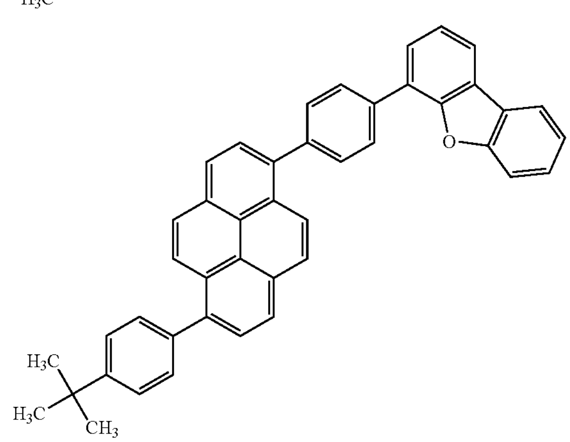

-continued
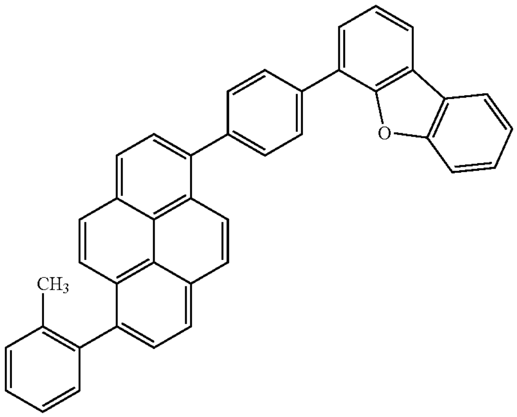
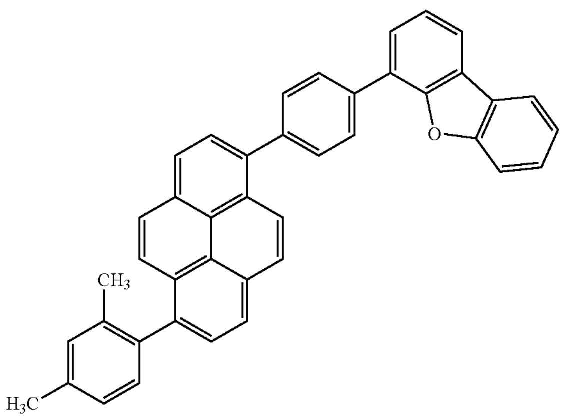
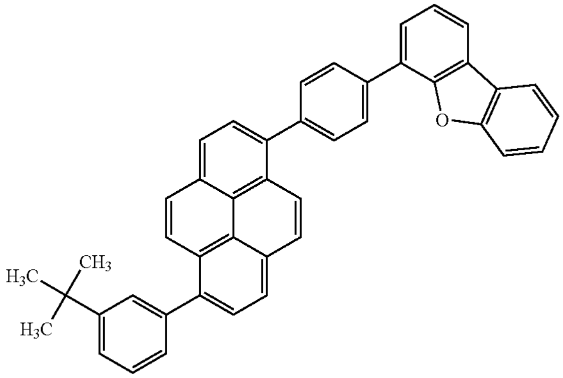
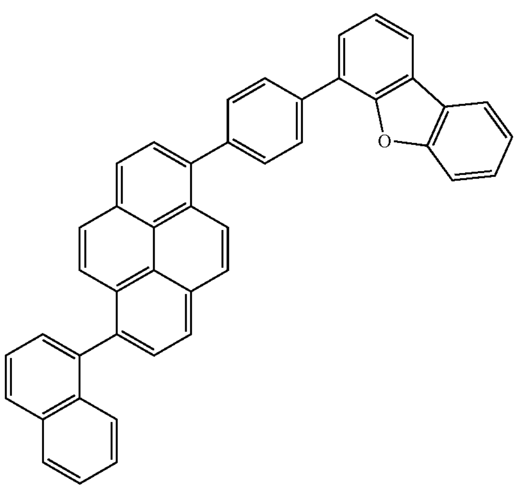
-continued
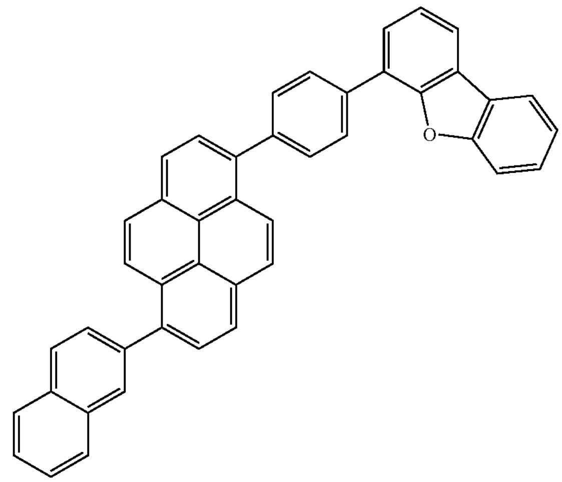
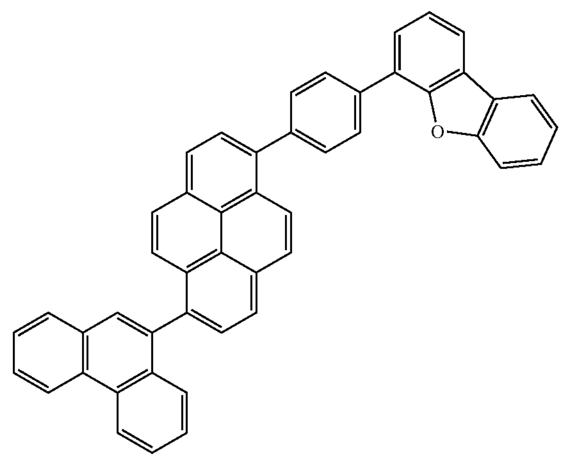
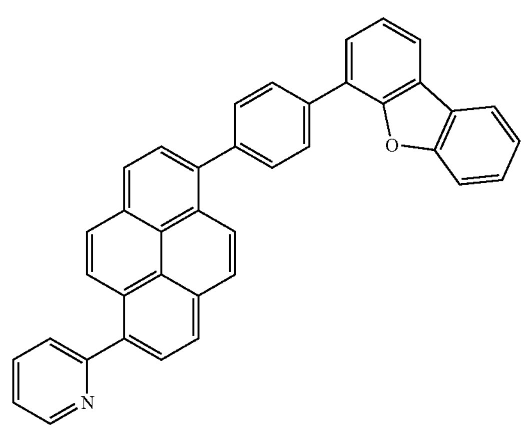

-continued
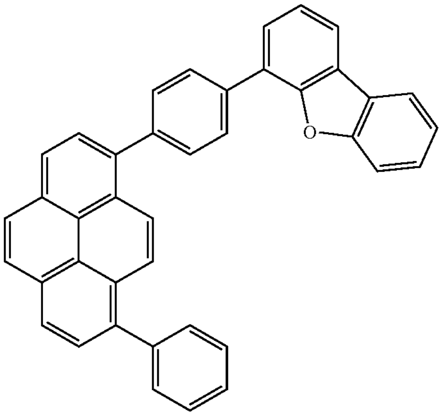
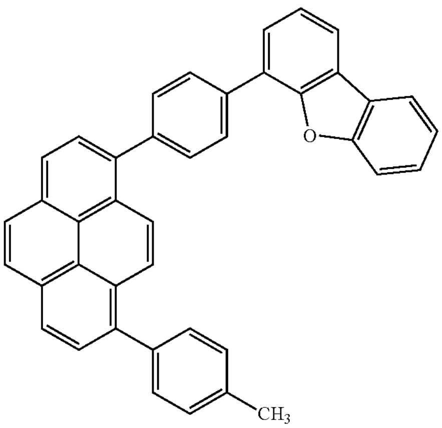
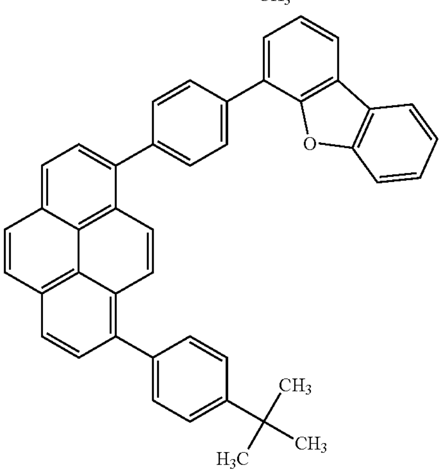
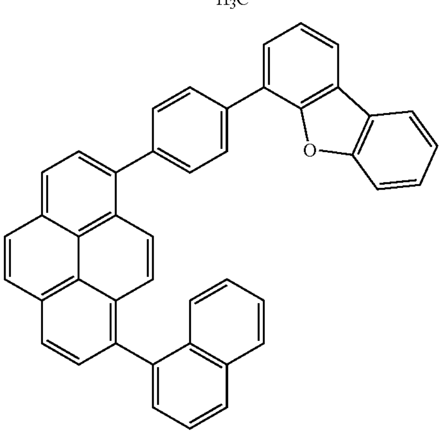
-continued
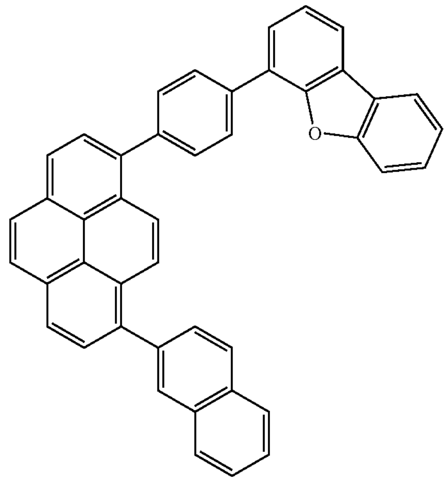
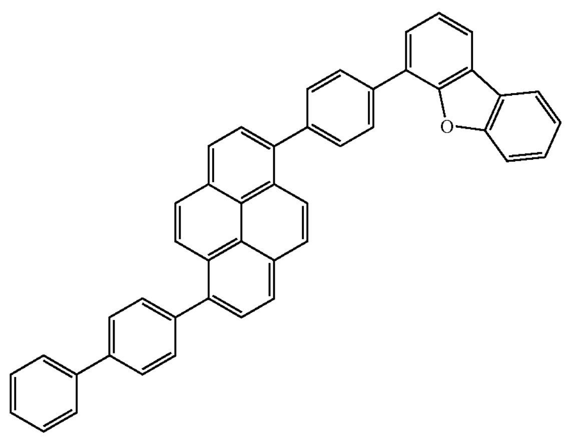
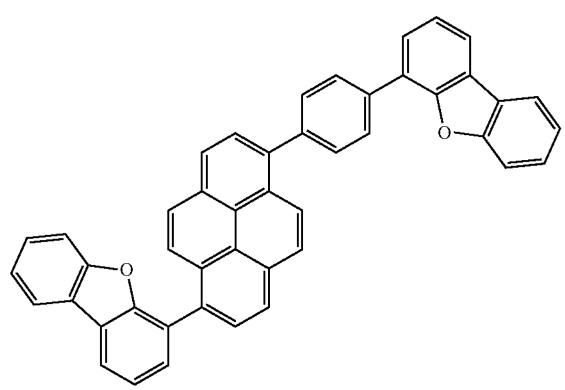

-continued
[Formula 21]
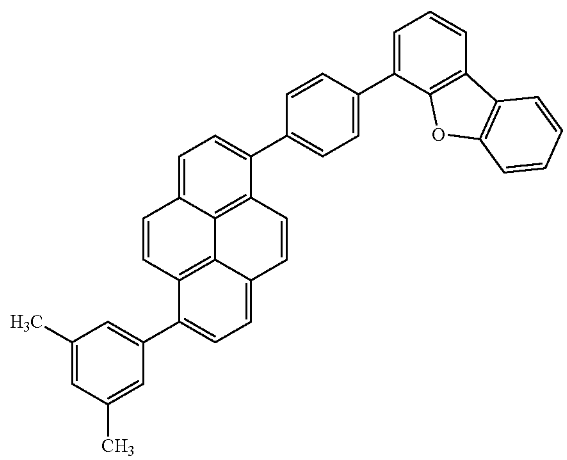
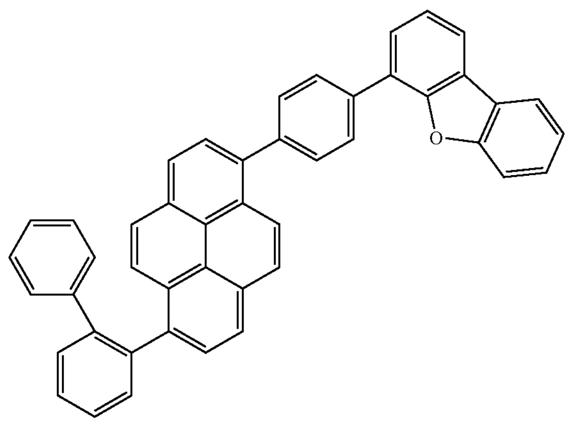
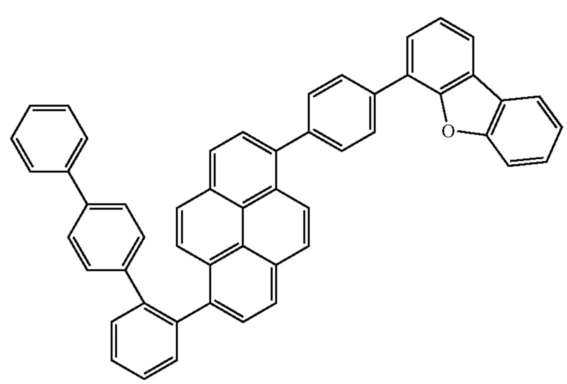
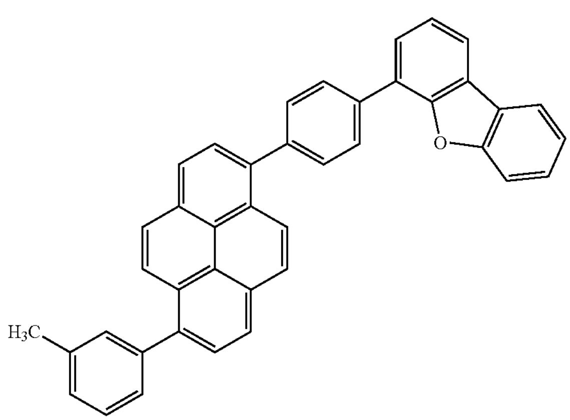
-continued
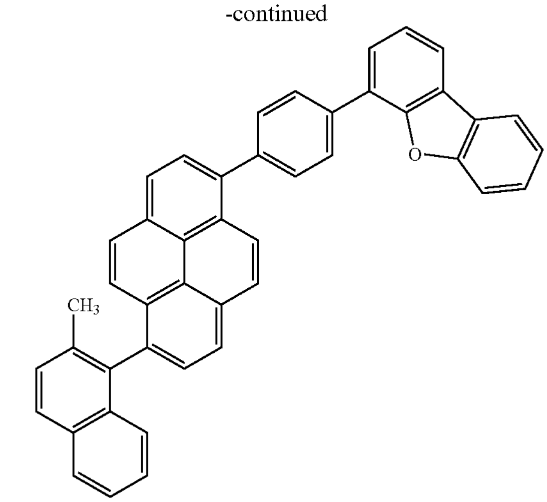
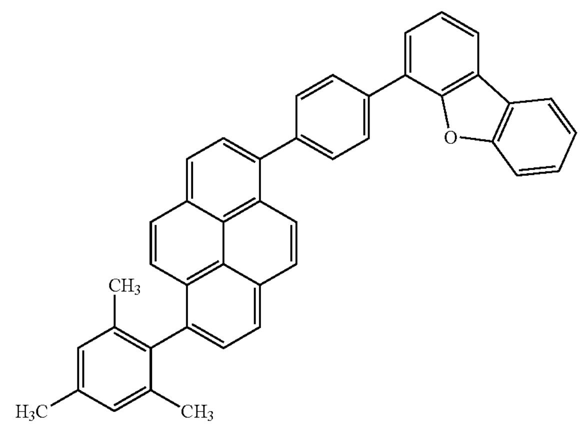
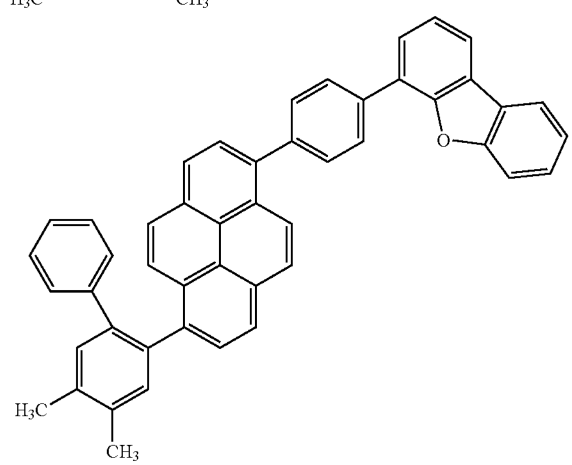
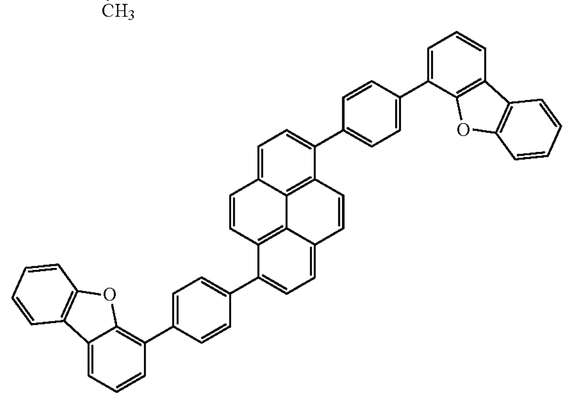

-continued
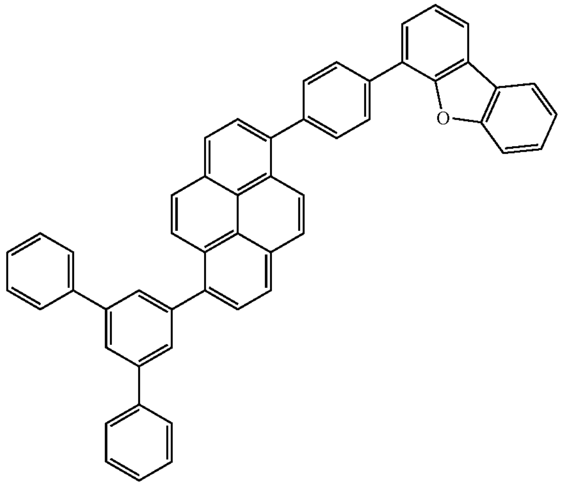
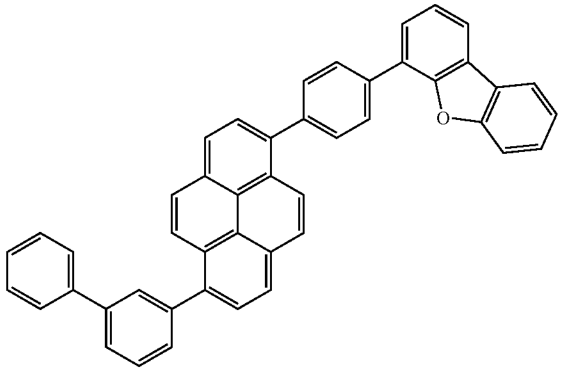
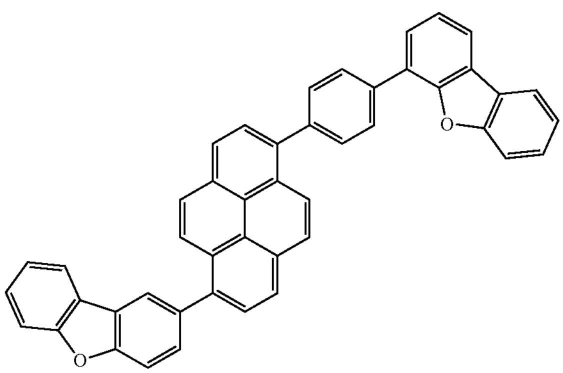
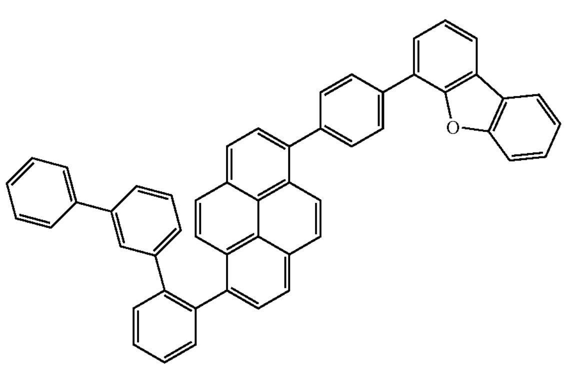
-continued
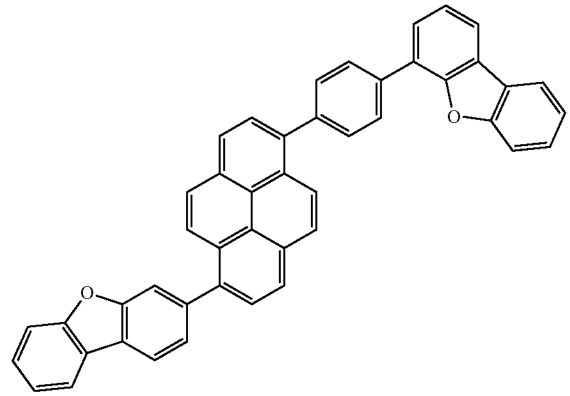
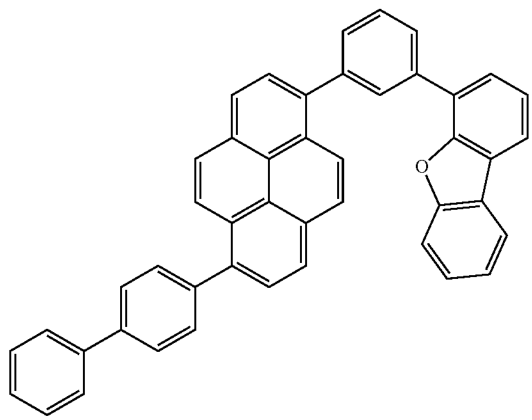
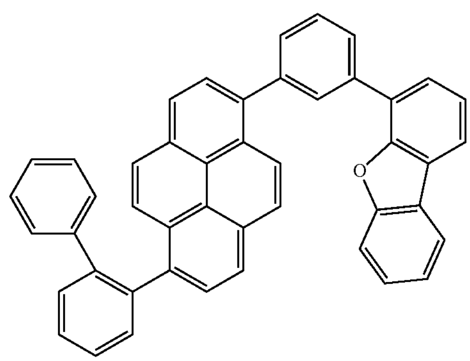
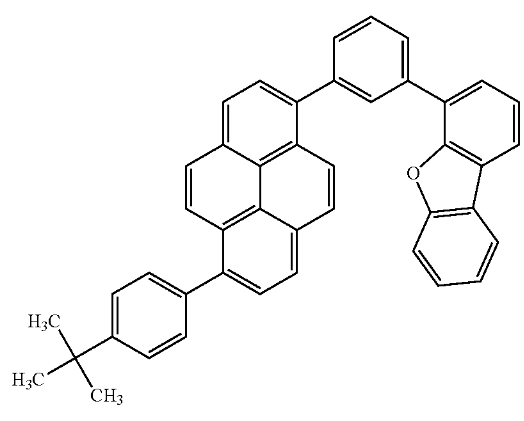

-continued
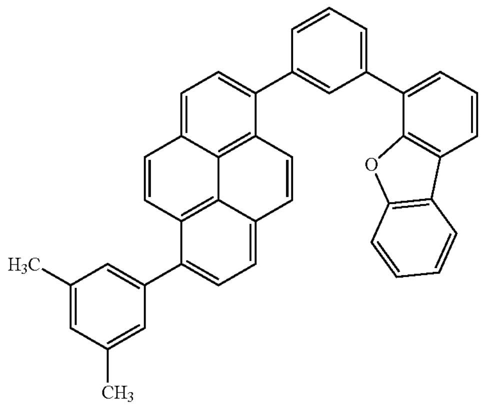
[Formula 22]
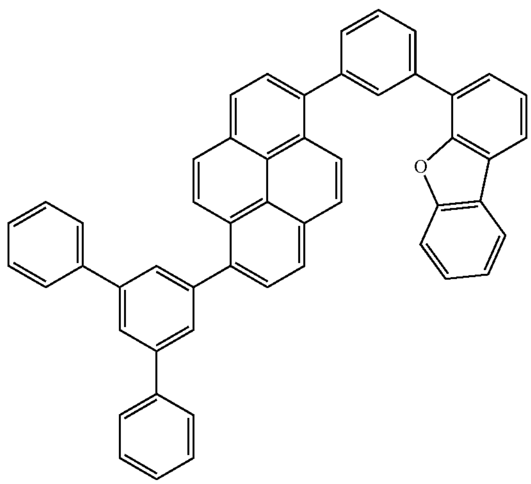
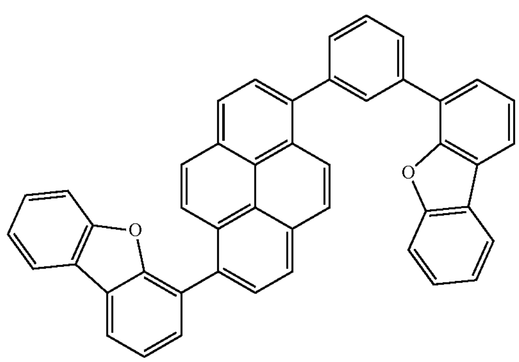
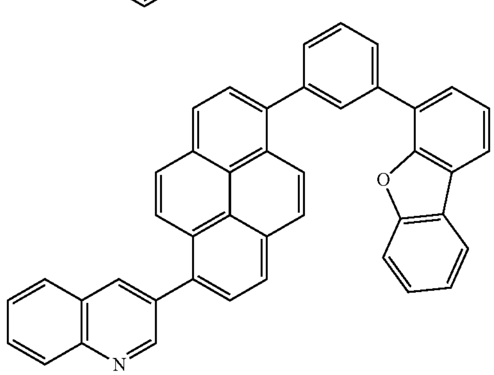
-continued
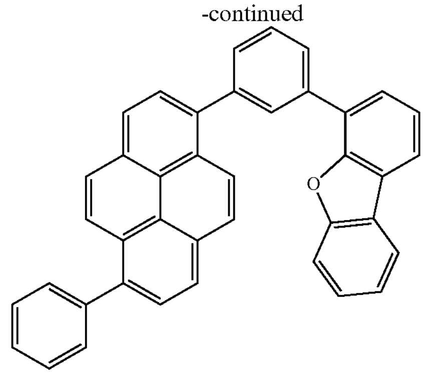
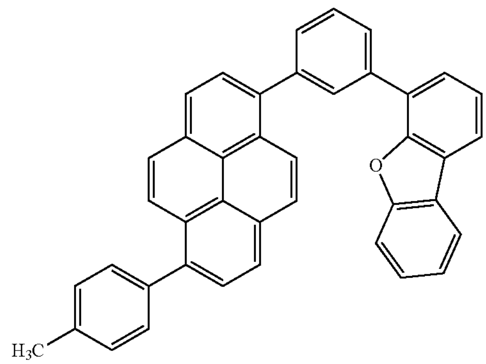
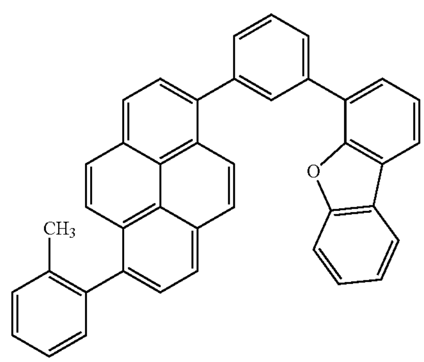
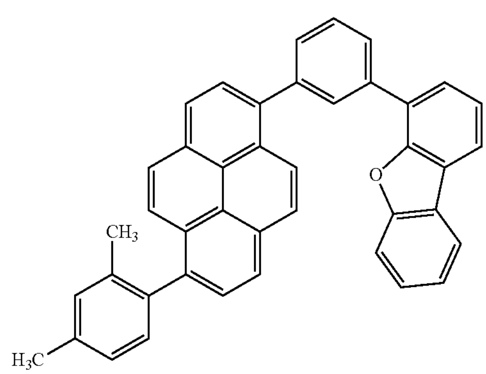

-continued
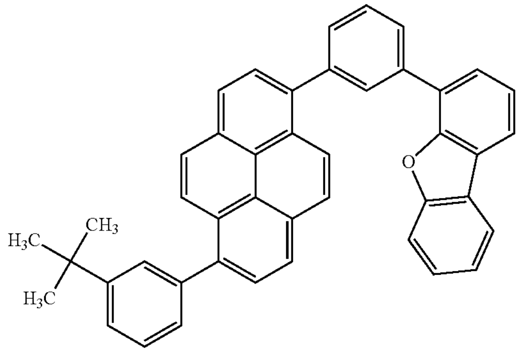
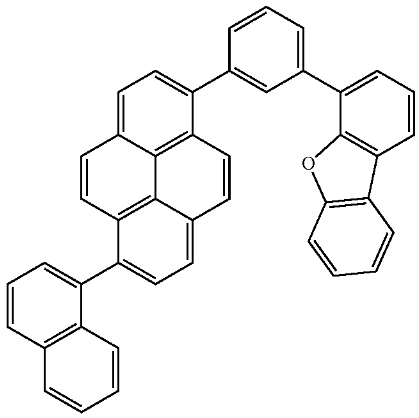
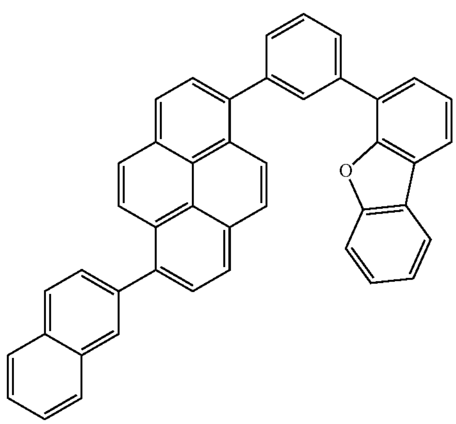
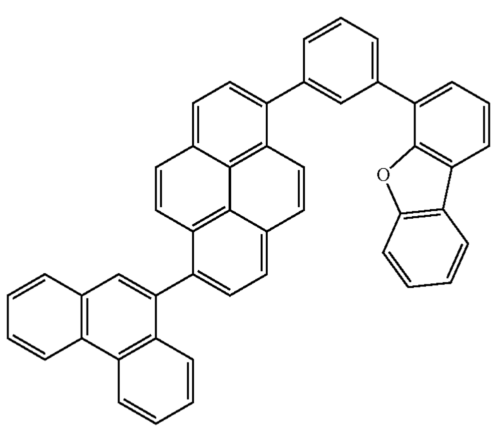
-continued
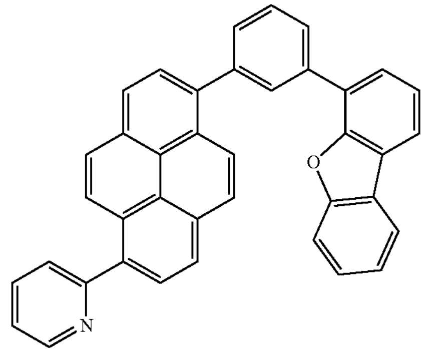
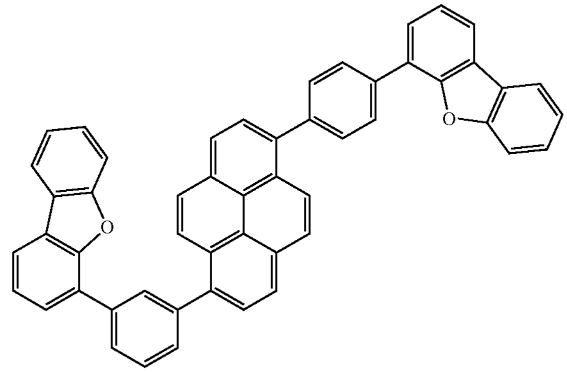
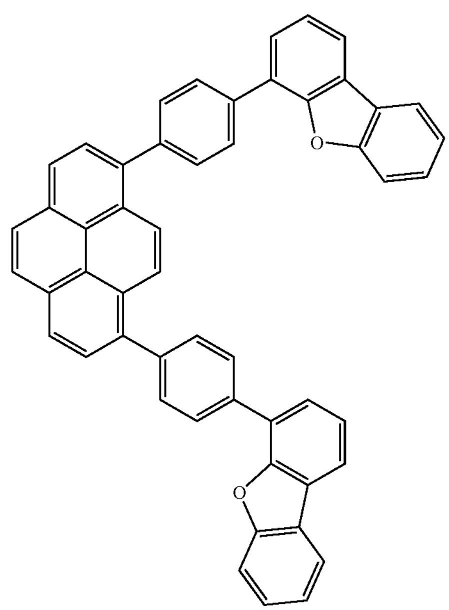

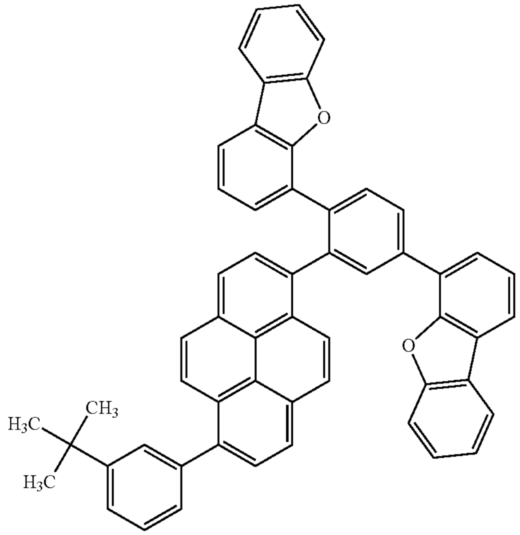
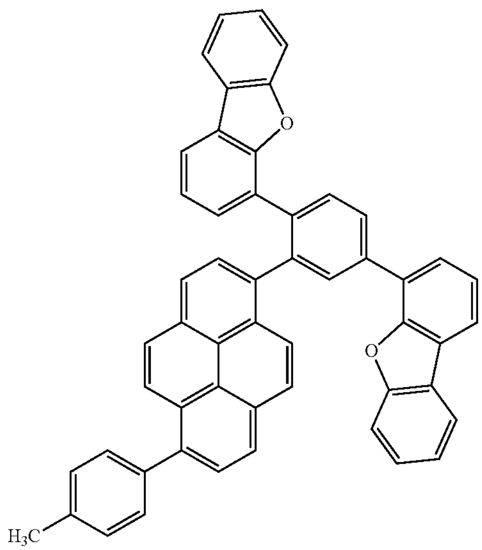
[Formula 23]
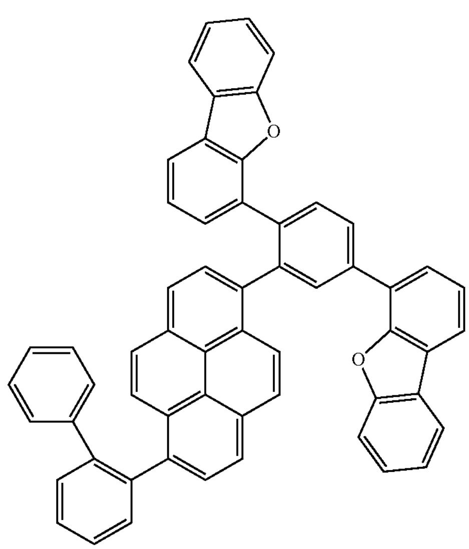
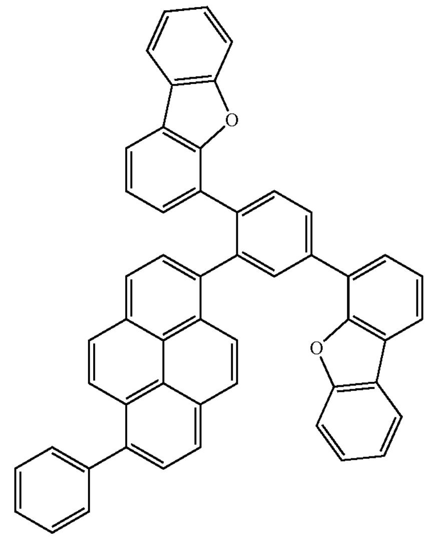
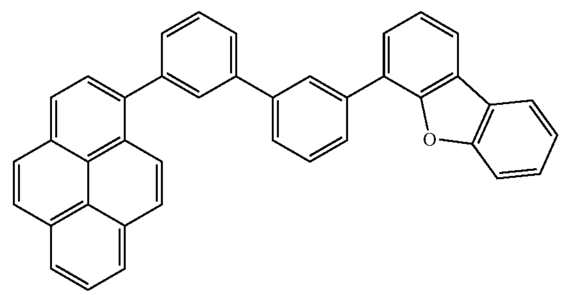
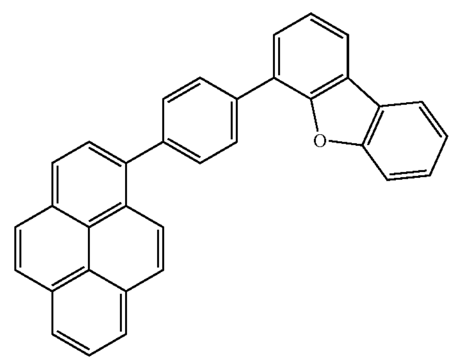
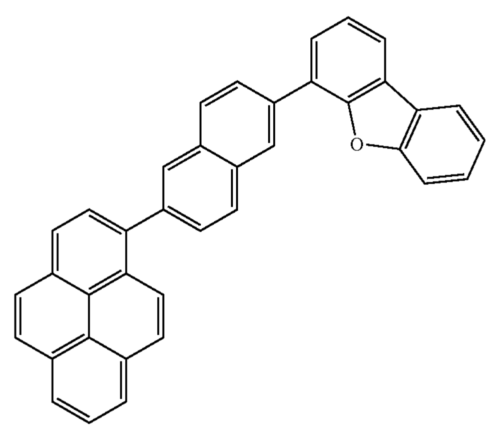

-continued
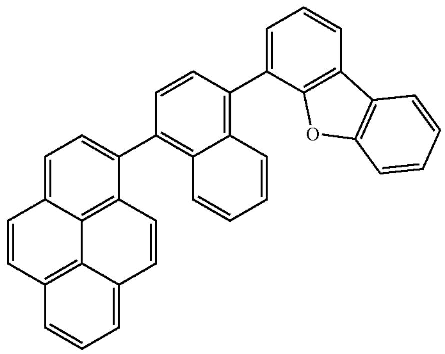
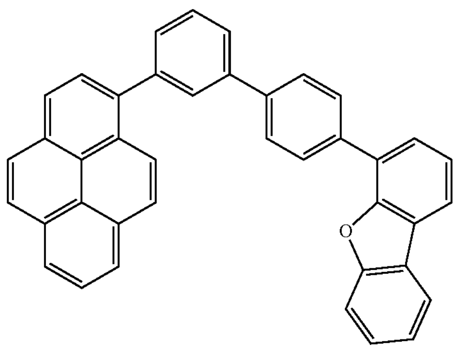
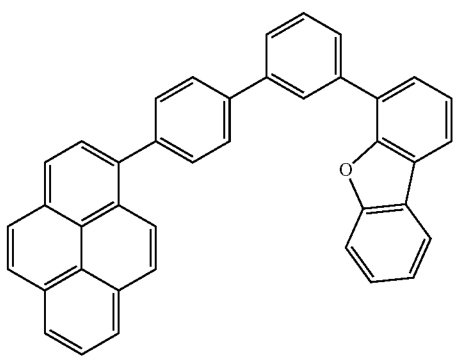
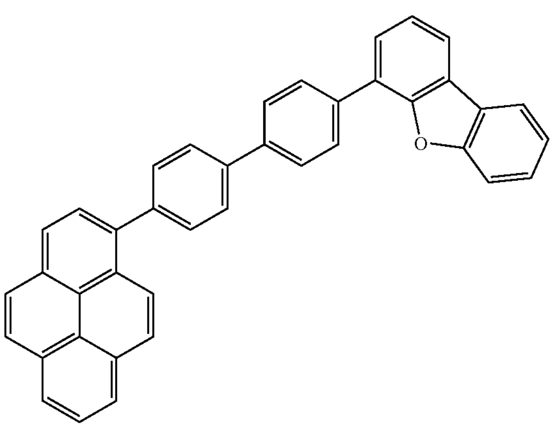
-continued
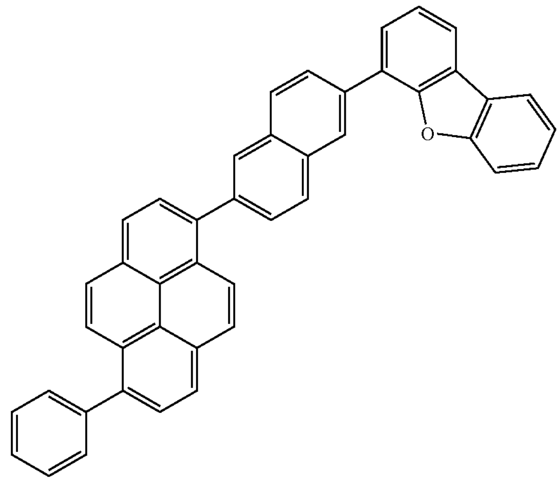
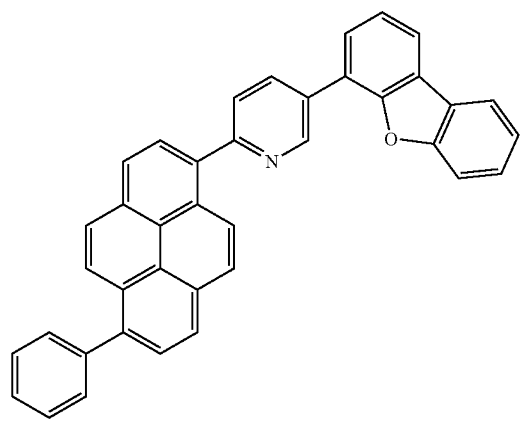
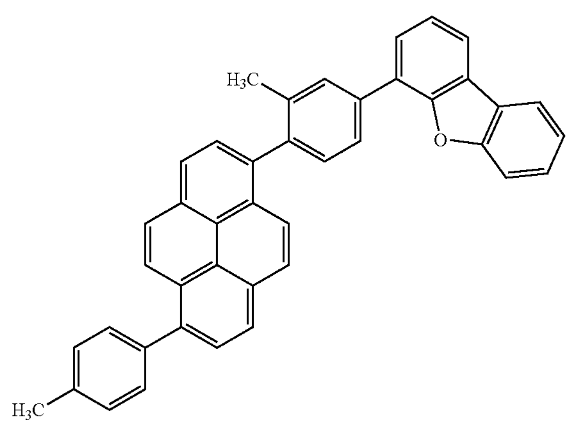

-continued
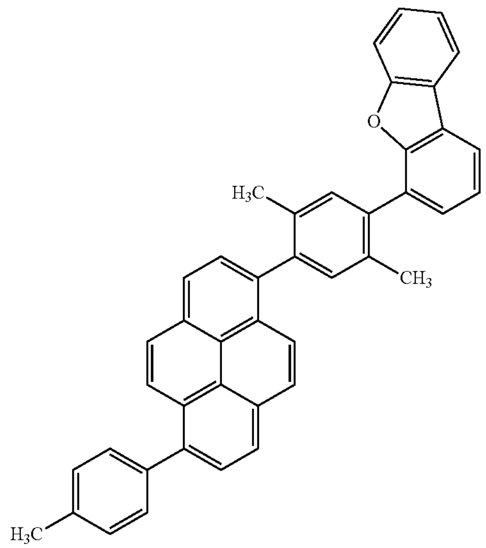
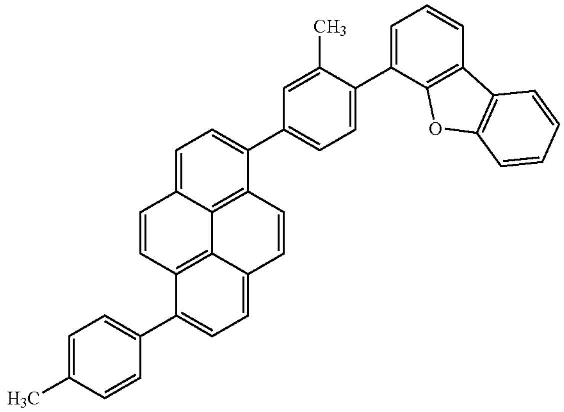
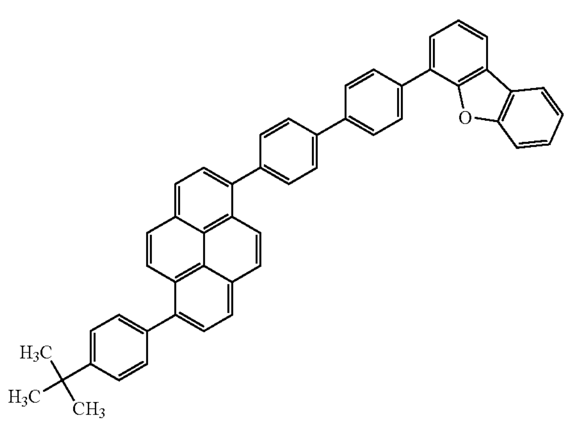
-continued
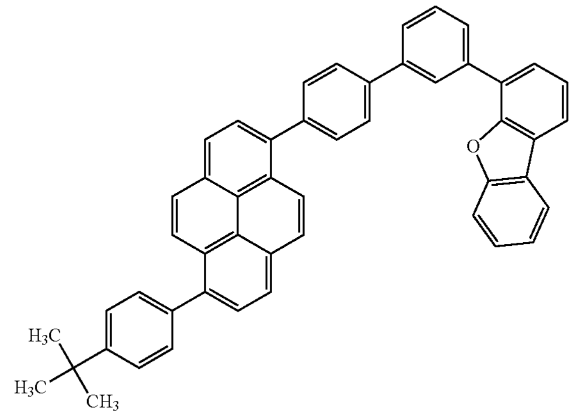
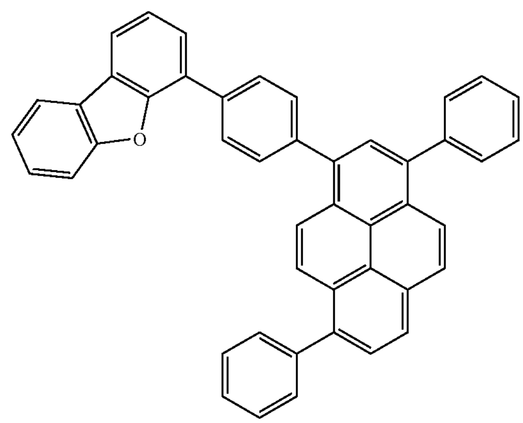
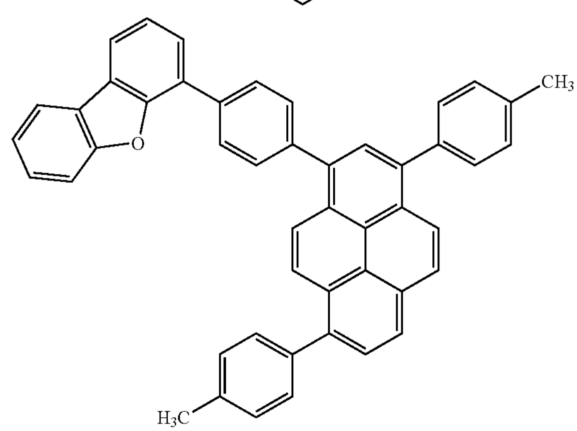
[Formula 24]
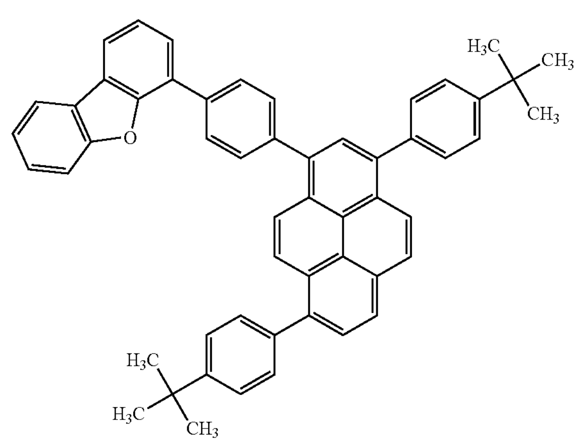

-continued
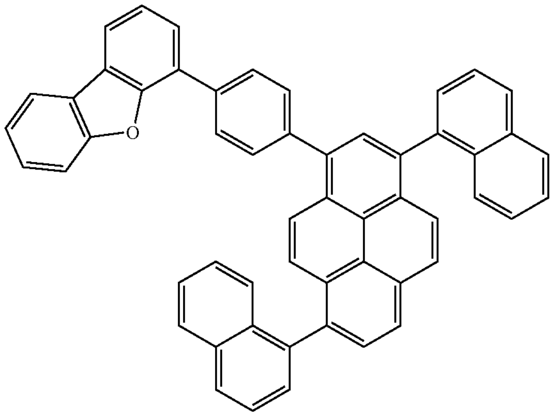
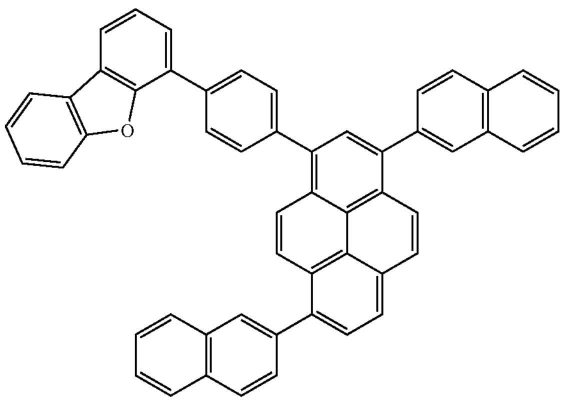
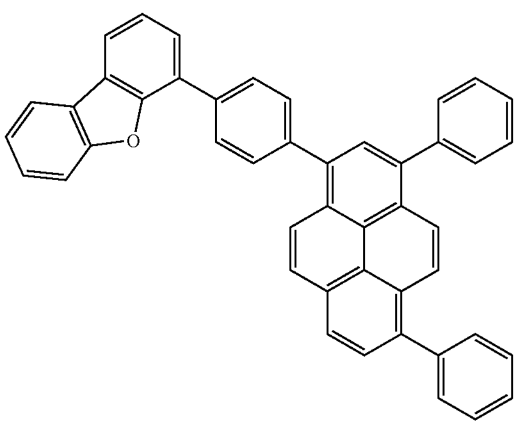
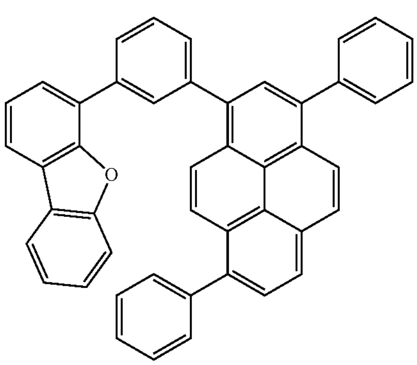
-continued
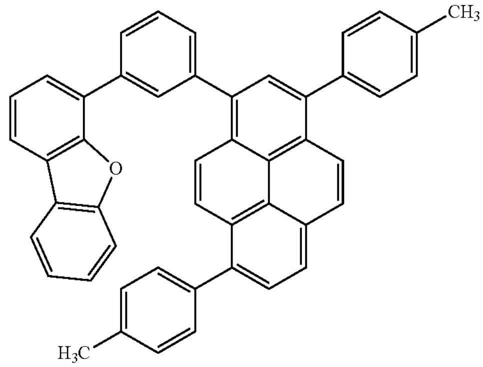
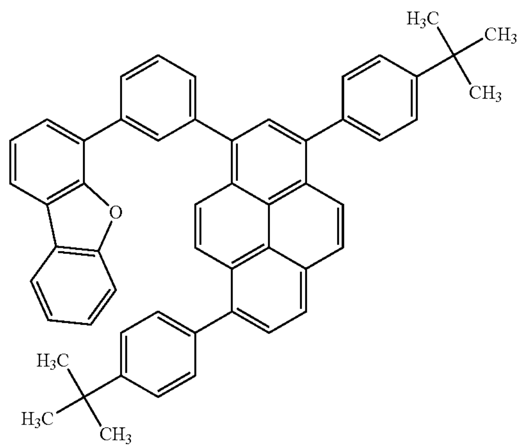
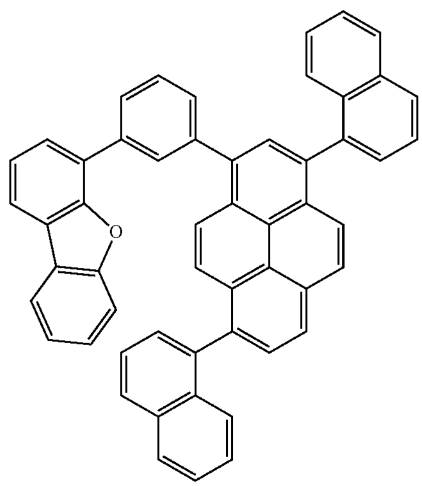
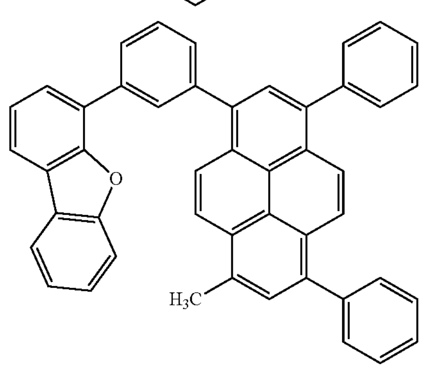

-continued
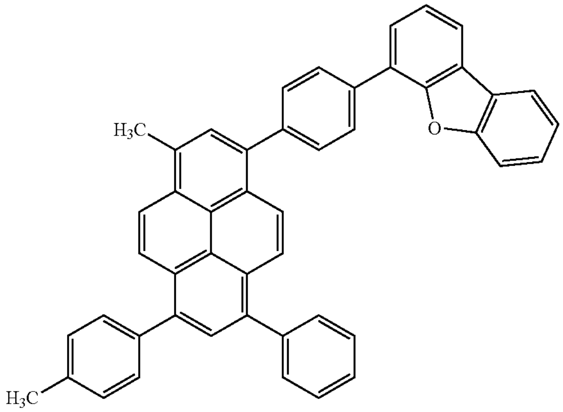
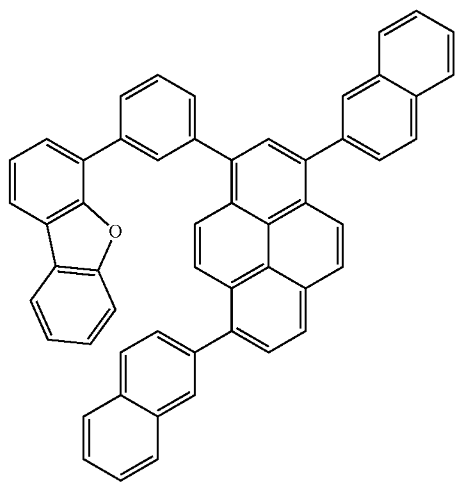
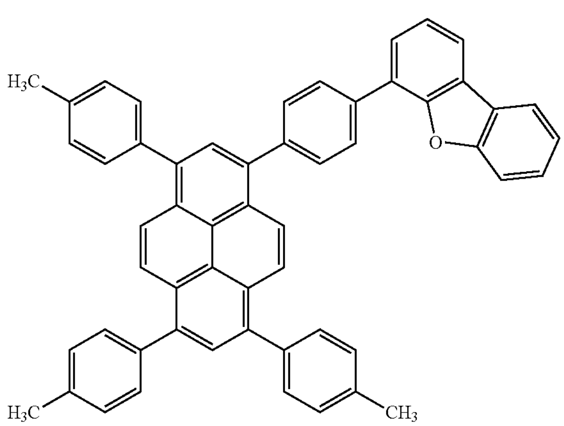
-continued
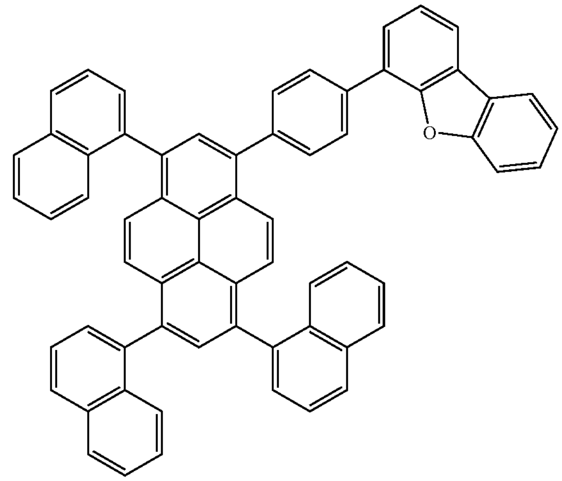
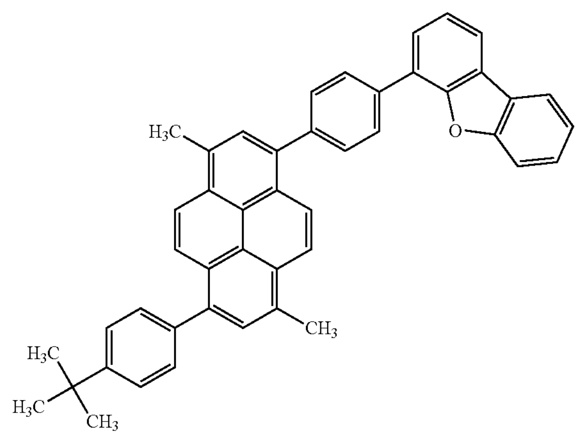
[Formula 25]
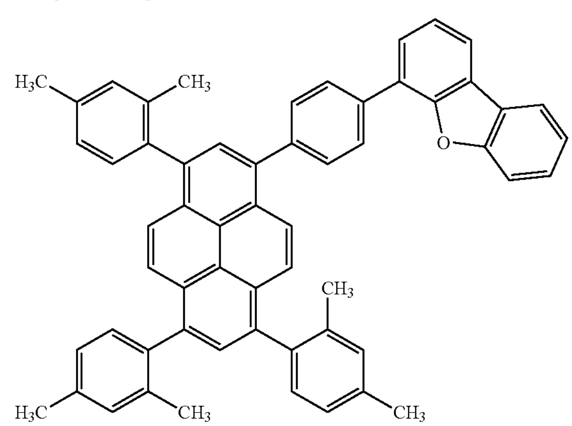

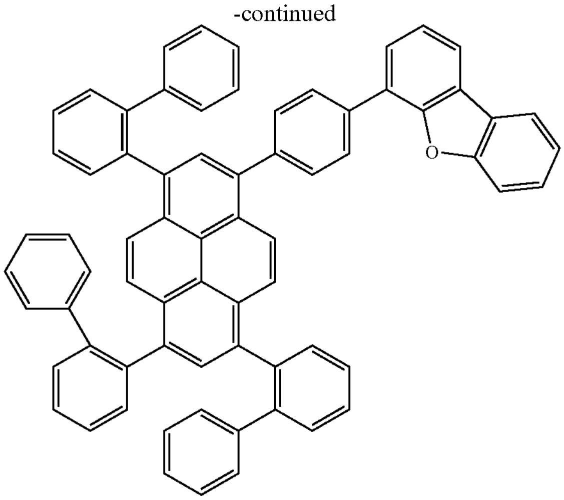
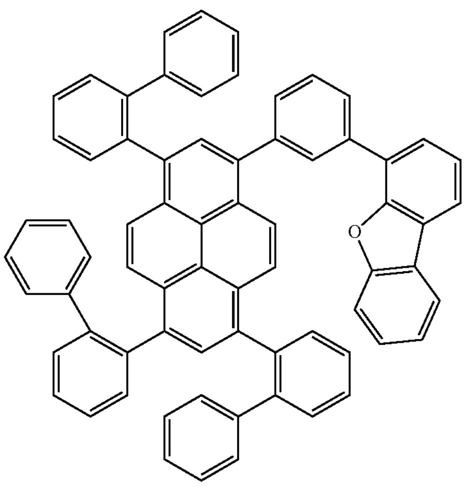
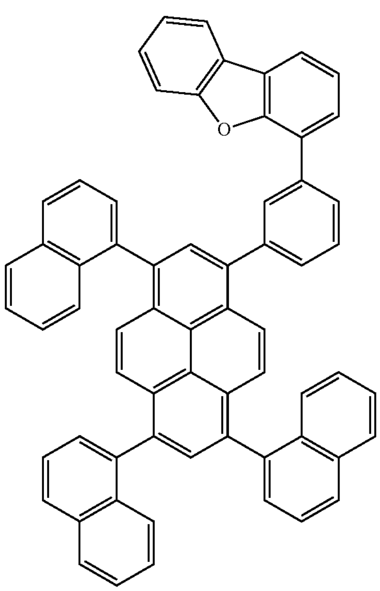
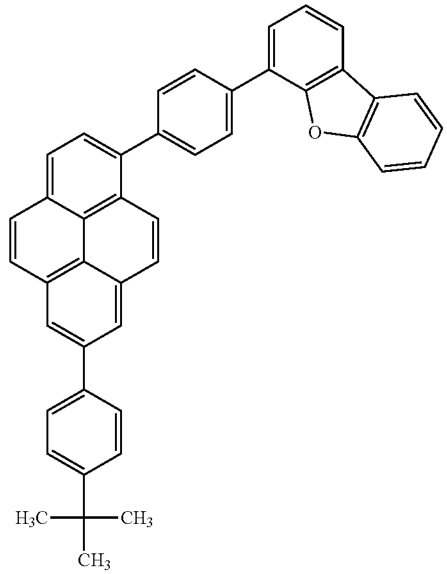
O
H3C
CH3
CH3
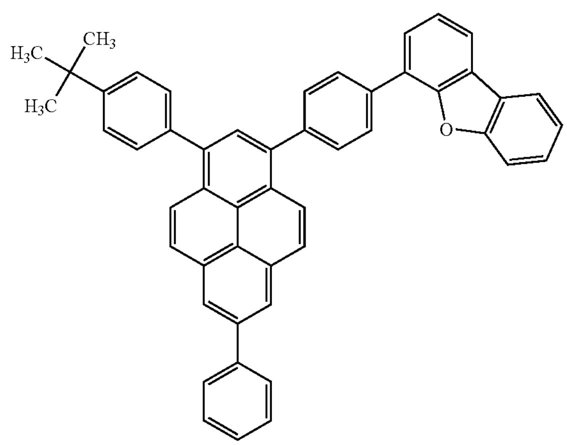
H3C
CH3
H3C
O
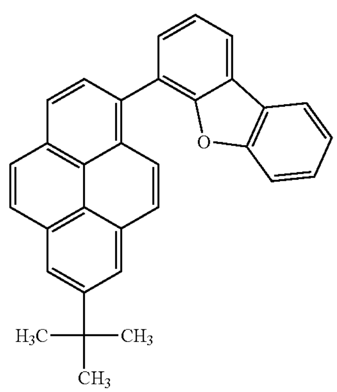
O
H3C
CH3
CH3

-continued
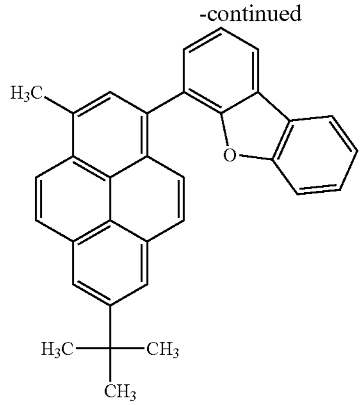
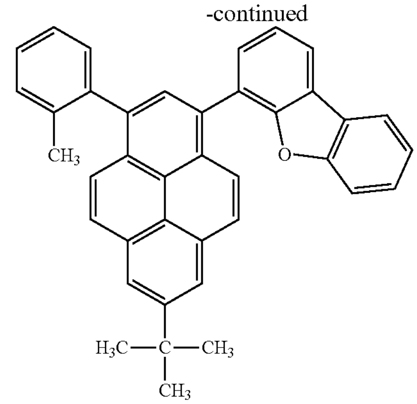
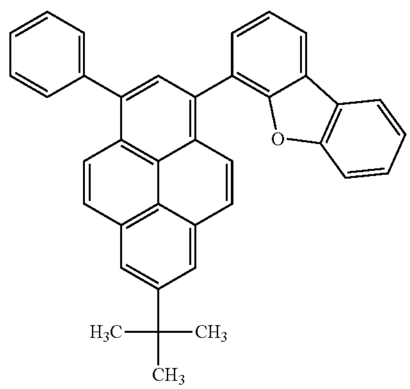
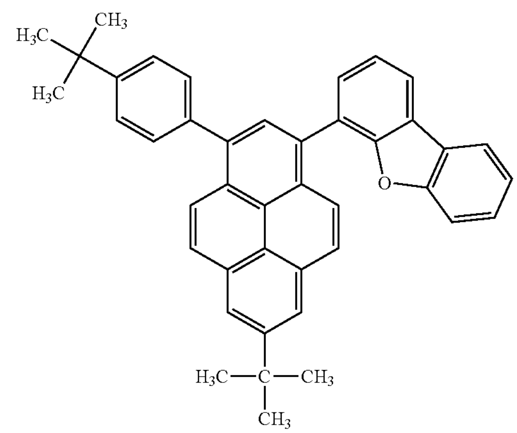
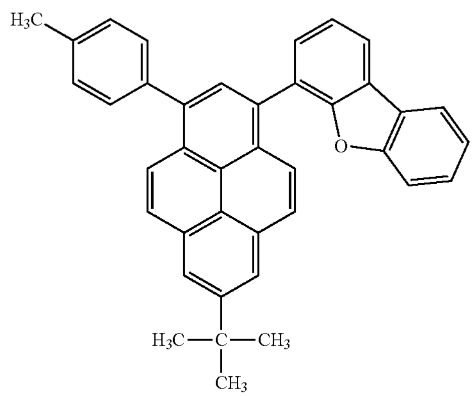
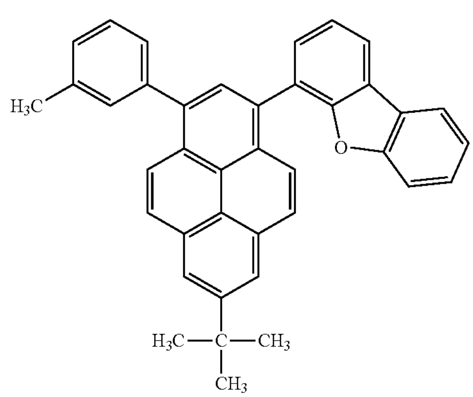
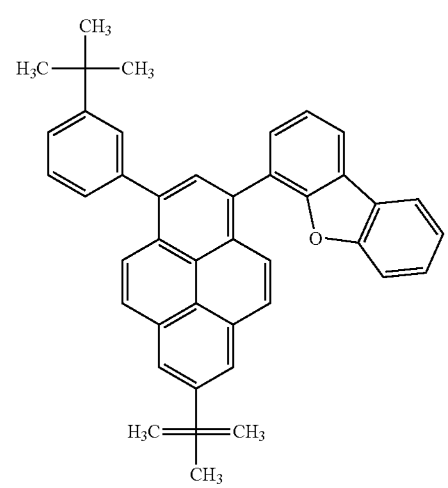

-continued
[Formula 26]
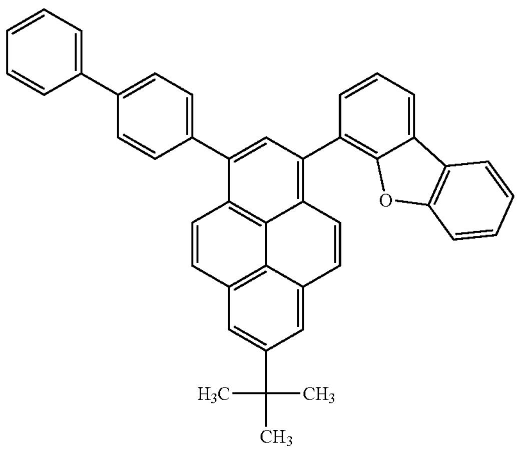
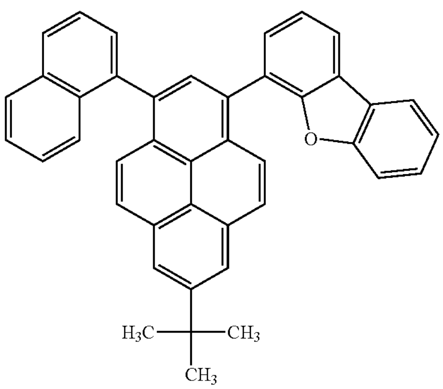
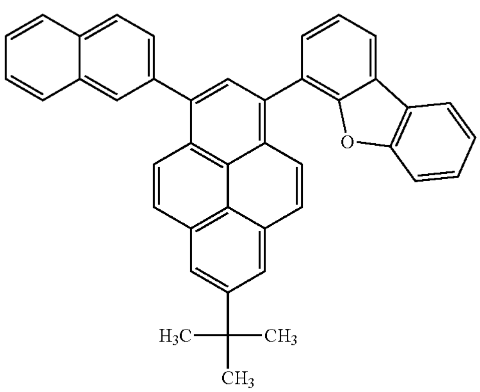
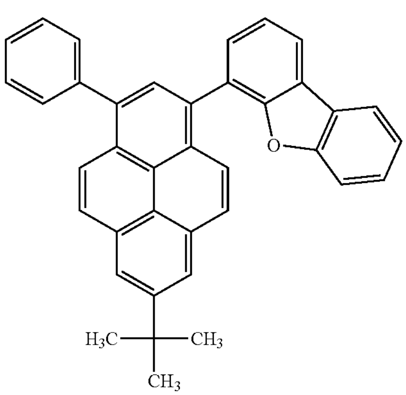
-continued
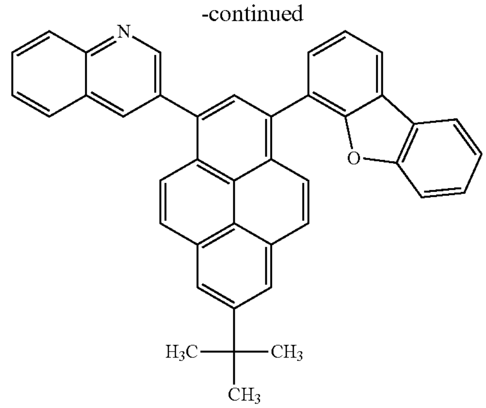
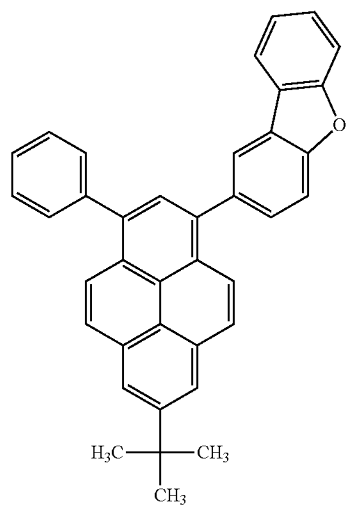
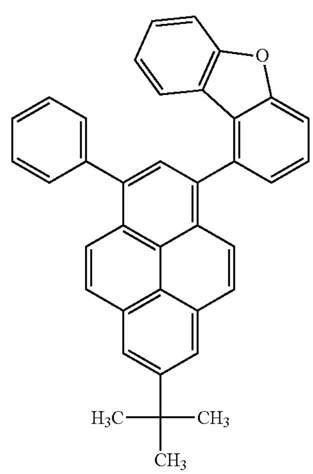

-continued
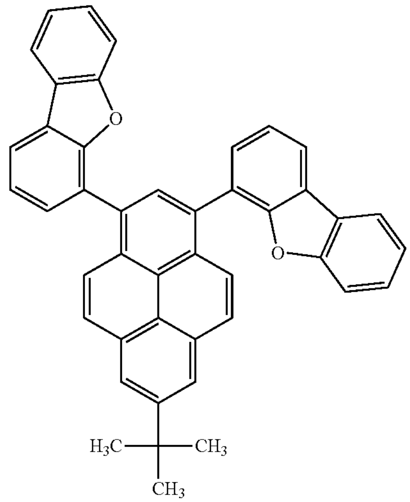
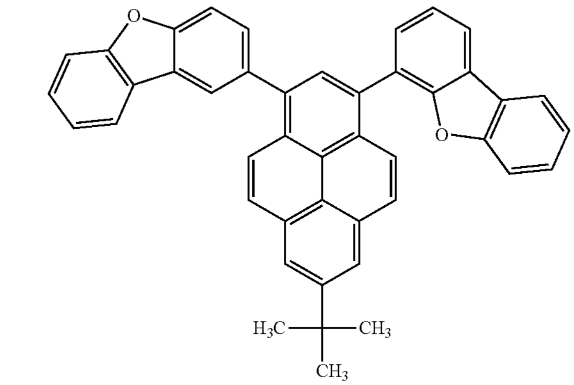
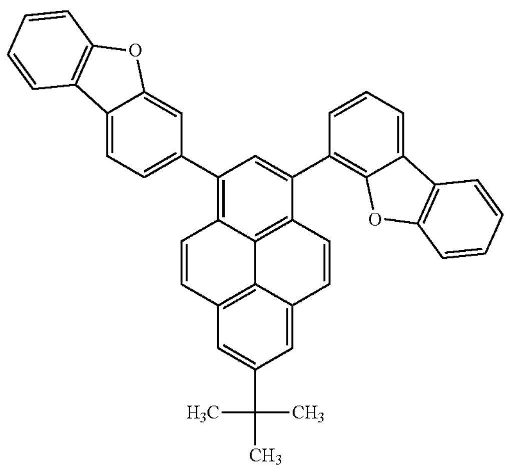
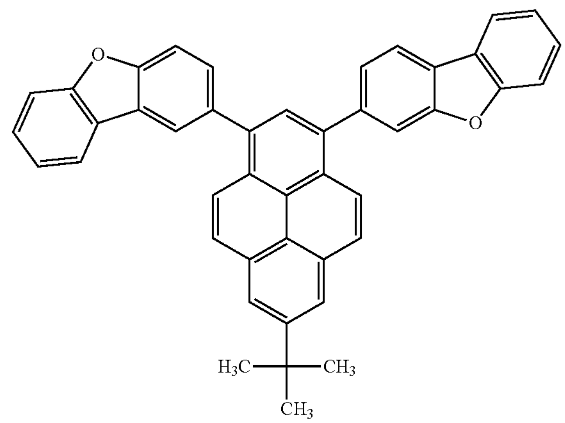
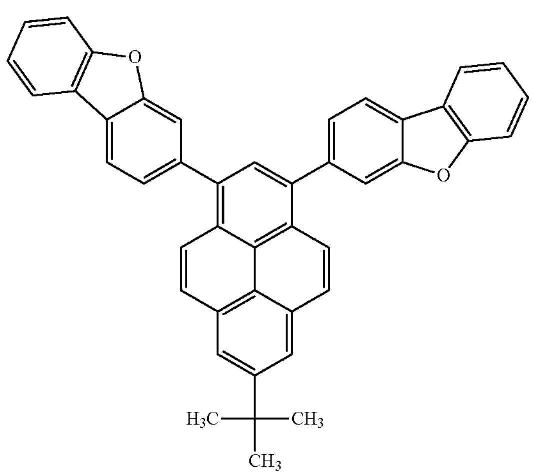
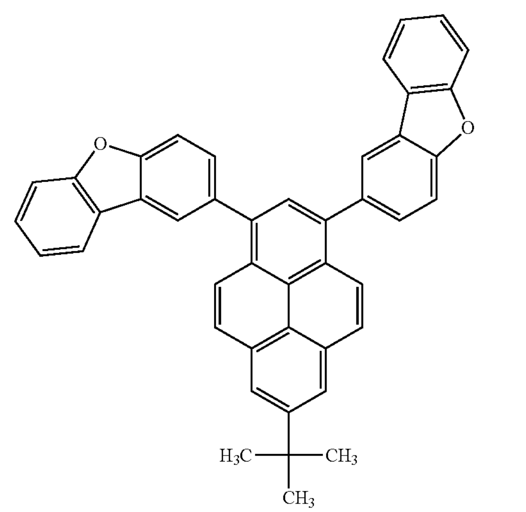

-continued
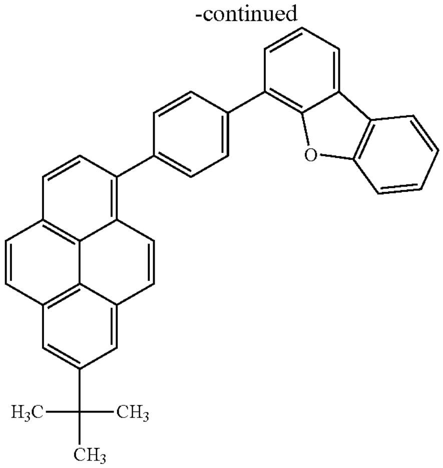
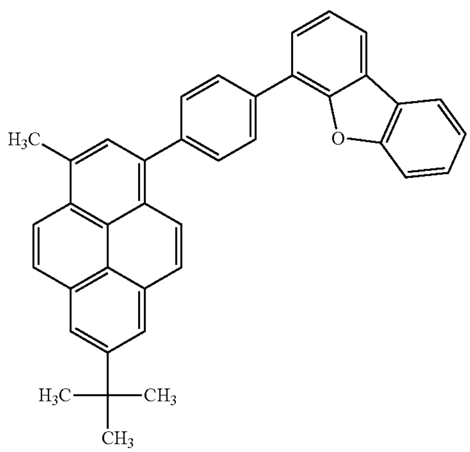
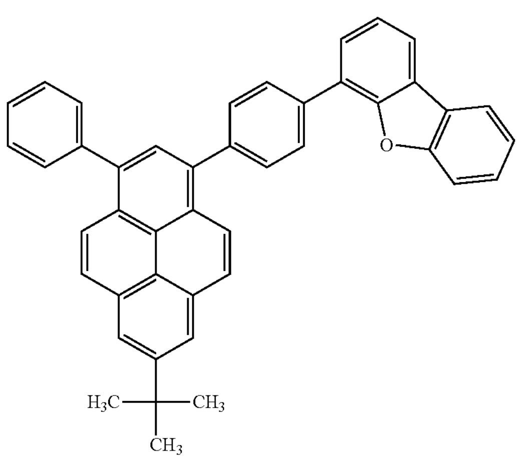
-continued
[Formula 27]
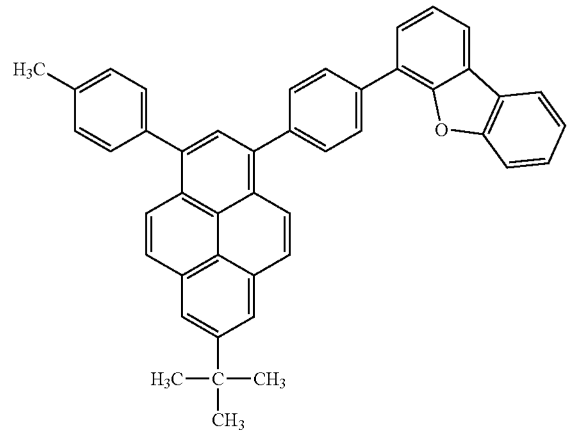
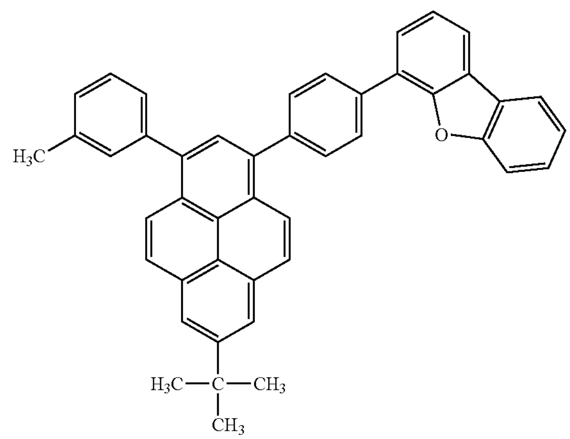
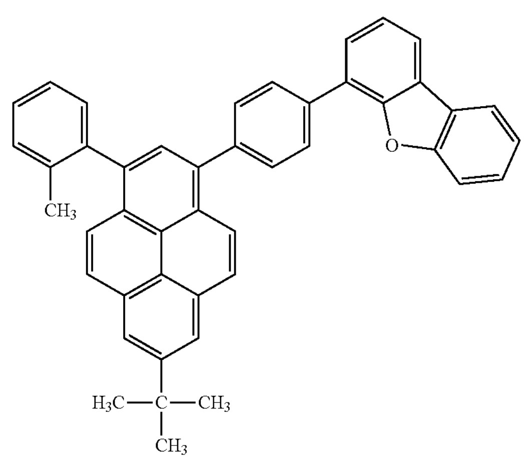

-continued
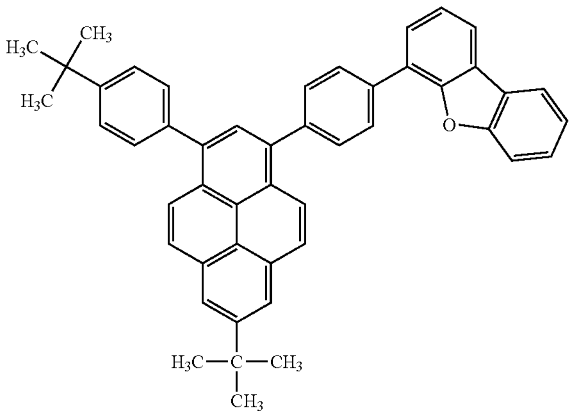
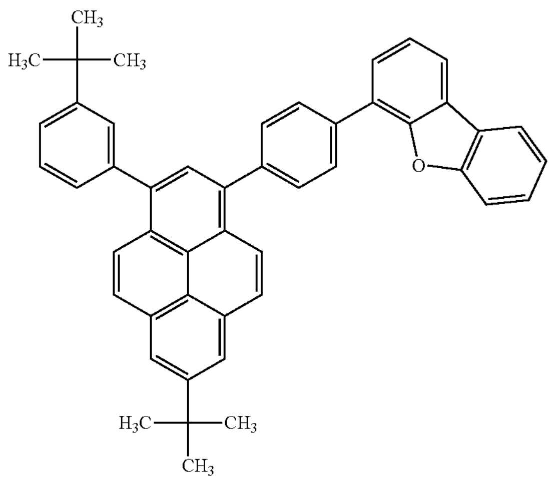
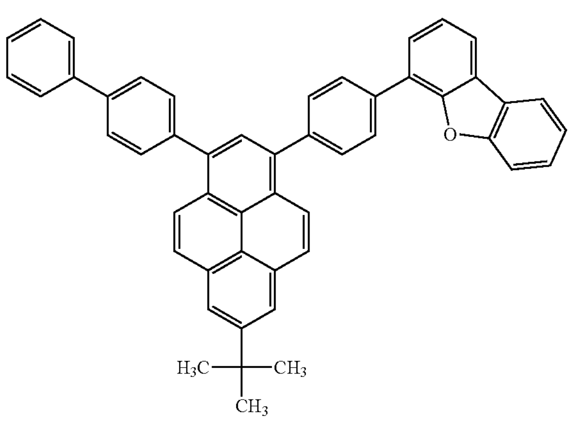
-continued
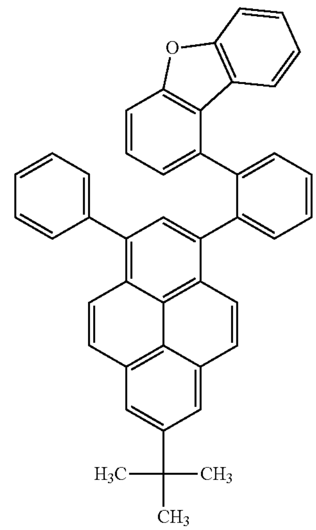
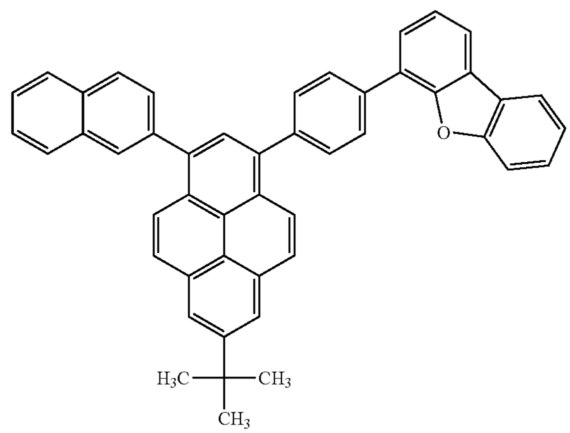
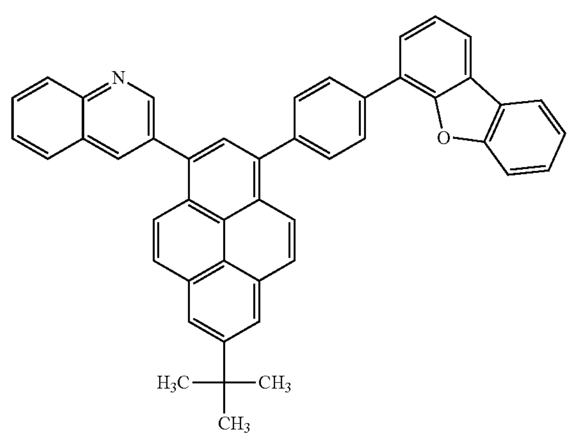

-continued
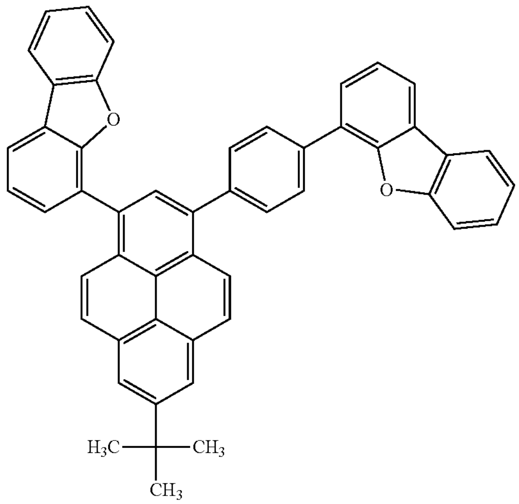
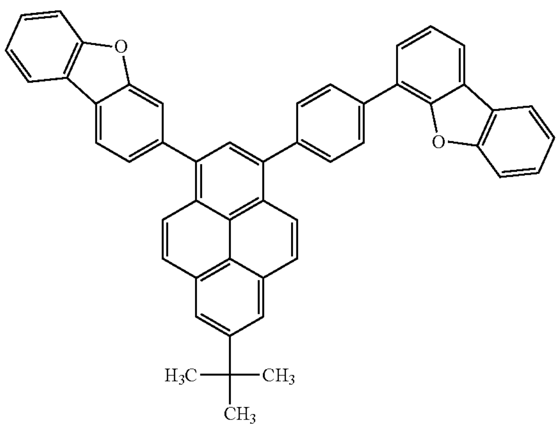
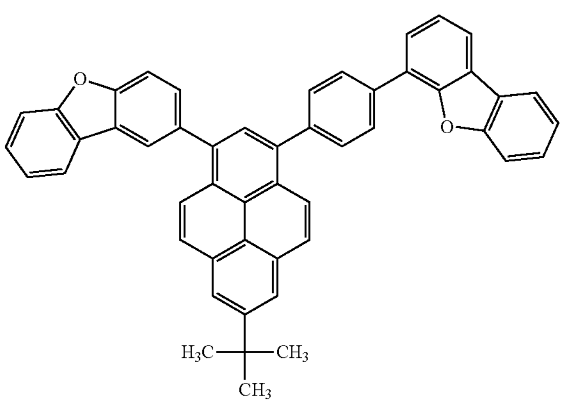
-continued
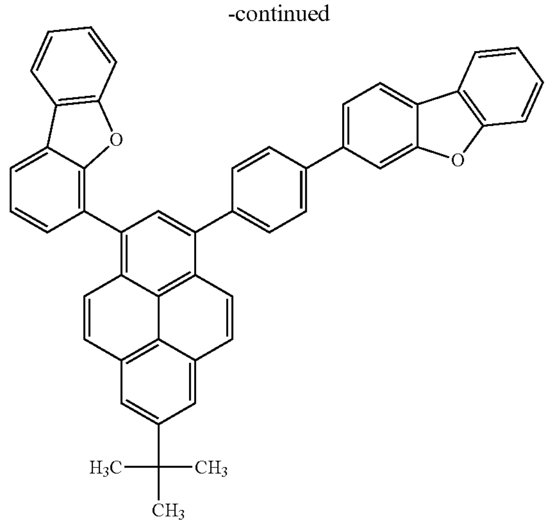
[Formula 28]
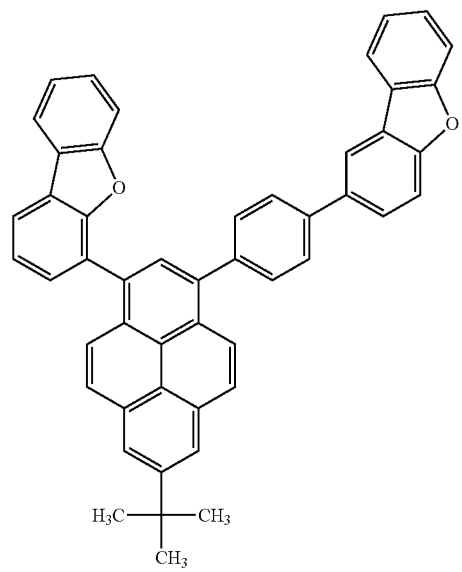
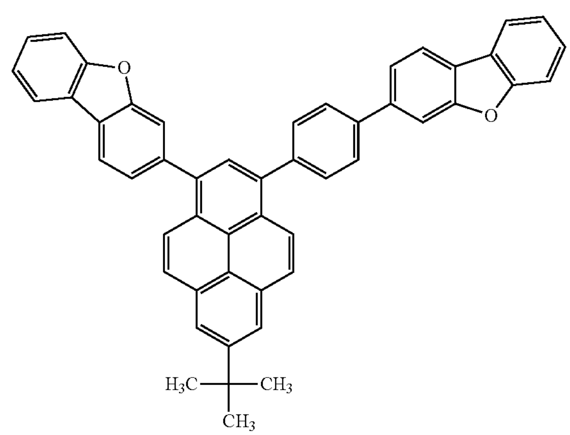

-continued
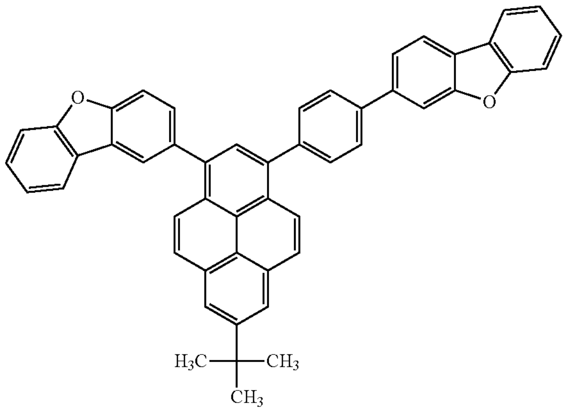
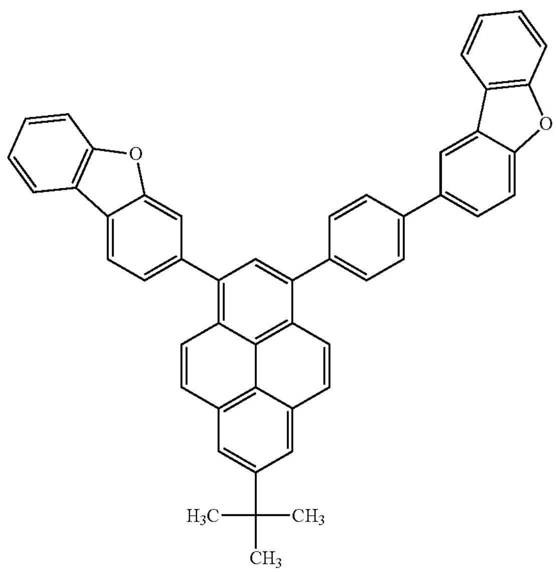
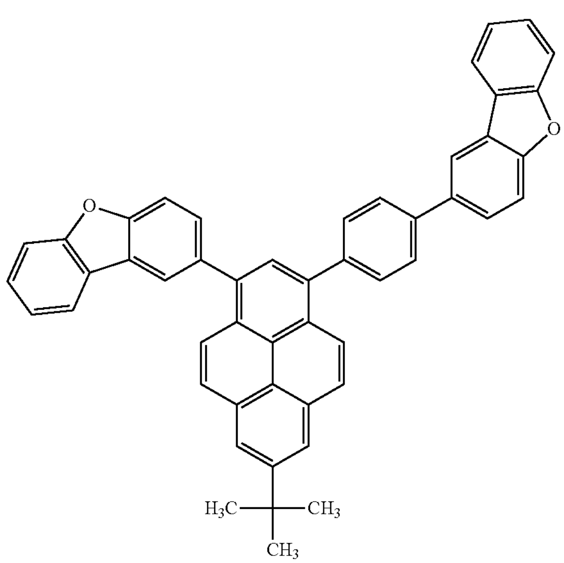
-continued
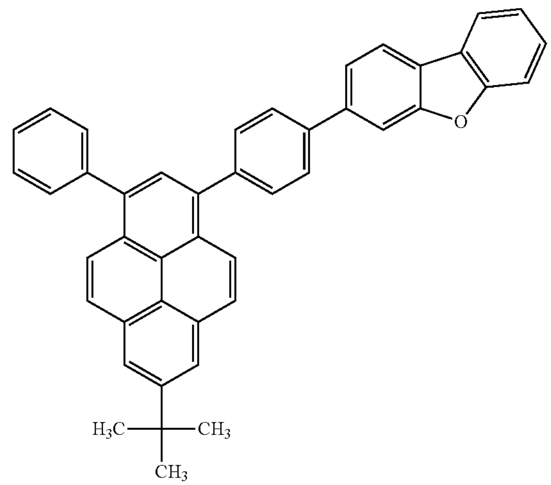
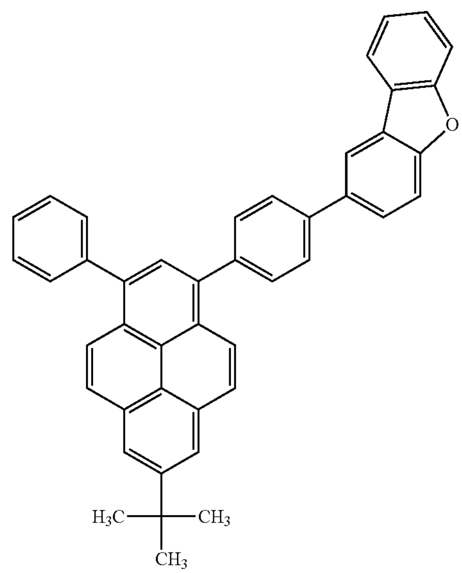
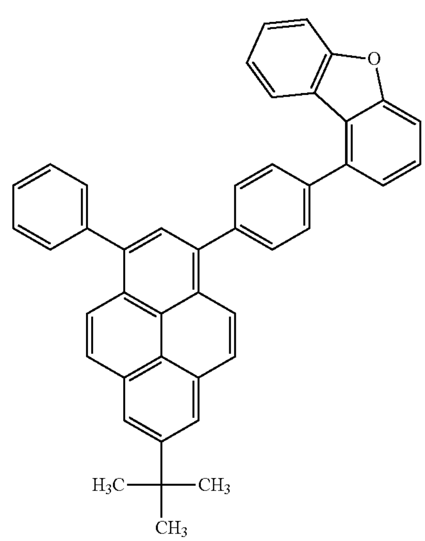

-continued
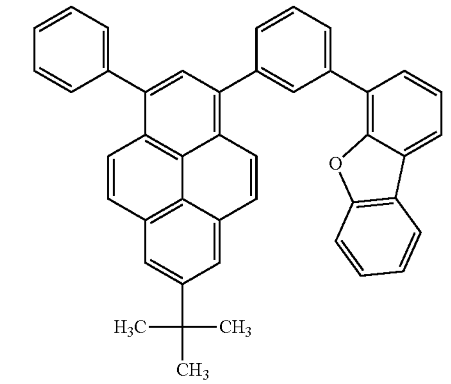
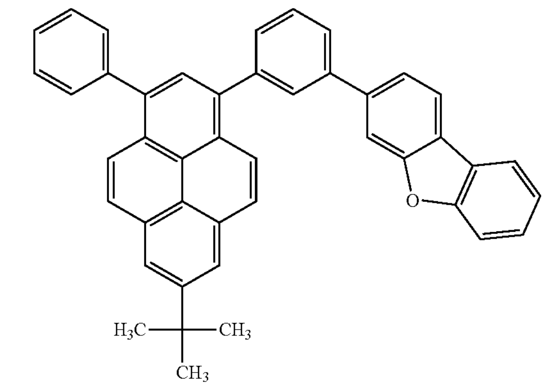
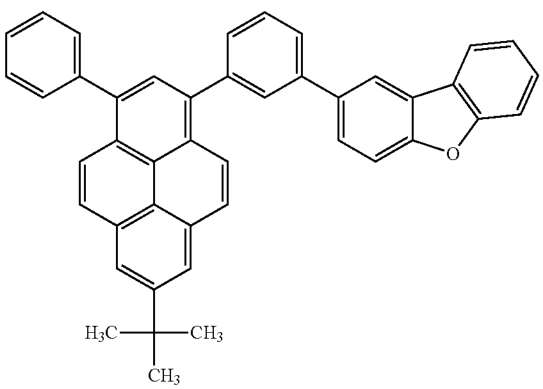
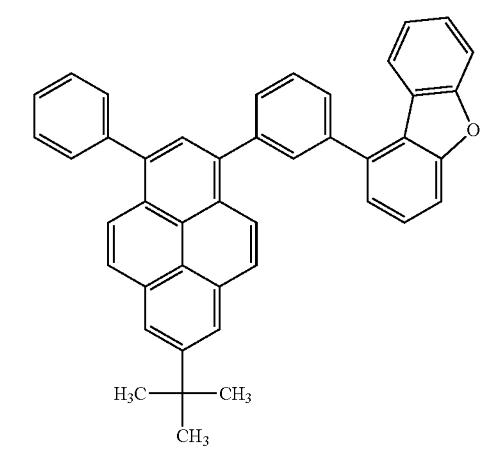
-continued
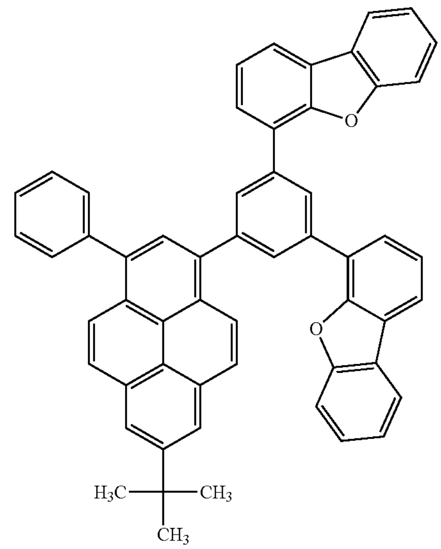
[Formula 29]
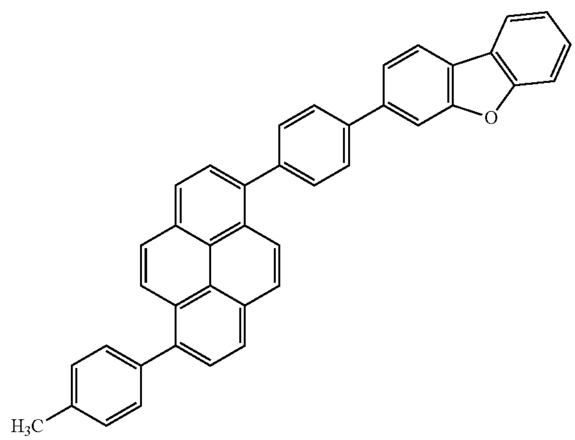
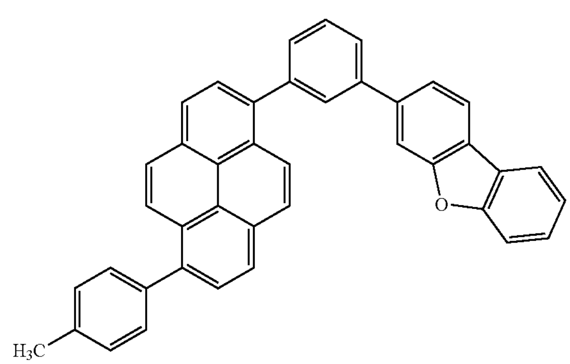

-continued
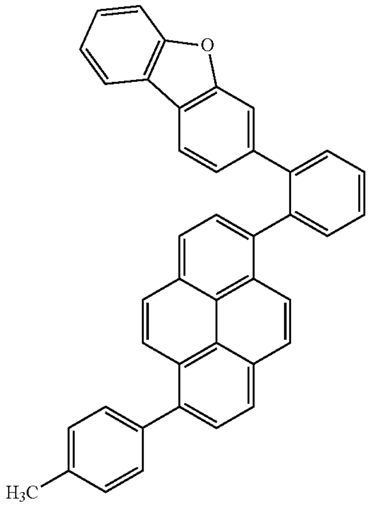
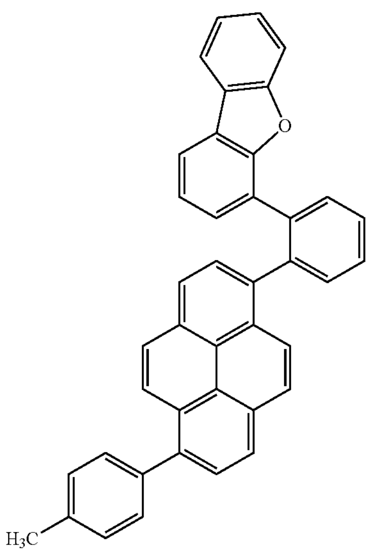
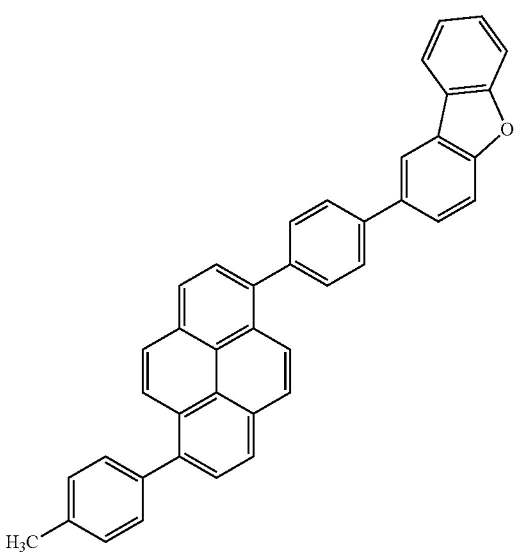
-continued
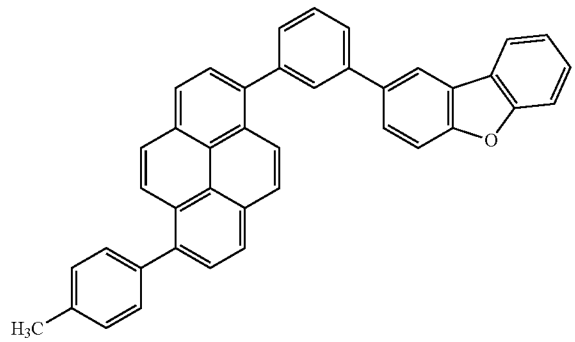
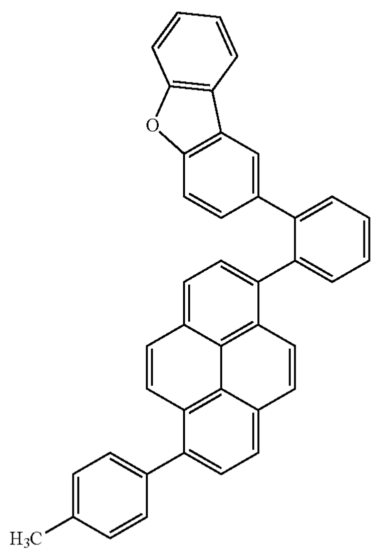
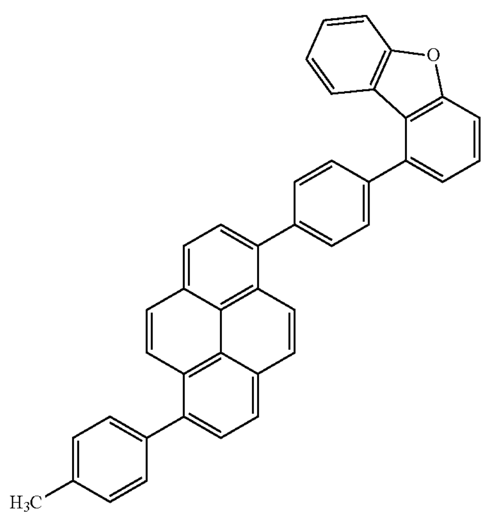

-continued
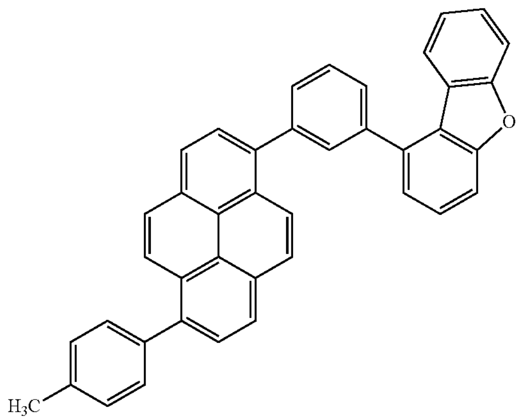
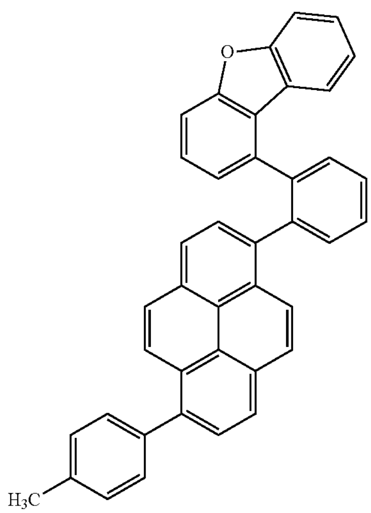
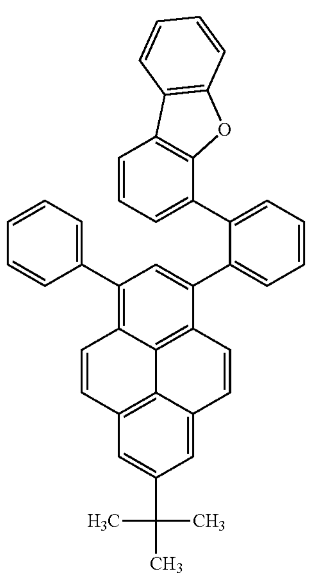
-continued
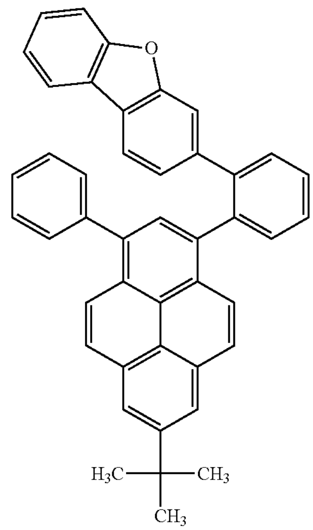
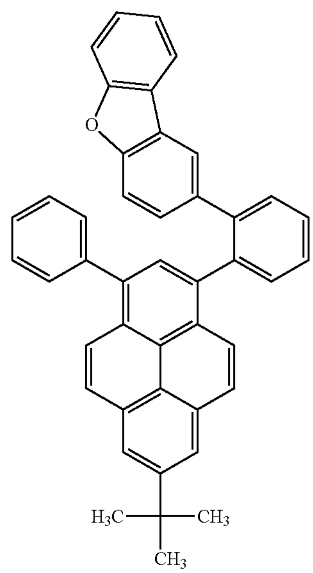
[Formula 30]
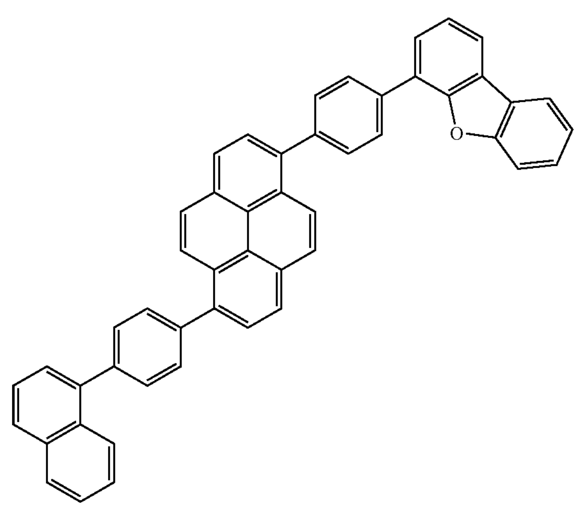

-continued
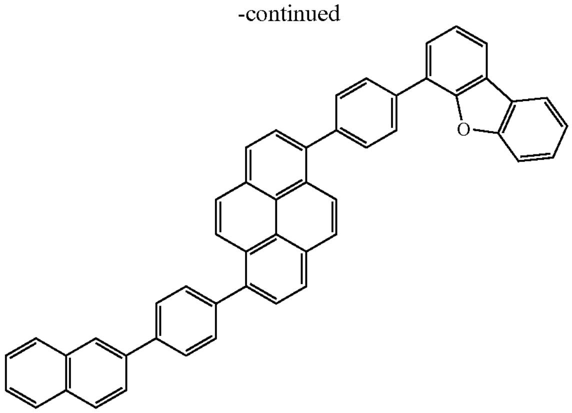
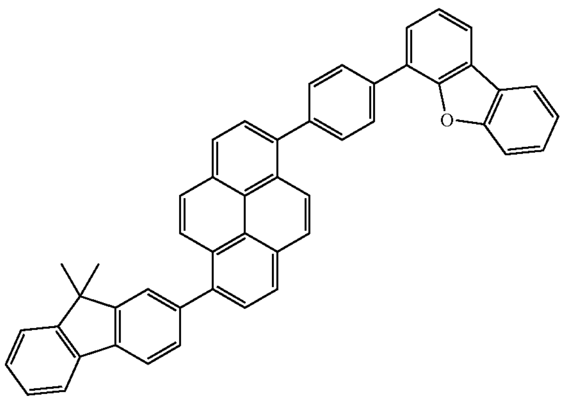
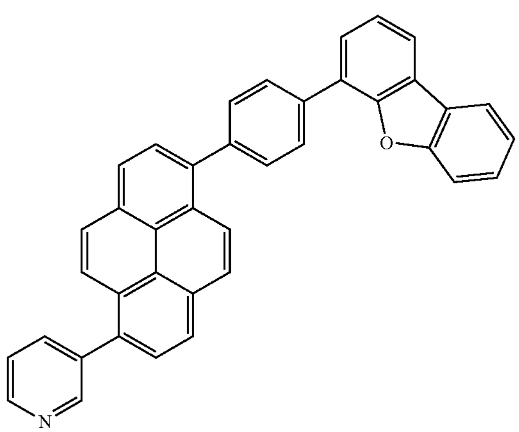
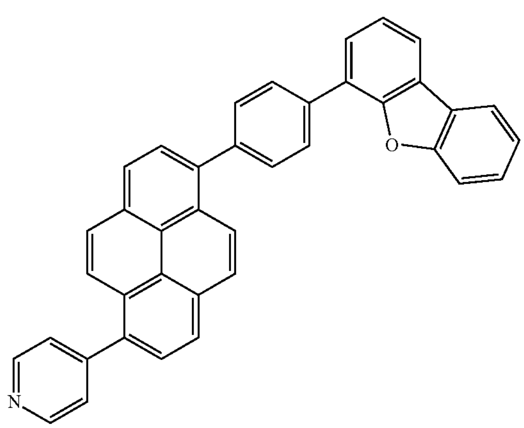
-continued
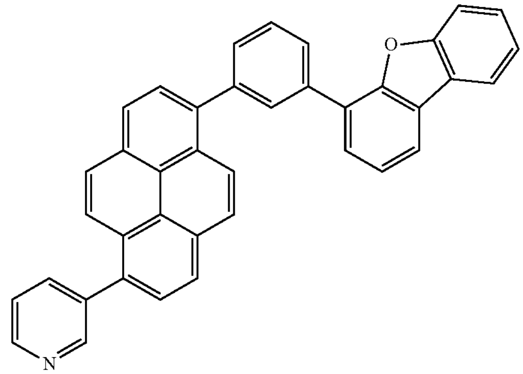
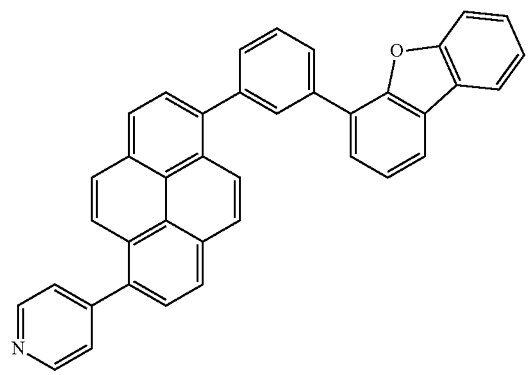
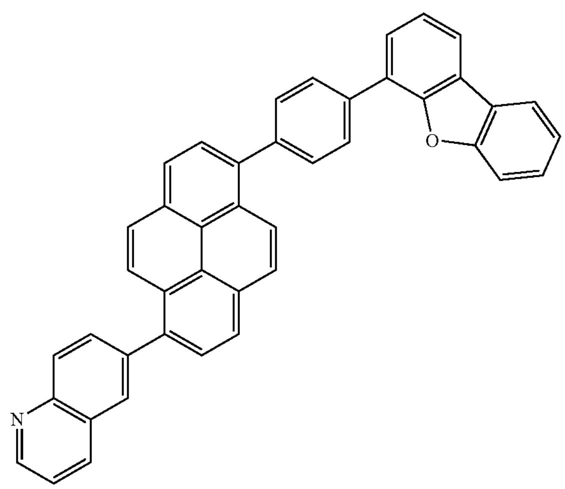
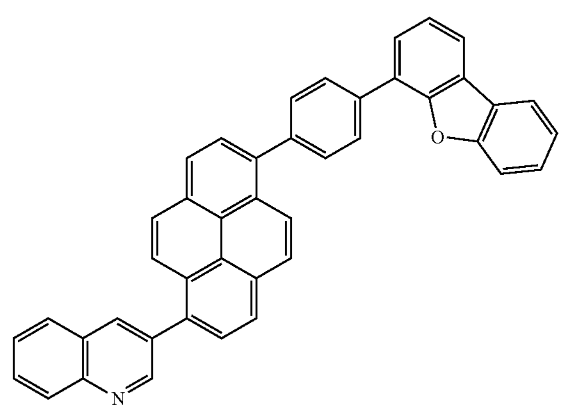

-continued
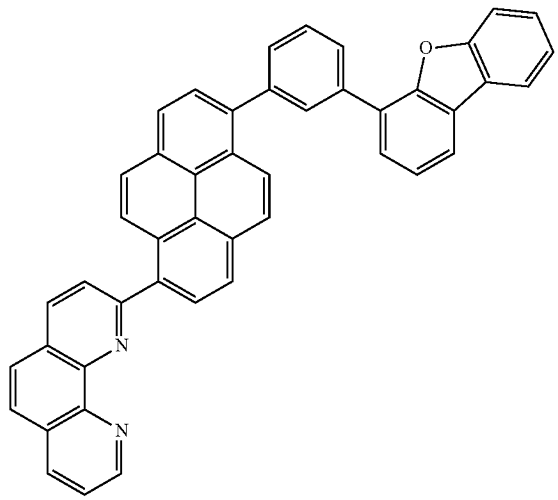
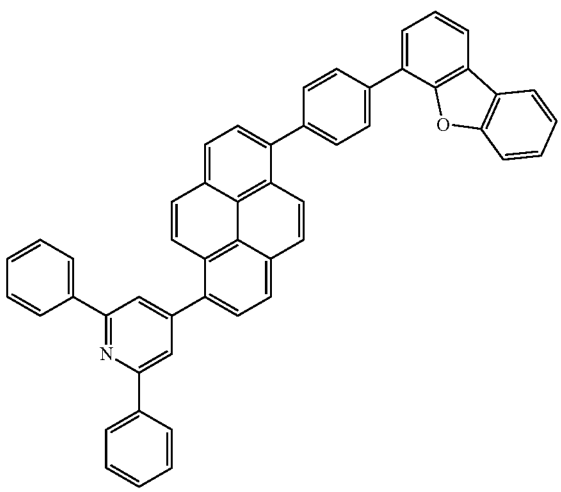
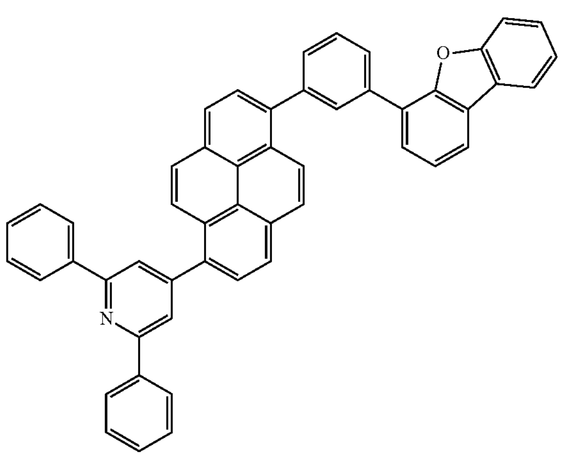
-continued
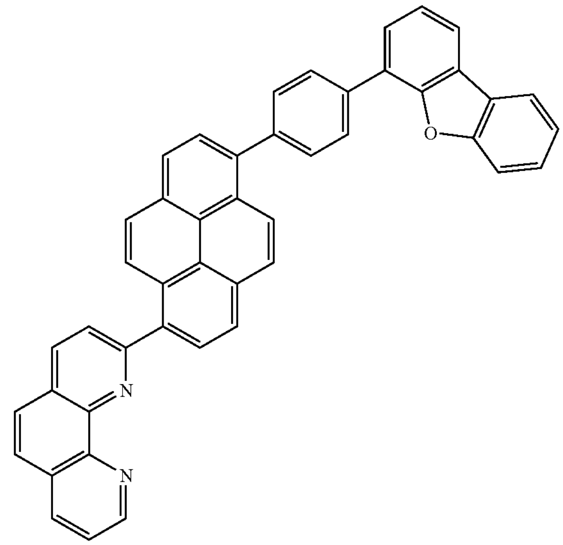
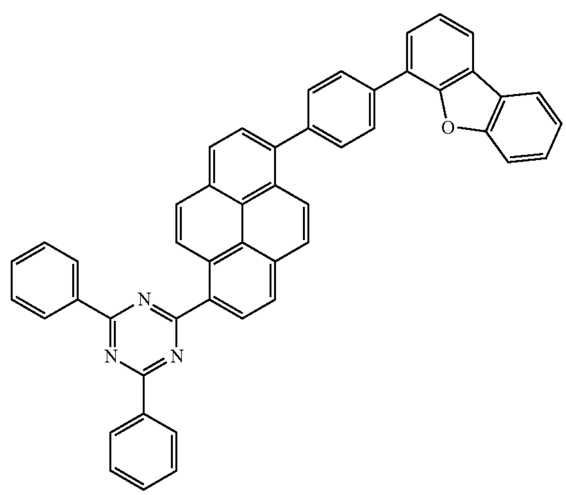
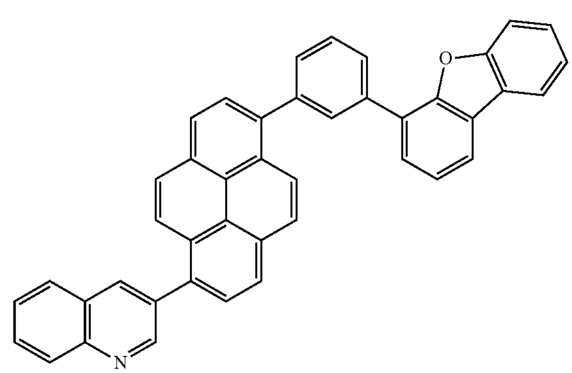

-continued
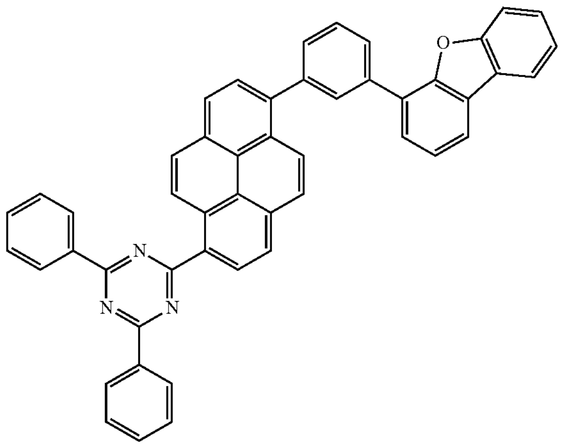
[Formula 31]
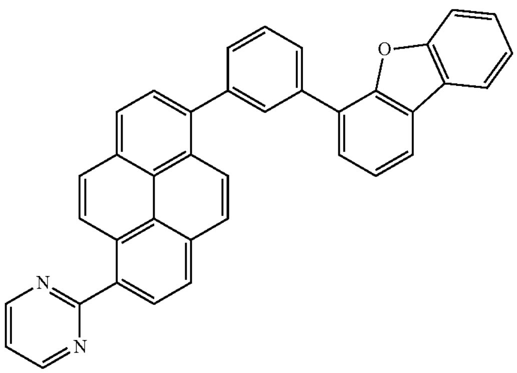
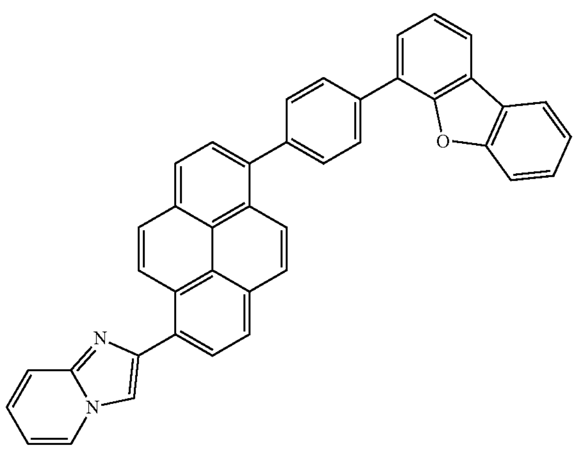
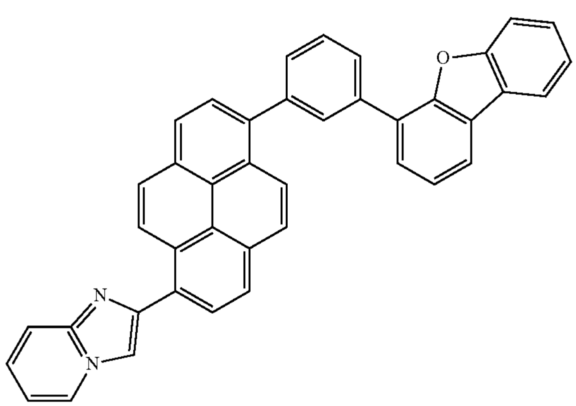
-continued
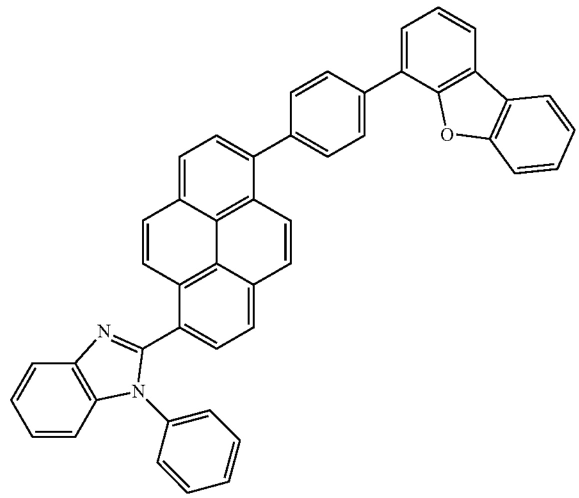
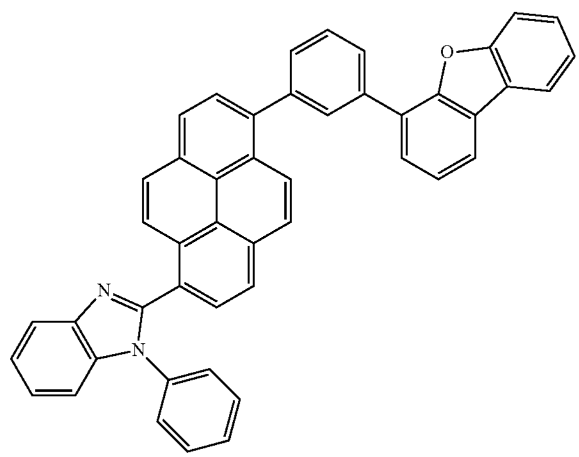
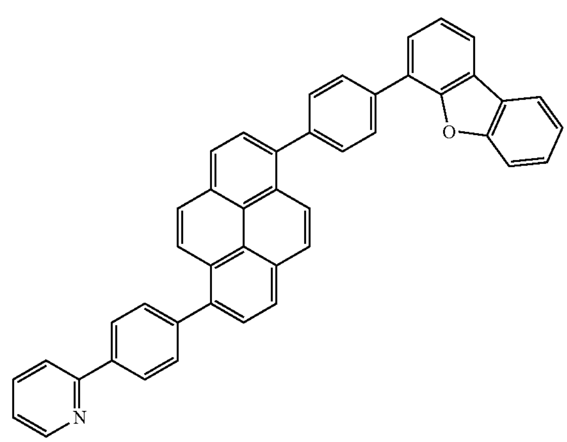

-continued
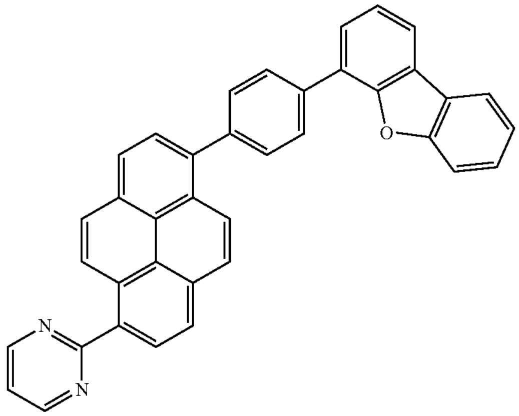
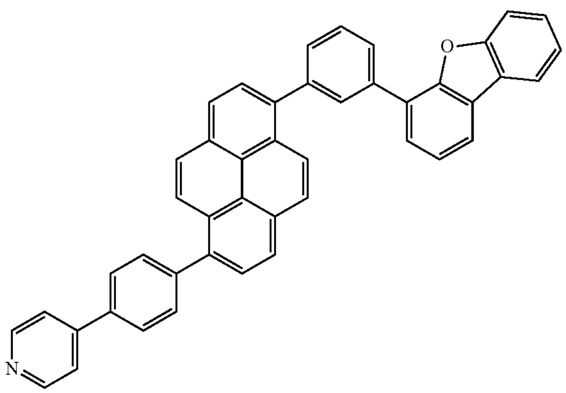
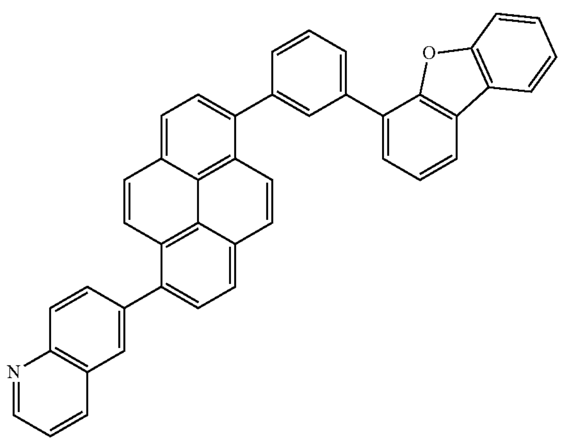
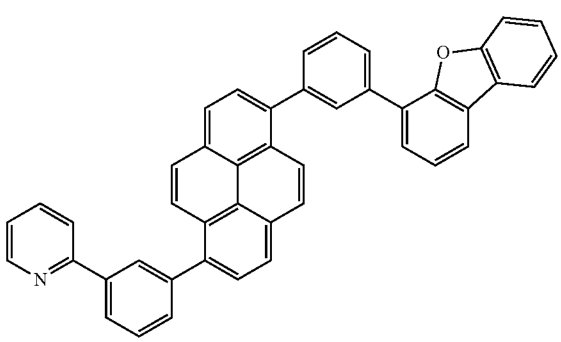
-continued
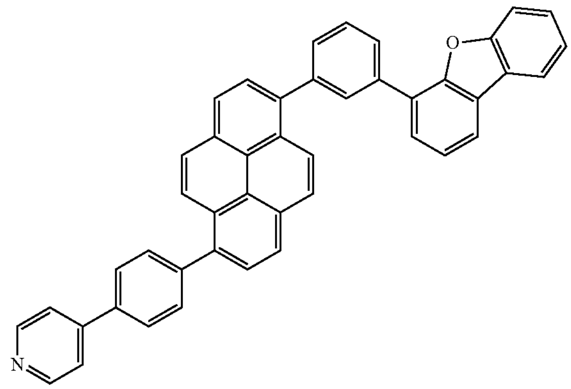
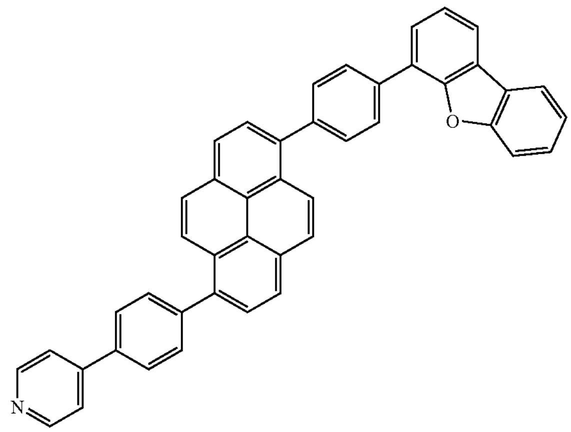
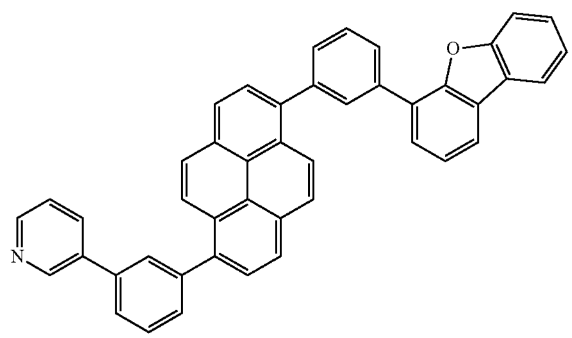
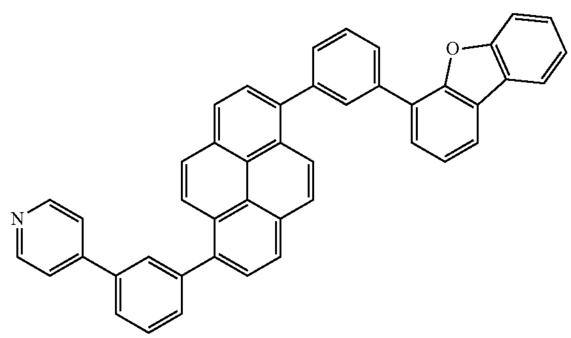

-continued
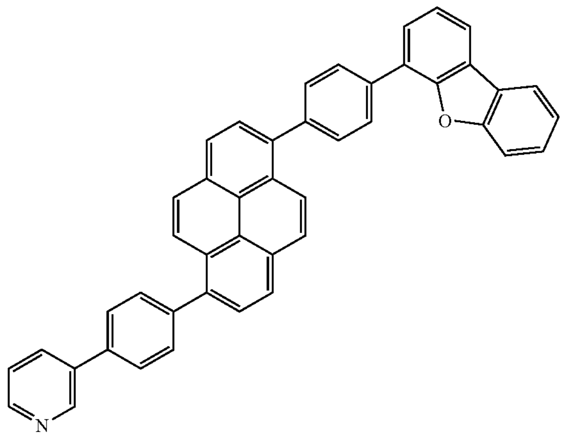
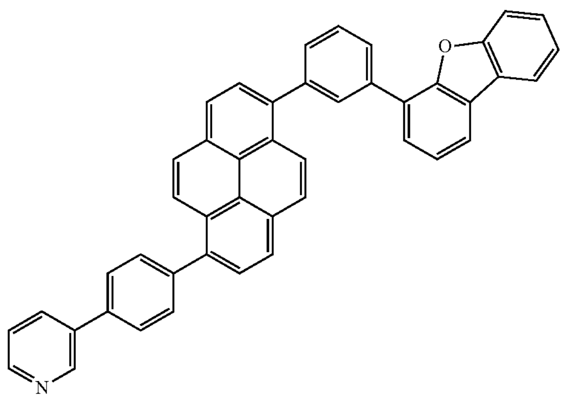
[Formula 32]
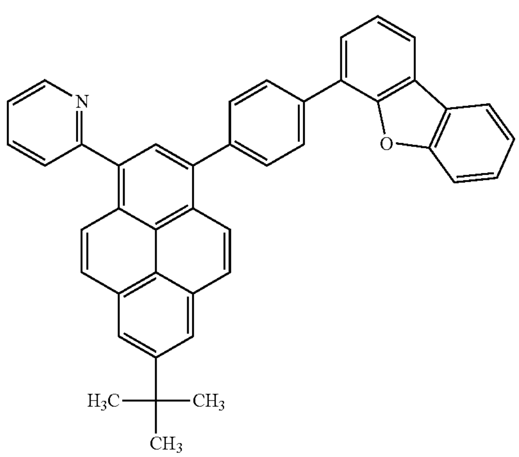
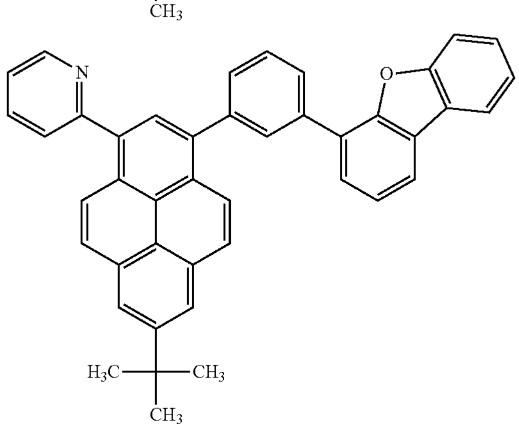
-continued
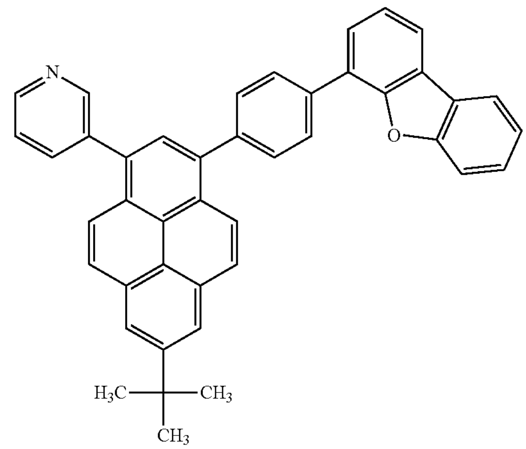
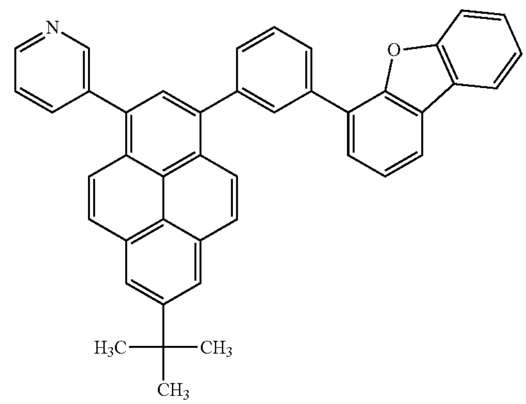
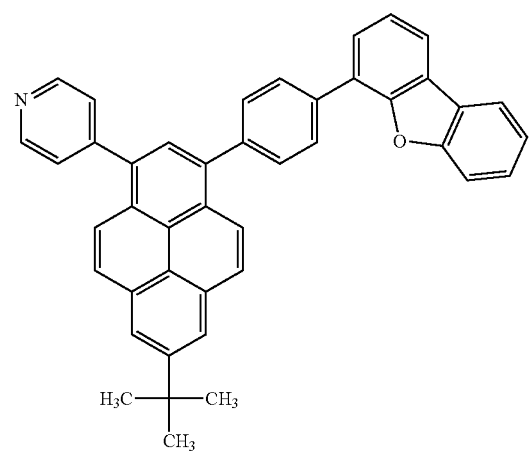
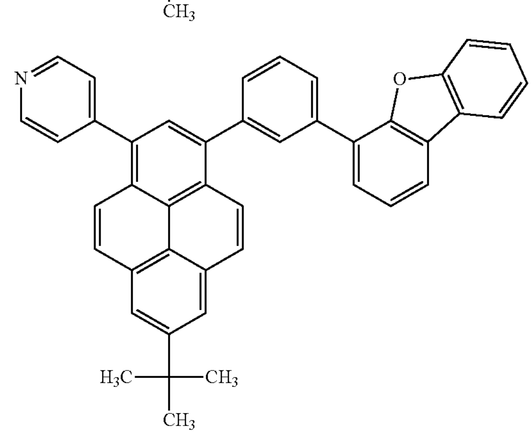

-continued
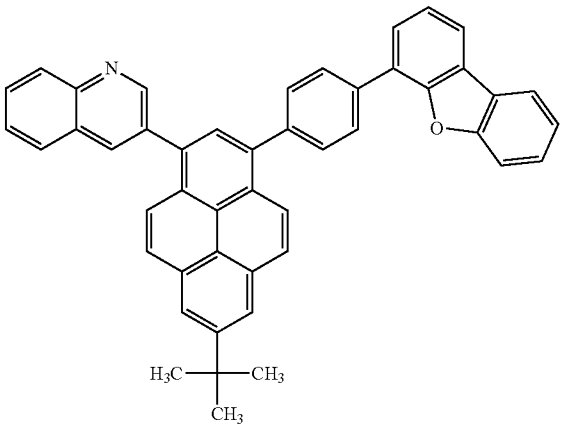
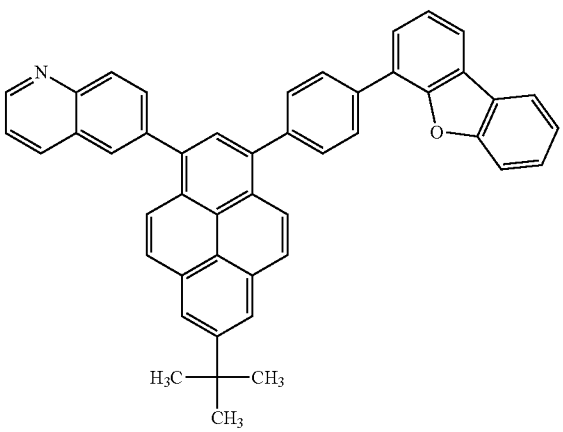
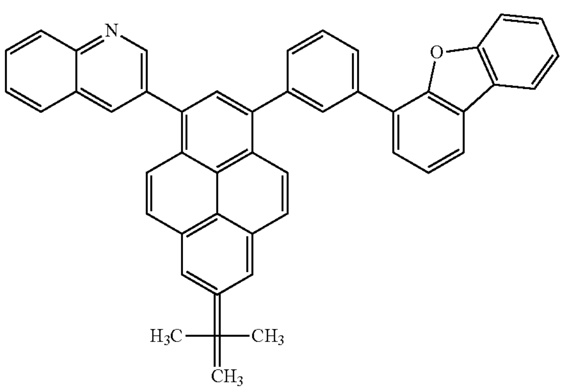
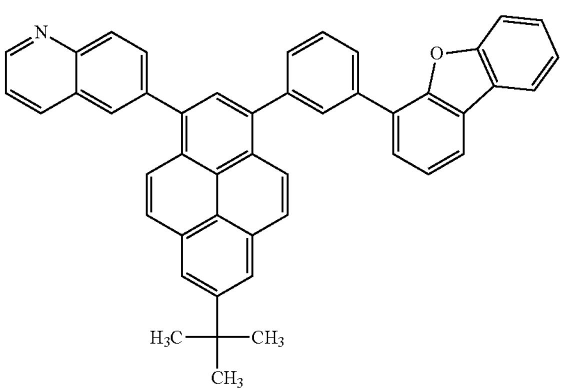
-continued
[Formula 33]
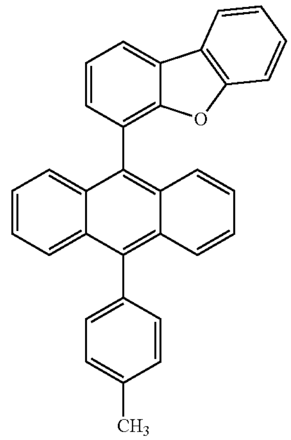
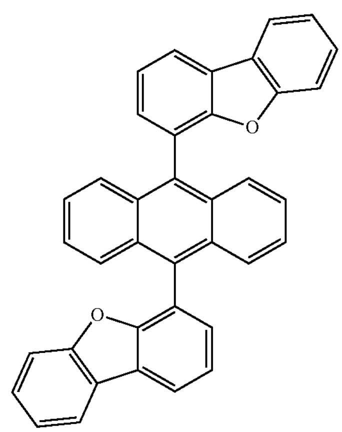
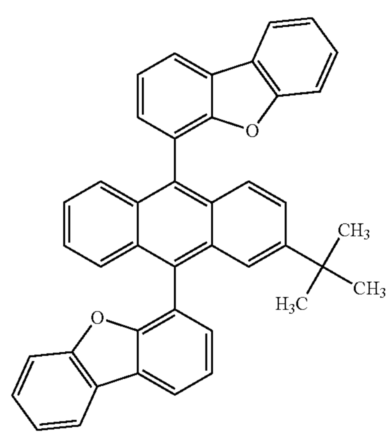

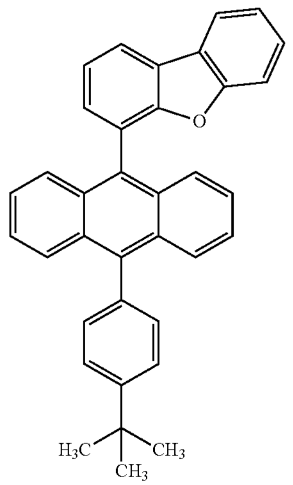
O
H3C
CH3
CH3
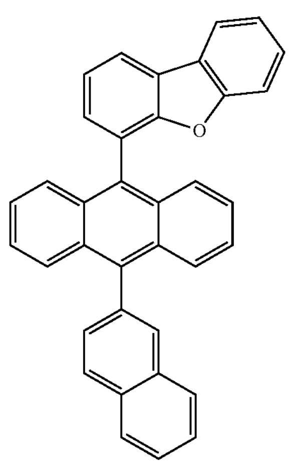
O
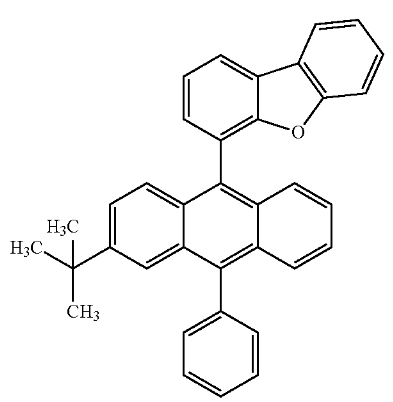
O
H3C
H3C
CH3
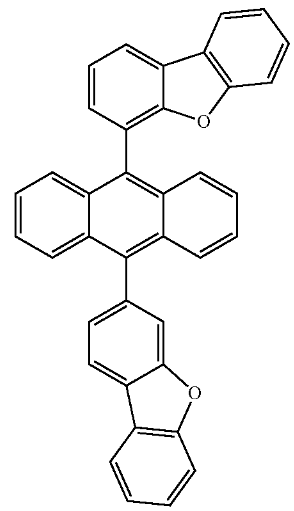
O
O
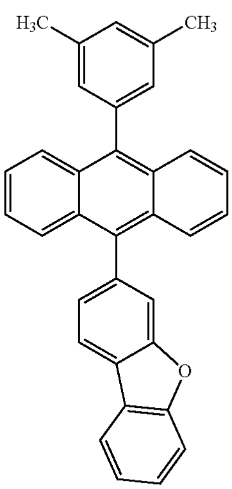
H3C
CH3
O
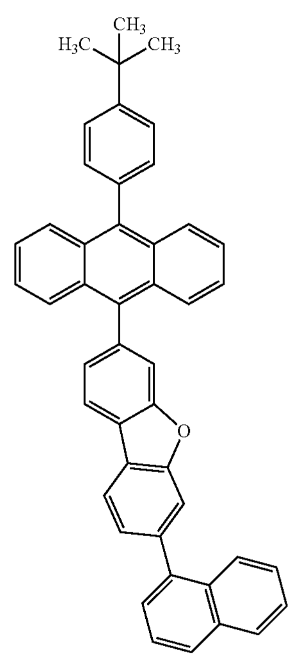
CH3
H3C
CH3
O -continued
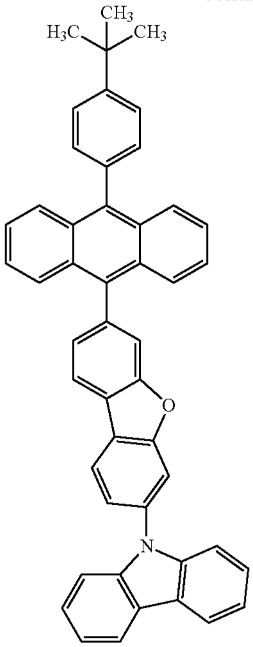
-continued
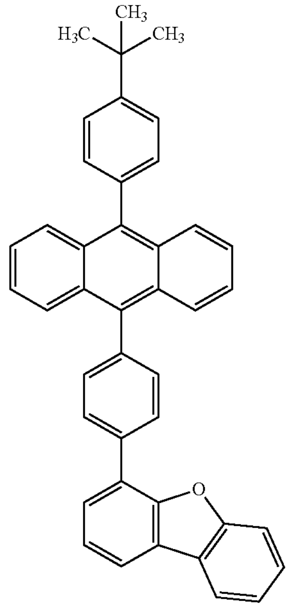
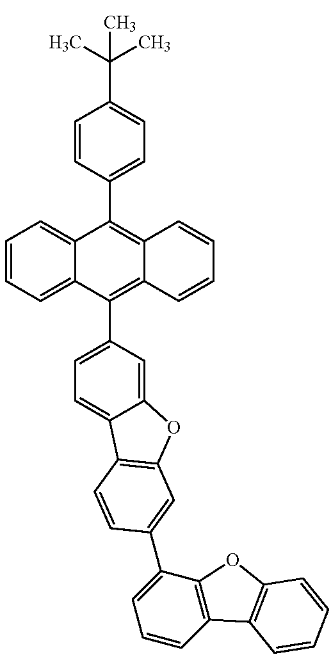
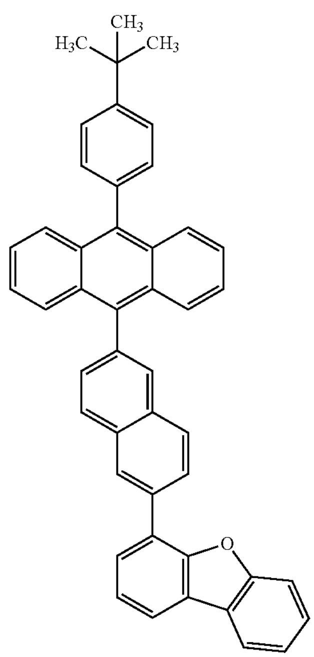

-continued
[Formula 34]
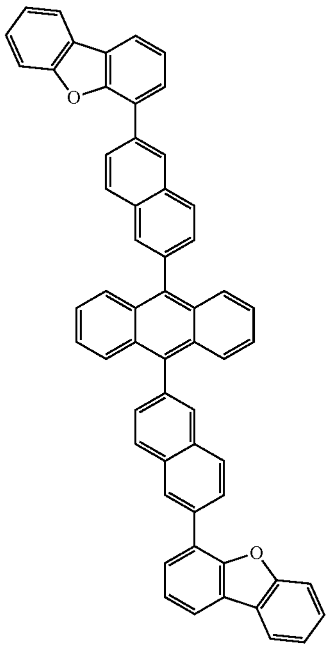
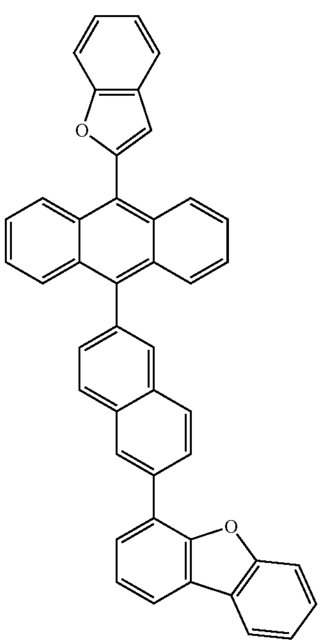
-continued
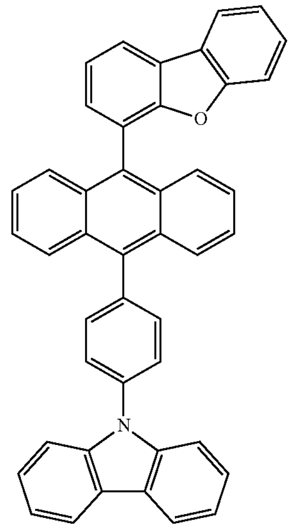
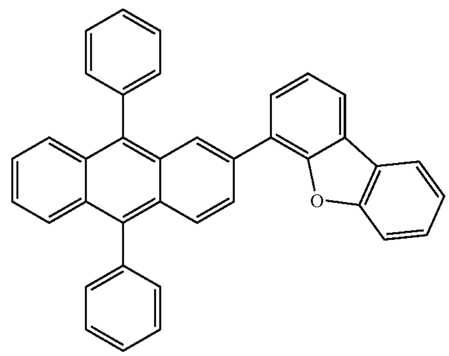
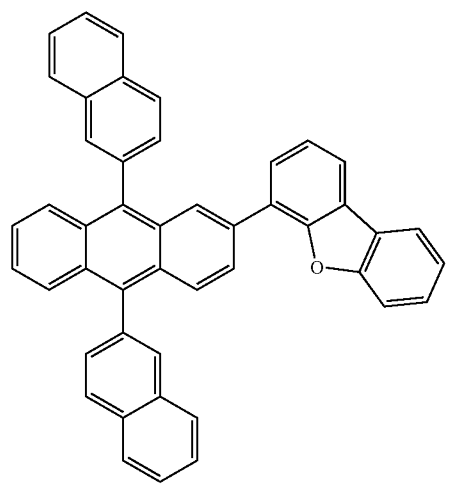
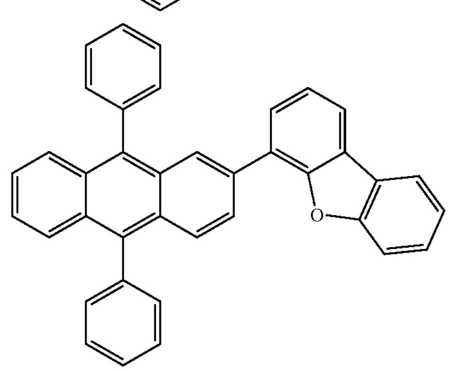

-continued
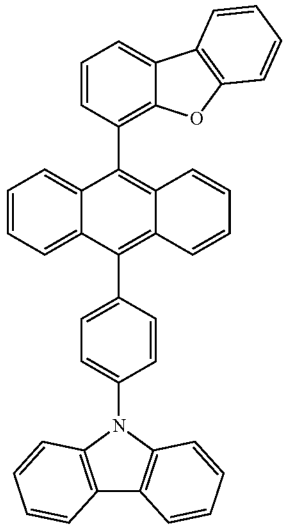
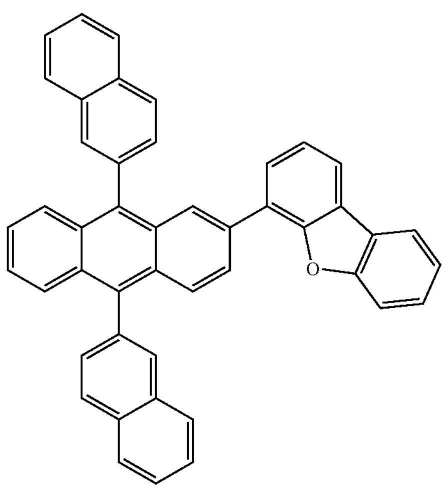
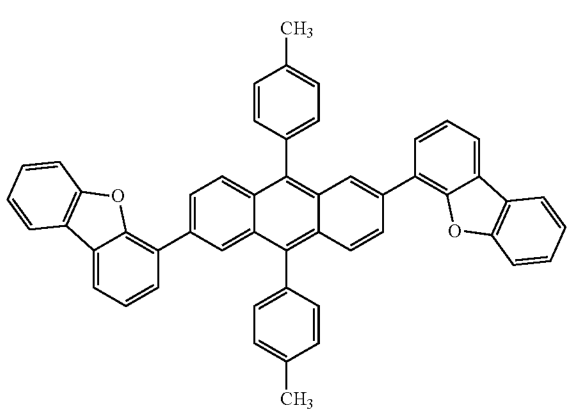
-continued
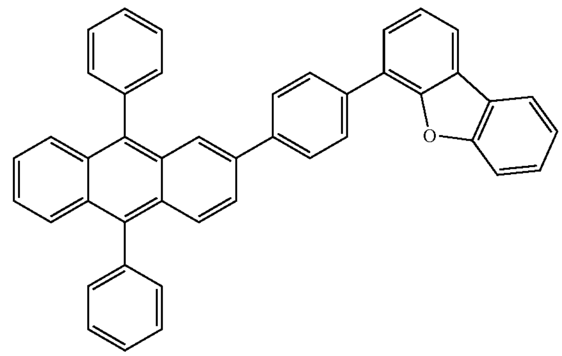
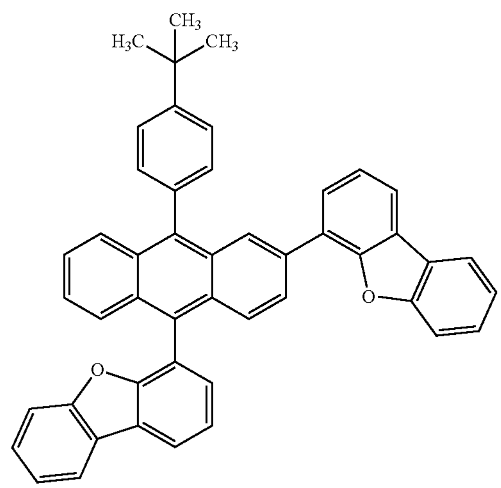
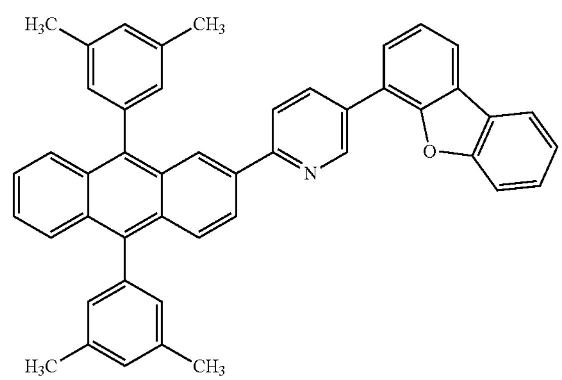
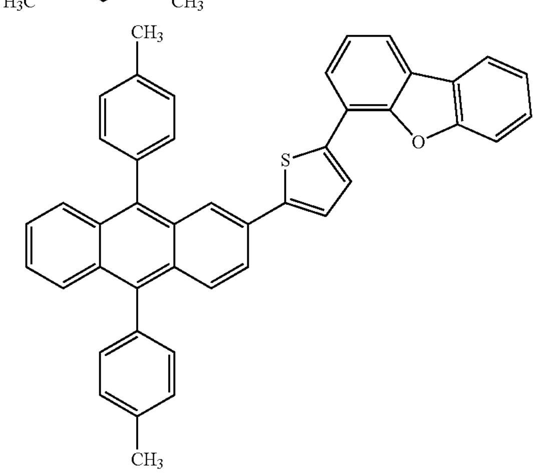

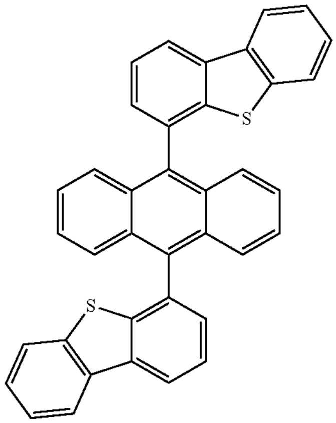
[Formula 35]
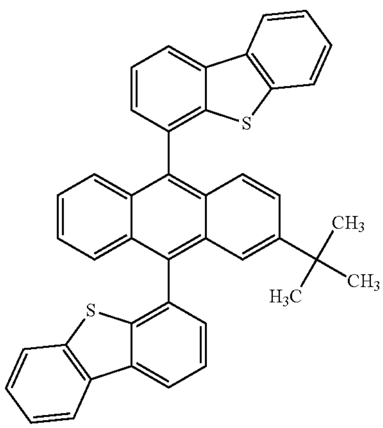
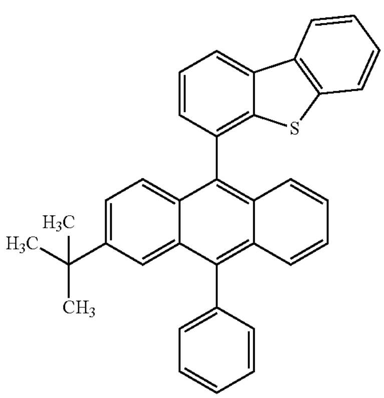
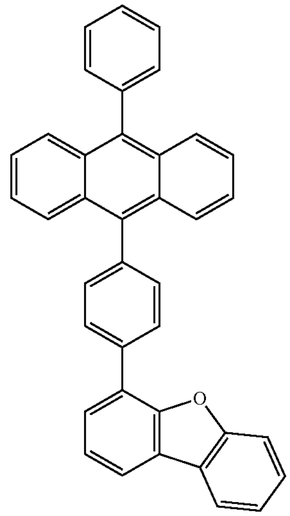
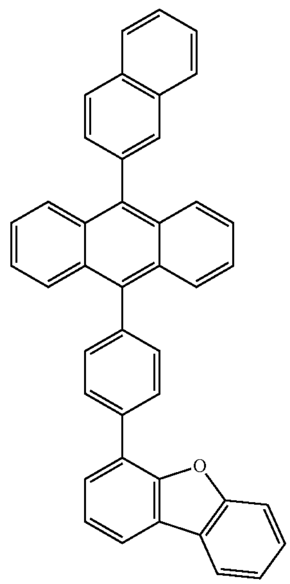
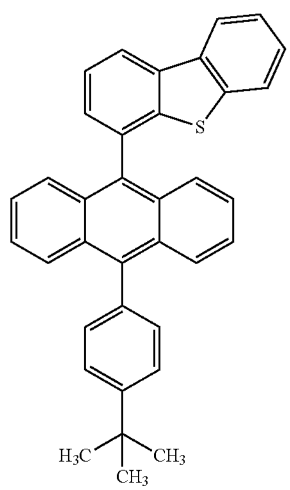

-continued
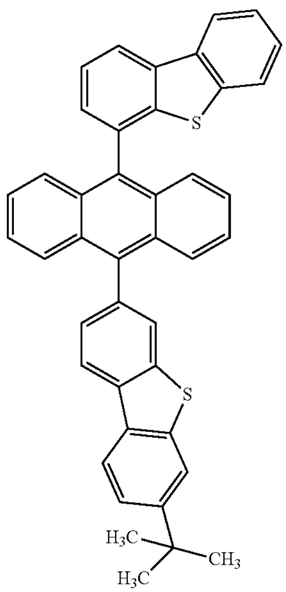
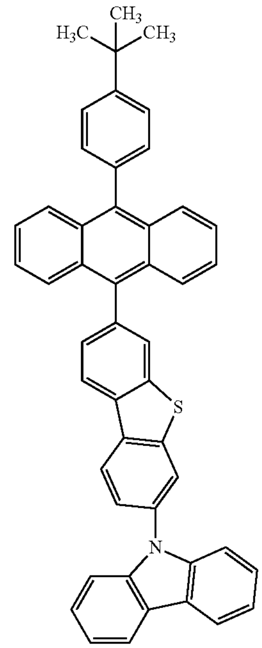
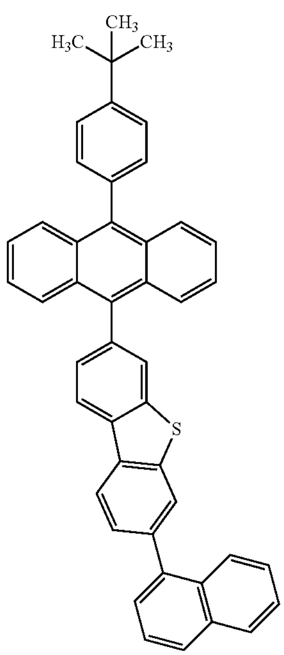
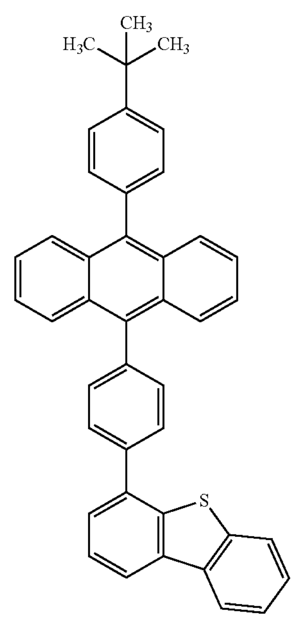

-continued
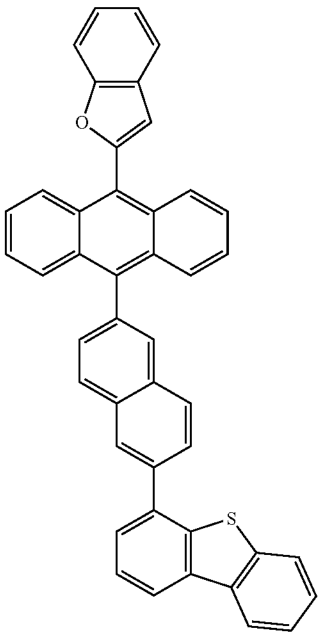
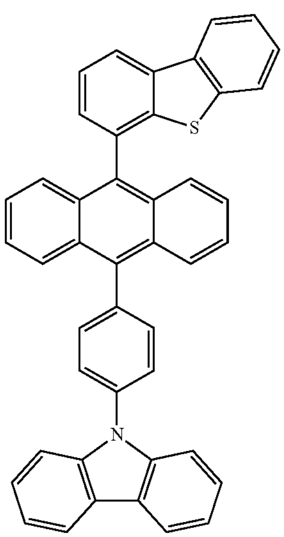
-continued
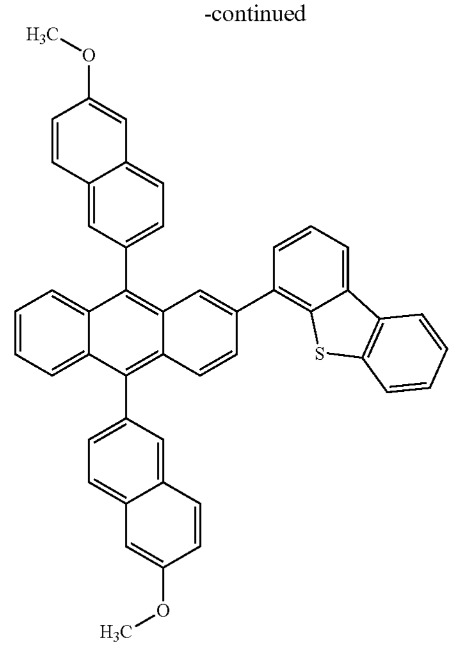
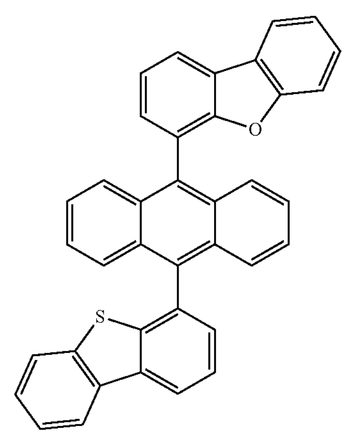
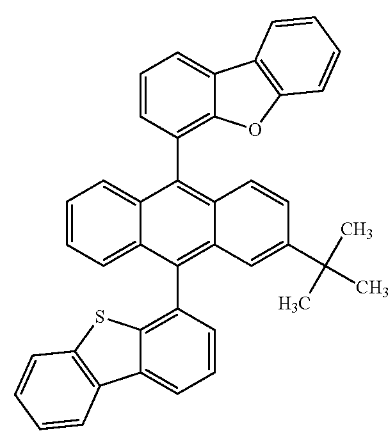

-continued
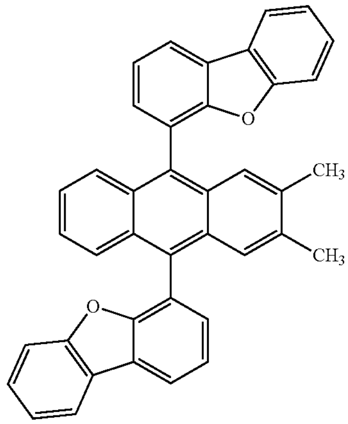
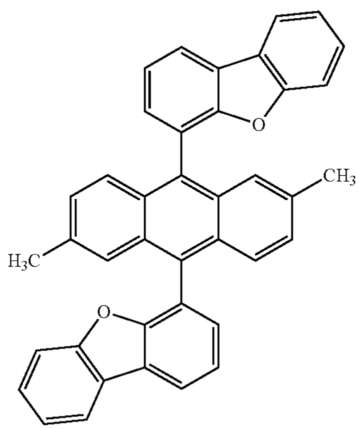
[Formula 36]
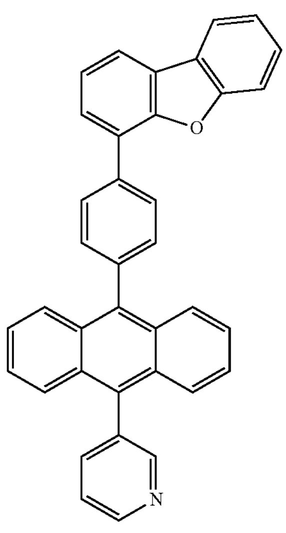
-continued
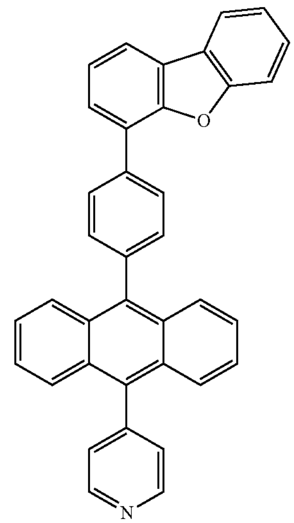
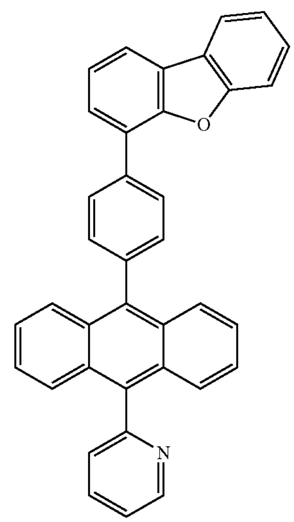
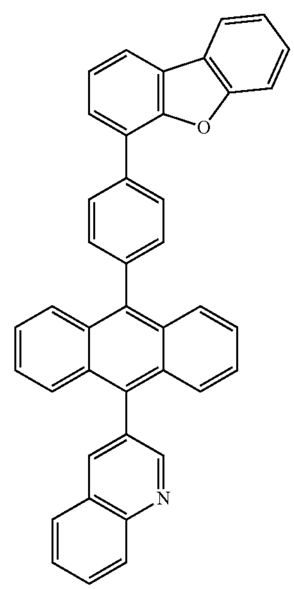

-continued
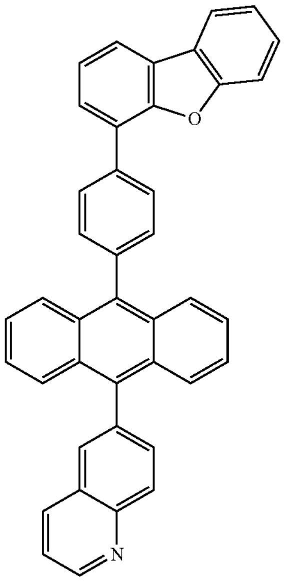
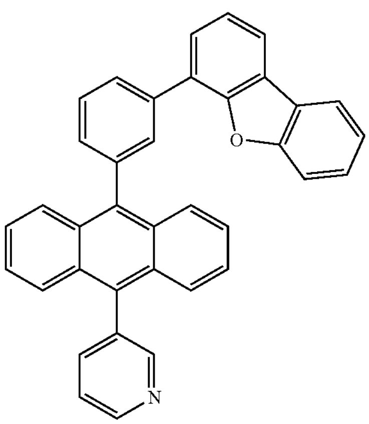
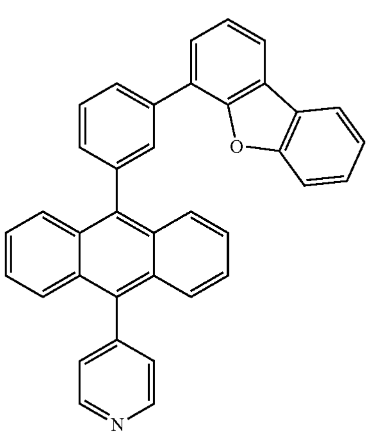
-continued
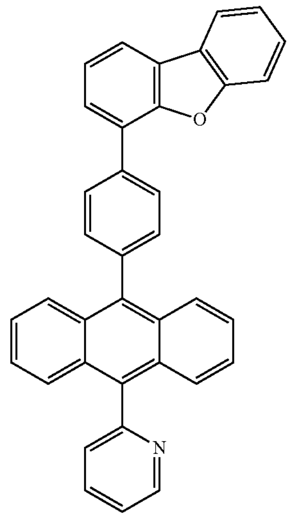
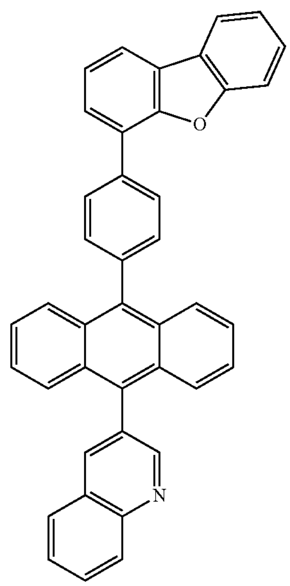
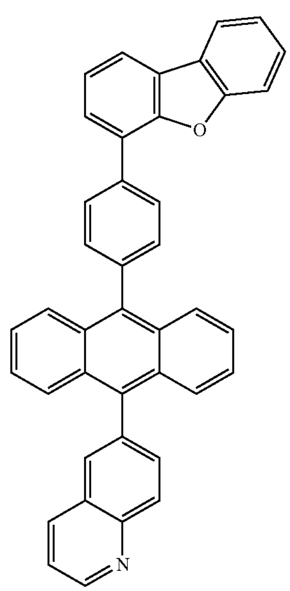

-continued
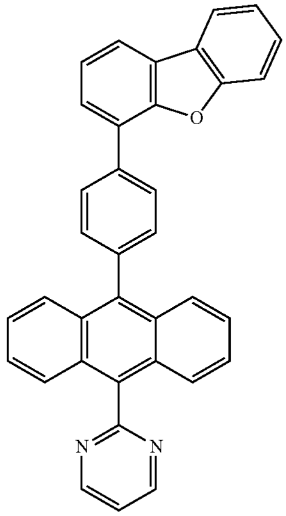
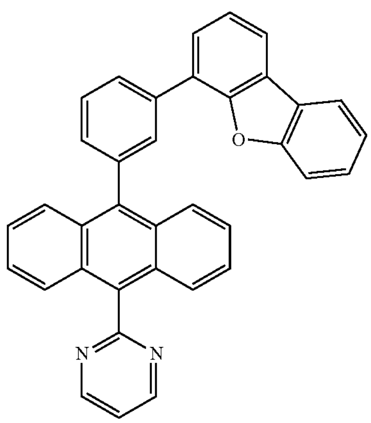
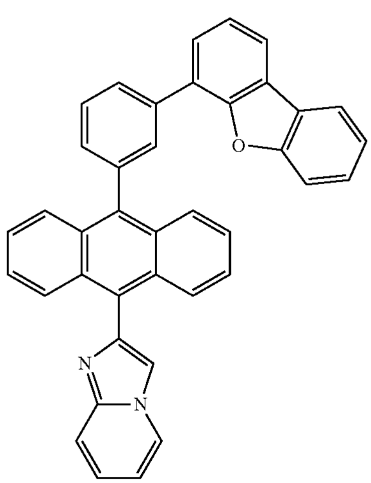
-continued
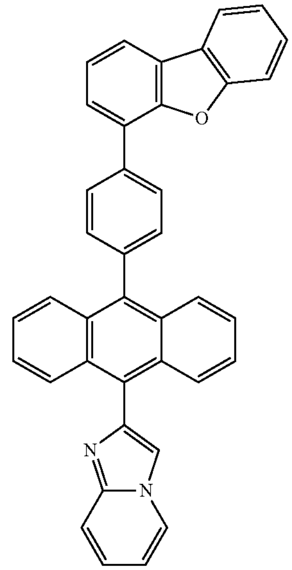
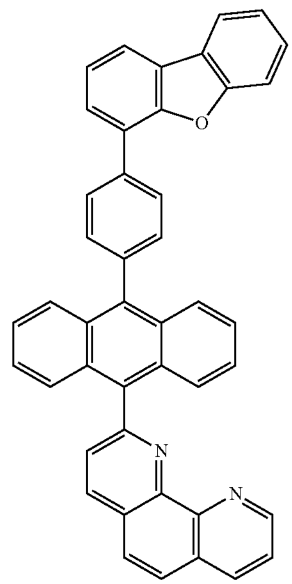
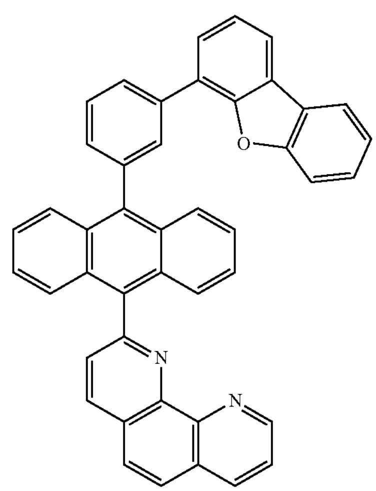

-continued
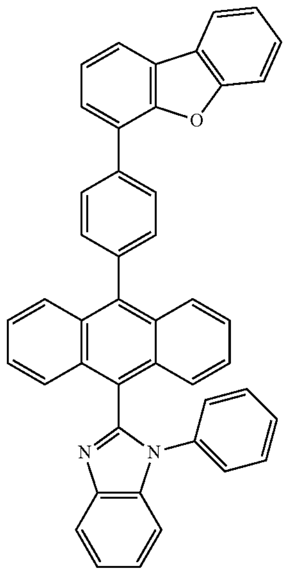
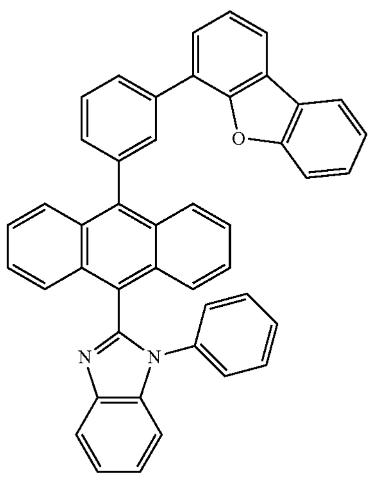
[Formula 37]
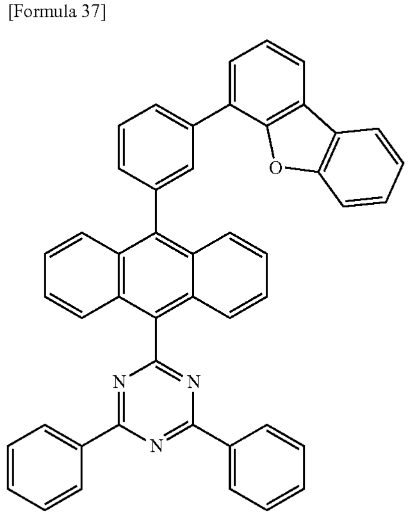
-continued
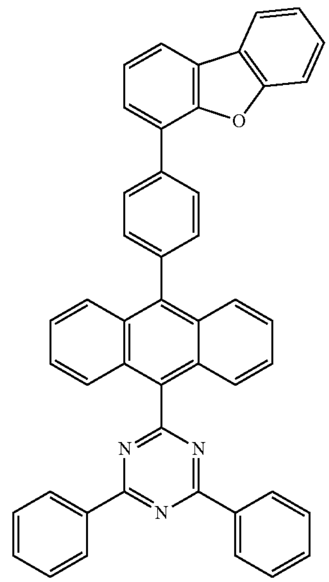
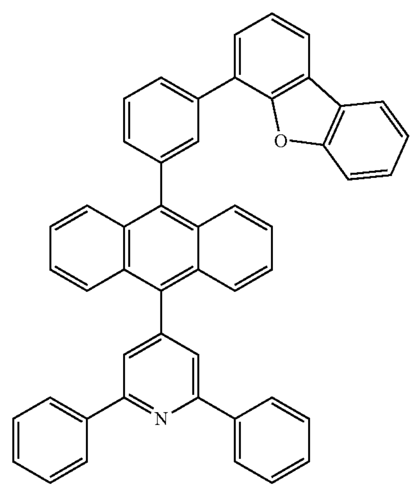
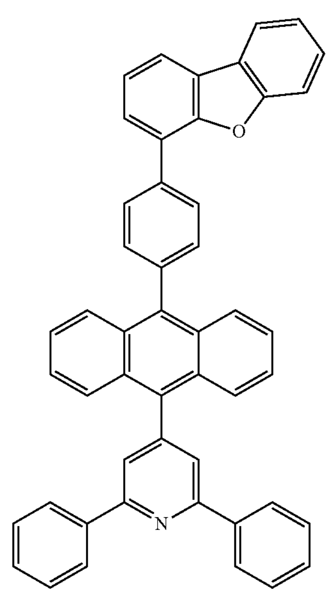

-continued
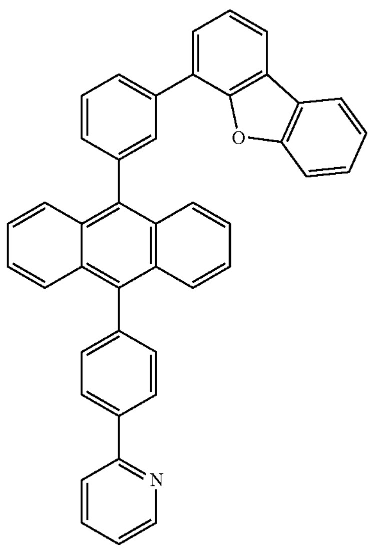
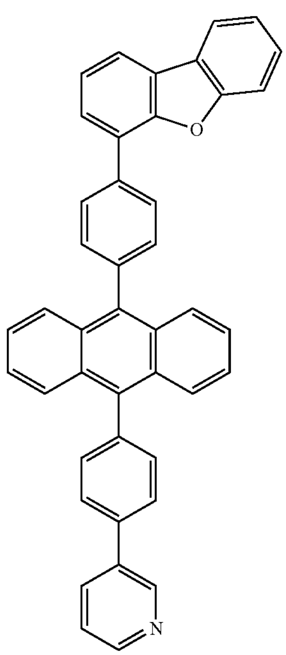
-continued
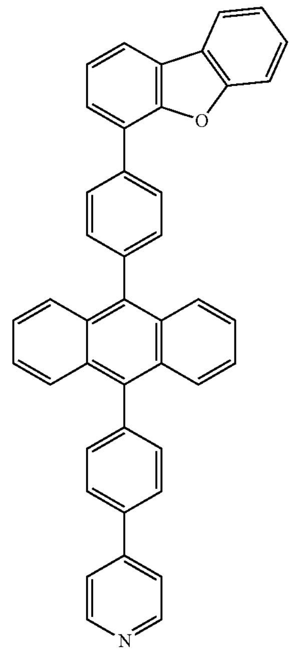
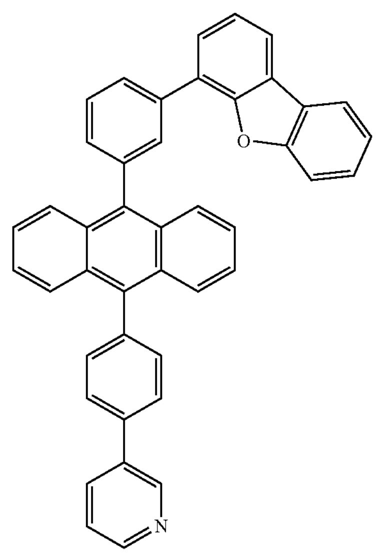
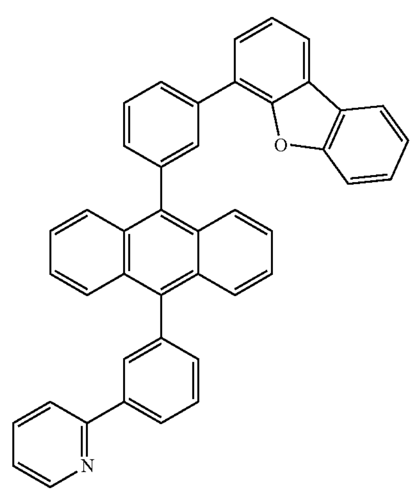

-continued
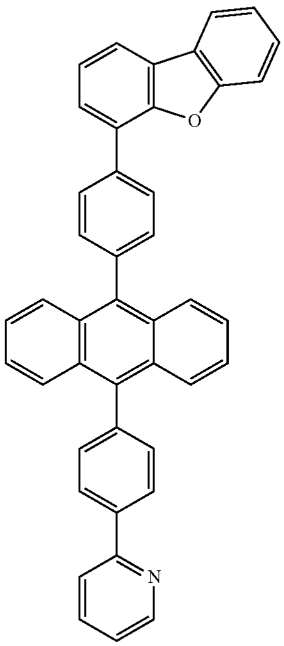
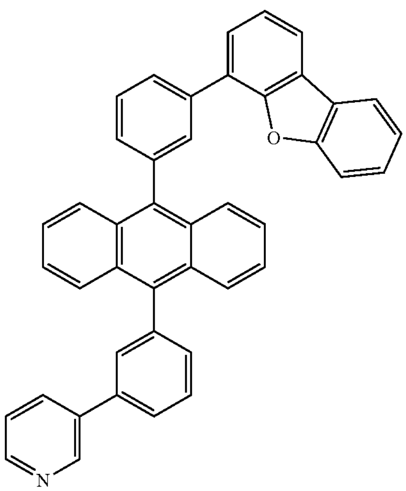
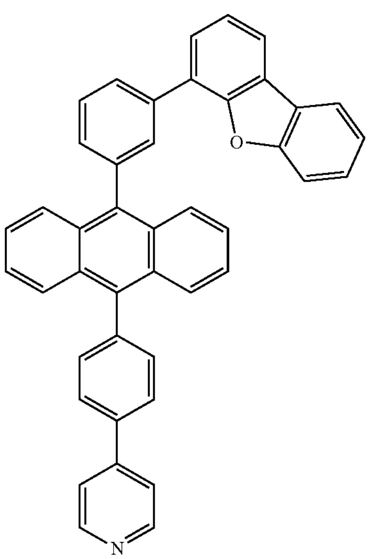
-continued
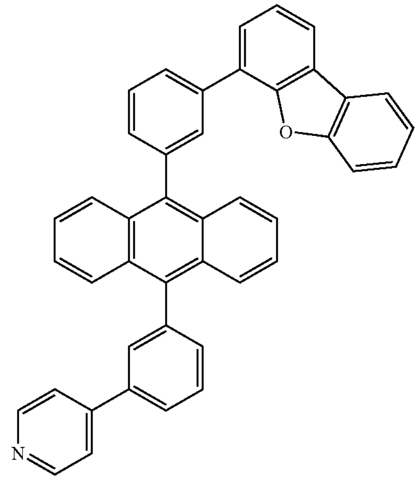
[Formula 38]
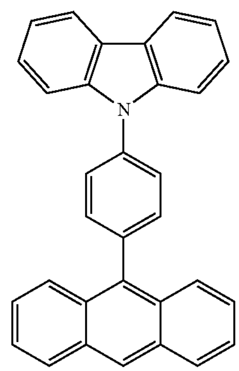
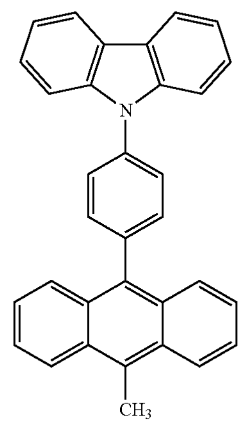
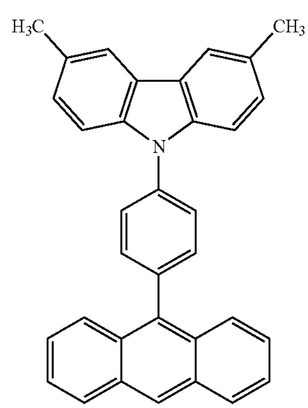

-continued
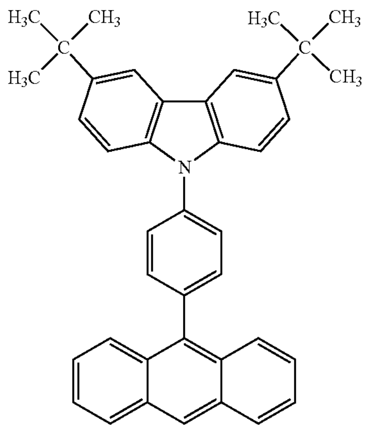
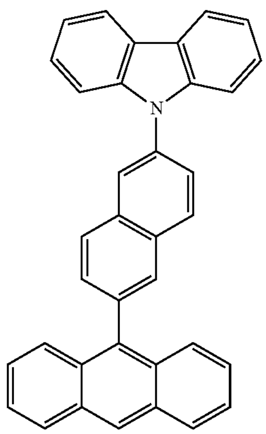
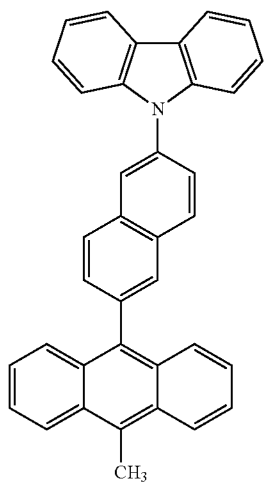
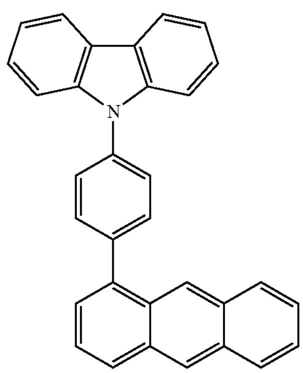
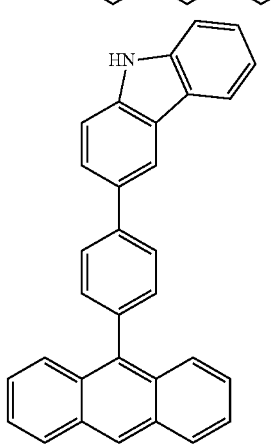
-continued
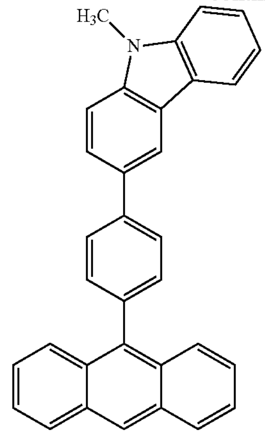
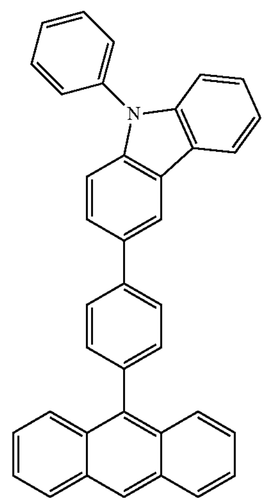
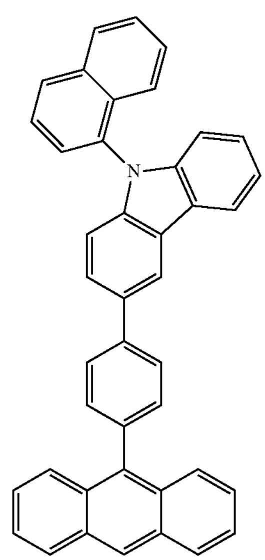

-continued
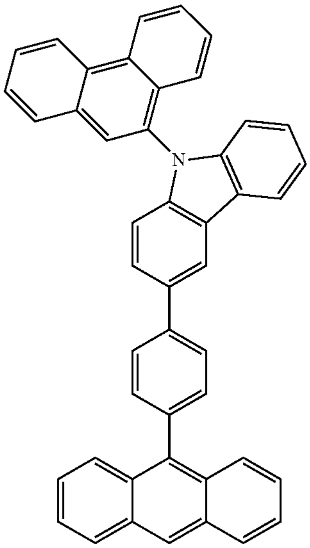
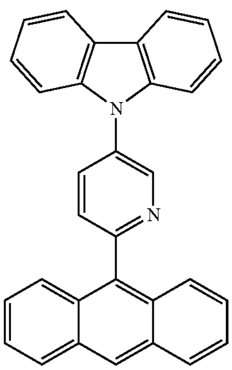
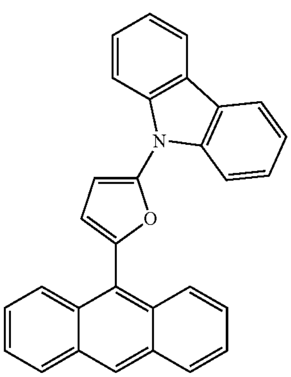
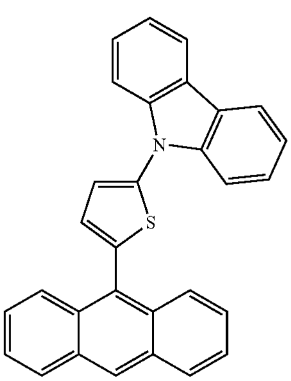
-continued
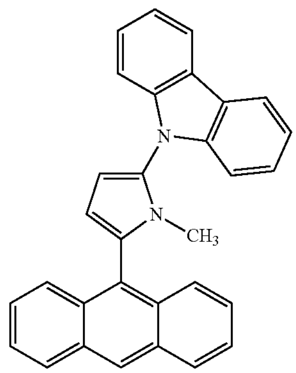
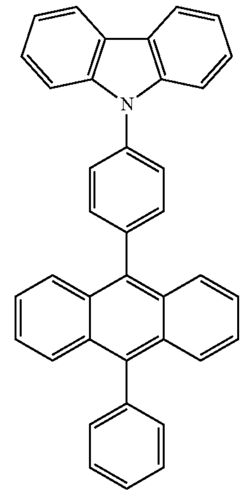
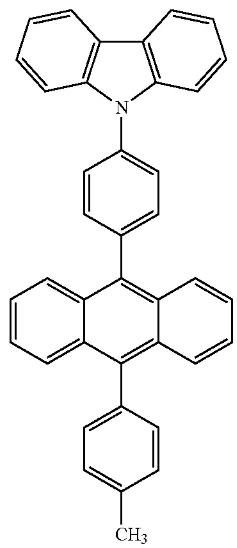
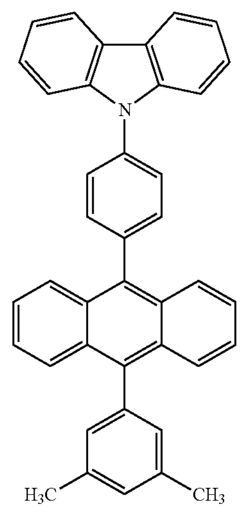
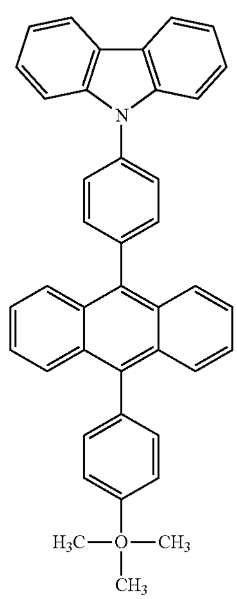
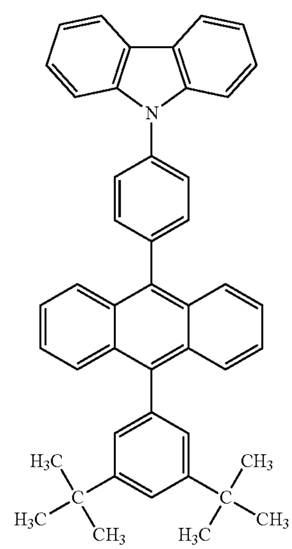

-continued
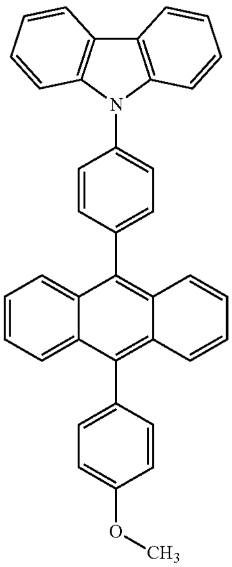
-continued
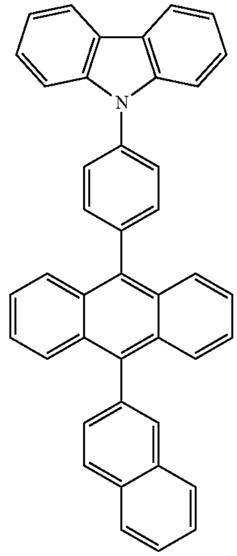
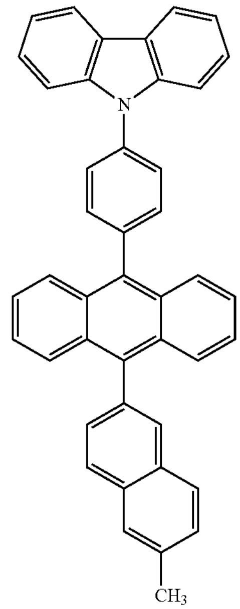
[Formula 39]
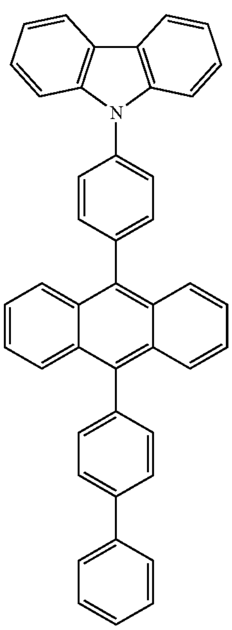
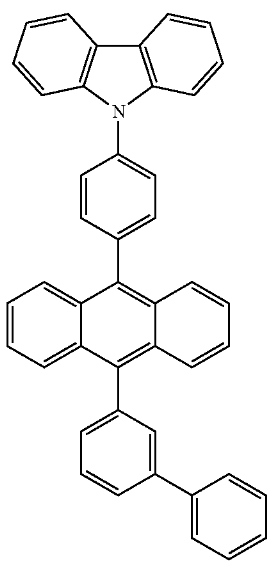
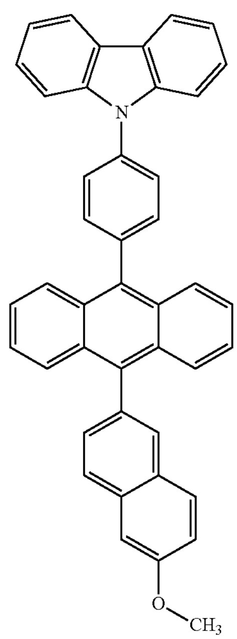
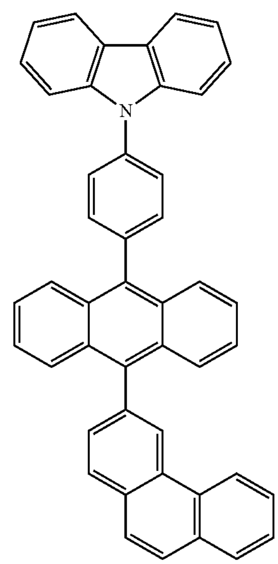

-continued
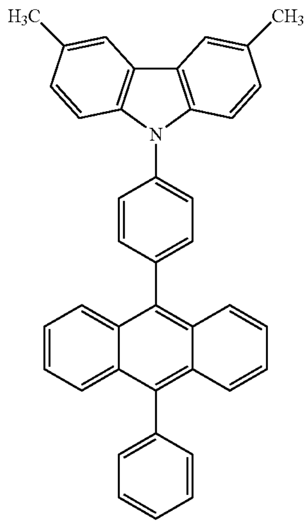
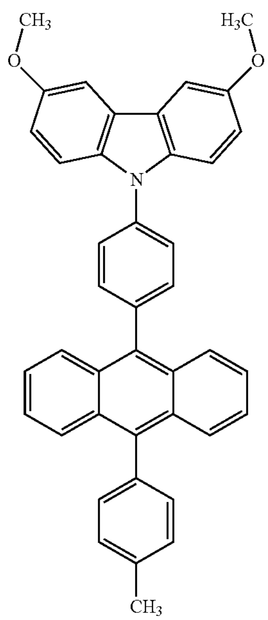
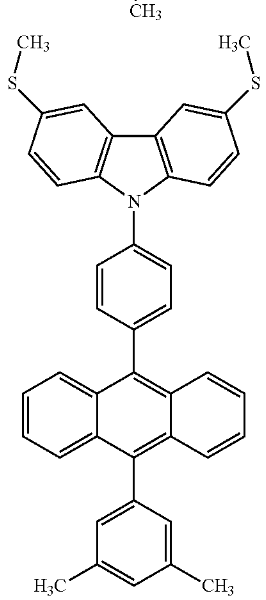
-continued
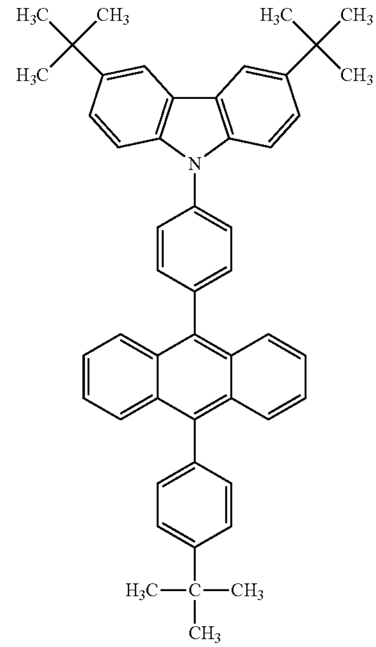
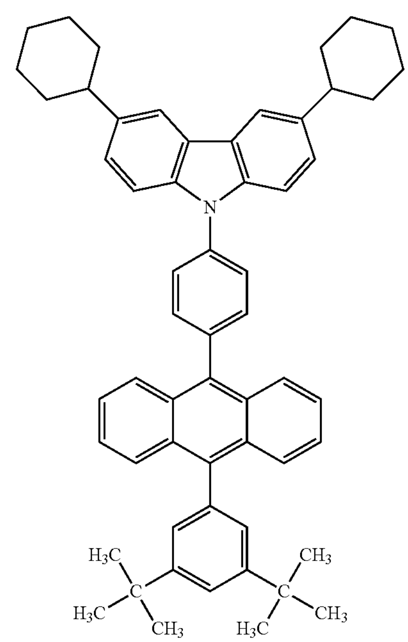

-continued
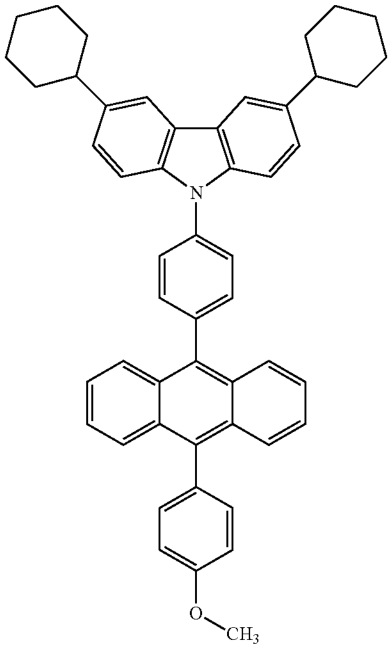
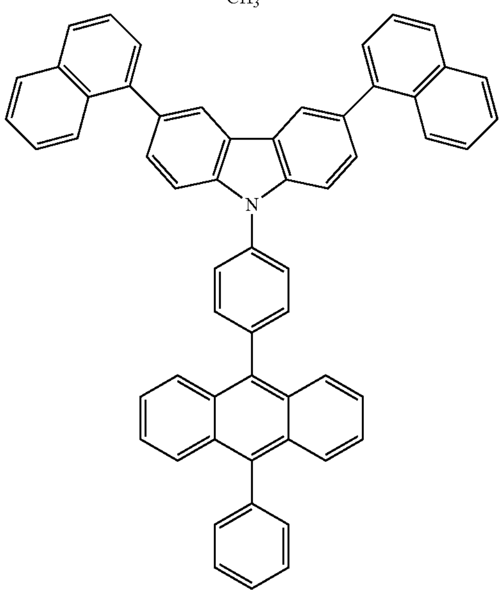
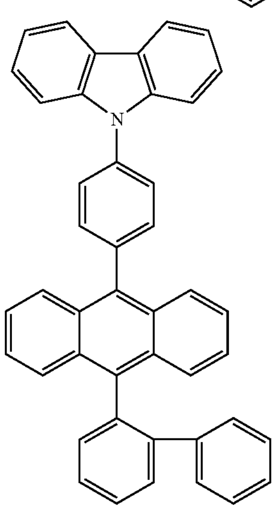
-continued
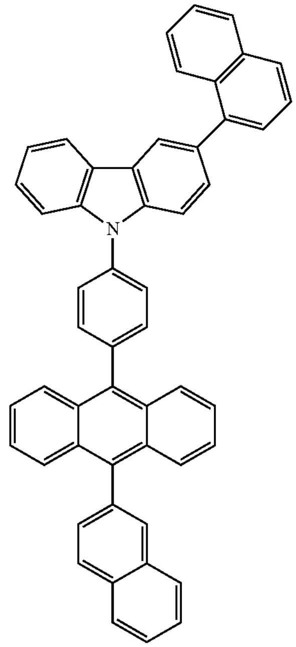
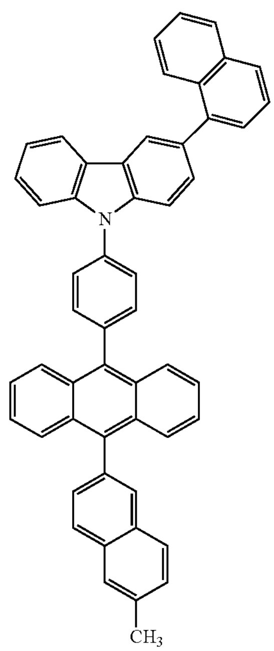

[Formula 40]
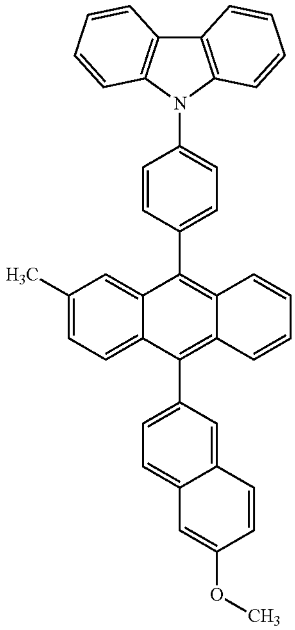
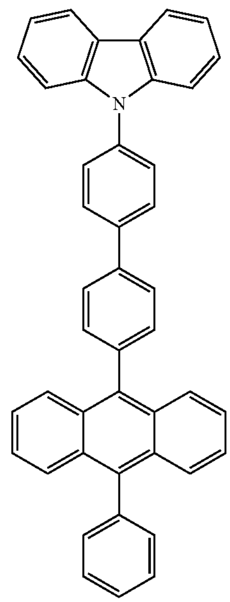
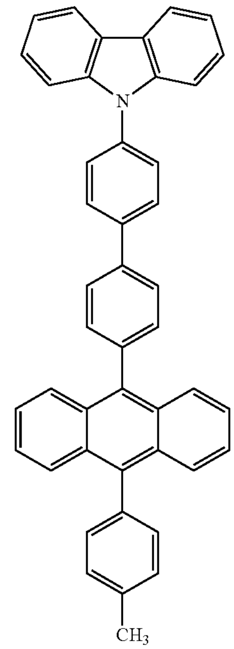
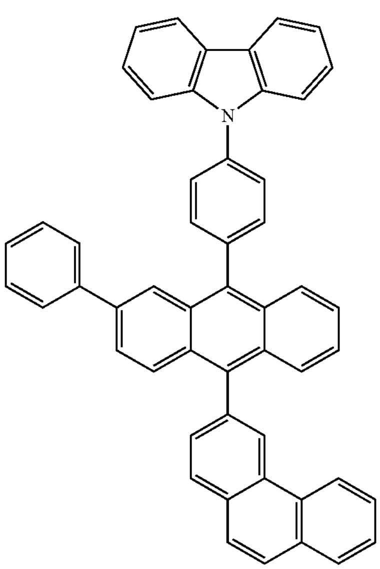
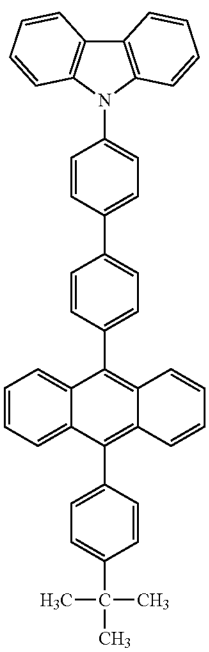
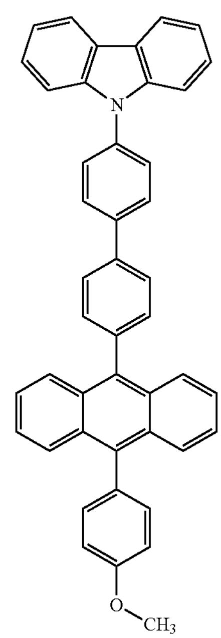

-continued
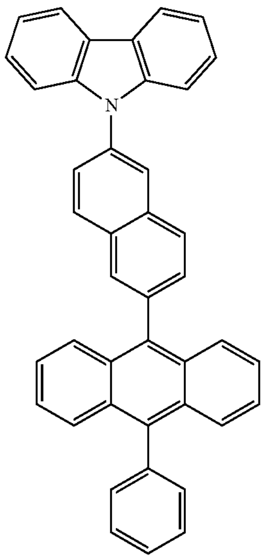
-continued
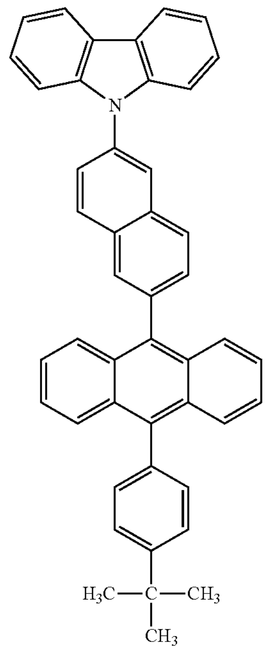
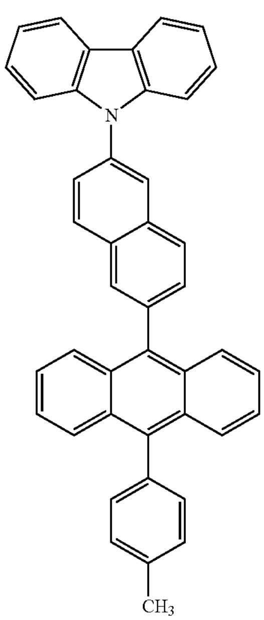
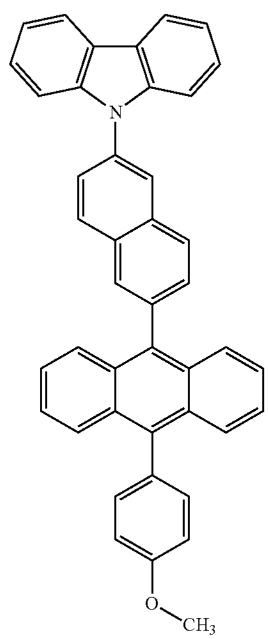

-continued
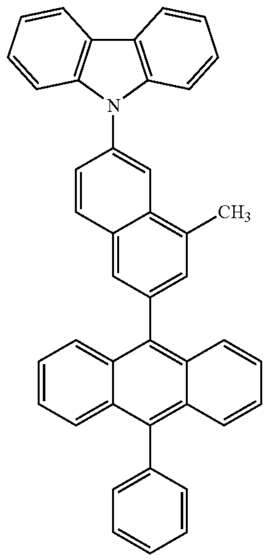
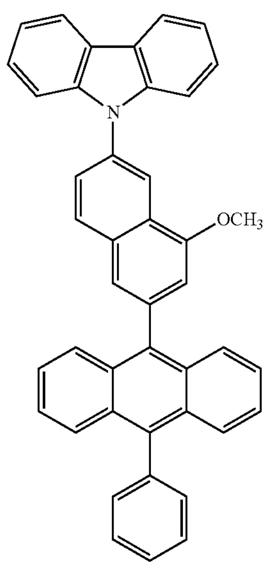
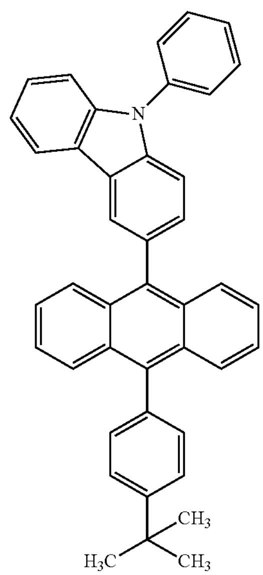
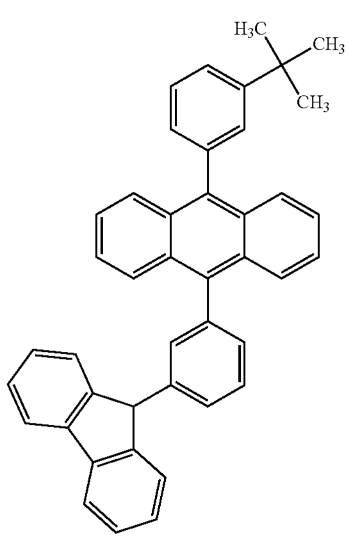
-continued
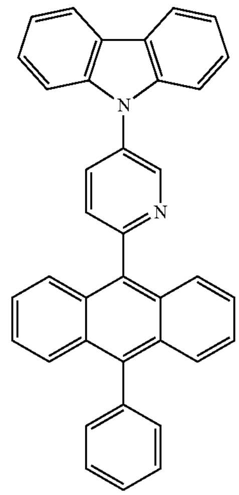
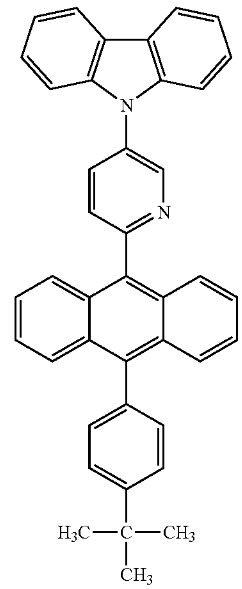
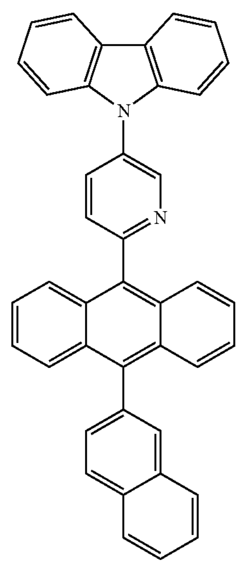
[Formula 41]
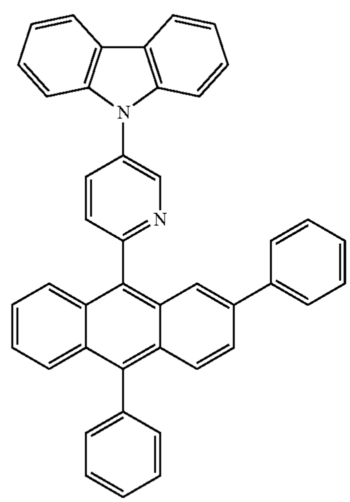

-continued
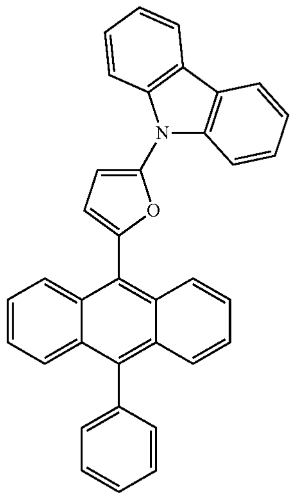
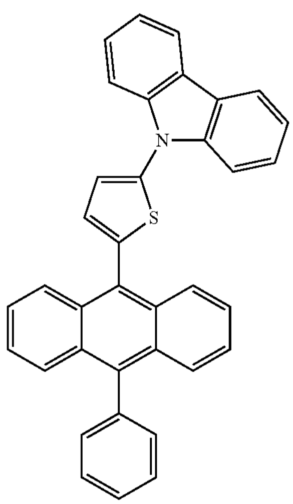
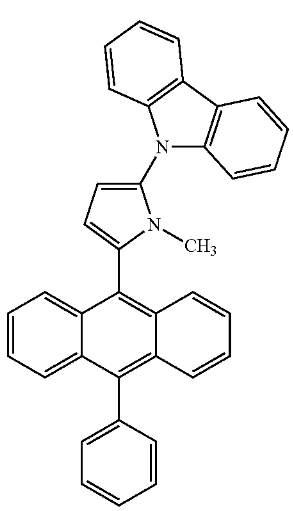
-continued
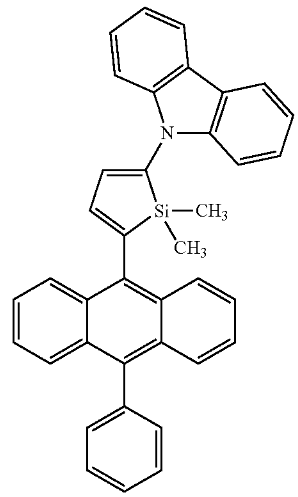
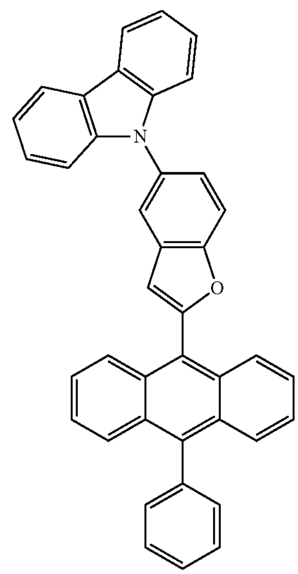
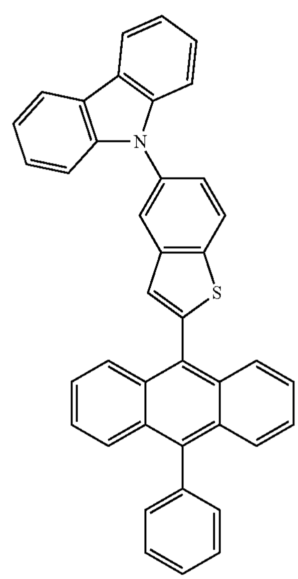

-continued
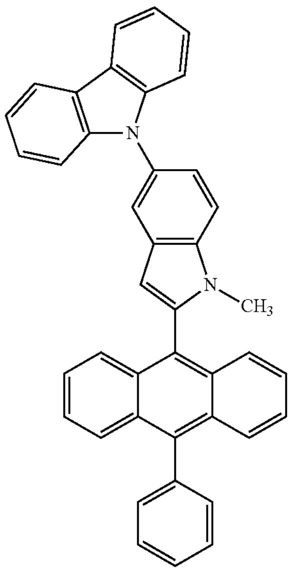
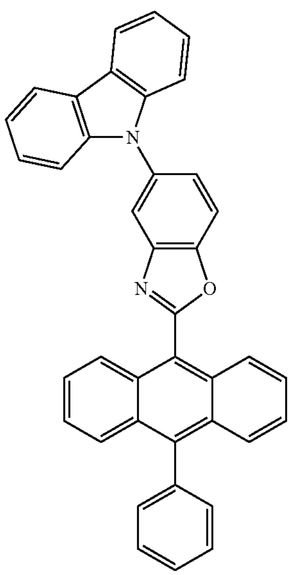
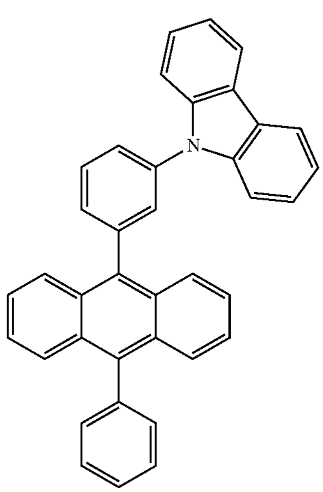
-continued
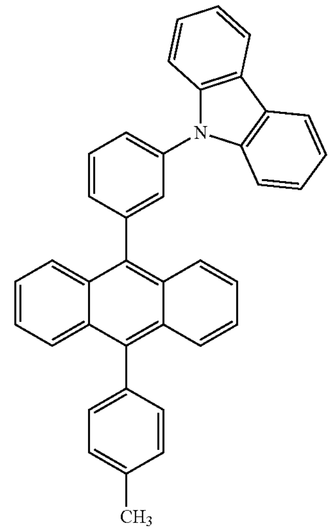
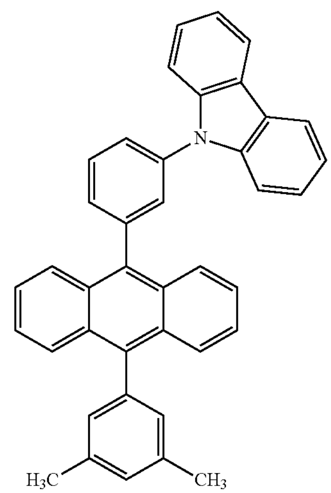
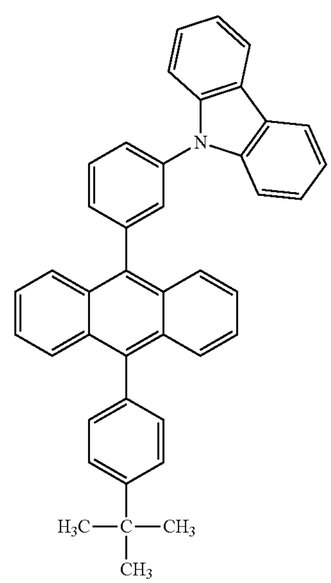

-continued
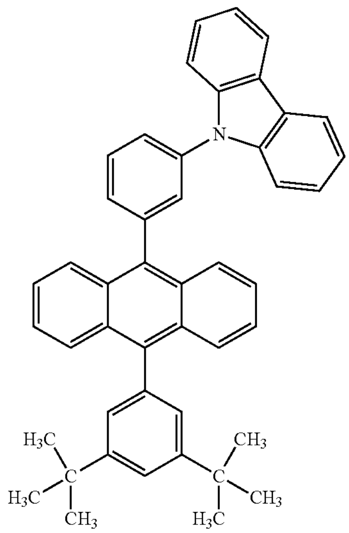
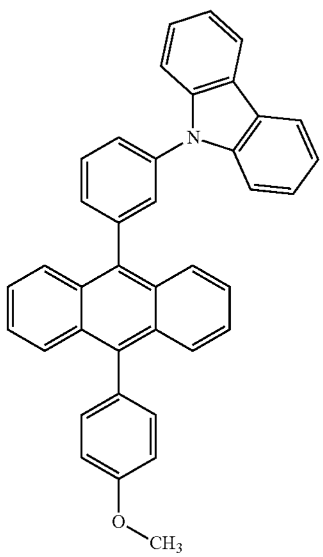
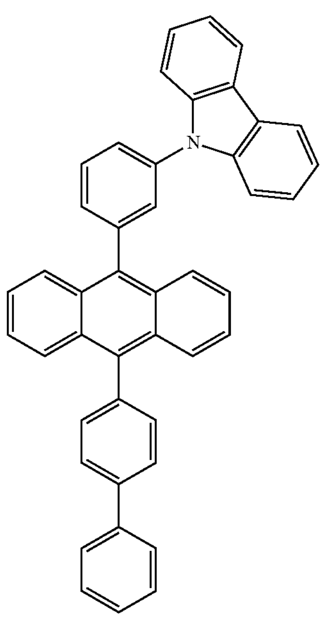
-continued
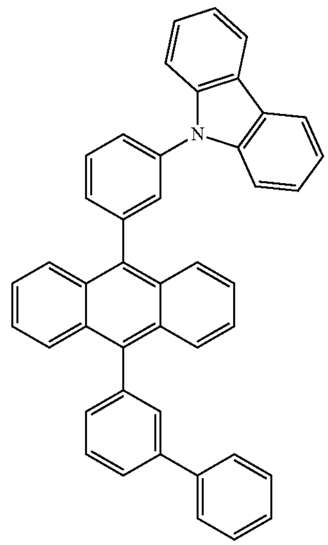
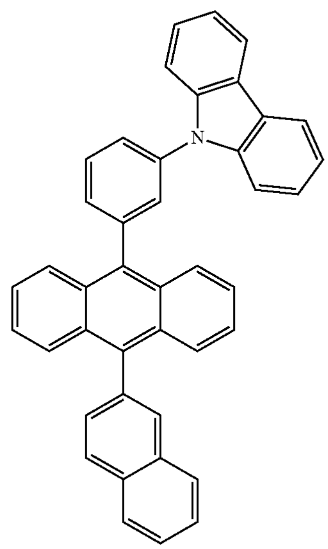
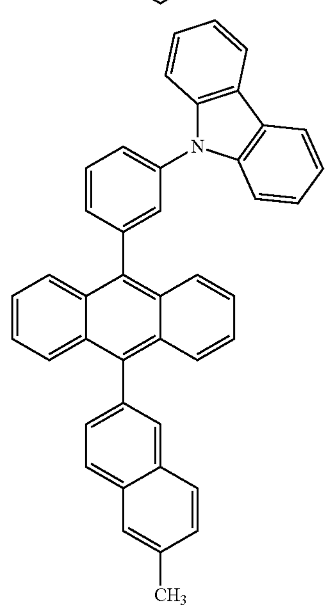

-continued
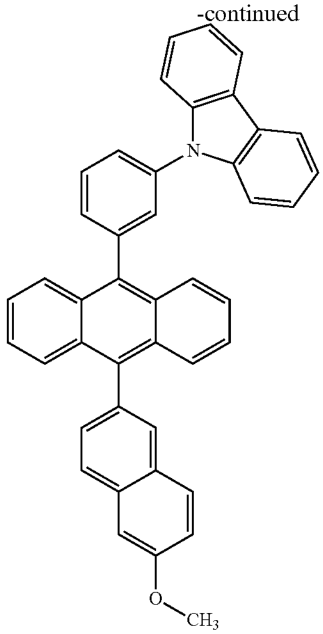
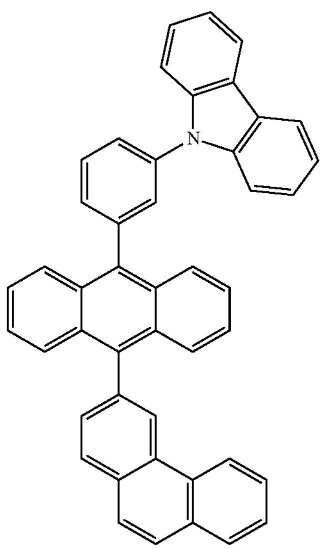
[Formula 42]
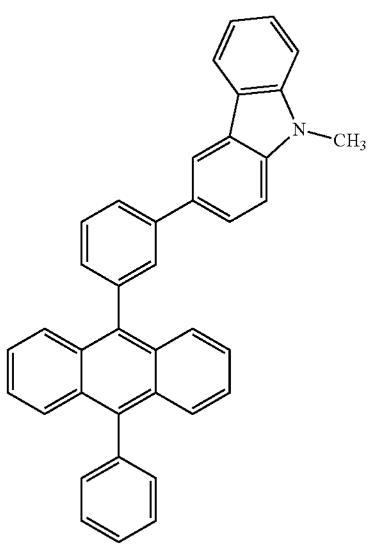
-continued
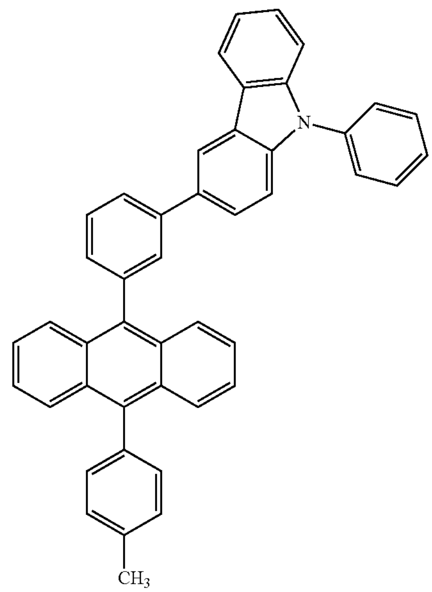
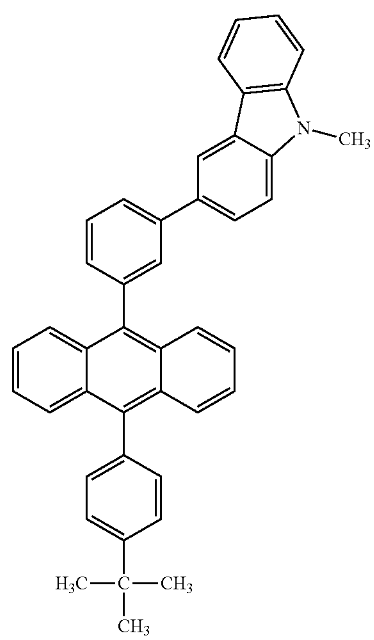

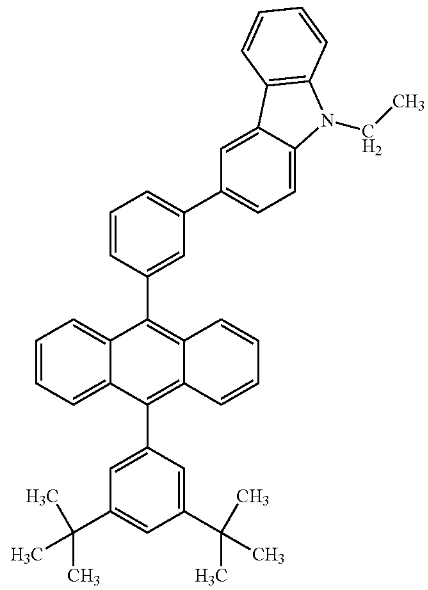
N
CH3
C
H2
H3C
CH3
H3C
CH3
CH3
H3C
CH3
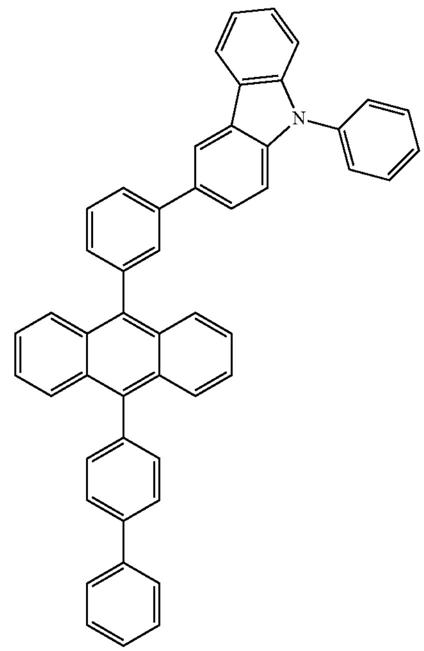
N
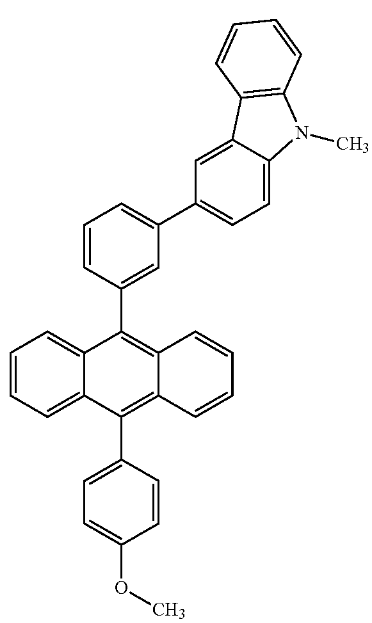
N
CH3
O
CH3
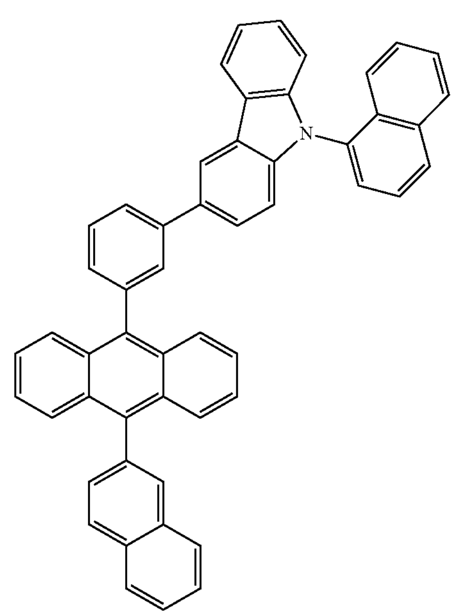
N -continued
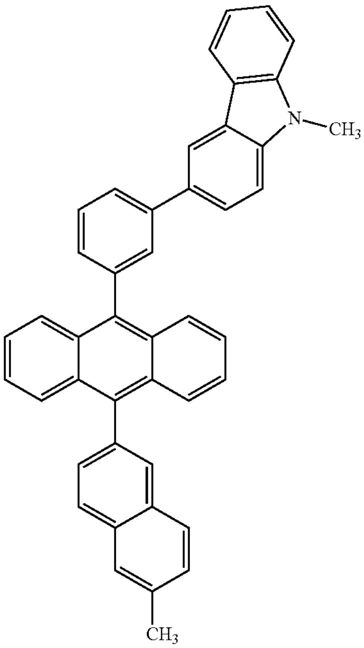
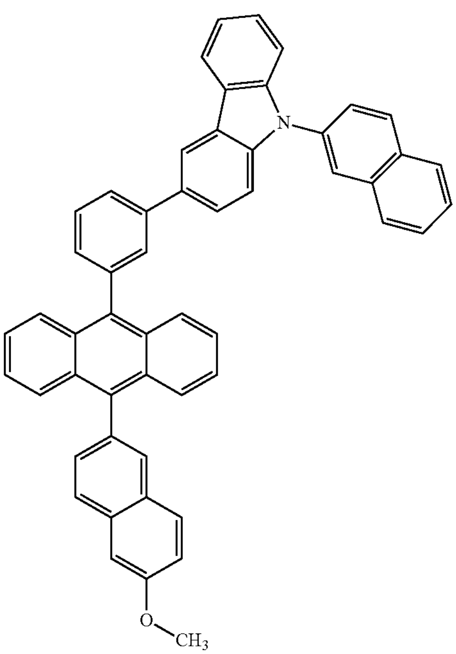
-continued
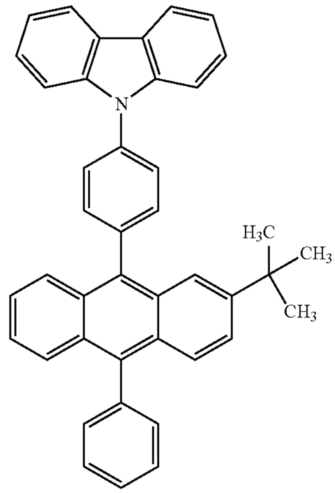
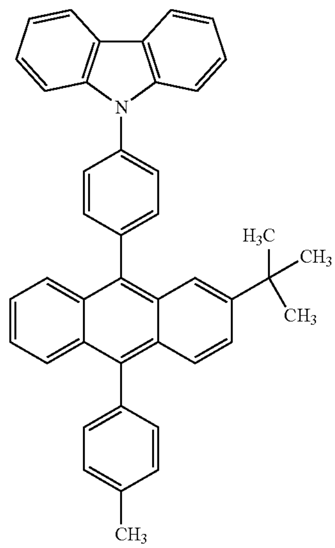
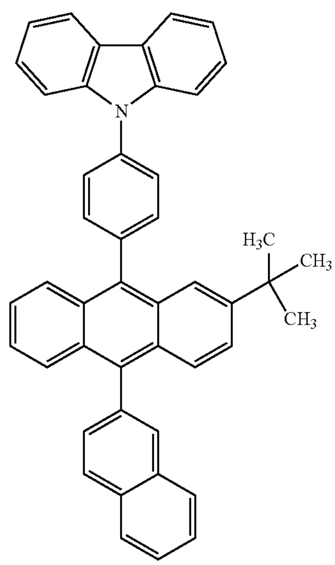

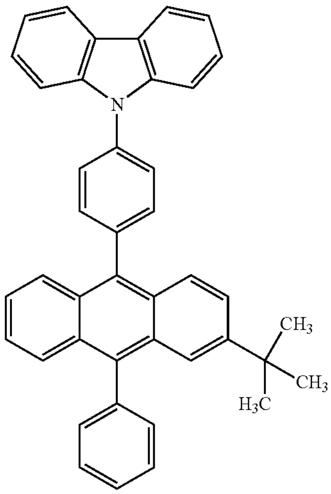
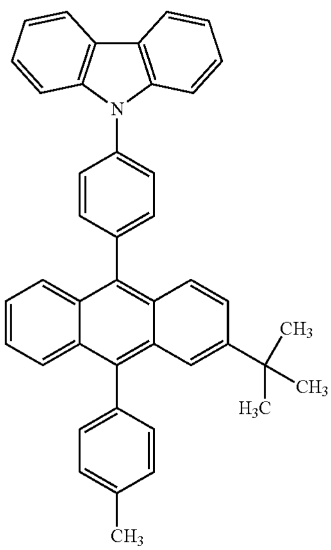
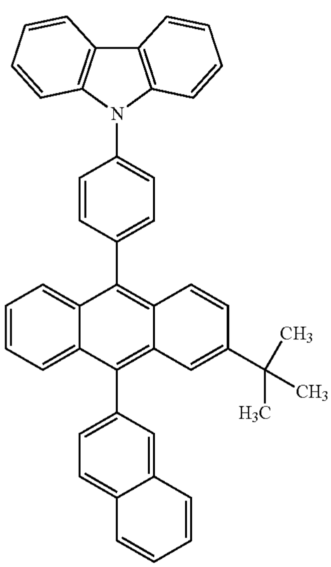
[Formula 43]
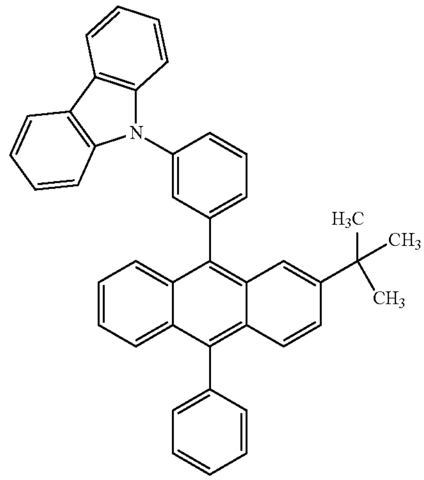
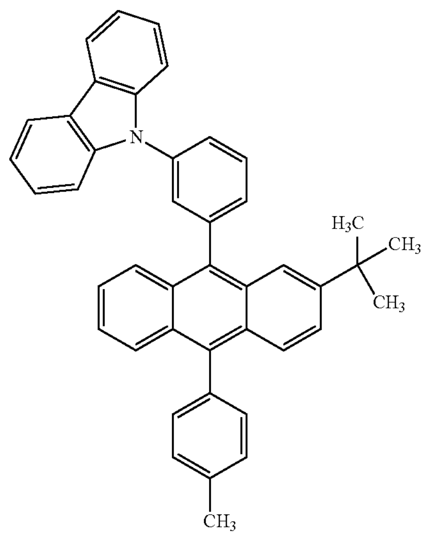
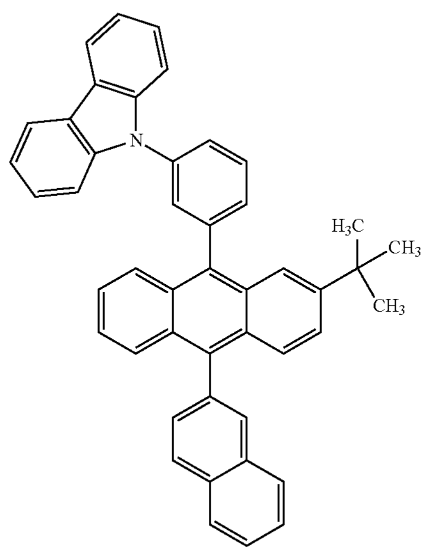

-continued
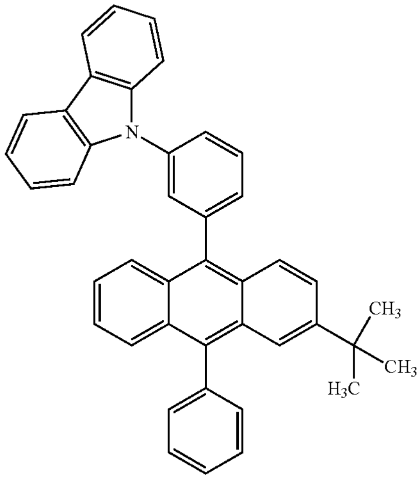
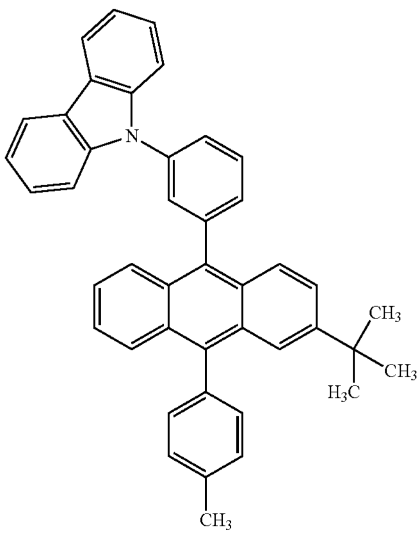
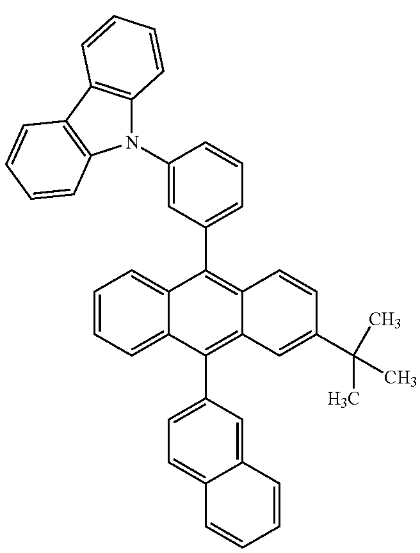
-continued
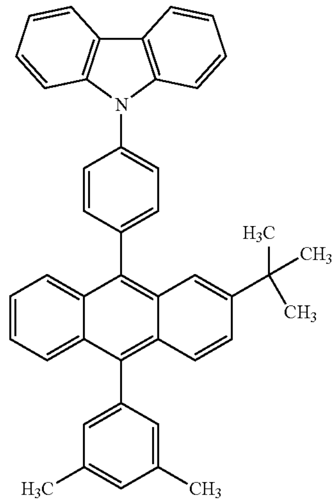
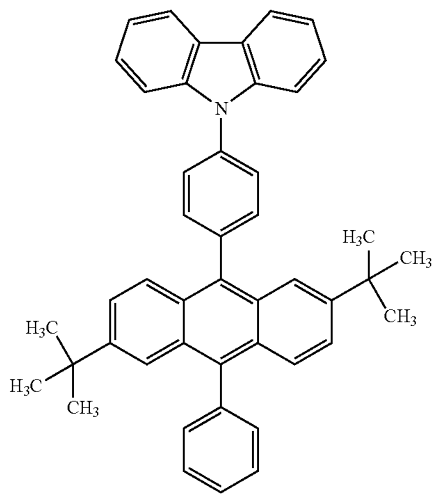
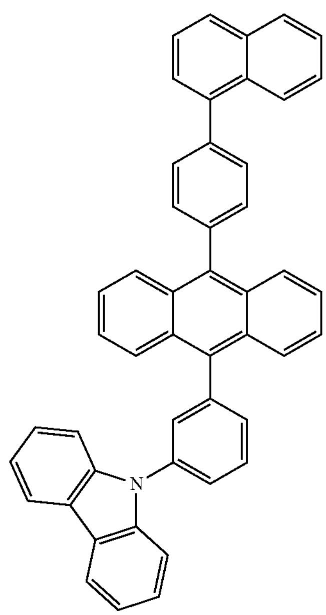

-continued
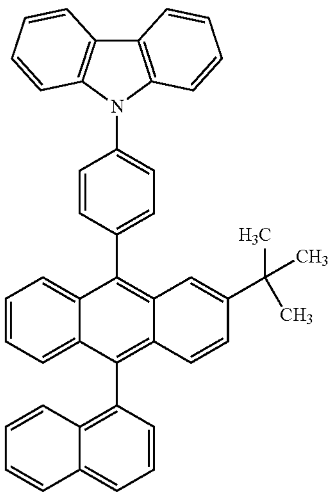
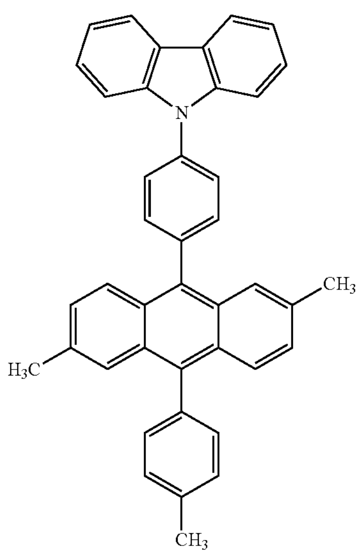
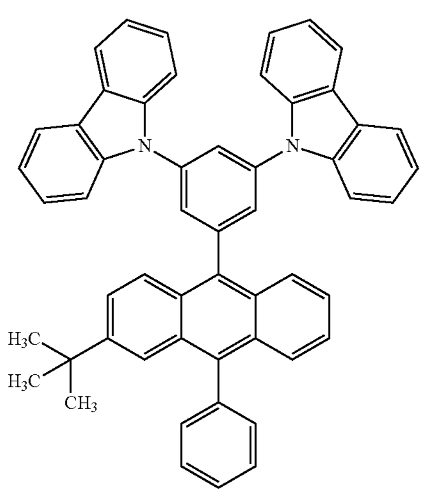
-continued
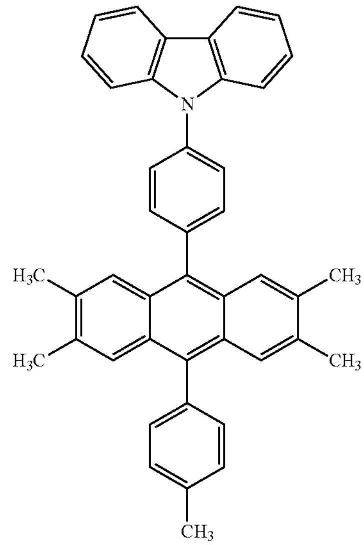
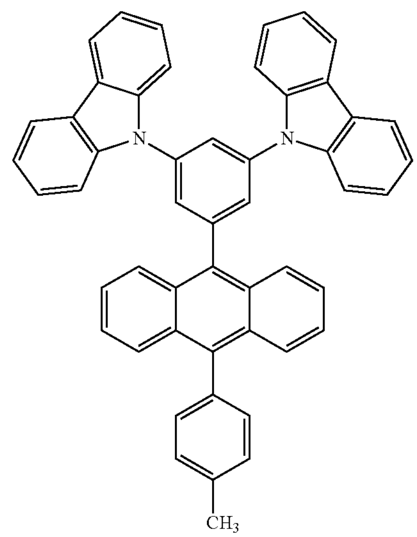
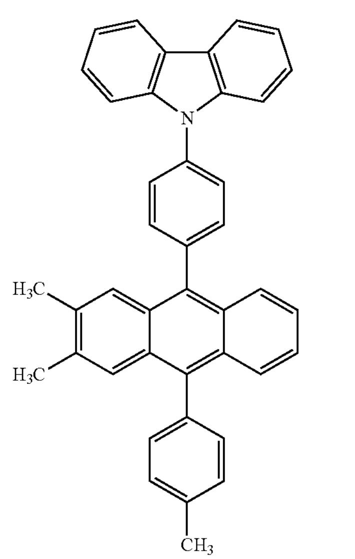

-continued
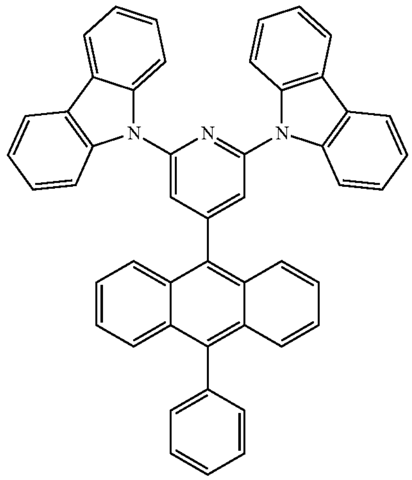
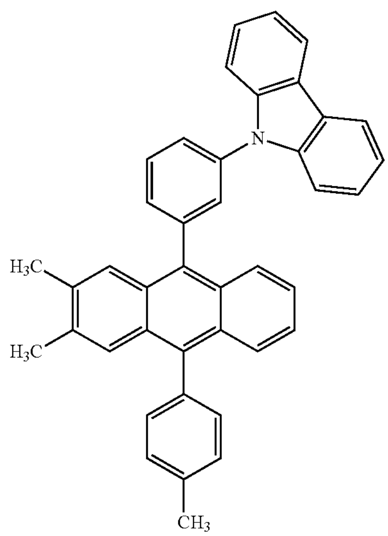
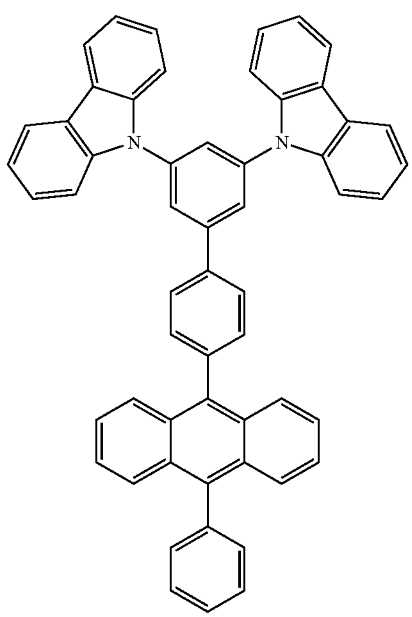
-continued
[Formula 44]
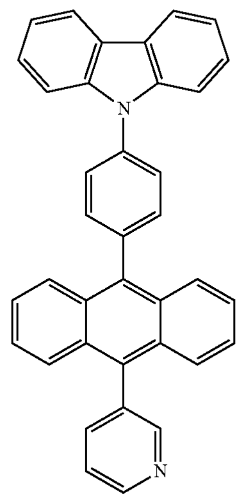
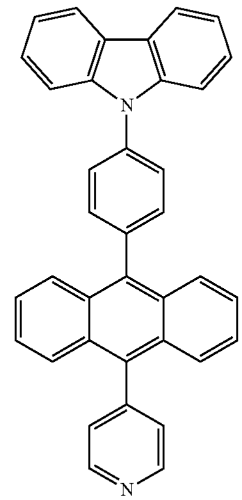
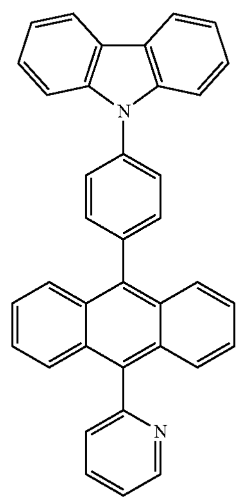
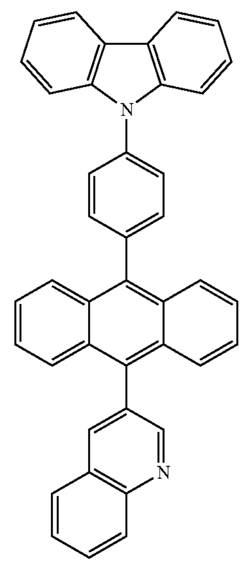
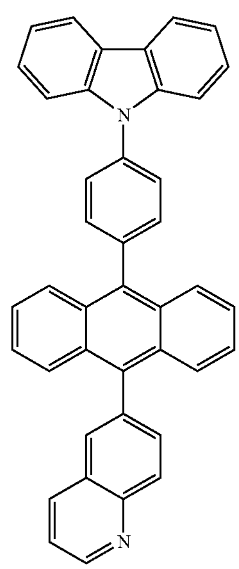

-continued
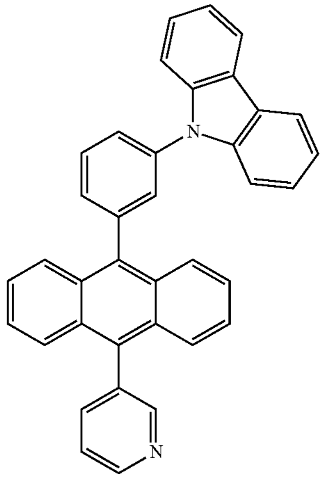
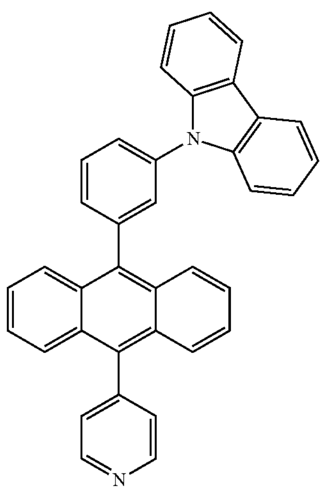
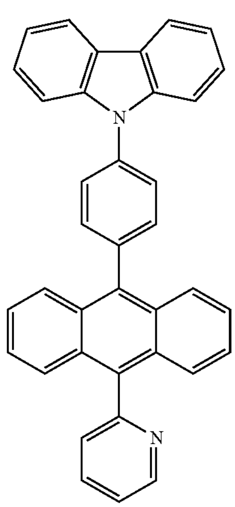
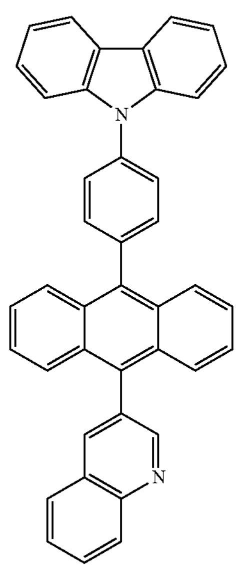
-continued
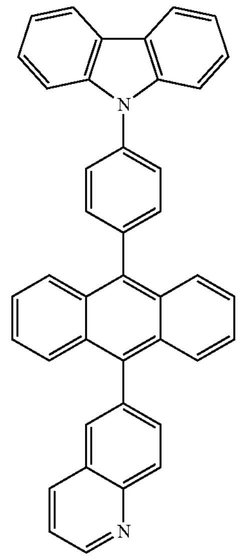
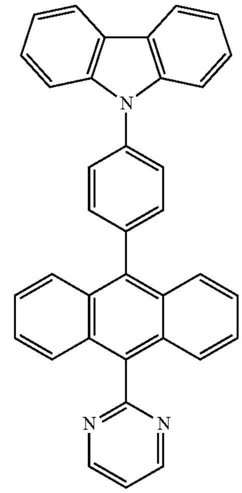
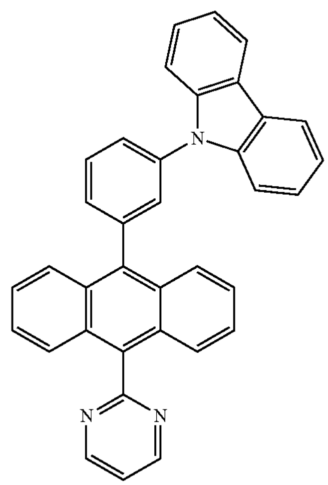
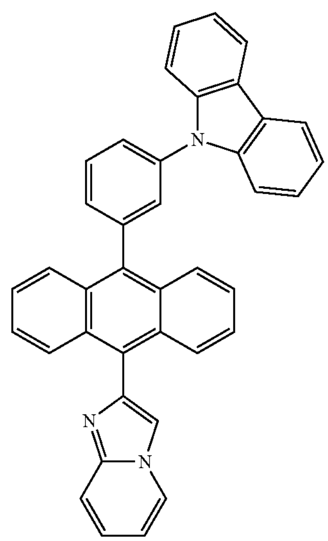

-continued
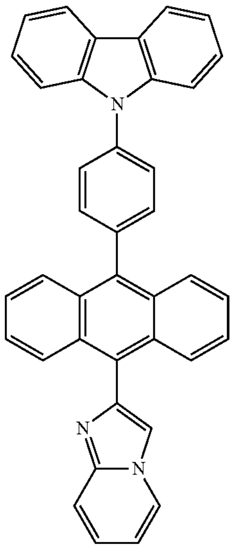
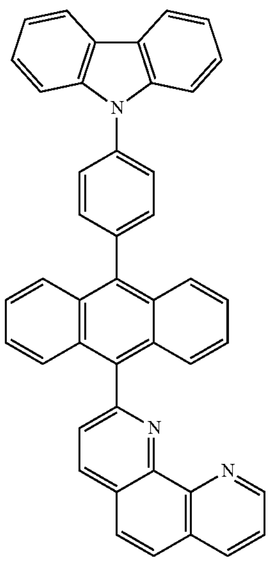
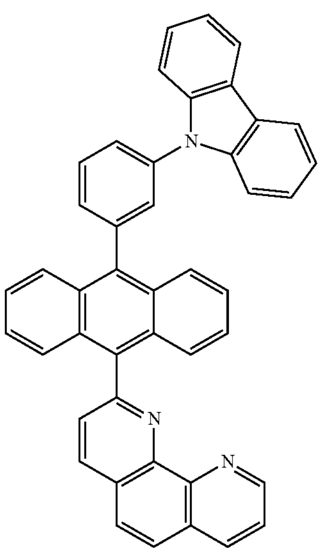
-continued
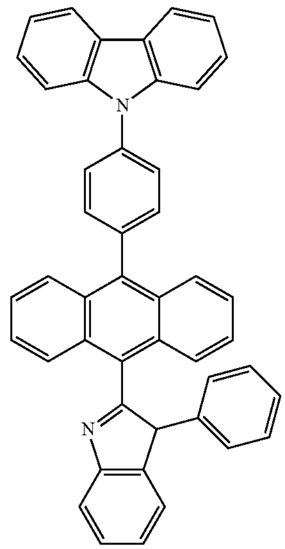
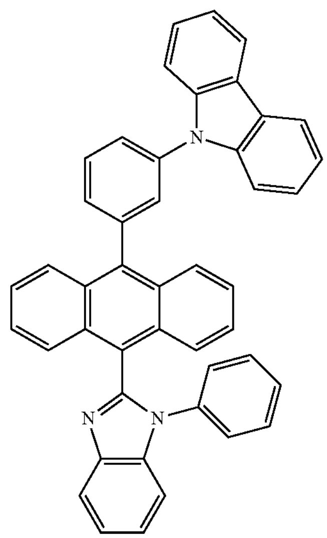
[Formula 45]
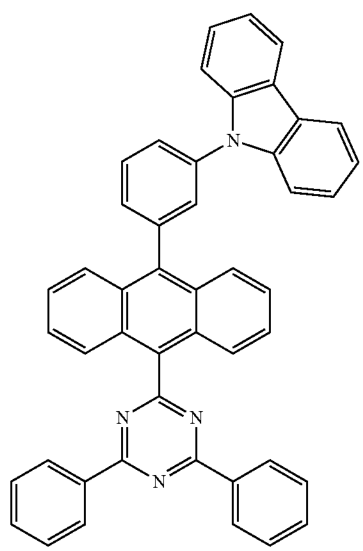

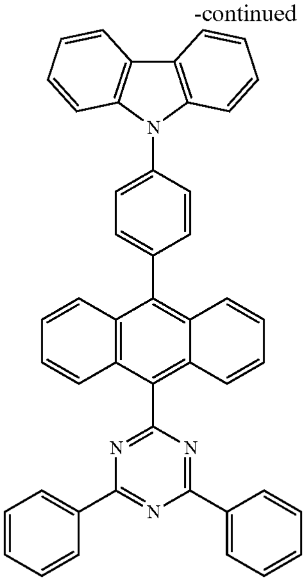
N
N
N
N
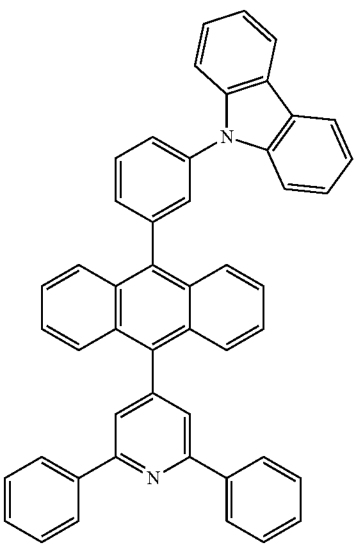
N
N
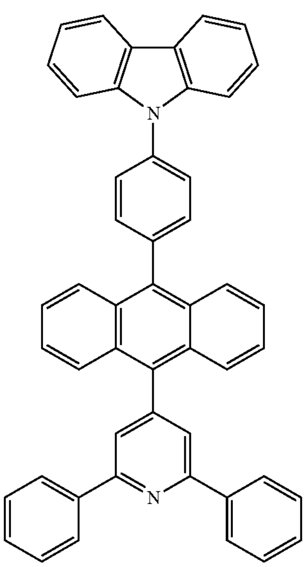
N
N
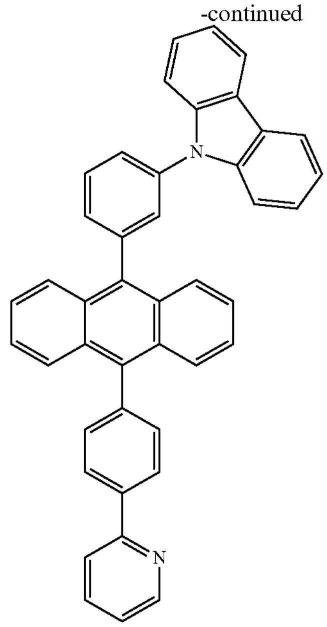
N
N
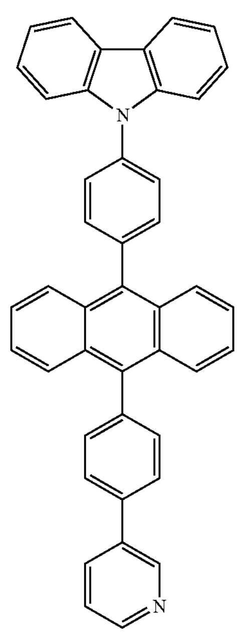
N
N -continued
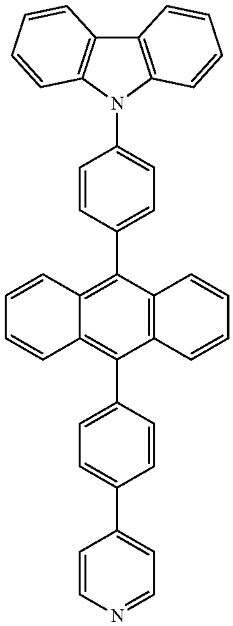
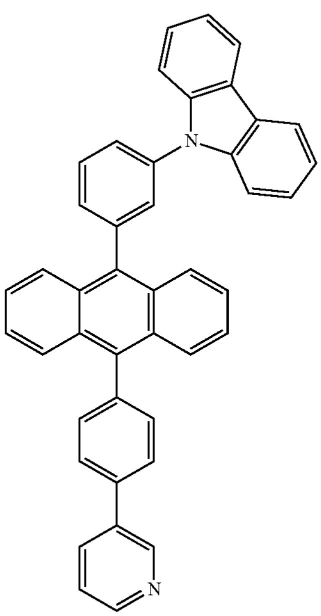
-continued
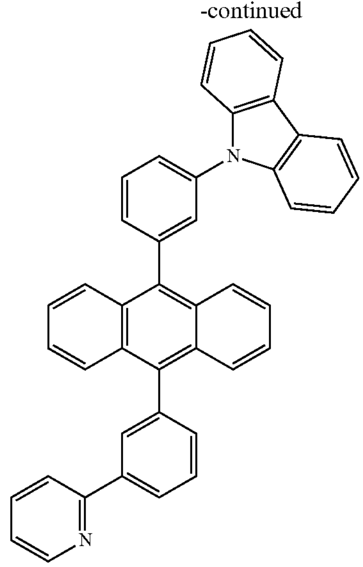
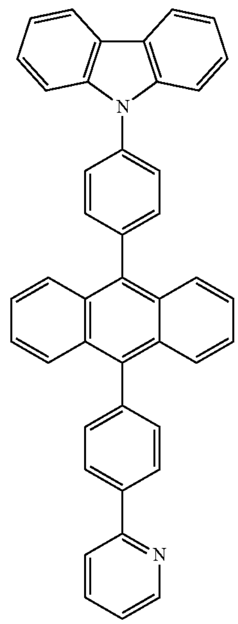
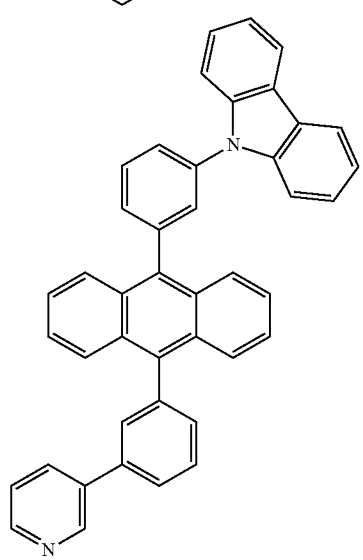

-continued

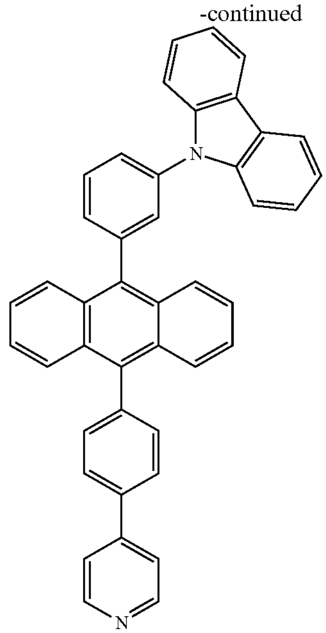

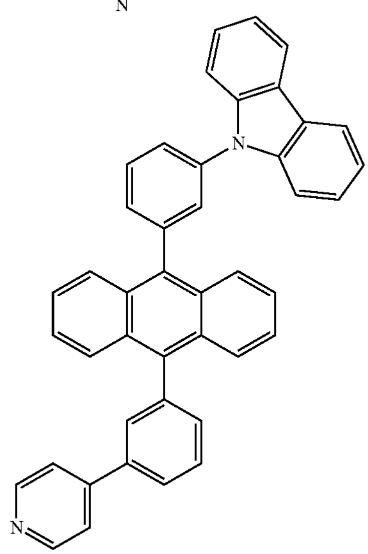

In the light emitting device of the present invention, the first electrode and the second electrode have a function for sufficiently supplying electric current so as to emit light, and at least one of them is preferably made transparent or translucent so as to take light out. Normally, the first electrode to be formed on the substrate is formed as a transparent electrode serving as an anode, with the second electrode serving as a cathode.

The material to be used for the first electrode is not particularly limited as long as it is a material that can efficiently inject holes to the organic layer, and is transparent or translucent so as to take light out, and examples thereof include: conductive metal oxides, such as tin oxide, indium oxide, indium-tin oxide (ITO) and indium zinc oxide (IZO), or metals, such as gold, silver and chromium, or inorganic conductive substances, such as copper iodide, and copper sulfide, or conductive polymers, such as polythiophene, polypyrrole, and polyaniline, although not particularly limited to these, and in particular, ITO glass and NESA glass are desirably used. These electrode materials may be used alone, or a plurality of these may be used as stacked layers, or in a mixed manner. Although not particularly limited as long as a sufficient electric current for light emission of the device is supplied, the resistivity of the transparent electrode is preferably set to a low resistivity from the viewpoint of power consumption for the device. For example, an ITO substrate of 300 Ω/sq or less is allowed to function as the device electrode; however, at present, since a substrate having a low resistivity of about 10 Ω/sq can be prepared, a substrate having a low resistivity of 20 Ω/sq or less is preferably used. The thickness of ITO can be desirably selected in accordance with the resistance value, and normally, the thickness in a range of 100 to 300 nm is used in most cases.

Moreover, in order to properly maintain the mechanical strength of the light emitting device, the light emitting device is desirably formed on a substrate. As the substrate, a glass substrate made from soda glass or non-alkali glass is desirably used. The thickness of the glass substrate is sufficiently set to 0.5 mm or more, since this thickness can sufficiently maintain the mechanical strength. With respect to the material quality of the glass, since it is preferable to make eluted ions from the glass as little as possible, the non-alkali glass is more preferably used. Alternatively, since soda lime glass covered with a barrier coat, such as $SiO_2$, is commercially available, such glass may also be used. Moreover, in an attempt to function the first electrode stably, the substrate is not necessarily prepared as glass, and, for example, the anode may be formed on a plastic substrate. Not particularly limited, the method for forming the ITO film includes an electron beam method, a sputtering method, a chemical reaction method, and the like.

The material to be used for the second electrode is not particularly limited as long as it is a material that can efficiently inject electrons to the emissive layer. In general, preferable examples thereof include: metals, such as platinum, gold, silver, copper, iron, tin, aluminum, indium and the like, or alloys and stacked layers between these metals and metals of low work function, such as lithium, sodium, potassium, calcium, magnesium and the like. Among these, as its main component, aluminum, silver, or magnesium is preferably used from the viewpoints of an appropriate electric resistance value, easiness in forming a film, film stability, luminance efficiency, and the like. In particular, in the case when the electrode is composed of magnesium and silver, an electron injection process to the electron transporting layer and the electron injection layer of the present invention can be easily carried out so that it becomes possible to desirably carry out a low voltage driving operation.

Moreover, a preferable example is proposed in which in order to protect the second electrode, a metal, such as platinum, gold, silver, copper, iron, tin, aluminum and indium, or an alloy using these metals, or an inorganic substance, such as silica, titania and silicon nitride, or an organic polymer compound, such as polyvinyl alcohol, polyvinyl chloride, and a hydrocarbon-based polymer compound, or the like, is stacked on the second electrode, as a protective layer. In this case, however, in the case of a device structure (top emission structure) in which light is taken out from the second electrode side, the protective film layer is selected from materials having a light-transmitting characteristic. Not particularly limited, the forming method of the electrodes is selected from the group consisting of a resistance heating process, an electron beam method, a sputtering method, an ion plating method, and a coating method.

The hole transporting layer is formed by using a method for stacking or mixing one kind or two or more kinds of hole transporting materials, or a method in which a mixture of a hole transporting material and a polymer binding agent is used. Moreover, an inorganic salt such as iron (III) chloride may be added to the hole transporting material so as to form a hole transporting layer. The hole transporting material is required for efficiently transporting holes from the positive electrode between the electrodes to which an electric field is applied, and it is preferable to keep the hole injection efficiency high, and also to efficiently transport the injected holes. For these purposes, a material having an appropriate ionizing potential and a high hole mobility, which is superior in stability, and hardly generates impurities that cause traps, is required. As materials that satisfy these conditions, although not particularly limited, preferable examples include: heterocyclic compounds that include triphenylamine derivatives, such as 4,4'-bis(N-(3-methylphenyl)-N-phenylamino)biphenyl,)-N-phenylamino)biphenyl, and 4,4',4"-tris(3-methylphenyl(phenyl)amino)triphenyl amine; biscarbazole derivatives, such as bis(N-allylcarbazole) or bis(N-alkylcarbazole); pyrazoline derivatives, stilbene-based compounds, hydrazine-based compounds, benzofuran derivatives, thiophene derivatives, oxadiazole derivatives, phthalocyanine derivatives, porphyrin derivatives; fullerene derivatives, and polymer-based compounds, such as polycarbonate and styrene derivatives having a monomer in the side chain thereof; polythiophene, polyaniline, polyfluorene, polyvinylcarbazole, polysilane, and the like.

Furthermore, inorganic compounds, such as p-type Si and p-type SiC may also be used. A compound, represented by the following formula (8), tetrafluorotetracyanoquinodimethane (4F-TCNQ) or molybdenum oxide, may also be used.

[Formula 46]

(8)

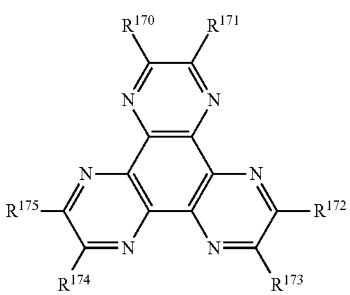

In this formula, $R^{170}$ to $R^{175}$, which may be the same as or different from one another, are selected from the group consisting of halogen, a sulfonyl group, a carbonyl group, a nitro group, a cyano group, and a trifluoromethyl group.

Among these, in the case when compound (9) (1,4,5,8,9,12-hexa-aza-triphenylene hexacarbonitrile) is contained in the hole transporting layer or the hole injection layer, since electrons are forcefully drawn from the hole transporting layer adjacent to the emissive layer, a large number of holes are injected to the emissive layer, and the energy barrier between the layers is alleviated so that a low-voltage driving process can be desirably carried out.

[Formula 47]

(9)

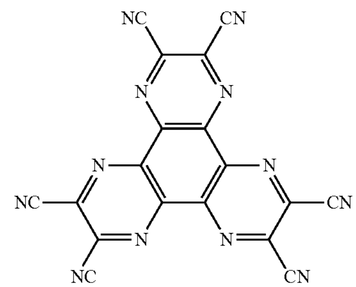

In the present invention, the emissive layer may be prepared as either a single layer or a plurality of layers, and each layer is formed by emissive materials (a host material and a dopant material), and the layer may be prepared as either a mixture of a host material and a dopant material, or a host material alone. That is, in the light emitting device of the present invention, in each of the emissive layers, only the host material or the dopant material may emit light, or both of the host material and the dopant material may emit light. From the viewpoints of efficiently utilizing electric energy and obtaining light emission with high color purity, the emissive layer is preferably made from a mixture of the host material and the dopant material. In this case, each of the host material and the dopant material may be prepared as one kind, or may be prepared as a combination of a plurality of kinds. The dopant material may be contained in the entire portion of the host material, or may be partially contained therein. The dopant material may be either stacked or dispersed. The dopant material makes it possible to control the luminescent color. In the case when the amount of the dopant material is too high, since a concentration quenching phenomenon occurs, the dopant material is preferably used at 20% by weight or less relative to the host material, more preferably, at 10% by weight or less. As the doping method, a co-evaporation method together with the host material may be used; however, the dopant material may be preliminarily mixed with the host material, and may be simultaneously vapor-deposited.

As the emissive material, specific examples thereof include: condensed cyclic derivatives, such as anthracene and pyrene, conventionally known as illuminants; metal chelated oxynoid compounds, typically represented by tris(8-quinolinolato) aluminum; bis-styryl derivatives, such as bis-styryl anthracene derivatives and distyryl benzene derivatives; tetraphenyl butadiene derivatives, indene derivatives, coumarin derivatives, oxadiazole derivatives, pyrrolopyridine derivatives, perinone derivatives, cyclopentadiene derivatives, oxadiazole derivatives, thiadiazolopyridine derivatives, dibenzofuran derivatives, carbazole derivatives, and indolocarbazole derivatives, and those of polymer-based derivatives include: polyphenylene vinylene derivatives, polyparaphenylene derivatives, and polythiophene derivatives; however, the present invention is not intended to be limited by these.

Although not particularly limited, examples of the host material contained in the emissive material include: compounds having a condensed aryl-ring, such as naphthalene, anthracene, phenanthrene, pyrene, chrysene, naphthacene, triphenylene, perylene, fluorantene, fluorene, and indene, and derivatives thereof; aromatic amine derivatives, such as N,N'-dinaphthyl-N,N'-diphenyl-4,4'-diphenyl-1,1'-diamine; metal chelated oxynoid compounds, typically represented by tris(8-quinolinate) aluminum (III), bis-styryl derivatives, such as distyryl benzene derivatives; tetraphenyl butadiene derivatives, indene derivatives, coumarin derivatives, oxadiazole derivatives, pyrrolopyridine derivatives, perinone derivatives, cyclopentadiene derivatives, pyrrolopyrrole derivatives, thiadiazolopyridine derivatives, dibenzofuran derivatives, carbazole derivatives, indolocarbazole derivatives, carboline derivatives, pyridoindole derivatives, and triazine derivatives, and those of polymer-based derivatives including: polyphenylene vinylene derivatives, polyparaphenylene derivatives, polyfluorene derivatives, polyvinylcarbazole derivatives, and polythiophene derivatives; however, the present invention is not intended to be limited by these. Among these, as a host to be used when the emissive layer executes phosphorescent light emission, metal chelated oxynoid compounds, chrysene derivatives, binaphthyl derivatives, dibenzofuran derivatives, carbazole derivatives, indolocarbazole derivatives, carboline derivatives, pyridoindole derivatives, triazine derivatives and the like are preferably used.

Although not particularly limited, examples of the dopant material include: compounds having a condensed aryl-ring, such as naphthalene, anthracene, phenanthrene, pyrene, chrysene, triphenylene, perylene, fluorantene, fluorene, and indene, and derivatives thereof (for example, 2-(benzothiazole-2-yl)-9,10-diphenylanthracene, 5,6,11,12-tetraphenyl naphthacene, and the like); compounds having a heteroaryl-ring, such as furan, pyrrole, thiophene, silole, 9-silafluorene, 9,9'-spiro-bisilafluorene, benzothiophene, benzofuran, indole, dibenzothiophene, dibenzofuran, imidazopyridine, phenanthroline, pyridine, pyrazine, naphthylidine, quinoxaline, pyrrolopyridine, and thioxanthone, and derivatives thereof; amino styryl derivatives, such as borane derivatives, distyrylbenzene derivatives, 4,4'-bis(2-(4-diphenylaminophenyl)ethenyl)biphenyl, and 4,4'-bis(N-(stilbene-4-yl)-N-phenylamino)stilbene; aromatic acetylene derivatives, tetraphenylbutadiene derivatives, stilbene derivatives, aldazine derivatives, pyrromethene derivatives, diketopyrrolo[3,4-c] pyrrole derivatives, coumarin derivatives, such as 2,3,5,6-1H, 4H-tetrahydro-9-(2'-benzothiazolyl) quinolidino[9,9a,1-gh] coumarin; azole derivatives, such as imidazole, thiazole, thiadiazole, carbazole, oxazole, oxadiazole, and triazole, and metal complexes thereof; and aromatic amine derivatives, typically represented by N,N'-diphenyl-N,N'-di(3-methylphenyl)-4,4'-diphenyl-1,1'-diamine. Moreover, as a dopant to be used when the emissive layer executes phosphorescent light emission, metal complex compounds, which contain at least one metal selected from the group consisting of iridium (Ir), ruthenium (Ru), palladium (Pd), platinum (Pt), osmium (Os), and rhenium (Re), are preferably used, and the ligand thereof preferably includes an aromatic heterocyclic ring containing nitrogen, such as a phenylpyridine skeleton or a phenylquinoline skeleton. However, the present invention is not intended to be limited by these, and depending on required luminescent color, device performances, and the relationship with the host compound, an appropriate complex can be selected.

In the case when a compound represented by any one of formulas (1) to (7) is used for the electron transporting layer as shown in the present invention, among the above-mentioned materials, some of those phosphorescent light emissive materials are preferably contained in the emissive layer so that it becomes possible to desirably achieve high luminance efficiency by their superior electron injecting characteristic and electron transporting characteristic. Preferable combinations of the phosphorescent light emissive materials include, for example, combinations of the metal chelated oxynoid compound, dibenzofuran derivative, carbazole derivative, indolocarbazole derivative, carboline derivative, pyridoindole derivative, triazine derivative and the like. When these compounds are used for the emissive layer, the quantum yield of the phosphorescent light emission increases so that it becomes possible to improve the luminance efficiency of the light emitting device. The metal to be contained in the metal chelated oxynoid compound is preferably prepared as iridium, palladium or platinum, and among these, iridium is particularly preferably used.

Although preferable phosphorescence light emissive hosts or dopant are not particularly limited, specific examples thereof include the following compounds:

[Formula 48]

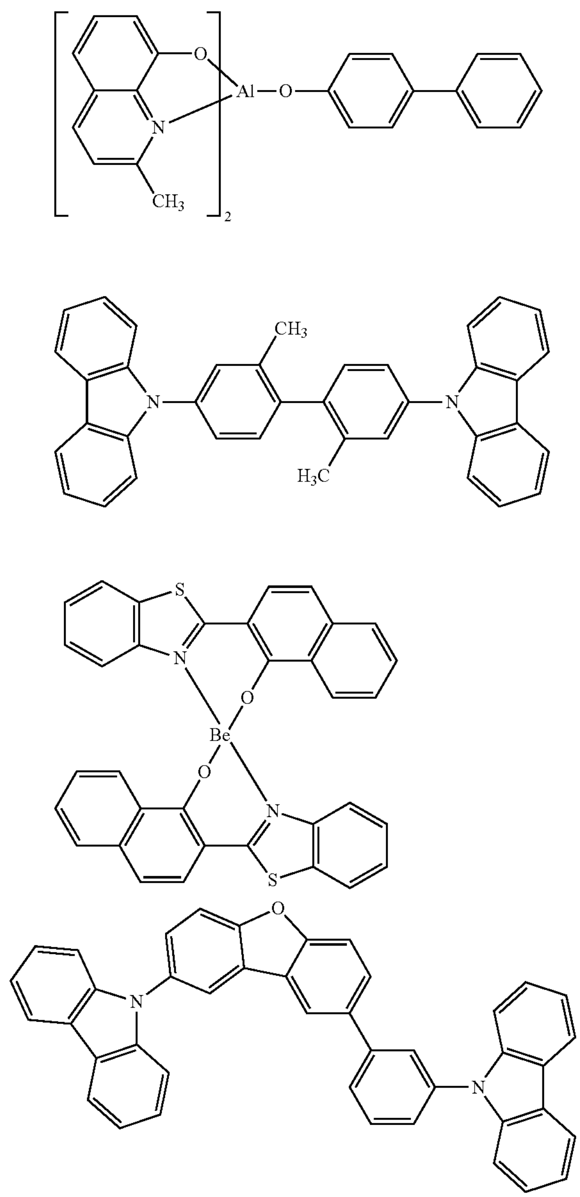

-continued
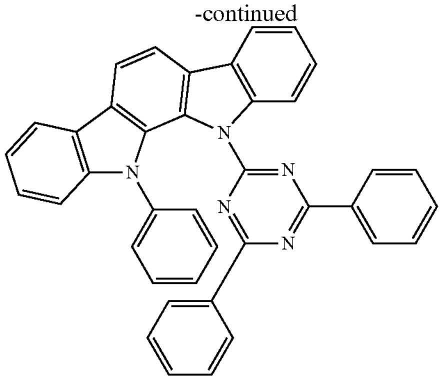
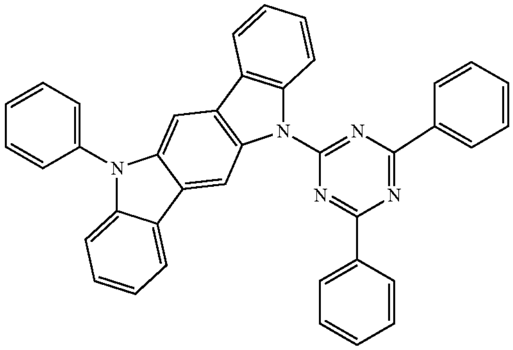
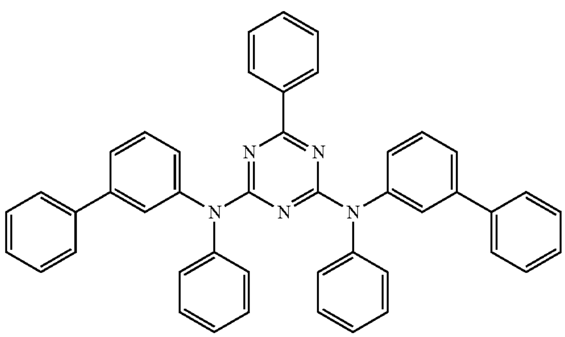
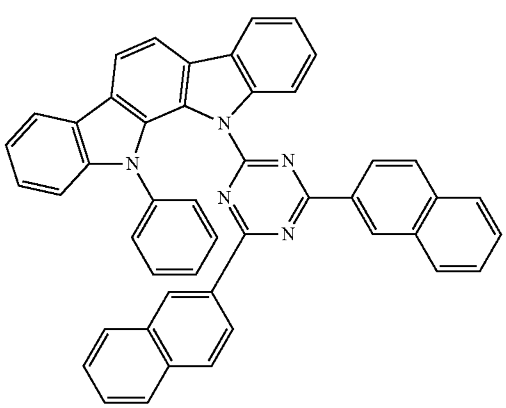
-continued
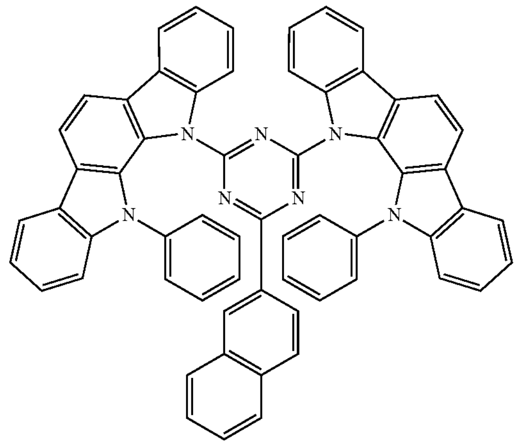
[Formula 49]
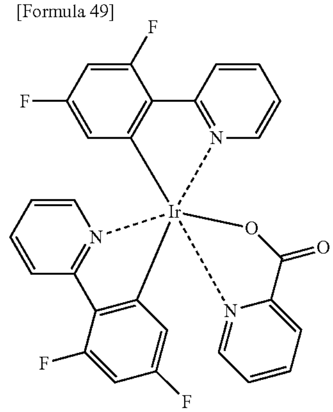
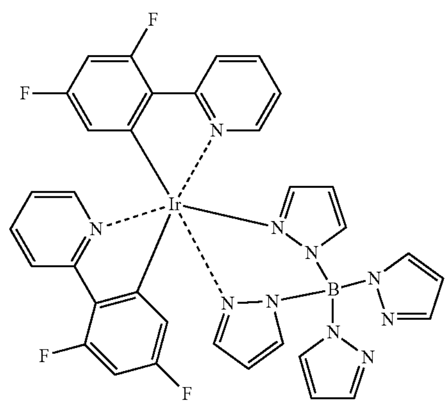
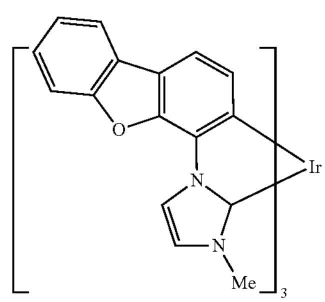

-continued

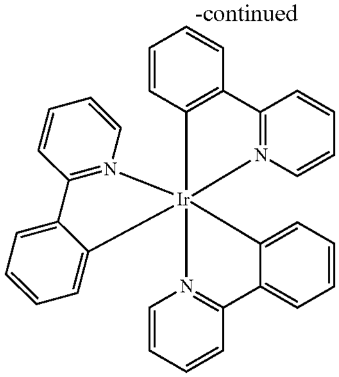

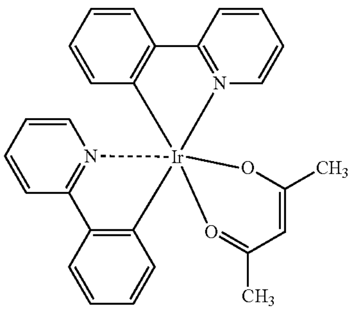

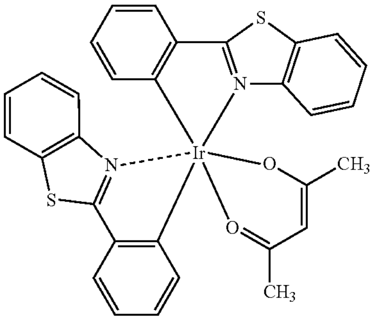

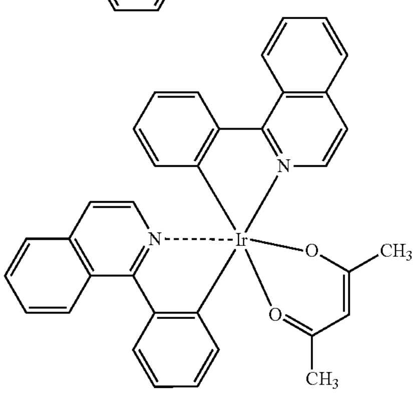

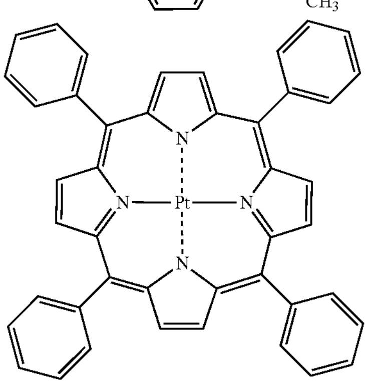

-continued

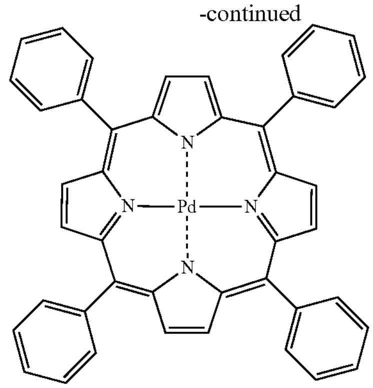

In the present invention, the electron transporting layer represents a layer to which electrons are injected from a cathode, and which further transports electrons. The electron transporting layer is desirably made to have high electron injection efficiency, and required for transporting injected electrons with high efficiency. For these reasons, the electron transporting layer is desirably made from a substance that has high electron affinity and high electron mobility, is superior in stability, and also hardly generates impurities that cause traps, upon manufacturing processes and use. In the case when the transporting balance between holes and electrons is taken into consideration, however, if the electron transporting layer mainly exerts a function for efficiently blocking a hole from flowing toward the cathode side from an anode, without being re-combined, even when it is made from a material whose electron transporting capability is not so high, the same effect for improving the luminance efficiency as that in the case of using a material whose electron transporting capability is high can be obtained. Therefore, the electron transporting layer of the present invention also includes a hole blocking layer capable of blocking the mobility of holes with high efficiency as being synonymous therewith.

The compounds represented by formulas (1) to (7) are compounds that satisfy the above-mentioned conditions, and since they have a high electron injecting/transporting capability, they are desirably used as electron transporting materials.

Since compounds represented by formulas (1) to (7) contain a pyrene skeleton and a specific substituent, they are superior in electron injecting/transporting characteristics and electrochemical stability. Moreover, by the introduction of the substituent, the compatibility with a donor compound to be described later in a thin-film state is improved, making it possible to exert higher electron injecting/transporting capabilities. By the function of this mixture layer, the electron transport from the cathode to the emissive layer is accelerated so that both of high luminance efficiency and a low driving voltage can be achieved.

Moreover, in the case when the compounds represented by formulas (1) to (7) of the present invention have a substituent containing a heteroaryl ring-structure with electron-accepting nitrogen, the resultant compounds are preferably used from the viewpoint of electron injecting or electron transporting capability from the cathode. This substituent is preferably bonded to pyrene or anthracene directly or through a bonding group.

In the present invention, the electron-accepting nitrogen refers to a nitrogen atom forming multiple bonds between adjacent atoms. Since the nitrogen atom has a high electron negative degree, the multiple bonds exert an electron-accepting characteristic. For this reason, the heteroaryl ring containing the electron-accepting nitrogen has a high electron affinity, and is superior in electron-transporting capability, and by using a material having this ring for an electron transporting layer, it becomes possible to reduce a driving voltage for a light emitting device. Examples of the heteroaryl ring containing electron-accepting nitrogen include: a pyridine ring, a pyrazine ring, a pyrimidine ring, a quinoline ring, a quinoxaline ring, a naphthylidine ring, a pyrimidopyrimidine ring, a benzoquinoline ring, a phenanthroline ring, an imidazole ring, an oxazole ring, an oxadiazole ring, a triazole ring, a thiazole ring, a thiadiazole ring, a benzo-oxazole ring, a benzothiazole ring, a benzimidazole ring, a phenanthroimidazole ring, and the like.

Among these, compounds having a six-membered ring structure, such as a pyridine ring, a pyrimidine ring and a triazine ring, represented by formulas (1) to (7), are preferably used, and those compounds having a pyridine ring are more preferably used. Among the pyridine rings, in the case when 3-pyridyl group is directly bonded to pyrene or anthracene, since the resultant compound has the highest electron-injecting or electron-transporting capability to provide a low driving voltage, it is more preferably used.

Additionally, in the case when the substituent containing a heteroaryl ring-structure having electron-accepting nitrogen is bonded through a bonding group, an arylene group or a heteroarylene group is preferably used as the bonding group, and these may be substituted with an alkyl group. In particular, an arylene group or a heteroarylene group having carbon atoms of 3 to 12 including the substituent is preferably used, and a phenylene group is, in particular, more preferably used.

The electron transporting material to be used in the present invention is not necessarily limited to one kind of compounds represented by formulas (1) to (7) of the present invention, and a plurality of the compounds of the present invention may be mixed and used, or one or more kinds of other electron transporting materials may be mixed with the compound of the present invention within a range that does not impair the effects of the present invention, and used. Although the electron transporting materials that can be mixed are not particularly limited, examples thereof include: compounds having a condensed aryl ring, such as naphthalene, anthracene and pyrene, and derivatives thereof; styryl-based aromatic ring derivatives, typically represented by 4,4'-bis(diphenylethenyl)biphenyl, perylene derivatives, perynone derivatives, coumarin derivatives, naphthalimide derivatives, quinone derivatives, such as anthraquinone and diphenoquinone, phosphorus oxide derivatives, carbazole derivatives, and indole derivatives; quinolinol complexes, such as tris(8-quinolinolato) aluminum (III); hydroxyazole complexes, such as hydroxyphenyloxazole complexes, azomethine complexes, tropolone metal complexes, and flavonol metal complexes, and those compounds having a heteroaryl-ring structure with electron-accepting nitrogen are preferably used because of their driving voltage reducing characteristic.

Preferable examples of the compound having a heteroaryl-ring structure include: benzimidazole derivatives, benzoxazole derivatives, benzthiazole derivatives, oxadiazole derivatives, thiadiazole derivatives, triazole derivatives, pyrazine derivatives, pyridine derivatives, pyrimidine derivatives, triazinederivatives, phenanthrolinederivatives, quinoxalinederivatives, quinolinederivatives, benzoquinoline derivatives, oligo pyridine derivatives, such as bipyridine and terpyridine; quinoxaline derivatives, and naphthylidine derivatives.

Among these, imidazole derivatives such as tris(N-phenylbenzimidazole-2-yl)benzene, oxadiazole derivatives such as 1,3-bis[(4-tert-butylphenyl)1,3,4-oxadiazolyl]phenylene, triazole derivatives such as N-naphthyl-2,5-diphenyl-1,3,4-triazole, phenanthroline derivatives, such as bathocuproin and 1,3-bis(1,10-phenanthroline-9-yl)benzene, benzoquinoline derivatives, such as 2,2'-bis(benzo[h]quinoline-2-yl)-9,9'-spirobifluorene, bipyridine derivatives, such as 2,5-bis(6'-(2',2"-bipyridyl))-1,1-dimethyl-3,4-diphenyl silole, terpyridine derivatives such as 1,3-bis(4'-(2,2':6'2"-terpyridinyl)) benzene, and naphthylidine derivatives, such as bis(1-naphtyl)-4-(1,8-naphthylidine-2-yl)phenylphosphine oxide, are preferably used from the viewpoint of electron transporting capability.

Next, the following description will discuss donor compounds. The donor compounds of the present invention are compounds to be used for improving the electron injection barrier so as to easily carry out the electron injection to the electron transporting layer from the second electrode or the electron injecting layer, so that the electric conductivity of the electron transporting layer is further improved. That is, the light emitting device of the present invention is designed so that its electron transporting layer is doped with a donor compound so as to improve the electron transporting capability.

Preferable examples of the donor compound of the present invention include: an alkali metal, an inorganic salt containing an alkali metal, a complex between an alkali metal and an organic substance, an alkali earth metal, an inorganic salt containing an alkali earth metal, or a complex between an alkali earth metal and an organic substance. Preferable kinds of the alkali metal and alkali earth metal include: alkali metals, such as lithium, sodium, and cesium, and alkali earth metals, such as magnesium, and calcium, which are effective in improving the electron transporting capability with a low work function.

Moreover, the metal is preferably used as an inorganic salt or as a complex with an organic substance, rather than the metal single substance, because this makes it possible to provide an easy vacuum vapor-deposition process, and also to provide superior handling performance. From the viewpoints of easy handling in the air and easiness in controlling the additive concentration, the metal is more preferably used as a complex with an organic substance. Examples of the inorganic salt include: oxides, such as LiO and $Li_2O$, nitrides, fluorides, such as LiF, NaF and KF, and carbonates, such as $Li_2CO_3$, $Na_2CO_3$, $K_2CO_3$, $Rb_2CO_3$ and $Cs_2CO_3$. Moreover, as a preferable example of the alkali metal or alkali earth metal, lithium is proposed from the viewpoints of inexpensive materials and easiness in syntheses. Preferable examples of the organic substance in the complex with an organic substance include: quinolinol, benzoquinolinol, flavonol, hydroxyimidazopyridine, hydroxybenzazole, and hydroxytriazole. Among these, a complex between an alkali metal and an organic substance is preferably used, and a complex between lithium and an organic substance is more preferably used. More specifically, a complex between lithium and a compound having a heteroaryl ring containing electron-accepting nitrogen is preferably used, and lithium quinolinol is, in particular, preferably used.

Furthermore, in the case when the donor compound in the electron transporting layer has an appropriate doping rate, the injection rate of electrons from the cathode or the electron injection layer to the electron transporting layer increases so that the energy barrier between the cathode and the electron injection layer or between the electron injection layer and the electron transporting layer is alleviated so that a low-voltage driving process can be desirably carried out. Although the preferable doping concentration differs depending on the material and the film thickness of the doping region, the molar ratio between the organic compound and the donor compound is preferably set in a range from 100:1 to 1:100, more preferably, from 10:1 to 1:10.

The method for doping an electron transporting layer with a donor compound so as to improve the electron transporting capability is particularly effective, in the case when the film thickness of the thin-film layer is thick. The method is, in particular, preferably used when the total film thickness of the electron transporting layer and the emissive layer is set to 50 nm or more. For example, a method for utilizing interference effects so as to improve the luminance efficiency is proposed; however, this method improves the light taking-out efficiency by making light directly emitted from the emissive layer and reflected light by the cathode are matched with each other in the phases thereof. Although the optimal conditions thereof vary depending on light emission wavelengths of the light, the total film thickness of the electron transporting layer and the emissive layer tends to become 50 nm or more, and tends to form a thick film close to about 100 nm, in the case of long wavelength light emission, such as red light emission.

With respect to the film thickness of the electron transporting layer to be doped, as the film thickness of the total electron transporting layer increases, the doping concentration should increase, independent of whether it is one portion of the electron transporting layer or the entire portion thereof. In the case when one portion is doped, a doping region is preferably formed at least on the interface of the electron transporting layer and the cathode, and even in the case when only the portion near the electrode interface is doped, the effect for providing a low-voltage driving process can be obtained. In contrast, in the case when, upon doping the emissive layer with a donor compound, adverse effects to cause a reduction of the luminance efficiency are given, a non-doping region is preferably formed on the interface of the emissive layer and the electron transporting layer.

The formation method for the respective layers forming a light emitting device is not particularly limited, and examples thereof include a resistance heating vapor deposition method, an electron beam vapor deposition method, a sputtering method, a molecule stacking method, and a coating method; normally, from the viewpoint of element characteristics, the resistance heating vapor deposition method and the electron beam vapor deposition method are preferably used.

Although not particularly limited since the thickness of the organic layer varies depending on the resistance value of the emissive substance, the thickness of the organic layer is preferably set in a range from 1 to 1000 nm. The thicknesses of the emissive layer, the electron transporting layer and the hole transporting layer are each preferably set in a range from 1 nm or more to 200 nm or less, more preferably, from 5 nm or more to 100 nm or less.

The light emitting device of the present invention has a function for converting electric energy to light. In this case, as the electric energy, a dc current is mainly used; however, a pulse current and an ac current may also be used. The electric current value and the voltage value are not particularly limited; however, in consideration of power consumption and service life of the device, these should be selected so as to obtain the highest luminance by using energy as low as possible.

The light emitting device of the present invention is desirably used for, for example, displays of matrix and/or segment systems.

In the matrix system, pixels for use in image display are two-dimensionally disposed in a lattice pattern, a mosaic pattern, or the like, so that sets of pixels are used for displaying a character or an image. The shape and size of the pixels are determined depending on the application. For example, for image and character displays for a personal computer, a monitor, or a television, square pixels, each having 300 μm or less in each side, are normally utilized, and in the case of a large-size display such as a display panel, pixels, each having a size of mm order in each side, are utilized. In the case of a monochrome display, pixels of the same color may be arranged; however, in the case of a color display, pixels of red, green and blue are arranged, and displayed. In this case, typically, those of a delta type and a stripe type are proposed. Moreover, with respect to the driving method for the matrix, either a passive matrix driving method or an active matrix driving method may be used. The passive matrix driving method has a simple structure, but in the case when its operation characteristic is taken into consideration, since the active matrix driving method tends to be superior in some cases, it is necessary to separately use these methods properly depending on cases.

In the present invention, a segment system refers to a system in which a pattern is formed so as to display predetermined information, and a region determined by the pattern arrangement is allowed to emit light. Examples thereof include: time and temperature displays for a digital watch or a thermometer, and operation state displays of an audio apparatus and a microwave cooking apparatus, as well as panel displays for an automobile. Moreover, the matrix display and the segment display may coexist in the same panel.

The light emitting device of the present invention is also preferably used as backlights for various apparatuses. The backlight is mainly used for improving the visibility of display devices that do not spontaneously emit light, and applied to liquid crystal displays, watches, audio apparatuses, automobile panels, display panels and signs, and the like. In particular, the light emitting device of the present invention is preferably used for backlights for liquid crystal displays, in particular, for backlights for use in personal computers, in which thinner devices have been demanded, and makes it possible to provide thinner and light-weight back lights in comparison with the conventional ones.

EXAMPLES

The following description will explain the present invention by reference to examples; however, the present invention is not intended to be limited by these examples.

Example 1

A glass substrate (sputtered product at 11 Ω/sq, made by Geomatic Company) on which an ITO transparent conductive film was deposited with a thickness of 150 nm was cut into plates of 38×46 mm, and each of these was etched. After the resultant substrate had been ultrasonic washed for 15 minutes by using "SEMICO CLEAN 56" (trade name, made by Furuuchi Chemical Corporation), it was washed with ultrapure water. Immediately before forming the resultant substrate into a device, it was subjected to a UV-ozone treatment for one hour, and placed inside a vacuum vapor deposition device so that the inside of the device was evacuated up to $5\times10^{-4}$ Pa or less in vacuum degree. First, copper phthalocyanine was formed thereon with a thickness of 10 nm as a hole injection material by using a resistance heating method, and 4,4'-bis(N-(1-naphthyl)-N-phenylamino)biphenyl was vapor deposited thereon with a thickness of 50 nm as a hole transporting material. Next, as emissive materials, a compound (H-1) serving as a host material, and a compound (D-1) serving as a dopant material were vapor deposited thereon with a thickness of 40 nm, with its doping concentration being set to 5% by weight. Next, a mixed layer of an organic compound (1E-1) and a donor compound (lithium fluoride) was vapor deposited and stacked thereon with a thickness of 20 nm at a vapor deposition speed ratio of 1:1 (=0.05 nm/s:0.05 nm/s) as an electron transporting layer.

Next, after lithium fluoride had been vapor deposited with a thickness of 0.5 nm, aluminum was deposited thereon, with a thickness of 1000 nm to form a cathode, so that a device having a size of 5×5 mm in each side was manufactured. The film thickness referred herein was a displayed value on a crystal oscillation-type thick-film monitor. When this light emitting device was driven by a dc current at 10 mA/$cm^2$, a high efficiency blue light emission with a driving voltage of 4.8 V and an external quantum efficiency of 5.3% was obtained.

Examples 2 to 32

The same processes as those of example 1 were carried out except that materials shown in Tables 1 and 2 were used as the host material, dopant material and electron transporting layer; thus, a light emitting device was produced. The results of the respective examples are shown in Tables 1 and 2.

Comparative Example 1

The same processes as those of example 1 were carried out except that no donor compound was used as the electron transporting layer so that a light emitting device was produced. When this light emitting device was driven by a dc current at 10 mA/$cm^2$, a high efficiency blue light emission with a driving voltage of 6.4 V and an external quantum efficiency of 4.2% was obtained.

Comparative examples 2 to 8

The same processes as those of example 1 were carried out except that materials shown in Tables 1 and 2 were used as the host material, dopant material and electron transporting material; thus, a light emitting device was produced. The results of the respective comparative examples are shown in Tables 1 and 2.

Example 33

A glass substrate (sputtered product at 11 Ω/sq, made by Geomatic Company) on which an ITO transparent conductive film was deposited with a thickness of 165 nm was cut into plates of 38×46 mm, and each of these was etched. After the resultant substrate had been ultrasonic washed for 15 minutes by using "SEMICO CLEAN 56" (trade name, made by Furuuchi Chemical Corporation), it was washed with ultrapure water. Immediately before forming the resultant substrate into a device, it was subjected to a UV-ozone treatment for one hour, and placed inside a vacuum vapor deposition device so that the inside of the device was evacuated up to $5\times10^{-4}$ Pa or less in vacuum degree. First, 1,4,5,8,9,12-hexa-aza-triphenylene hexacarbonitrile was formed thereon with a thickness of 10 nm as a hole injection material by using a resistance heating method, and 4,4'-bis(N-(1-naphthyl)-N-phenylamino)biphenyl was vapor deposited thereon with a thickness of 50 nm as a hole transporting material. Next, as emissive materials, a compound (H-1) serving as a host material, and a compound (D-2) serving as a dopant material were vapor deposited thereon with a thickness of 40 nm, with its doping concentration being set to 5% by weight. Next, a mixed layer of an organic compound (1E-1) and a donor compound (lithium quinolinol) was stacked thereon with a thickness of 10 nm at a vapor deposition speed ratio of 1:1 (=0.05 nm/s:0.05 nm/s) as an electron transporting layer.

Next, after lithium quinolinol had been vapor deposited with a thickness of 1 nm, a co-vapor deposition film of magnesium and silver was deposited thereon, with a thickness of 100 nm at a vapor deposition speed ratio of magnesium:silver=10:1 (=0.5 nm/s:0.05 nm/s) to form a cathode so that a device having 5×5 mm in each side was manufactured. The film thickness referred herein was a displayed value on a crystal oscillation-type thick-film monitor. When this light emitting device was driven by a dc current at 10 mA/$cm^2$, a high efficiency blue light emission with a driving voltage of 4.3 V and an external quantum efficiency of 6.3% was obtained.

Examples 34 to 102

The same processes as those of example 33 were carried out except that materials shown in Tables 3 to 6 were used as the host material, dopant material and electron transporting layer; thus, a light emitting device was produced. The results of the respective examples are shown in Tables 3 to 6.

Comparative examples 9 to 16

The same processes as those of example 33 were carried out except that materials shown in Tables 3 to 6 were used as the host material, dopant material and electron transporting material; thus, a light emitting device was produced. The results of the respective comparative examples are shown in Tables 3 and 6.

Compounds used in the respective examples and comparative examples are shown below:

[Formula 50]

(H-1)

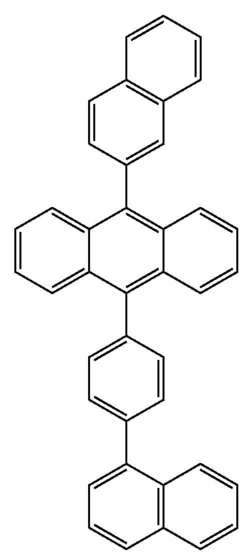

-continued
(H-2)
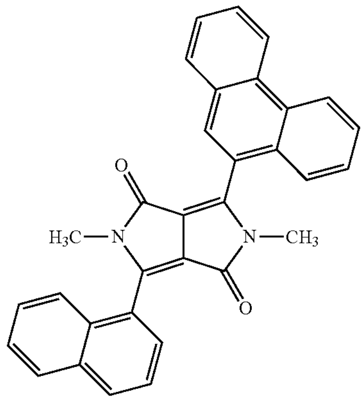
(H-3)
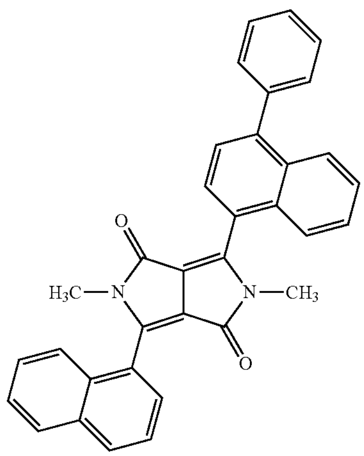
(D-1)
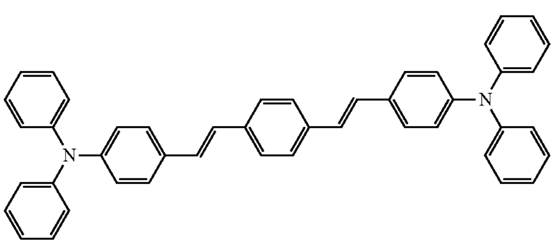
(D-2)
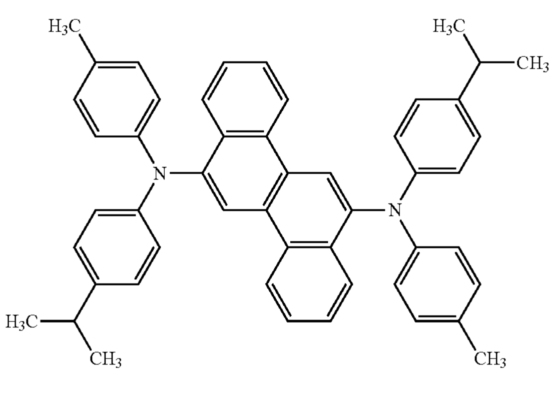
-continued
(D-3)
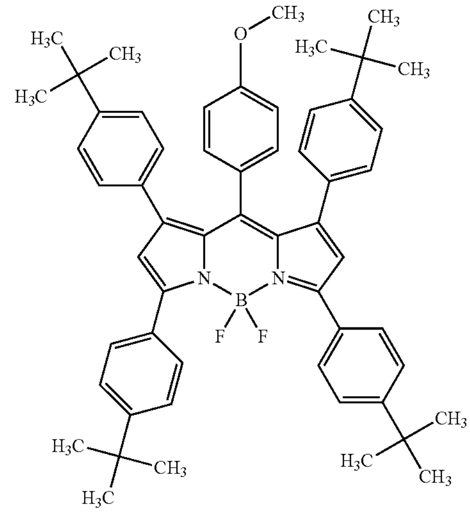
[Formula 51]
(1E-1)
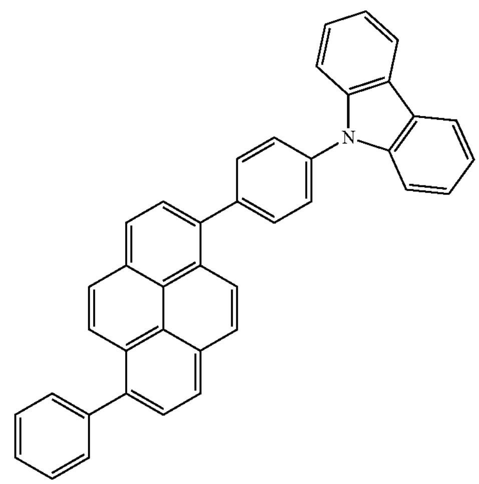
(1E-2)
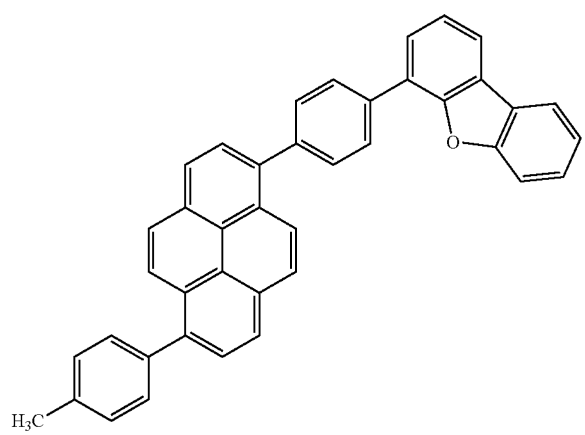

-continued
(1E-3)
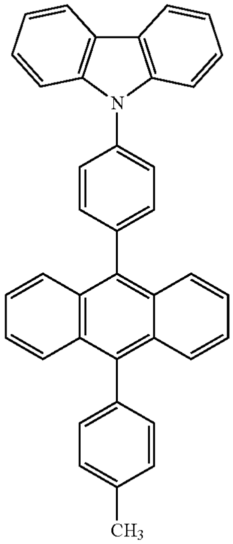
(1E-4)
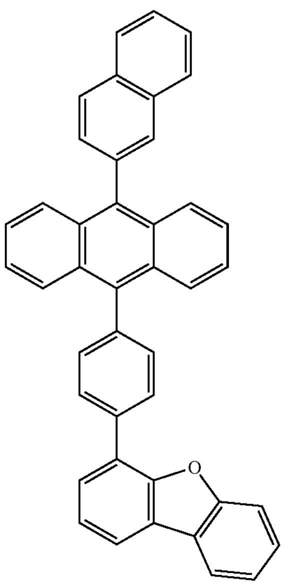
(1E-5)
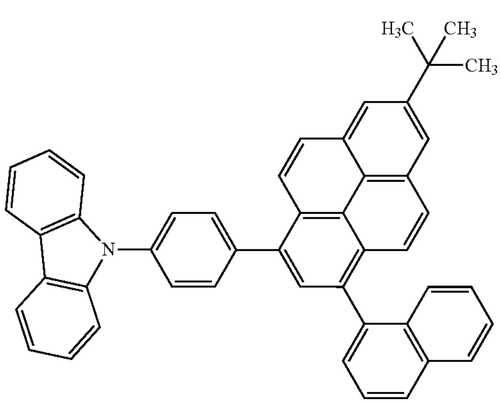
-continued
(1E-6)
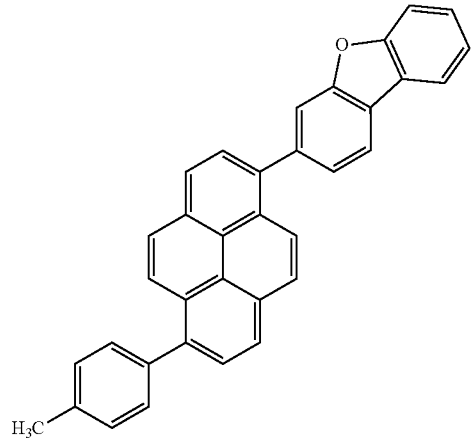
[Formula 52]
(1E-7)
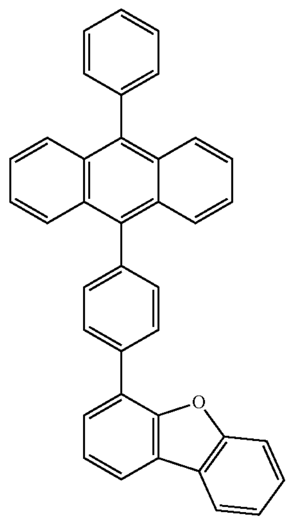
(1E-8)
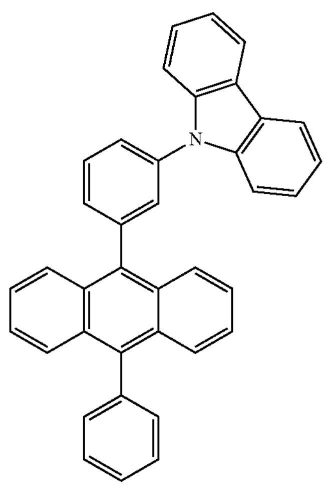

-continued
(1E-9)
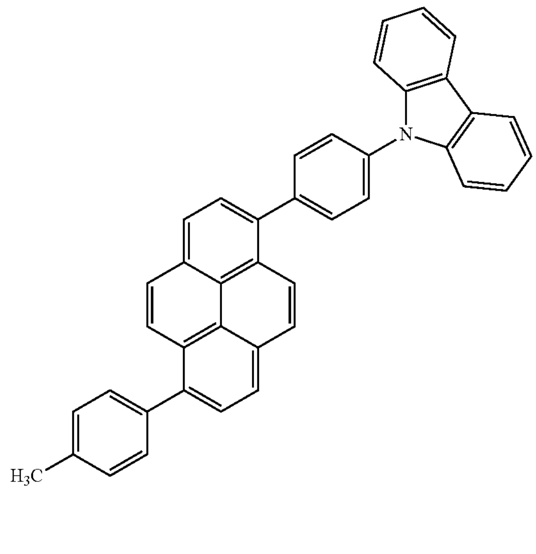
(1E-10)
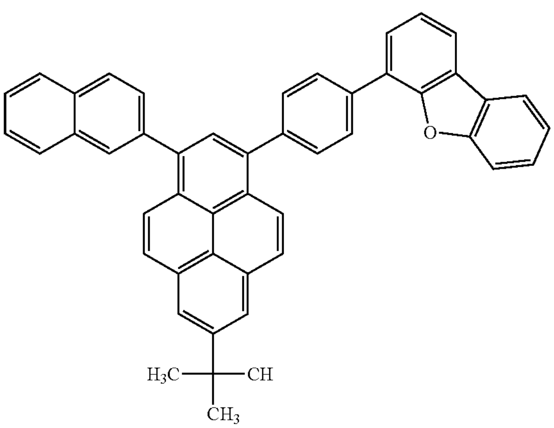
(1E-11)
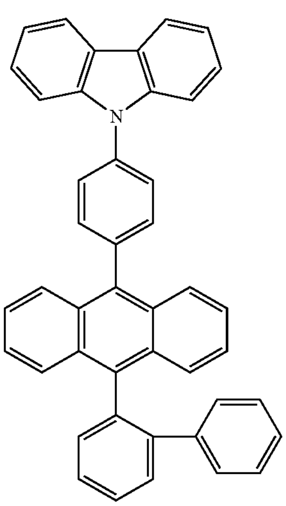
-continued
(1E-12)
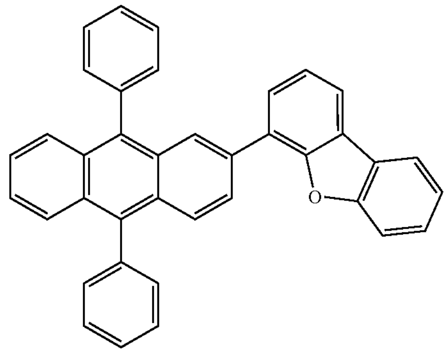
[Formula 53]
(1E-13)
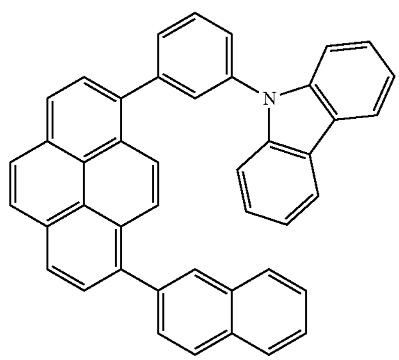
(1E-14)
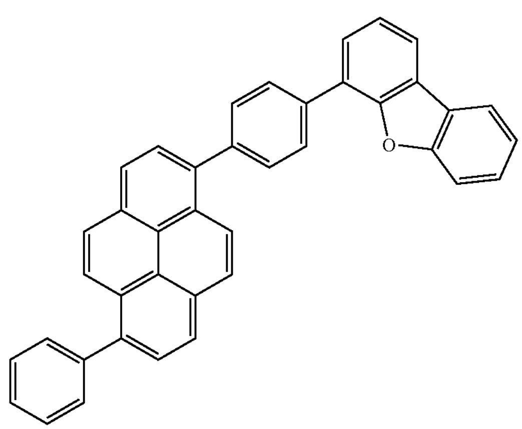

-continued
(1E-15)
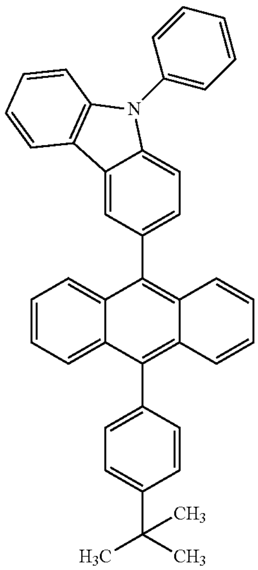
(1E-16)
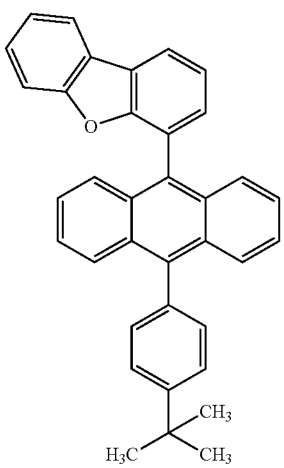
(1E-17)
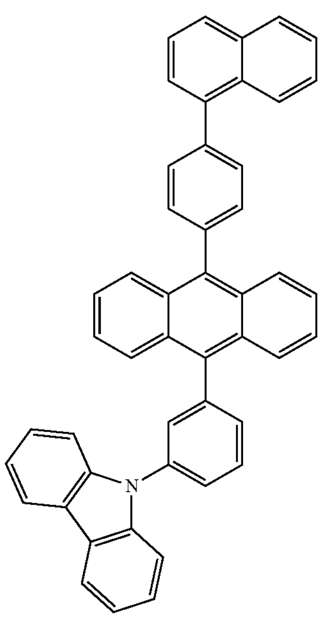
-continued
(1E-18)
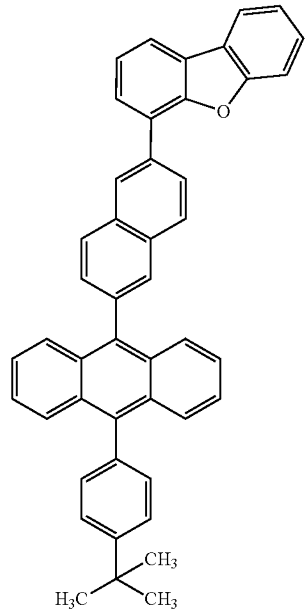
[Formula 54]
(1E-19)
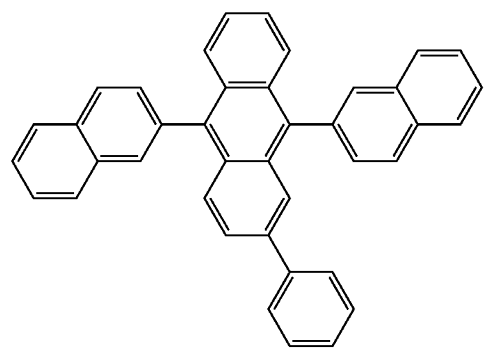
(2E-1)
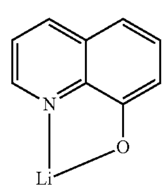
(D-4)
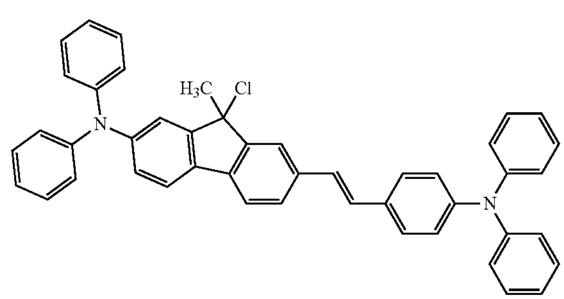

-continued
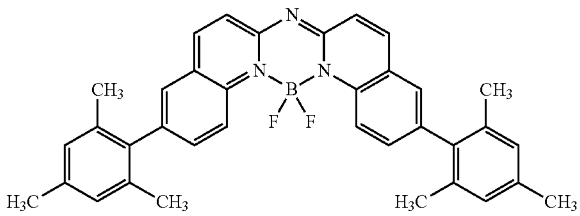
(D-5)
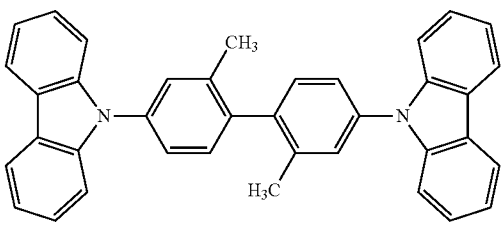
(H-4)
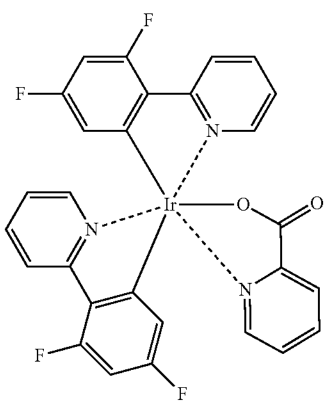
(D-6)
[Formula 55]
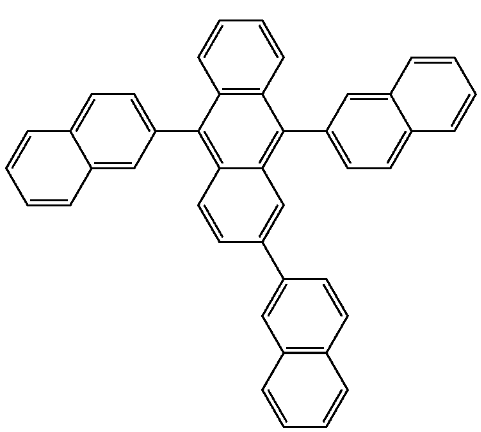
(H-5)
-continued
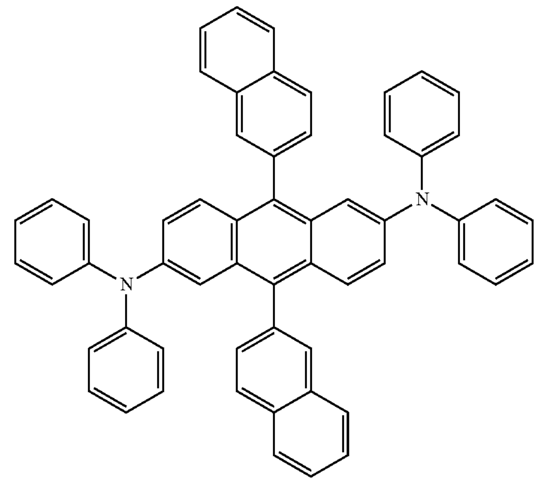
(D-7)
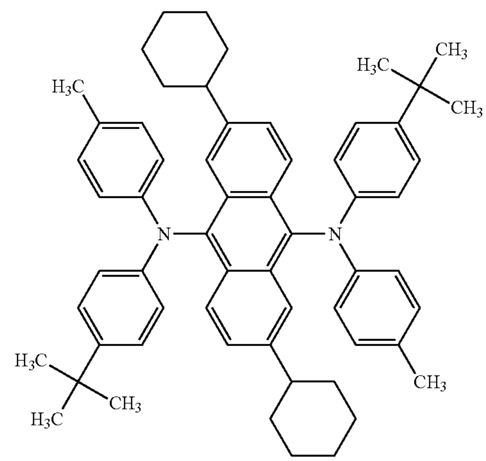
(D-8)
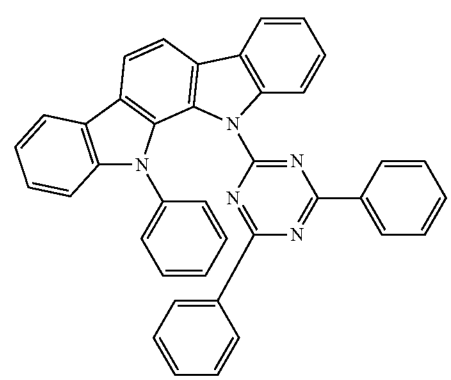
(H-6)

-continued
(D-9)
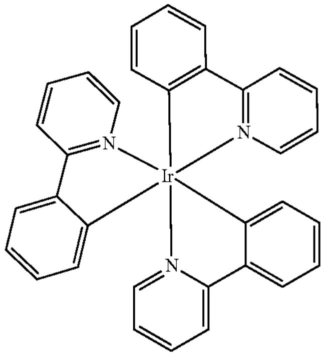
(H-7)
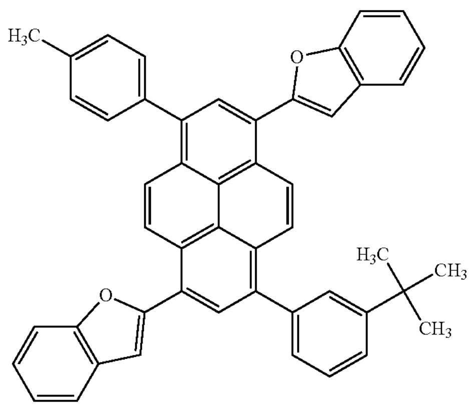
(H-8)
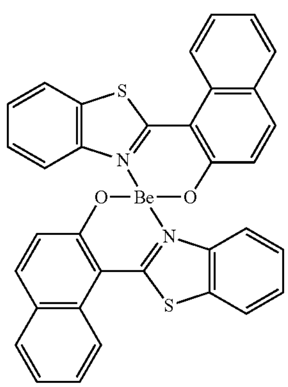
(D-10)
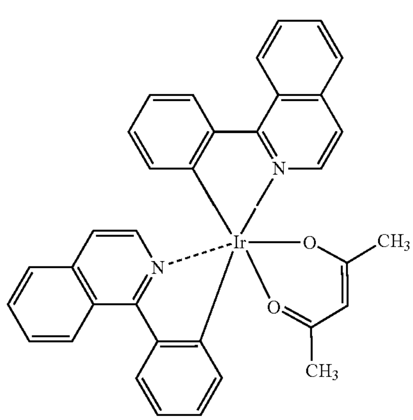
-continued
[Formula 56]
(1E-20)
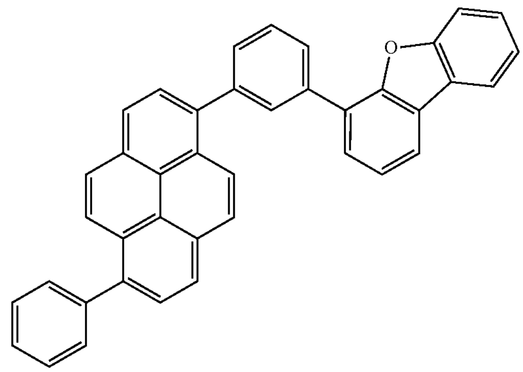
(1E-21)
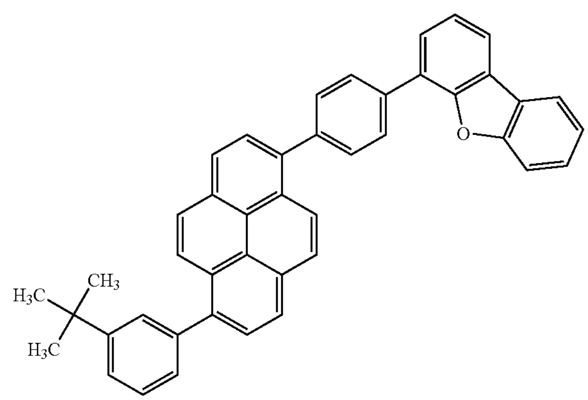
(1E-22)
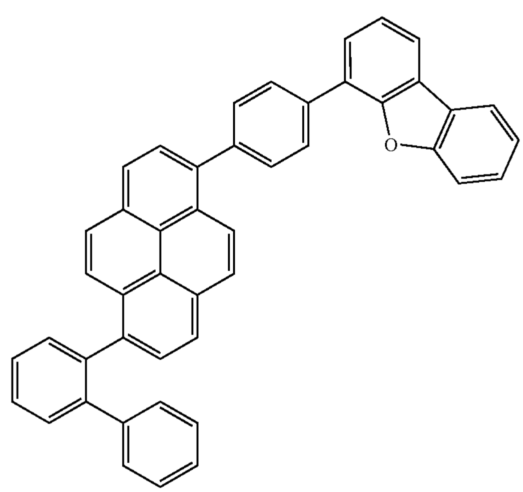

(1E-23)
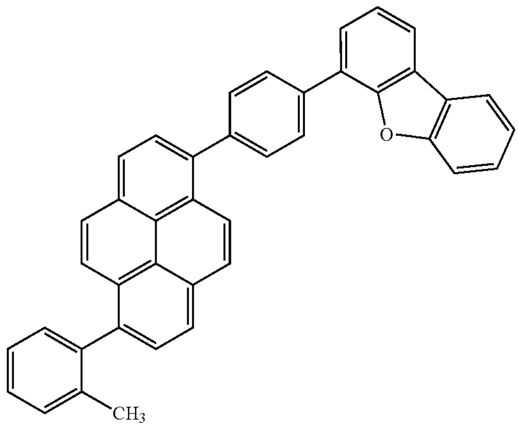
(1E-24)
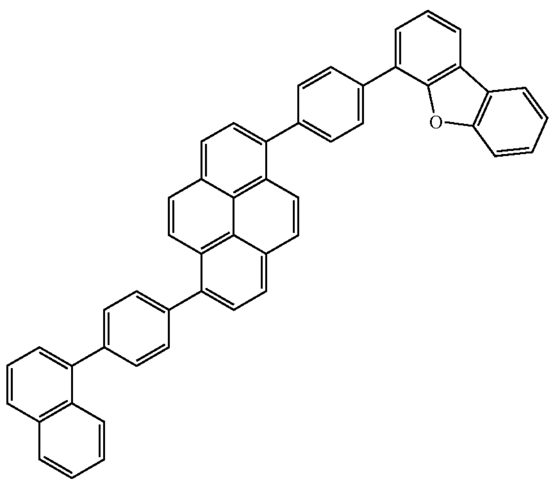
(1E-25)
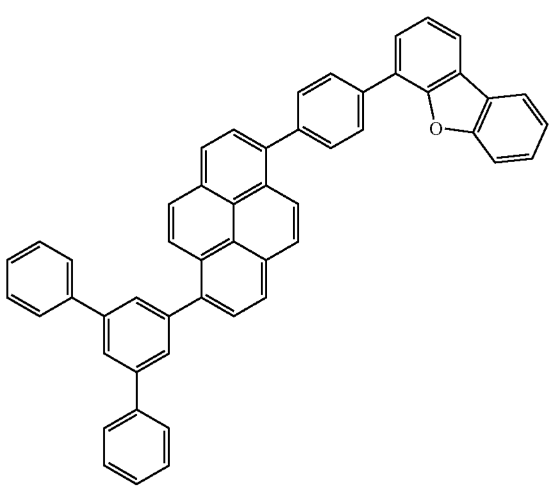
(1E-26)
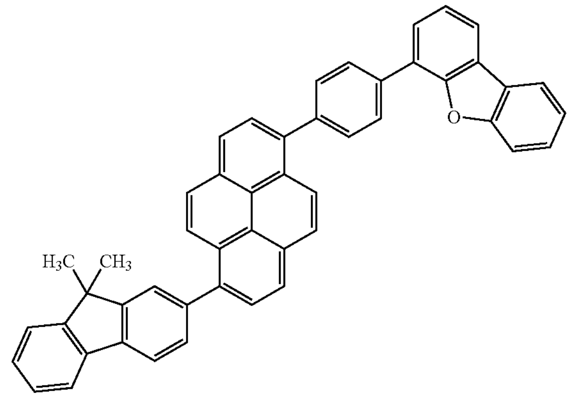
(1E-27)
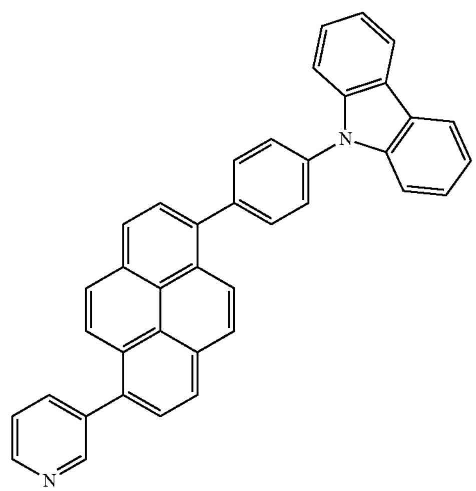
(1E-28)
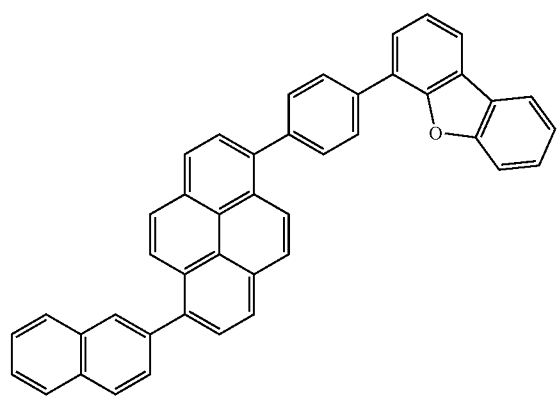
(1E-29)
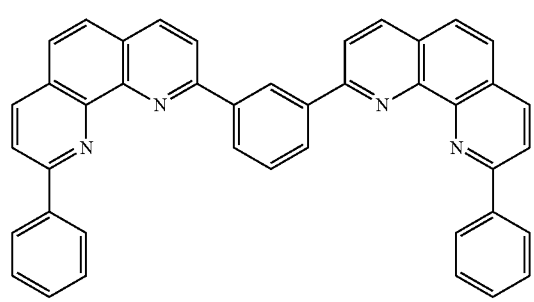

-continued
(1E-30)
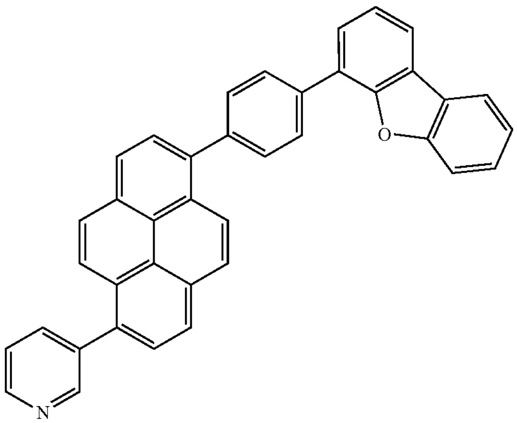
(1E-31)
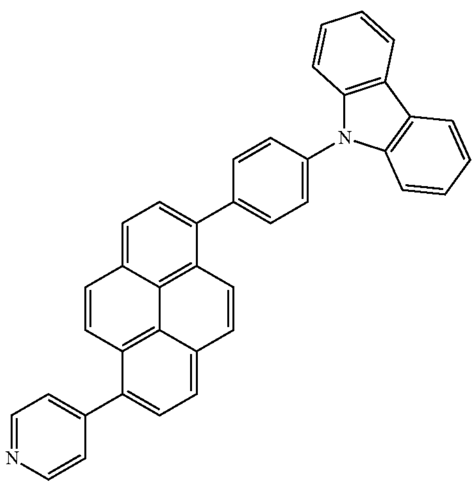
[Formula 57]
(1E-32)
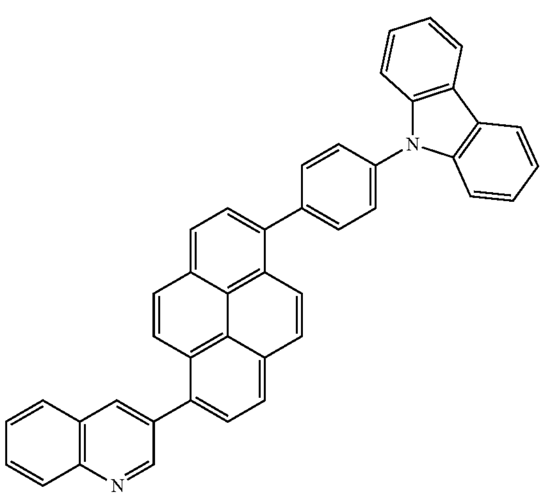
-continued
(1E-33)
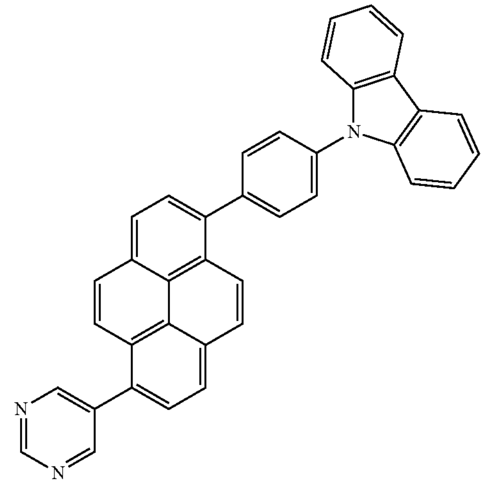
(1E-34)
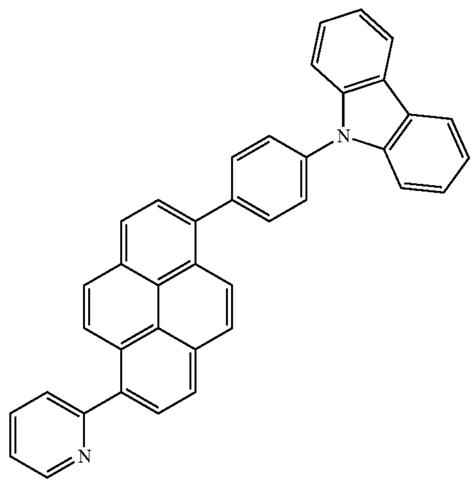
(1E-35)
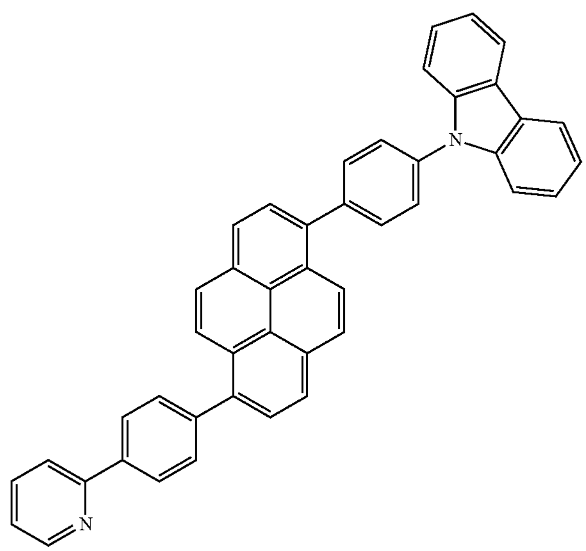

-continued
(1E-36)
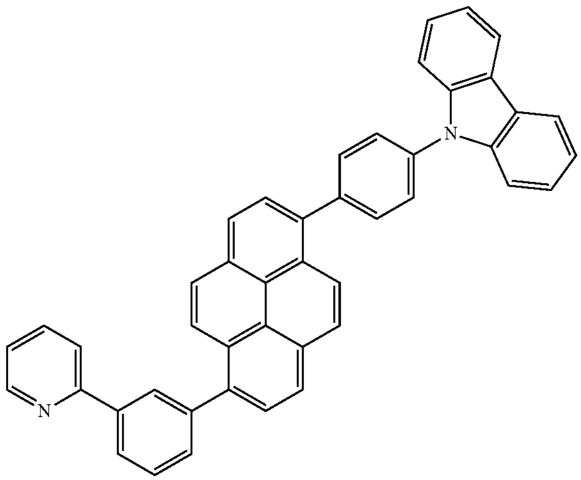
(1E-37)
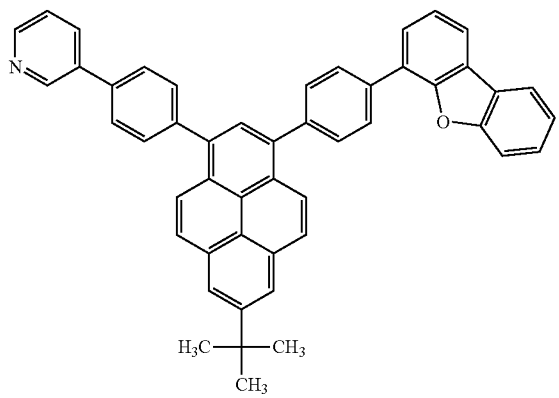
(1E-38)
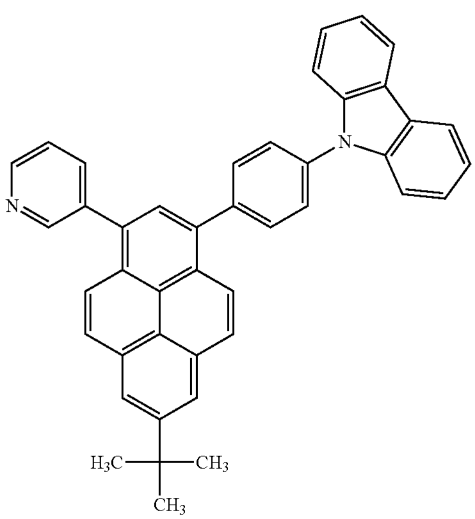
-continued
(1E-39)
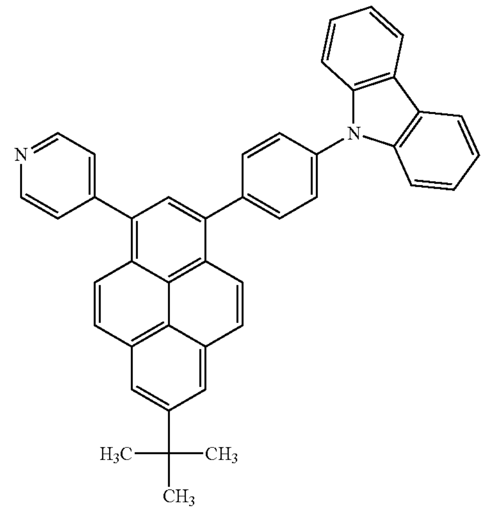
(1E-40)
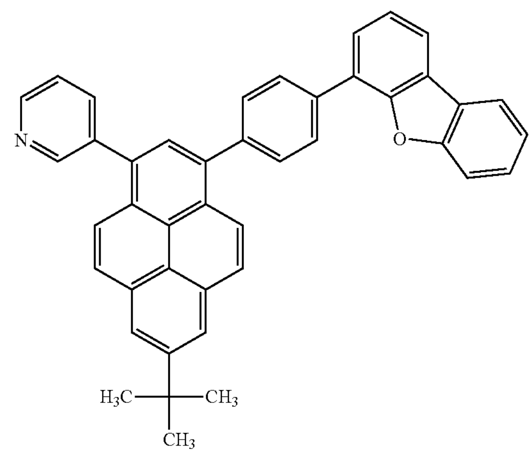
(1E-41)
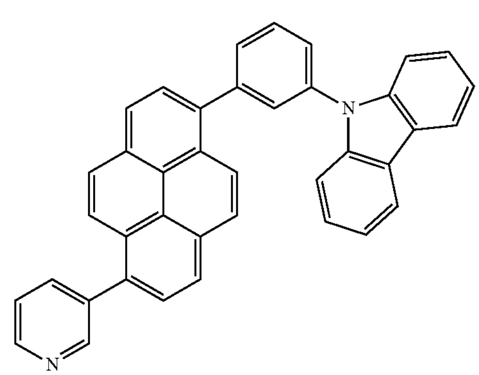

-continued
(1E-42)
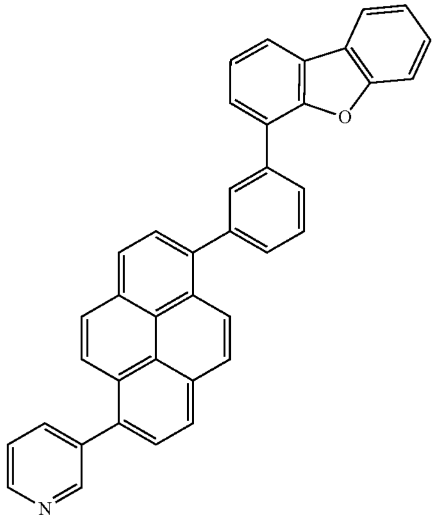
(1E-43)
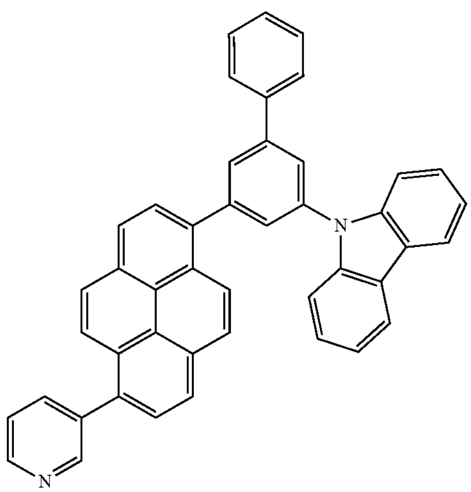
[Formula 58]
(1E-44)
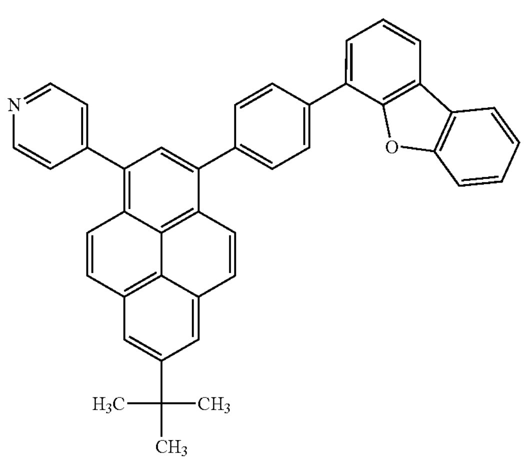
-continued
(1E-45)
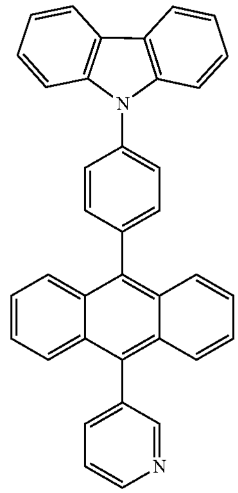
(1E-46)
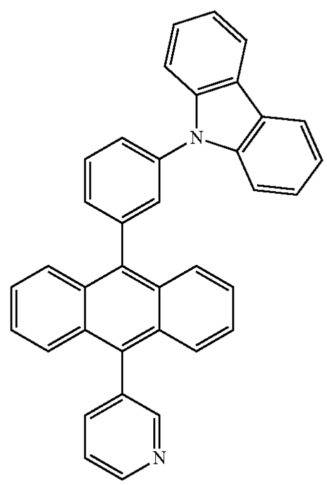
(1E-47)
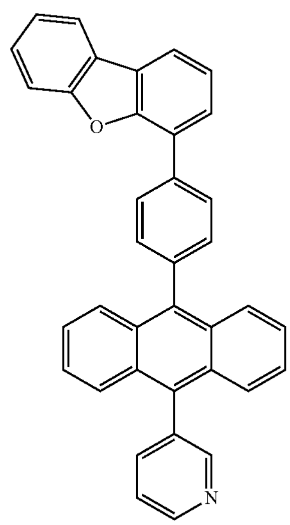

-continued
(1E-48)
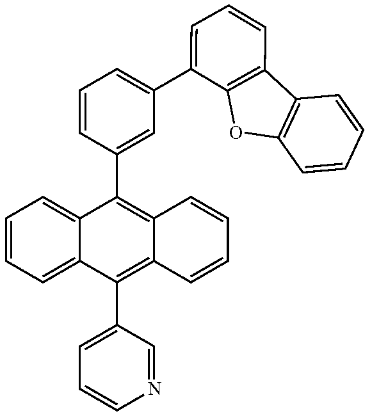
(1E-49)
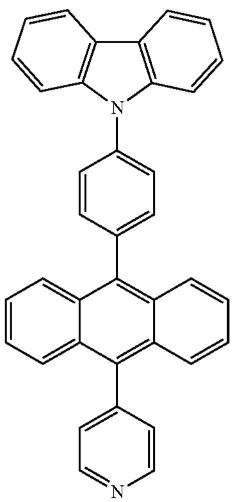
(1E-50)
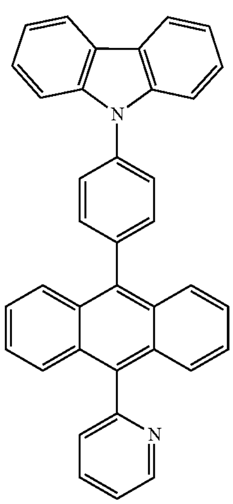
-continued
(1E-51)
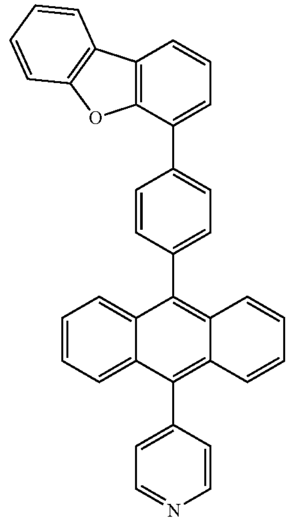
(1E-52)
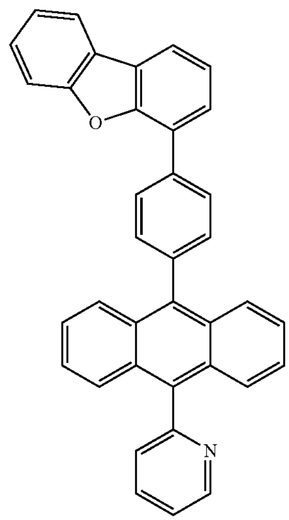
(1E-53)
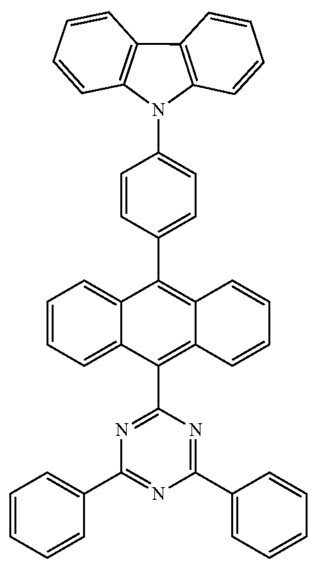

-continued (1E-54)

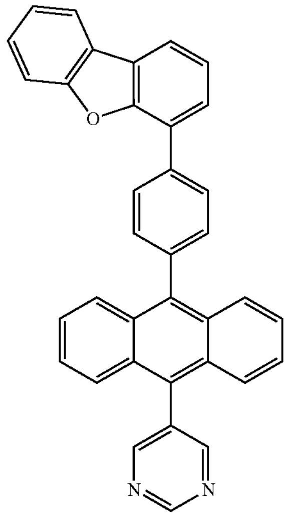

-continued (2E-2)

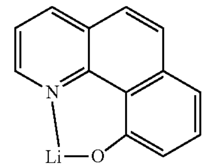

TABLE 1

| | emissive material | | | electron transporting material | | external | driving |
|---|---|---|---|---|---|---|---|
| | host material | dopant material | emission color | organic compound | donor compound | quantum efficiency (%) | voltage (V) |
| Example 1 | H-1 | D-1 | blue | 1E-1 | lithium fluoride | 5.3 | 4.8 |
| Example 2 | | | blue | 1E-2 | lithium fluoride | 5.1 | 4.9 |
| Example 3 | | | blue | 1E-3 | lithium fluoride | 5.0 | 4.9 |
| Example 4 | | | blue | 1E-4 | lithium fluoride | 5.1 | 4.7 |
| Example 5 | | | blue | 1E-5 | lithium fluoride | 4.9 | 5.2 |
| Example 6 | | | blue | 1E-6 | lithium fluoride | 5.0 | 5.0 |
| Example 7 | | | blue | 1E-7 | lithium fluoride | 5.1 | 5.0 |
| Example 8 | | | blue | 1E-8 | lithium fluoride | 5.0 | 5.1 |
| Comparative Example 1 | H-1 | D-1 | blue | 1E-1 | none | 4.2 | 6.4 |
| Comparative Example 2 | | | blue | 1E-19 | lithium fluoride | 4.4 | 6.0 |
| Example 9 | H-1 | D-2 | blue | 1E-1 | 2E-1 | 5.9 | 4.3 |
| Example 10 | | | blue | 1E-2 | 2E-1 | 5.7 | 4.4 |
| Example 11 | | | blue | 1E-3 | 2E-1 | 5.7 | 4.3 |
| Example 12 | | | blue | 1E-4 | 2E-1 | 5.8 | 4.5 |
| Example 13 | | | blue | 1E-9 | 2E-1 | 5.6 | 4.6 |
| Example 14 | | | blue | 1E-10 | 2E-1 | 5.8 | 4.5 |
| Example 15 | | | blue | 1E-11 | 2E-1 | 5.6 | 4.8 |
| Example 16 | | | blue | 1E-12 | 2E-1 | 5.5 | 4.7 |
| Comparative Example 3 | H-1 | D-2 | blue | 1E-2 | none | 4.4 | 6.0 |
| Comparative Example 4 | | | blue | 1E-19 | 2E-1 | 4.6 | 5.8 |

TABLE 2

| | emissive material | | | electron transporting material | | external | driving |
|---|---|---|---|---|---|---|---|
| | host material | dopant material | emission color | organic compound | donor compound | quantum efficiency (%) | voltage (V) |
| Example 17 | H-2 | D-3 | red | 1E-1 | cesium | 4.4 | 4.2 |
| Example 18 | | | red | 1E-2 | cesium | 4.4 | 4.4 |
| Example 19 | | | red | 1E-3 | cesium | 4.5 | 4.2 |
| Example 20 | | | red | 1E-4 | cesium | 4.5 | 4.1 |

TABLE 2-continued

| | emissive material | | | electron transporting material | | external | driving |
|---|---|---|---|---|---|---|---|
| | host material | dopant material | emission color | organic compound | donor compound | quantum efficiency (%) | voltage (V) |
| Example 21 | | | red | 1E-13 | cesium | 4.3 | 4.5 |
| Example 22 | | | red | 1E-14 | cesium | 4.6 | 4.3 |
| Example 23 | | | red | 1E-15 | cesium | 4.2 | 4.7 |
| Example 24 | | | red | 1E-16 | cesium | 4.3 | 4.5 |
| Comparative Example 5 | H-2 | D-3 | red | 1E-3 | none | 4.0 | 5.5 |
| Comparative Example 6 | | | red | 1E-19 | cesium | 3.9 | 5.5 |
| Example 25 | H-3 | D-3 | red | 1E-1 | 2E-1 | 5.0 | 4.2 |
| Example 26 | | | red | 1E-2 | 2E-1 | 4.9 | 4.1 |
| Example 27 | | | red | 1E-3 | 2E-1 | 5.1 | 3.9 |
| Example 28 | | | red | 1E-4 | 2E-1 | 5.1 | 4.2 |
| Example 29 | | | red | 1E-9 | 2E-1 | 4.9 | 4.2 |
| Example 30 | | | red | 1E-10 | 2E-1 | 4.8 | 4.3 |
| Example 31 | | | red | 1E-17 | 2E-1 | 5.0 | 4.2 |
| Example 32 | | | red | 1E-18 | 2E-1 | 4.6 | 4.5 |
| Comparative Example 7 | H-3 | D-3 | red | 1E-4 | none | 3.5 | 5.1 |
| Comparative Example 8 | | | red | 1E-19 | 2E-1 | 3.6 | 5.1 |

TABLE 3

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 33 | H-1 | D-2 | blue | 1E-1 | 2E-1 | Mg/Ag | 6.3 | 4.3 |
| Example 34 | | | blue | 1E-20 | 2E-1 | Mg/Ag | 6.2 | 4.2 |
| Example 35 | | | blue | 1E-21 | 2E-1 | Mg/Ag | 6.2 | 4.3 |
| Example 36 | | | blue | 1E-28 | 2E-1 | Mg/Ag | 6.0 | 4.3 |
| Example 37 | | | blue | 1E-22 | 2E-1 | Mg/Ag | 6.1 | 4.2 |
| Example 38 | | | blue | 1E-23 | 2E-1 | Mg/Ag | 6.3 | 4.3 |
| Example 39 | | | blue | 1E-22 | 2E-2 | Mg/Ag | 5.8 | 4.3 |
| Example 40 | | | blue | 1E-22 | lithium fluoride | Mg/Ag | 5.6 | 4.3 |
| Example 41 | | | blue | 1E-27 | 2E-1 | Mg/Ag | 6.7 | 3.8 |
| Example 42 | | | blue | 1E-30 | 2E-1 | Mg/Ag | 6.6 | 3.8 |
| Example 43 | | | blue | 1E-33 | 2E-1 | Mg/Ag | 6.5 | 4.0 |
| Example 44 | | | blue | 1E-42 | 2E-1 | Mg/Ag | 6.5 | 3.8 |
| Example 45 | | | blue | 1E-43 | 2E-1 | Mg/Ag | 6.5 | 3.8 |
| Example 46 | | | blue | 1E-45 | 2E-1 | Mg/Ag | 6.6 | 3.8 |
| Comparative Example 9 | H-1 | D-2 | blue | 1E-22 | none | Mg/Ag | 4.5 | 5.3 |
| Comparative Example 10 | | | blue | 1E-29 | 2E-1 | Mg/Ag | 3.8 | 4.5 |

TABLE 4

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 47 | H-1 | D-4 | blue | 1E-14 | 2E-1 | Mg/Ag | 6.0 | 4.2 |
| Example 48 | | | blue | 1E-24 | 2E-1 | Mg/Ag | 6.1 | 4.2 |
| Example 49 | | | blue | 1E-25 | 2E-1 | Mg/Ag | 6.1 | 4.2 |
| Example 50 | | | blue | 1E-26 | 2E-1 | Mg/Ag | 6.0 | 4.3 |
| Example 51 | | | blue | 1E-27 | 2E-1 | Mg/Ag | 6.3 | 3.8 |
| Example 52 | | | blue | 1E-30 | 2E-1 | Mg/Ag | 6.4 | 3.8 |
| Example 53 | | | blue | 1E-31 | 2E-1 | Mg/Ag | 6.1 | 4.0 |
| Example 54 | | | blue | 1E-35 | 2E-1 | Mg/Ag | 6.1 | 4.0 |
| Example 55 | | | blue | 1E-46 | 2E-1 | Mg/Ag | 6.0 | 3.8 |
| Example 56 | | | blue | 1E-47 | 2E-1 | Mg/Ag | 6.1 | 3.8 |
| Example 57 | 1E-1 | | blue | 1E-27 | 2E-1 | Mg/Ag | 6.5 | 3.8 |

TABLE 4-continued

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 58 | H-1 | D-5 | blue | 1E-10 | 2E-1 | Mg/Ag | 6.0 | 4.4 |
| Example 59 | | | blue | 1E-27 | 2E-1 | Mg/Ag | 6.1 | 4.0 |
| Example 60 | | | blue | 1E-30 | 2E-1 | Mg/Ag | 6.1 | 4.0 |
| Example 61 | | | blue | 1E-34 | 2E-1 | Mg/Ag | 6.0 | 4.2 |
| Example 62 | | | blue | 1E-36 | 2E-1 | Mg/Ag | 6.0 | 4.2 |
| Example 63 | | | blue | 1E-48 | 2E-1 | Mg/Ag | 6.0 | 4.0 |
| Example 64 | H-4 | D-6 | blue | 1E-10 | 2E-1 | Mg/Ag | 7.9 | 5.8 |
| Example 65 | | | blue | 1E-27 | 2E-1 | Mg/Ag | 8.3 | 5.3 |
| Example 66 | | | blue | 1E-30 | 2E-1 | Mg/Ag | 8.2 | 5.3 |
| Example 67 | | | blue | 1E-37 | 2E-1 | Mg/Ag | 8.1 | 5.5 |
| Example 68 | | | blue | 1E-49 | 2E-1 | Mg/Ag | 8.0 | 5.5 |

TABLE 5

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 69 | H-5 | D-7 | green | 1E-10 | 2E-1 | Mg/Ag | 7.3 | 4.3 |
| Example 70 | | | green | 1E-27 | 2E-1 | Mg/Ag | 7.8 | 3.9 |
| Example 71 | | | green | 1E-30 | 2E-1 | Mg/Ag | 7.8 | 3.9 |
| Example 72 | | | green | 1E-40 | 2E-1 | Mg/Ag | 7.6 | 3.9 |
| Example 73 | | | green | 1E-50 | 2E-1 | Mg/Ag | 7.4 | 4.1 |
| Example 74 | | | green | 1E-10 | 2E-1 | Al | 6.8 | 4.9 |
| Comparative Example 11 | H-5 | D-7 | green | 1E-10 | none | Mg/Ag | 6.1 | 5.3 |
| Comparative Example 12 | | | green | 1E-29 | 2E-1 | Mg/Ag | 4.4 | 4.5 |
| Comparative Example 13 | | | green | 1E-10 | none | Al | 5.1 | 5.7 |
| Example 75 | H-5 | D-8 | green | 1E-1 | 2E-1 | Mg/Ag | 7.1 | 4.3 |
| Example 76 | | | green | 1E-22 | 2E-1 | Mg/Ag | 7.3 | 4.3 |
| Example 77 | | | green | 1E-27 | 2E-1 | Mg/Ag | 7.6 | 3.9 |
| Example 78 | | | green | 1E-41 | 2E-1 | Mg/Ag | 7.5 | 3.9 |
| Example 79 | | | green | 1E-51 | 2E-1 | Mg/Ag | 7.4 | 4.1 |
| Example 80 | H-6 | D-9 | green | 1E-1 | 2E-1 | Mg/Ag | 11.7 | 4.6 |
| Example 81 | | | green | 1E-10 | 2E-1 | Mg/Ag | 12.3 | 4.5 |
| Example 82 | | | green | 1E-14 | 2E-1 | Mg/Ag | 11.3 | 4.8 |
| Example 83 | | | green | 1E-22 | 2E-1 | Mg/Ag | 11.8 | 4.8 |
| Example 84 | | | green | 1E-27 | 2E-1 | Mg/Ag | 13.1 | 3.9 |
| Example 85 | | | green | 1E-30 | 2E-1 | Mg/Ag | 13.0 | 3.9 |
| Example 86 | | | green | 1E-38 | 2E-1 | Mg/Ag | 12.9 | 3.9 |
| Example 87 | | | green | 1E-52 | 2E-1 | Mg/Ag | 12.6 | 4.1 |

TABLE 6

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 88 | H-7 | D-3 | red | 1E-1 | 2E-1 | Mg/Ag | 7.9 | 4.6 |
| Example 89 | | | red | 1E-10 | 2E-1 | Mg/Ag | 7.8 | 4.7 |
| Example 90 | | | red | 1E-14 | 2E-1 | Mg/Ag | 8.1 | 4.5 |
| Example 91 | | | red | 1E-27 | 2E-1 | Mg/Ag | 8.0 | 3.9 |
| Example 92 | | | red | 1E-32 | 2E-1 | Mg/Ag | 7.9 | 4.1 |
| Example 93 | | | red | 1E-53 | 2E-1 | Mg/Ag | 7.9 | 4.1 |
| Example 94 | H-8 | D-10 | red | 1E-1 | 2E-1 | Mg/Ag | 10.3 | 4.5 |
| Example 95 | | | red | 1E-10 | 2E-1 | Mg/Ag | 10.9 | 4.6 |
| Example 96 | | | red | 1E-22 | 2E-1 | Mg/Ag | 10.6 | 4.7 |
| Example 97 | | | red | 1E-27 | 2E-1 | Mg/Ag | 12.1 | 3.9 |
| Example 98 | | | red | 1E-30 | 2E-1 | Mg/Ag | 12.0 | 3.9 |
| Example 99 | | | red | 1E-39 | 2E-1 | Mg/Ag | 11.7 | 4.1 |
| Example 100 | | | red | 1E-44 | 2E-1 | Mg/Ag | 11.6 | 4.1 |
| Example 101 | | | red | 1E-54 | 2E-1 | Mg/Ag | 11.6 | 4.1 |

TABLE 6-continued

| | emissive material | | | electron transporting material | | | external | driving |
|---|---|---|---|---|---|---|---|---|
| | host material | dopant material | emission color | organic compound | donor compound | cathode metal | quantum efficiency (%) | voltage (V) |
| Example 102 | | | red | 1E-1 | 2E-1 | Al | 9.7 | 4.9 |
| Comparative Example 14 | H-8 | D-10 | red | 1E-1 | none | Mg/Ag | 8.6 | 5.7 |
| Comparative Example 15 | | | red | 1E-29 | 2E-1 | Mg/Ag | 7.8 | 5.3 |
| Comparative Example 16 | | | red | 1E-1 | none | Al | 8.1 | 5.8 |

INDUSTRIAL APPLICABILITY

The light emitting device material of the present invention is applicable to light emitting devices and the like, and capable of providing a light emitting device material that is superior in thin-film stability. In accordance with the present invention, it is possible to obtain a light emitting device that can achieve both of high luminance efficiency and low driving voltage. The light emitting device of the present invention is applicable to various fields, such as display devices, flat panel displays, backlights, lighting fittings, interior goods, signs, signboards, electronic cameras, and light signal generators.

The invention claimed is:

1. A light emitting device, which serves as an organic electric field light emitting device, comprising:

a thin-film layer including at least an emissive layer and an electron transporting layer; and a second electrode formed on the thin-film layer, the thin-film layer and the second electrode being formed on a first electrode formed on a substrate, wherein the electron transporting layer contains an organic compound represented by the following formula (1) and a donor compound:

$$Y\!\left(\!-A^1\text{-}Ar\right)_{n^1} \qquad (1)$$

wherein Y represents either substituted or unsubstituted pyrene, or substituted or unsubstituted anthracene; $A^1$ is selected from the group consisting of a single bond, an arylene group, and a hetero arylene group; Ar is selected from the group consisting of a carbazolyl group, a dibenzofuranyl group, and a dibenzothiophenyl group, where these groups may be substituted or unsubstituted, and $n^1$ is an integer of 1 to 3.

2. The light emitting device according to claim 1, wherein the donor compound is prepared as an alkali metal, an inorganic salt containing an alkali metal, a complex between an alkali metal and an organic substance, an alkali earth metal, an inorganic salt containing an alkali earth metal, or a complex between an alkali earth metal and an organic substance.

3. The light emitting device according to claim 1, wherein the donor compound is a complex between an alkali metal and an organic substance, or a complex between an alkali earth metal and an organic substance.

4. The light emitting device according to claim 1, wherein the emissive layer contains a phosphorescence emissive material.

5. The light emitting device according to claim 1, wherein hole injection/transporting layers contain a compound represented by the following formula (8):

[Formula 2]

(8)

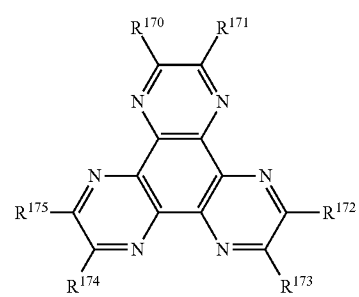

wherein $R^{170}$ to $R^{175}$, which may be the same as or different from one another, are selected from the group consisting of halogen, a sulfonyl group, a carbonyl group, a nitro group, a cyano group, and a trifluoromethyl group.

6. The light emitting device according to claim 1, wherein the organic compound is represented by the following formula (2):

(2)

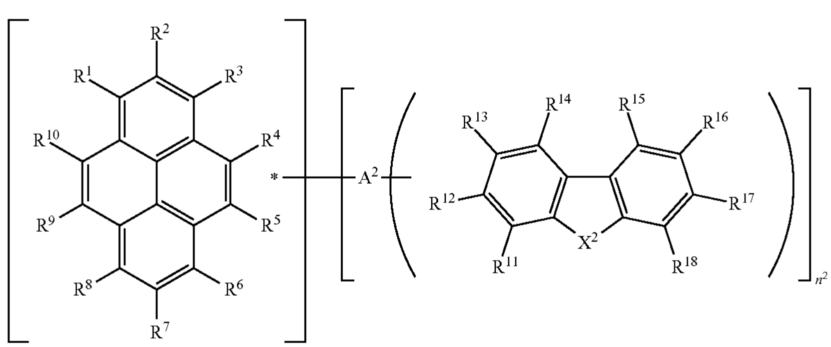

wherein $R^1$ to $R^{18}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and —P(═O)$R^{19}R^{20}$, where each of $R^{19}$ and $R^{20}$ is an aryl group or a heteroaryl group; $R^1$ to $R^{20}$ may form a ring together with adjacent substituents, and $n^2$ is an integer of 1 to 3; $X^2$ is selected from the group consisting of —O—, —S—, and —$NR^{21}$—; where $R^{21}$ is selected from the group consisting of hydrogen, an alkyl group, a cycloalkyl group, a heterocyclic group, an alkenyl group, a cycloalkenyl group, an alkynyl group, an aryl group, a heteroaryl group, and an amino group, and $R^{21}$ may be bonded to $R^{11}$ or $R^{18}$ to form a ring; $A^2$ is selected from the group consisting of a single bond, an arylene group, and a heteroarylene group; and any $n^2$ number of $R^1$ to $R^{10}$ and any one of $R^{11}$ to $R^{21}$ are used for a linkage to $A^2$; however, at least one group of $R^3$, $R^6$ and $R^8$ is a group different from $R^1$.

7. The light emitting device according to claim 6, wherein the organic compound is represented by the following formula (3):

(3)

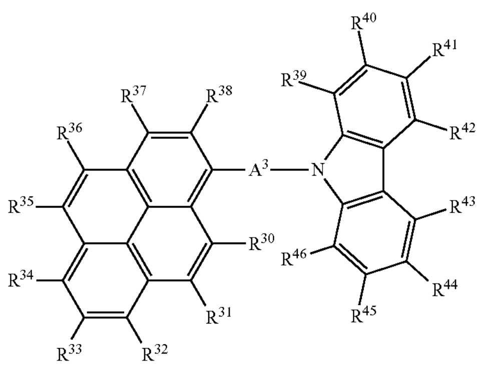

wherein $R^{30}$ to $R^{46}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and —P(═O)$R^{47}R^{48}$; where each of $R^{47}$ and $R^{48}$ is an aryl group or a heteroaryl group; $R^{30}$ to $R^{48}$ may form a ring together with adjacent substituents; $A^3$ is an arylene group or a heteroarylene group; at least one of $R^{32}$ and $R^{34}$ is an aryl group or a heteroaryl group, or $R^{33}$ is an alkyl group or a cycloalkyl group.

8. The light emitting device according to claim 6, wherein the organic compound is represented by the following formula (4):

(4)

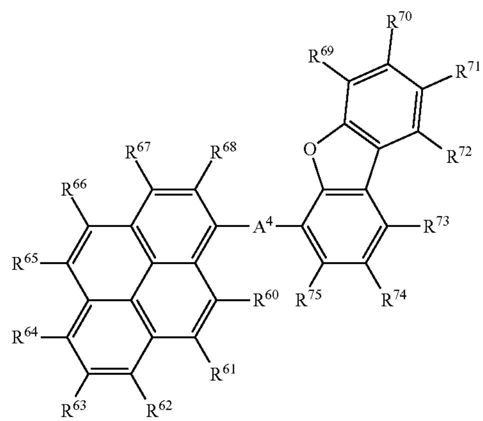

wherein $R^{60}$ to $R^{75}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a carbonyl group, a carboxyl group, an oxycarbonyl group, a carbamoyl group, an amino group, a silyl group, and —P(═O)$R^{76}R^{77}$, where each of $R^{76}$ and $R^{77}$ is an aryl group or a heteroaryl group; $R^{60}$ to $R^{77}$ may form a ring together with adjacent substituents; A4 is an arylene group or a heteroarylene group; and at least one of $R^{62}$ and $R^{64}$ is an aryl group or a heteroaryl group, or $R^{63}$ is an alkyl group or a cycloalkyl group.

9. The light emitting device according to claim 1, wherein the organic compound is represented by the following formula (5):

(5)

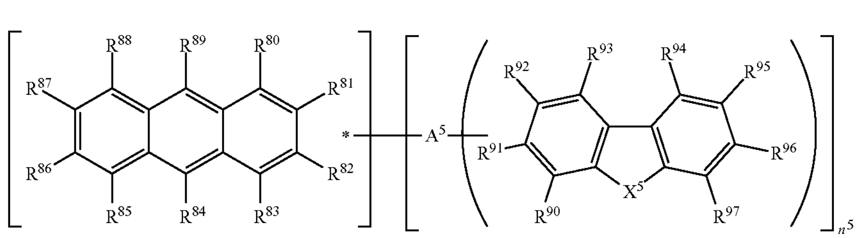

wherein $R^{60}$ to $R^{97}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a cyano group, a carbonyl group, an ester group, a carbamoyl group, an amino group, a silyl group, and —P(=O)$R^{98}R^{99}$, where each of $R^{98}$ and $R^{99}$ is an aryl group or a heteroaryl group; $R^{80}$ to $R^{99}$ may form a ring together with adjacent substituents, and $n^5$ is an integer of 1 or 2 $X^5$ is selected from the group consisting of —O—, —S—, and —$NR^{100}$—, where $R^{100}$ is selected from the group consisting of hydrogen, an alkyl group, a cycloalkyl group, a heterocyclic group, an alkenyl group, a cycloalkenyl group, an alkynyl group, an aryl group, a heteroaryl, group, and an amino group; $R^{100}$ may be bonded to $R^{90}$ or $R^{97}$ to form a ring; $A^5$ is selected from the group consisting of a single bond, an arylene group, and a heteroarylene group; any $n^5$ number of $R^{80}$ to $R^{85}$ and any one of $R^{90}$ to $R^{100}$ are used for a linkage to $A^5$.

10. The light emitting device according to claim 9, wherein the organic compound is represented by the following formula (6):

(6)

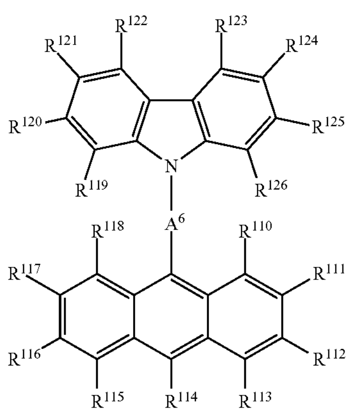

wherein $R^{110}$ to $R^{126}$, which may be the same as or different from one another, are selected from the group consisting of hydrogen, an alkyl group, a cycloalkyl group, a heterocyclic group, an alkoxy group, an alkylthio group, an aryl ether group, an arylthio ether group, a phenyl group, an alkyl-substituted phenyl group, an alkoxy-substituted phenyl group, an aryl-substituted phenyl group, a naphthyl group, an alkyl-substituted naphthyl group, an alkoxy-substituted naphthyl group, an aryl-substituted naphthyl group, a phenanthryl group, an alkyl-substituted phenanthryl group, an alkoxy-substituted phenanthryl group, an aryl-substituted phenanthryl group, a heteroaryl group, and a silyl group; and $A^6$ is a heteroarylene group or an arylene group having carbon atoms of 6 or more to 12 or less.

11. The light emitting device according to claim 9, wherein the organic compound is represented by the following formula (7):

(7)

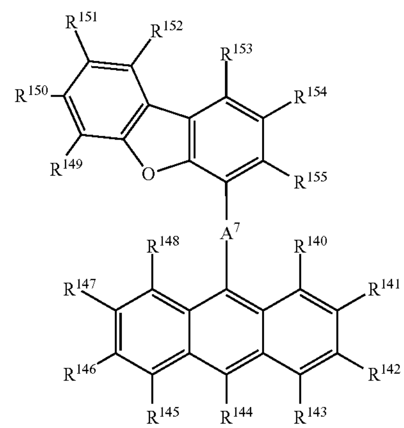

wherein $R^{140}$ to $R^{148}$, which may be the same as or different from one another, are selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, halogen, a cyano group, a carbonyl group, an ester group, a carbamoyl group, an amino group, a silyl group, and —P(=O)$R^{156}R^{157}$, where each of $R^{156}$ and $R^{157}$ is an aryl group or a heteroaryl group; $R^{149}$ to $R^{155}$, which may be the same as or different from one another, are selected from the group consisting of hydrogen, an alkyl group, an cycloalkyl group, an alkoxy group, a phenyl group, a naphthyl group, and a heteroaryl group; and $A^7$ is selected from the group consisting of a single bond, an arylene group, and a heteroarylene group.

12. The light emitting device according to claim 1, wherein pyrene or anthracene in the organic compound has a substituent containing a heteroaryl-ring structure having electron-accepting nitrogen.

13. The light emitting device according to claim 1, wherein the second electrode is composed of magnesium and silver.

* * * * *